(12) United States Patent
Lin et al.

(10) Patent No.: US 7,129,113 B1
(45) Date of Patent: *Oct. 31, 2006

(54) METHOD OF MAKING A THREE-DIMENSIONAL STACKED SEMICONDUCTOR PACKAGE WITH A METAL PILLAR IN AN ENCAPSULANT APERTURE

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 245 days.

This patent is subject to a terminal disclaimer.

(21) Appl. No.: 10/971,856

(22) Filed: Oct. 22, 2004

Related U.S. Application Data

(60) Continuation of application No. 10/966,816, filed on Oct. 15, 2004, now Pat. No. 7,067,911, which is a continuation-in-part of application No. 10/922,280, filed on Aug. 19, 2004, now Pat. No. 7,009,297, which is a continuation-in-part of application No. 10/307,218, filed on Nov. 29, 2002, now Pat. No. 6,809,414, which is a division of application No. 09/997,973, filed on Nov. 29, 2001, now Pat. No. 6,492,252, which is a continuation-in-part of application No. 09/917,339, filed on Jul. 27, 2001, now Pat. No. 6,537,851, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, application No. 10/922,280.

(60) Provisional application No. 60/497,672, filed on Aug. 25, 2003, provisional application No. 60/497,425, filed on Aug. 22, 2003.

(51) Int. Cl.
*H01L 21/44* (2006.01)

(52) U.S. Cl. ............... 438/109; 438/112; 438/E21.499; 257/698; 257/E21.507; 257/E21.508

(58) Field of Classification Search ................. 438/55, 438/108, 109, 112, 124–127, 745; 257/686, 257/687, 698, 700, 730
See application file for complete search history.

(56) References Cited

U.S. PATENT DOCUMENTS

| 4,442,967 A | 4/1984 | van de Pas et al. ......... 228/159 |
| 4,661,192 A | 4/1987 | McShane ..................... 156/292 |
| 4,706,166 A | 11/1987 | Go .............................. 361/403 |

(Continued)

FOREIGN PATENT DOCUMENTS

EP 0 718 882 A1 6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Quoc Hoang
(74) *Attorney, Agent, or Firm*—David M. Sigmond

(57) ABSTRACT

A method of making a three-dimensional stacked semiconductor package includes providing a first semiconductor chip assembly that includes a first chip, a first conductive trace and a first encapsulant, wherein the first conductive trace includes a first metal pillar, providing a second semiconductor chip assembly that includes a second chip, a second conductive trace and a second encapsulant, wherein the second encapsulant includes a second aperture, and then positioning the first and second assemblies such that the first assembly overlaps the second assembly and the first metal pillar extends into the second aperture.

200 Claims, 68 Drawing Sheets

U.S. PATENT DOCUMENTS

| | | | |
|---|---|---|---|
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,897,708 A | 1/1990 | Clements | 357/65 |
| 4,925,083 A | 5/1990 | Farassat et al. | 228/102 |
| 4,937,653 A | 6/1990 | Blonder et al. | 357/68 |
| 4,954,875 A | 9/1990 | Clements | 357/75 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 4,996,583 A | 2/1991 | Hatada | 357/70 |
| 5,014,111 A | 5/1991 | Tsuda et al. | 357/68 |
| 5,049,979 A | 9/1991 | Hashemi et al. | 357/75 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,104,820 A | 4/1992 | Go et al. | 437/51 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,138,438 A | 8/1992 | Masayuki et al. | 357/75 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,332,922 A | 7/1994 | Oguchi et al. | 257/723 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,394,303 A | 2/1995 | Yamaji | 361/749 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,484,959 A | 1/1996 | Burns | 174/524 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,514,907 A | 5/1996 | Moshayedi | 257/723 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,594,275 A | 1/1997 | Kwon et al. | 257/686 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,625,221 A | 4/1997 | Kim et al. | 257/686 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,856 A | 8/1997 | Kweon | 257/686 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,827 A | 4/1998 | Jeong et al. | 257/686 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,804,874 A | 9/1998 | An et al. | 257/676 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,854,507 A | 12/1998 | Miremadi et al. | 257/686 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,910,685 A | 6/1999 | Watanabe et al. | 257/777 |
| 5,925,931 A | 7/1999 | Yamamoto | 257/737 |
| 5,973,393 A | 10/1999 | Chia et al. | 257/690 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,025,650 A | 2/2000 | Tsuji et al. | 257/786 |
| 6,037,665 A | 3/2000 | Miyazaki | 257/773 |
| 6,046,909 A | 4/2000 | Joy | 361/748 |
| 6,072,233 A | 6/2000 | Corisis et al. | 257/686 |
| 6,084,297 A | 7/2000 | Brooks et al. | 257/698 |

| | | | |
|---|---|---|---|
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,124,633 A | 9/2000 | Vindasius et al. | 257/685 |
| 6,127,204 A | 10/2000 | Isaacs et al. | 438/106 |
| 6,137,163 A | 10/2000 | Kim et al. | 257/686 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,190,944 B1 | 2/2001 | Choi | 438/109 |
| 6,218,728 B1 | 4/2001 | Kimura | 257/693 |
| 6,235,554 B1 | 5/2001 | Akram et al. | 438/109 |
| 6,303,997 B1 | 10/2001 | Lee | 257/778 |
| 6,335,565 B1 | 1/2002 | Miyamoto et al. | 257/686 |
| 6,479,321 B1 | 11/2002 | Wang et al. | 438/109 |
| 6,483,718 B1 | 11/2002 | Hashimoto | 361/803 |
| 6,492,718 B1 | 12/2002 | Ohmori | 257/686 |
| 6,501,165 B1 | 12/2002 | Farnworth et al. | 257/686 |
| 6,504,241 B1 | 1/2003 | Yanagida | 257/686 |
| 6,509,639 B1 | 1/2003 | Lin | 257/686 |
| 6,564,454 B1 | 5/2003 | Glenn et al. | 29/852 |
| 6,608,371 B1 | 8/2003 | Kurashima et al. | 257/686 |
| 6,765,287 B1 * | 7/2004 | Lin | 257/686 |
| 6,794,741 B1 | 9/2004 | Lin et al. | 257/686 |
| 2002/0153599 A1 | 10/2002 | Chang et al. | 257/676 |

FOREIGN PATENT DOCUMENTS

| | | |
|---|---|---|
| WO | WO 97/38563 | 10/1997 |
| WO | WO 99/57762 | 11/1999 |

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly with Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 10/714,794, filed Nov. 17, 2003, entitled "Semiconductor Chip Assembly With Embedded Metal Pillar".

* cited by examiner

METHOD OF MAKING A THREE-DIMENSIONAL STACKED SEMICONDUCTOR PACKAGE WITH A METAL PILLAR IN AN ENCAPSULANT APERTURE

CROSS-REFERENCE TO RELATED APPLICATIONS

This application is a continuation of U.S. application Ser. No. 10/966,816 filed Oct. 15, 2004, now U.S. Pat. No. 7,067,911, which is a continuation-in-part of U.S. application Ser. No. 10/922,280 filed Aug. 19, 2004, now U.S. Pat. No. 7,009,297, which is a continuation-in-part of U.S. application Ser. No. 10/307,218 filed Nov. 29, 2002, now U.S. Pat. No. 6,809,414, which is a divisional of U.S. application Ser. No. 09/997,973 filed Nov. 29, 2001, now U.S. Pat. No. 6,492,252, which is a continuation-in-part of U.S. application Ser. No. 09/917,339 filed Jul. 27, 2001, now U.S. Pat. No. 6,537,851, which is a continuation-in-part of U.S. application Ser. No. 09/878,626 filed Jun. 11, 2001, now U.S. Pat. No. 6,653,217, which is a continuation-in-part of U.S. application Ser. No. 09/687,619 filed Oct. 13, 2000, now U.S. Pat. No. 6,440,835, each of which is incorporated by reference.

U.S. application Ser. No. 10/922,280 filed Aug. 19, 2004 also claims the benefit of U.S. Provisional Application Ser. No. 60/497,672 filed Aug. 25, 2003, and U.S. Provisional Application Ser. No. 60/497,425 filed Aug. 22, 2003, each of which is incorporated by reference.

BACKGROUND OF THE INVENTION

1. Field of the Invention

The present invention relates to semiconductor packaging, and more particularly to a three-dimensional stacked semiconductor package with multiple semiconductor chip assemblies and its method of manufacture.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as ball grid arrays (BGA) and chip scale packages (CSP) have been recently developed to address these considerations. Although these packages provide certain advantages, further size reduction and performance enhancement with these packages has been difficult to obtain due to physical dimension, design and manufacturing constraints.

Multi-chip modules (MCM) or hybrid modules that package multiple chips on a common platform are an alternative to single-chip packages. These modules aim to achieve higher packaging density (lower volume and mass per chip), better signal integrity and reasonable manufacturing cost.

Conventional multi-chip modules are essentially two-dimensional structures with multiple chips connected to a planar interconnection substrate which contains traces to supply power and signal transmission. Co-fired ceramic substrates have given way to organic-based substrates due to performance and cost advantages. However, since multi-chip modules utilize a planar interconnection substrate as the base, their effectiveness in packaging density is limited. For instance, a substrate transmission line that is 25 microns wide, 5 microns high and 10 millimeters long creates high line resistance and signal delays, which necessitates complex wiring rules in order to provide acceptable signal transmission distances and reasonable propagation delays.

Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and large cache memory devices which require high operating speed and high capacity in very limited space.

Three-dimensional packages generally follow two approaches. In one approach, individual chips are packaged in conventional single-chip packages and then the single-chip packages are vertically stacked and interconnected to one another. Single-chip packages stacked this way include thin small-outline packages (TSOP), ball grid arrays (BGA) and tape chip packages (TCP), and chip connections within the single-chip packages include wire bonding, TAB and flip-chip bonding. In another approach, leads are connected to the chips, and then the exposed leaded chips are vertically stacked and interconnected to one another. Most three-dimensional packages involve peripheral interconnection, but some provide area array interconnection. Numerous three-dimensional packages are reported in the literature.

U.S. Pat. Nos. 5,484,959, 5,514,907, 5,625,221 and 5,744,827 disclose three-dimensional packages in which stacked single-chip packages have large footprints that require large amounts of space. The single-chip packages also have long extended leads and associated wire bonds that limit electrical performance.

U.S. Pat. Nos. 5,854,507 and 6,072,233 disclose three-dimensional packages with stacked single-chip packages in which solder balls provide the primary vertical interconnections. The solder balls require large amounts of space.

U.S. Pat. No. 5,394,303 discloses a three-dimensional package in which the stacked single-chip packages include a flexible film with wiring layers wrapped around the chip. The flexible film is relatively difficult to wrap and bending the wiring layers causes low yields.

U.S. Pat. Nos. 4,996,583, 5,138,438 and 5,910,685 disclose three-dimensional packages in which TAB leads are connected to and extend beyond the peripheries of the chips, the exposed chips are stacked together and the TAB leads are connected together. The TAB leads for different chips have different shapes and lengths which complicates manufacturing. Furthermore, the TAB leads are interconnected by applying thermocompression, which also complicates manufacturing.

U.S. Pat. Nos. 4,706,166 and 5,104,820 disclose three-dimensional packages in is which chips are formed with leads that extend to the sidewalls, the exposed chips are stacked together, and then thin film routing lines are deposited on the sidewalls to interconnect the leads. The wafer process must be modified, and aligning the sidewalls and forming the routing lines on the leads is difficult.

U.S. Pat. Nos. 4,897,708 and 4,954,875 disclose three-dimensional packages composed of wafers rather than individual chips. Cone-shaped vias are formed in the wafers, electrically conductive material is filled in the vias which contacts the pads on the wafers, and the wafers are stacked such that the electrically conductive material in the vias provides vertical interconnections between the pads. The wafer stacks are difficult to separate for repairs and too large for many applications.

Another drawback with many conventional three-dimensional packages is that the vertical interconnections lack the flexibility to accommodate thickness variations of the stacked assemblies. For instance, chip thickness may vary by 20 microns or more even after back-side wafer polishing attempts to planarize the wafer. As a result, vertical interconnections with fixed heights cannot adequately accommodate these thickness variations, and suffer from disoriented, cracked and open connections, high mechanical stress and reliability problems.

In summary, conventional three-dimensional packages suffer from numerous deficiencies including large area requirements, inflexible vertical interconnections, limited electrical performance, poor structural strength and low reliability. Moreover, conventional three-dimensional packages are often unsuitable for test and repair, manufactured by complicated processes that are impractical for volume production, and too difficult and costly to develop.

In view of the various development stages and limitations in currently available three-dimensional packages, there is a need for a three-dimensional package that is cost-effective, reliable, manufacturable, and provides excellent mechanical and electrical performance.

SUMMARY OF THE INVENTION

An object of the present invention is to provide a three-dimensional stack of semiconductor chip assemblies that provides a low cost, high performance, high reliability package.

Another object of the present invention is to provide a convenient, cost-effective method for stacking semiconductor chip assemblies.

Generally speaking, the present invention provides a three-dimensional stacked semiconductor package that includes first and second semiconductor chip assemblies. The first semiconductor chip assembly includes a first chip, a first conductive trace and a first encapsulant, and the first conductive trace includes a first metal pillar. The second semiconductor chip assembly includes a second chip, a second conductive trace and a second encapsulant, and the second encapsulant includes a second aperture. The first metal pillar extends into the second aperture.

Generally speaking, the present invention also provides a method of making a three-dimensional stacked semiconductor package that includes providing a first semiconductor chip assembly that includes a first chip, a first conductive trace and a first encapsulant, wherein the first conductive trace includes a first metal pillar, providing a second semiconductor chip assembly that includes a second chip, a second conductive trace and a second encapsulant, wherein the second encapsulant includes a second aperture, and then positioning the first and second assemblies such that the first assembly overlaps the second assembly and the first metal pillar extends into the second aperture.

In accordance with an aspect of the invention, a three-dimensional stacked semiconductor package includes (1) a first semiconductor chip assembly that includes (a) a first semiconductor chip that includes first and second opposing surfaces, wherein the first surface of the first chip includes a first conductive pad, (b) a first conductive trace that includes a first routing line and a first metal pillar and is electrically connected to the first pad, and (c) a first encapsulant that includes first and second opposing surfaces, wherein the first surface of the first encapsulant faces in a first direction, the second surface of the first encapsulant faces in a second direction opposite the first direction, the first chip is embedded in the first encapsulant, the first routing line overlaps the first metal pillar and extends laterally beyond the first metal pillar towards the first chip, and the first metal pillar is devoid of solder and conductive adhesive, is disposed outside a periphery of the first chip and extends vertically beyond the first chip, the first routing line and the first encapsulant in the second direction, and (2) a second semiconductor chip assembly that includes (a) a second semiconductor chip that includes first and second opposing surfaces, wherein the first surface of the second chip includes a second conductive pad, (b) a second conductive trace that includes a second routing line and a second metal particle and is electrically connected to the second pad, and (c) a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, the second chip and the second metal particle are embedded in the second encapsulant, the second routing line extends laterally beyond the second metal particle towards the second chip, and the second metal particle overlaps the second routing line, is disposed outside a periphery of the second chip and extends vertically across at least some of a thickness of the second chip between the first and second surfaces of the second chip. The first assembly overlaps the second assembly, the first surface of the second encapsulant faces towards the second surface of the first encapsulant, and the first metal pillar extends into the second aperture and is electrically connected to the second metal particle within the second encapsulant.

In accordance with another aspect of the invention, a three-dimensional stacked semiconductor package includes (1) a first semiconductor chip assembly that includes (a) a first semiconductor chip that includes first and second opposing surfaces, wherein the first surface of the first chip includes a first conductive pad, (b) a first conductive trace that includes a first routing line, a first metal particle and a first metal pillar, (c) a first connection joint that electrically connects the first routing line and the first pad, and (d) a first encapsulant that includes first and second opposing surfaces, wherein the first surface of the first encapsulant faces in a first direction, the second surface of the first encapsulant faces in a second direction opposite the first direction, a first aperture in the first encapsulant extends from the first surface of the first encapsulant to the first metal particle, extends into but not through the first encapsulant, is spaced from the first routing line and the first metal pillar and is disposed outside a periphery of the first chip, the first chip and the first metal particle are embedded in the first encapsulant, the first chip, the first metal particle and the first encapsulant extend vertically beyond the first routing line in the first direction, the first routing line extends laterally beyond the first metal particle and the first metal pillar towards the first chip and extends vertically beyond the first chip and the first metal particle in the second direction, the first metal particle overlaps and is non-integral with the first routing line and the first metal pillar, is disposed outside the periphery of the first chip and extends vertically across at least some of a thickness of the first chip between the first and second surfaces of the first chip, the first metal pillar is devoid of solder and conductive adhesive, contacts and is non-integral with the first routing line, is disposed outside the periphery of the first chip and extends vertically beyond the first chip, the first routing line, the first metal particle and the first encapsulant in the second direction, the first conductive trace includes solder or conductive adhesive that contacts and overlaps the first routing line and overlaps the first metal pillar, and any chip embedded in the first encapsulant is electrically connected to the first metal particle by an electrically conductive path that includes the first routing line, and (2) a second semiconductor chip assembly that includes (a) a second semiconductor chip that includes first and second opposing surfaces, wherein the first surface of the second chip includes a second conductive pad, (b) a second conductive trace that includes a second routing line, a second metal particle and a second metal pillar, (c) a second connection joint that electrically connects the second routing line and the second pad, and (d) a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, extends into but not through the second encapsulant, is spaced from the second routing line and the second metal pillar and is disposed outside a periphery of the second chip, the second chip and the second metal particle are embedded in the second encapsulant, the second chip, the second metal particle and the second encapsulant extend vertically beyond the second routing line in the first direction, the second routing line extends laterally beyond the second metal particle and the second metal pillar towards the second chip and extends vertically beyond the second chip and the second metal particle in the second direction, the second metal particle overlaps and is non-integral with the second routing line and the second metal pillar, is disposed outside the periphery of the second chip and extends vertically across at least some of a thickness of the second chip between the first and second surfaces of the second chip, the second metal pillar is devoid of solder and conductive adhesive, contacts and is non-integral with the second routing line, is disposed outside the periphery of the second chip and extends vertically beyond the second chip, the second routing line, the second metal particle and the second encapsulant in the second direction, the second conductive trace includes solder or conductive adhesive that contacts and overlaps the second routing line and overlaps the second metal pillar, and any chip embedded in the second encapsulant is electrically connected to the second metal particle by an electrically conductive path that includes the second routing line. The first assembly overlaps the second assembly, the first surface of the second encapsulant faces towards the second surface of the first encapsulant, the first metal pillar extends into the second aperture, is disposed vertically beyond the second routing line in the first direction and is electrically connected to the second metal particle within the second encapsulant, the first and second routing lines are spaced from and vertically aligned with one another, the first and second metal particles are spaced from and vertically aligned with one another, and the first and second metal pillars are spaced from and vertically aligned with one another.

The first surfaces of the first and second chips can face in the first direction and the second surfaces of the first and second chips can face in the second direction, or alternatively, the first surfaces of the first and second chips can face in the second direction and the second surfaces of the first and second chips can face in the first direction. The first chip can be the only chip embedded in the first encapsulant and the second chip can be the only chip embedded in the second encapsulant, or alternatively, multiple chips can be embedded in the first encapsulant and multiple chips can be embedded in the second encapsulant. In addition, any chip embedded in the first encapsulant can extend vertically beyond the first routing line in the first direction, and any chip embedded in the second encapsulant can extend vertically beyond the second routing line in the first direction. Furthermore, any chip embedded in the first encapsulant can be electrically connected to the first metal pillar by an electrically conductive path that includes the first routing line, and any chip embedded in the second encapsulant can be electrically connected to the second metal particle by an electrically conductive path that includes the second routing line.

The first routing line can extend vertically beyond the first chip in the second direction and can be disposed vertically beyond the first chip in the second direction, and the second routing line can extend vertically beyond the second chip in the second direction and can be disposed vertically beyond the second chip in the second direction. The first routing line can extend within and outside the periphery of the first chip and the second routing line can extend within and outside the periphery of the second chip, or alternatively, the first routing line can be disposed outside the periphery of the first chip and the second routing line can be disposed outside the periphery of the second chip. The first routing line can be unbent in the first and second directions outside the periphery of the first chip, and the second routing line can be unbent in the first and second directions outside the periphery of the second chip. Similarly, the first and second routing lines can be unbent in the first and second directions. In addition, the first routing line can be essentially flat and parallel to the first and second surfaces of the first chip, and the second routing line can be essentially flat and parallel to the first and second surfaces of the second chip. The second routing line can be disposed vertically beyond the second metal particle in the second direction. The second routing line can also include a second cavity that is disposed outside the periphery of the second chip and faces in the first direction, and the second metal particle can extend into the second cavity.

The first routing line can be in an electrically conductive path between the first metal particle and any chip embedded in the first encapsulant, and the second routing line can be in an electrically conductive path between the second metal particle and any chip embedded in the second encapsulant. That is, any chip embedded in the first encapsulant can be electrically connected to the first metal particle by an electrically conductive path that includes the first routing line, and any chip embedded in the second encapsulant can be electrically connected to the second metal particle by an electrically conductive path that includes the second routing line.

The first metal pillar can include first and second opposing surfaces. The first surface of the first metal pillar can face in the first direction and be disposed outside the second aperture, and the second surface of the first metal pillar can face in the second direction and be disposed within the second aperture. The first surface of the first metal pillar can face towards and contact the first routing line, and the second surface of the first metal pillar can face away from and be spaced from the first routing line. The first and second surfaces of the first metal pillar can be flat and parallel to one another and can have a circular shape. The second surface of the first metal pillar can be concentrically disposed within a surface area of the first surface of the first metal pillar, and a surface area of the first surface of the first metal pillar can be at least 20 percent larger than a surface area of the second surface of the first metal pillar. The second surface of the first metal pillar can also be concentrically disposed within a surface area of the second metal particle. Furthermore, the second surface of the first metal pillar can be disposed vertically beyond one of the first and second surfaces of the second chip in the first direction and disposed vertically beyond the other of the first and second surfaces of the second chip in the second direction.

The first metal pillar can also include first tapered sidewalls that are adjacent to the first and second surfaces of the first metal pillar and slant inwardly towards the second surface of the first metal pillar. The first tapered sidewalls have a taper between 45 and slightly less than 90 degrees, such as approximately 75 degrees. Thus, the first metal pillar can have a conical shape with a diameter that decreases from the first surface of the first metal pillar to the second surface of the first metal pillar. The first metal pillar can also be copper.

The first metal pillar can contact and be non-integral with the first routing line. The first metal pillar can be disposed vertically beyond the first chip, the first routing line and the first encapsulant in the second direction and can be disposed vertically beyond the second routing line in the first direction. The first metal pillar can extend vertically beyond one of the first and second surfaces of the second chip in the second direction. Most or all of the first metal pillar can extend into the second aperture. Similarly, essentially all of the first metal pillar can extend into the second aperture. Furthermore, the first metal pillar can contact only solder in the second aperture.

The first metal pillar can extend into and contact and be embedded in the second metal particle within the second encapsulant. In this instance, the second metal particle can be solder, the second metal particle can be the only material external to the first assembly that contacts the first metal pillar, and the first routing line and the second metal particle can be the only materials that contact the first metal pillar. Alternatively, the first metal pillar can extend into and contact and be embedded in a conductive interconnect within the second aperture, and the conductive interconnect can contact and electrically connect the first metal pillar and the second metal particle within the second encapsulant. In this instance, the conductive interconnect can be solder or conductive adhesive, the conductive interconnect can be the only material external to the first assembly that contacts the first metal pillar, and the first routing line and the conductive interconnect can be the only materials that contact the first metal pillar.

The second metal particle can be solder, or alternatively, another metal such as copper, tin, nickel, gold or silver. Thus, the second metal particle can be devoid of solder and conductive adhesive. The second metal particle can have a substantially spherical or cylindrical shape. The second metal particle can also include a first surface that faces in the first direction and has a concave, crater-like shape. The second metal particle can extend across at least some, most or all of a thickness of the second chip between the first and second surfaces of the second chip, can extend vertically beyond the second chip in the first direction, and can extend vertically beyond the second chip in the second direction. Likewise, the second metal particle can extend across some, most or all of a thickness of any other chip embedded in the second encapsulant. The second metal particle can extend vertically beyond the second routing line in the first direction. Most or all of the second metal particle can be embedded in the second encapsulant. Similarly, essentially all of the second metal particle can be embedded in the second encapsulant. The second metal particle can also be recessed relative to the first surface of the second encapsulant.

The first conductive trace can include a first metal particle that is embedded in the first encapsulant, disposed outside the periphery of the first chip, overlaps the first routing line and the first metal pillar and extends vertically across at least some of a thickness of the first chip between the first and second surfaces of the first chip.

The second conductive trace can include a second metal pillar that is devoid of solder and conductive adhesive, disposed outside the periphery of the second chip, overlapped by the second routing line and the second metal particle and extends vertically beyond the second chip, the second routing line, the second metal particle and the second encapsulant in the second direction.

The first conductive trace can include solder or conductive adhesive that contacts and overlaps the first routing line and extends within a periphery of the first metal pillar, and the second conductive trace can include solder or conductive adhesive that contacts and overlaps the second routing line and extends within a periphery of the second metal particle. For instance, the first metal particle can be solder and contact the first routing line and the first conductive trace can be devoid of conductive adhesive and the second metal particle can be solder and contact the second routing line and the second conductive trace can be devoid of conductive adhesive, or alternatively, the first metal particle can be devoid of solder and conductive adhesive and a first conductive bond that is solder or conductive adhesive can contact the first routing line and the first metal particle and the second metal particle can be devoid of solder and conductive adhesive and a second conductive bond that is solder or conductive adhesive can contact the second routing line and the second metal particle. In addition, the first conductive trace can be uncovered within a periphery of the first metal particle in the first direction by the first encapsulant or any other insulative material of the first assembly, and the second conductive trace can be uncovered within a periphery of the second metal particle in the first direction by the second encapsulant or any other insulative material of the second assembly.

The first metal particle can be solder and contact the first routing line, the second metal particle can be solder and contact the second routing line, and the first metal pillar can extend into and contact and be embedded in and electrically connected to the second metal particle within the second encapsulant.

The first conductive trace can include a first conductive bond that is solder or conductive adhesive, overlaps the first routing line and the first metal pillar, is overlapped by the first metal particle, is non-integral with the first routing line, the first metal pillar and the first metal particle and contacts and electrically connects the first routing line and the first metal particle, the second conductive trace can include a second conductive bond that is solder or conductive adhesive, overlaps the second routing line and the second metal pillar, is overlapped by the second metal particle, is non-integral with the second routing line, the second metal pillar and the second metal particle and contacts and electrically connects the second routing line and the second metal particle, the first and second metal particles can be devoid of solder and conductive adhesive, the first metal pillar can extend into and contact and be embedded in and electrically connected to a conductive interconnect within the second aperture, and the conductive interconnect can contact and electrically connect the first metal pillar and the second metal particle within the second encapsulant and be disposed vertically beyond the second routing line in the first direction.

The first encapsulant can have its first surface mostly or entirely uncovered in the first direction by another material of the first assembly and its second surface mostly or entirely covered in the second direction by another material of the first assembly, and the second encapsulant can have its first surface mostly or entirely uncovered in the first direction by another material of the second assembly and its second surface mostly or entirely covered in the second direction by another material of the second assembly. The first encapsulant can cover the first chip in the first direction and not overlap the first chip in the second direction, and the second encapsulant can cover the second chip in the first direction and not overlap the second chip in the second direction. Alternatively, the first surface of the first encapsulant can be laterally aligned with the second surface of the first chip and the second surface of the first chip can be not covered in the first direction by another material of the first assembly, and the first surface of the second encapsulant can be laterally aligned with the second surface of the second chip and the second surface of the second chip can be not covered in the first direction by another material of the second assembly. The first encapsulant can contact the first chip, and the second encapsulant can contact the second chip. The second encapsulant can also contact the second metal particle (with no second conductive bond), or alternatively, contact the second metal particle and the second conductive bond, or alternatively, contact the second conductive bond and be spaced from the second metal particle.

The second aperture can be disposed outside the periphery of the second chip, can be vertically aligned with the first metal pillar and the second metal particle, can extend into but not through the second encapsulant, and can be spaced from the second routing line. The second aperture can also have a diameter that increases as the second aperture extends from the first surface of the second encapsulant to the second metal particle.

The first assembly can include a first connection joint that contacts and electrically connects the first routing line and the first pad, and the second assembly can include a second connection joint that contacts and electrically connects the second routing line and the second pad. The connection joints can be electroplated metal, electrolessly plated metal, solder, conductive adhesive or wire bonds.

The first assembly can include a first insulative base that contacts the first routing line, is spaced from and overlapped by the first chip and extends vertically beyond the first chip, the first routing line and the first encapsulant in the second direction, and the second assembly can include a second insulative base that contacts the second routing line, is spaced from and overlapped by the second chip and the second metal particle and extends vertically beyond the second chip, the second routing line and the second encapsulant in the second direction.

The first assembly can include a first insulative adhesive that contacts the first chip and the first encapsulant and extends vertically beyond the first chip in the second direction, and the second assembly can include a second insulative adhesive that contacts the second chip and the second encapsulant and extends vertically beyond the second chip in the second direction.

The first assembly can be devoid of a heat sink, and the second assembly can include a heat sink that is mechanically attached to the second chip, electrically isolated from the second chip, overlapped by the second chip and disposed vertically beyond the second chip and the second conductive trace in the second direction.

The first assembly can be devoid of a ground plane, and the second assembly can include a ground plane that is mechanically attached to the second routing line, electrically connected to the second routing line, overlapped by the second routing line and disposed vertically beyond the second chip and the second routing line in the second direction.

The first assembly can be a first-level package that is a single-chip or multi-chip package, and the second assembly can be a first-level package that is a single-chip or multi-chip package.

The first and second assemblies can be separated from one another by an open air gap, or alternatively, the first and second assemblies can not be separated from one another by an open air gap. Furthermore, the first and second assemblies can be mechanically attached to one another solely by electrical conductors such as conductive interconnects that are solder joints.

The first and second chips can be essentially identical to and vertically aligned with one another, the first and second routing lines can be essentially identical to and vertically aligned with one another, the first and second metal particles can be essentially identical to and vertically aligned with one another, the first and second metal pillars can be essentially identical to and vertically aligned with one another, the first and second conductive traces can be essentially identical to and vertically aligned with one another, the first and second encapsulants can be essentially identical to and vertically aligned with one another, and the first and second assemblies can be essentially identical to and vertically aligned with one another.

In accordance with another aspect of the invention, a method of making a three-dimensional stacked semiconductor package includes (1) providing a first semiconductor chip assembly that includes (a) a first semiconductor chip that includes first and second opposing surfaces, wherein the first surface of the first chip includes a first conductive pad, (b) a first conductive trace that includes a first routing line and a first metal pillar and is electrically connected to the first pad, and (c) a first encapsulant that includes first and second opposing surfaces, wherein the first surface of the first encapsulant faces in a first direction, the second surface of the first encapsulant faces in a second direction opposite the first direction, the first chip is embedded in the first encapsulant, the first routing line overlaps the first metal pillar and extends laterally beyond the first metal pillar towards the first chip, and the first metal pillar is devoid of solder and conductive adhesive, is disposed outside a periphery of the first chip and extends vertically beyond the first chip, the first routing line and the first encapsulant in the second direction, (2) providing a second semiconductor chip assembly that includes (a) a second semiconductor chip that includes first and second opposing surfaces, wherein the first surface of the second chip includes a second conductive pad, (b) a second conductive trace that includes a second routing line and a second metal particle and is electrically connected to the second pad, and (c) a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, the second chip and the second metal particle are embedded in the second encapsulant, the second routing line extends laterally beyond the second metal particle towards the second chip, and the second metal particle overlaps the second routing line, is disposed outside a periphery of the second chip and extends vertically across at least some of a thickness of the second chip between the first and second surfaces of the second chip, then (3) positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture, and (4) electrically connecting the first metal pillar and the second metal particle within the second encapsulant.

In accordance with another aspect of the invention, a method of making a three-dimensional stacked semiconductor package includes (1) providing a first semiconductor chip assembly that includes (a) a first semiconductor chip that includes first and second opposing surfaces, wherein the first surface of the first chip includes a first conductive pad, (b) a first conductive trace that includes a first routing line, a first metal particle and a first metal pillar, (c) a first connection joint that electrically connects the first routing line and the first pad, and (d) a first encapsulant that includes first and second opposing surfaces, wherein the first surface of the first encapsulant faces in a first direction, the second surface of the first encapsulant faces in a second direction opposite the first direction, the first chip and the first metal particle are embedded in the first encapsulant, the first chip, the first metal particle and the first encapsulant extend vertically beyond the first routing line in the first direction, the first routing line extends laterally beyond the first metal particle and the first metal pillar towards the first chip and extends vertically beyond the first chip and the first metal particle in the second direction, the first metal particle overlaps and is non-integral with the first routing line and the first metal pillar, is disposed outside a periphery of the first chip and extends vertically across at least some of a thickness of the first chip between the first and second surfaces of the first chip, the first metal pillar is devoid of solder and conductive adhesive, contacts and is non-integral with the first routing line, is disposed outside the periphery of the first chip and extends vertically beyond the first chip, the first routing line, the first metal particle and the first encapsulant in the second direction, and any chip embedded in the first encapsulant is electrically connected to the first metal particle by an electrically conductive path that includes the first routing line, (2) providing a second semiconductor chip assembly that includes (a) a second semiconductor chip that includes first and second opposing surfaces, wherein the first surface of the second chip includes a second conductive pad, (b) a second conductive trace that includes a second routing line and a second metal particle, (c) a second connection joint that electrically connects the second routing line and the second pad, and (d) a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, extends into but not through the second encapsulant, is spaced from the second routing line and is disposed outside a periphery of the second chip, the second chip and the second metal particle are embedded in the second encapsulant, the second chip, the second metal particle and the second encapsulant extend vertically beyond the second routing line in the first direction, the second routing line extends laterally beyond the second metal particle towards the second chip and extends vertically beyond the second chip and the second metal particle in the second direction, the second metal particle overlaps and is non-integral with the second routing line, is disposed outside the periphery of the second chip and extends vertically across at least some of a thickness of the second chip between the first and second surfaces of the second chip, and any chip embedded in the second encapsulant is electrically connected to the second metal particle by an electrically conductive path that includes the second routing line, then (3) positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, the first metal pillar extends into the second aperture and is disposed vertically beyond the second routing line in the first direction, the first and second routing lines are spaced from and vertically aligned with one another, and the first and second metal particles are spaced from and vertically aligned with one another, and (d) electrically connecting the first metal pillar and the second metal particle within the second encapsulant.

In accordance with another aspect of the invention, a method of making a three-dimensional stacked semiconductor package includes (1) providing a first semiconductor chip assembly, including (a) providing a first routing line, (b) mechanically attaching a first semiconductor chip to the first routing line, wherein the first chip includes first and second opposing surfaces, and the first surface of the first chip includes a first conductive pad, (c) mechanically attaching and electrically connecting a first metal particle to the first routing line after providing the first metal particle, (d) forming a first metal pillar that is electrically connected to the first routing-line, (e) forming a first connection joint that electrically connects the first routing line and the first pad, and (f) forming a first encapsulant after attaching the first chip and the first metal particle to the first routing line, wherein the first encapsulant includes a first surface that faces in a first direction and a second surface that faces in a second direction opposite the first direction, the first encapsulant covers the first chip and extends vertically beyond the first chip, the first routing line and the first metal pillar in the first direction, the first chip and the first metal particle are embedded in the first encapsulant and extend vertically beyond the first routing line in the first direction, the first routing line overlaps the first metal pillar and extends laterally beyond the first metal particle and the first metal pillar towards the first chip, the first metal particle overlaps the first routing line and the first metal pillar and is disposed outside a periphery of the first chip, the first metal particle extends vertically across most or all of a thickness of the first chip between the first and second surfaces of the first chip while forming the first encapsulant, and the first metal pillar is devoid of solder and conductive adhesive, is disposed outside the periphery of the first chip and extends vertically beyond the first chip, the first routing line, the first metal particle and the first encapsulant in the second direction, (2) providing a second semiconductor chip assembly, including (a) providing a second routing line, (b) mechanically attaching a second semiconductor chip to the second routing line, wherein the second chip includes first and second opposing surfaces, and the first surface of the second chip includes a second conductive pad, (c) mechanically attaching and electrically connecting a second metal particle to the second routing line after providing the second metal particle, (d) forming a second connection joint that electrically connects the second routing line and the second pad, (e) forming a second encapsulant after attaching the second chip and the second metal particle to the second routing line, wherein the second encapsulant includes a first surface that faces in the first direction and a second surface that faces in the second direction, the second encapsulant covers the second chip and extends vertically beyond the second chip and the second routing line in the first direction, the second chip and the second metal particle are embedded in the second encapsulant and extend vertically beyond the second routing line in the first direction, the second routing line extends laterally beyond the second metal particle towards the second chip, the second metal particle overlaps the second routing line and is disposed outside a periphery of the second chip, and the second metal particle extends vertically across most or all of a thickness of the second chip between the first and second surfaces of the second chip while forming the second encapsulant, and (f) etching the second metal particle after forming the second encapsulant, thereby forming a second aperture in the second encapsulant that extends from the first surface of the second encapsulant to the second metal particle, extends into but not through the second encapsulant, is spaced from the second routing line and is disposed outside the periphery of the second chip, then (3) positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture, and (4) electrically connecting the first metal pillar and the second metal particle within the second encapsulant.

In accordance with another aspect of the invention, a method of making a three-dimensional stacked semiconductor package includes (1) providing a first semiconductor chip assembly, including (a) providing a first metal base, (b) forming a first routing line on the first metal base, (c) mechanically attaching a first semiconductor chip to the first routing line, wherein the first chip includes first and second opposing surfaces, and the first surface of the first chip includes a first conductive pad, (d) mechanically attaching and electrically connecting a first metal particle to the first routing line after providing the first metal particle, (e) forming a first connection joint that electrically connects the first routing line and the first pad, (f) forming a first encapsulant after attaching the first chip and the first metal particle to the first routing line, wherein the first encapsulant includes a first surface that faces in a first direction and a second surface that faces in a second direction opposite the first direction, the first encapsulant covers the first chip and extends vertically beyond the first chip, the first routing line and the first metal base in the first direction, the first chip and the first metal particle are embedded in the first encapsulant and extend vertically beyond the first routing line in the first direction, the first routing line extends laterally beyond the first metal particle towards the first chip, the first metal particle overlaps the first routing line and is disposed outside a periphery of the first chip, and the first metal particle extends vertically across most or all of a thickness of the first chip between the first and second surfaces of the first chip while forming the first encapsulant, and (g) etching the first metal base after forming the first encapsulant, thereby forming a first metal pillar from an unetched portion of the first metal base that contacts and is electrically connected to the first routing line, is disposed outside the periphery of the first chip, is overlapped by the first routing line and the first metal particle and extends vertically beyond the first chip, the first routing line, the first metal particle and the first encapsulant in the second direction, (2) providing a second semiconductor chip assembly, including (a) providing a second routing line, (b) mechanically attaching a second semiconductor chip to the second routing line, wherein the second chip includes first and second opposing surfaces, and the first surface of the second chip includes a second conductive pad, (c) mechanically attaching and electrically connecting a second metal particle to the second routing line after providing the second metal particle, (d) forming a second connection joint that electrically connects the second routing line and the second pad, (e) forming a second encapsulant after attaching the second chip and the second metal particle to the second routing line, wherein the second encapsulant includes a first surface that faces in the first direction and a second surface that faces in the second direction, the second encapsulant covers the second chip and the second metal particle and extends vertically beyond the second chip, the second routing line and the second metal particle in the first direction, the second chip and the second metal particle are embedded in the second encapsulant and extend vertically beyond the second routing line in the first direction, the second routing line extends laterally beyond the second metal particle towards the second chip, the second metal particle overlaps the second routing line and is disposed outside a periphery of the second chip, and the second metal particle extends vertically across most or all of a thickness of the second chip between the first and second surfaces of the second chip while forming the second encapsulant, then (f) removing a portion of the second encapsulant, thereby exposing the second metal particle, and then (g) etching the second metal particle, thereby forming a second aperture in the second encapsulant that extends from the first surface of the second encapsulant to the second metal particle, extends into but not through the second encapsulant, is spaced from the second routing line and is disposed outside the periphery of the second chip, then (3) positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture, and (4) electrically connecting the first metal pillar and the second metal particle within the second encapsulant.

The method can include forming the first routing line by selectively depositing the first routing line on a first metal base.

The method can include forming the first routing line by providing a plating mask on the first metal base, wherein the plating mask includes an opening that exposes a portion of the first metal base, and then electroplating the first routing line on the exposed portion of the first metal base through the opening in the plating mask.

The method can include forming the first metal pillar by etching the first metal base, thereby forming the first metal pillar from an unetched portion of the first metal base. Etching the first metal base can remove a first portion of the first metal base that contacts the first routing line without removing a second portion of the first metal base that contacts the first routing line, thereby exposing the first routing line and reducing but not eliminating contact area between the first metal base and the first routing line. Etching the first metal base can also remove all of the first metal base within the periphery of the first chip.

The method can include etching the first metal base, thereby electrically isolating the first routing line from other routing lines formed on the first metal base. The method can also include etching the first metal base, thereby electrically isolating the first conductive pad from other conductive pads of the first chip.

The method can include forming the first pillar after forming the first encapsulant. The method can also include forming the first pillar after forming the first connection joint.

The method can include etching the first metal particle after forming the first encapsulant, thereby forming a first aperture in the first encapsulant that extends from the first surface of the first encapsulant to the first metal particle, extends into but not through the first encapsulant, is spaced from the first routing line and is disposed outside the periphery of the first chip. The method can include forming the first aperture before the first metal pillar, or alternatively, forming the first aperture after forming the first metal pillar.

The method can include providing the second metal particle as a ball. For instance, the second metal particle can be provided as a solder ball, and attaching the second metal particle to the second routing line can include reflowing the solder ball. Alternatively, the second metal particle can be provided as a metal ball that is devoid of conductive adhesive, and attaching the second metal particle to the second routing line can include depositing solder paste or conductive adhesive on the second routing line, then depositing the second metal particle on the solder paste or the conductive adhesive, and then hardening the solder paste or the conductive adhesive to provide a second conductive bond that is solder or conductive adhesive and contacts the second routing line and the second metal particle. Alternatively, the second metal particle can be provided as a metal ball that is devoid of solder and conductive adhesive and is coated with solder, and attaching the second metal particle to the second routing line can include depositing the solder-coated second metal particle on the second routing line, and then reflowing the solder coating to provide a second conductive bond that is solder and contacts the second routing line and the second metal particle.

The method can include providing the second metal particle as a wire segment that is sliced from a wire. For instance, the second metal particle can be provided as a solder wire segment, and attaching the second metal particle to the second routing line can include reflowing the solder wire segment. Alternatively, the second metal particle can be provided as a metal wire segment that is devoid of conductive adhesive, and attaching the second metal particle to the second routing line can include depositing solder paste or conductive adhesive on the second routing line, then depositing the second metal particle on the solder paste or the conductive adhesive, and then hardening the solder paste or the conductive adhesive to provide a second conductive bond that is solder or conductive adhesive and contacts the second routing line and the second metal particle. Alternatively, the second metal particle can be provided as a metal wire segment that is devoid of solder and conductive adhesive and is coated with solder, and attaching the second metal particle to the second routing line can include depositing the solder-coated second metal particle on the second routing line, and then reflowing the solder coating to provide a second conductive bond that is solder and contacts the second routing line and the second metal particle.

The method can include having the first metal particle extend vertically beyond the first chip in the first and second directions while forming the first encapsulant, and having the second metal particle extend vertically beyond the second chip in the first and second directions while forming the second encapsulant. The method can also provide the first metal particle with a substantially spherical or cylindrical shape while forming the first encapsulant, and providing the second metal particle with a substantially spherical or cylindrical shape while forming the second encapsulant.

The method can include providing a second metal pillar that is devoid of solder and conductive adhesive, is disposed outside the periphery of the second chip, is overlapped by and electrically connected to the second routing line and the second metal particle and extends vertically beyond the second chip, the second routing line, the second metal particle and the second encapsulant in the second direction.

The method can include attaching the second chip to the second routing line and then attaching the second metal particle to the second routing line, or alternatively, attaching the second metal particle to the second routing line and then attaching the second chip to the second routing line.

The method can include forming the second encapsulant by transfer molding or curing. The method can include forming the second encapsulant by depositing the second encapsulant on the second metal particle such that the second encapsulant covers the second metal particle in the first direction and the second metal particle is not exposed, and then, before forming the second aperture, removing a portion of the second encapsulant such that the second metal particle is exposed.

The method can include removing the portion of the second encapsulant by grinding, laser ablation or plasma etching. For instance, removing the portion of the second encapsulant can include grinding the second encapsulant without grinding the second metal particle, and then grinding the second encapsulant and the second metal particle. Alternatively, removing the portion of the second encapsulant can include selectively removing the second encapsulant within the periphery of the second metal particle using laser ablation or plasma etching.

The method can include forming the second aperture by etching the second metal particle after forming the second encapsulant. For instance, the second metal particle can be etched using a wet chemical etch that is selective of the second metal particle relative to the second encapsulant, thereby receding the second metal particle relative to the first surface of the second encapsulant.

The method can include electrically connecting the first metal pillar and the second metal particle by reflowing the second metal particle such that the first metal pillar extends into and is embedded in the second metal particle. For instance, the second metal particle can be solder.

The method can include electrically connecting the first metal pillar and the second metal particle by depositing a non-solidified material on the first metal pillar, then inserting the first metal pillar and the non-solidified material into the second aperture, and then hardening the non-solidified material to form a conductive interconnect that contacts and electrically connects the first metal pillar and the second metal particle within the second encapsulant. For instance, the non-solidified material can be solder paste, the conductive interconnect can be solder and the second metal particle can be copper.

The method can include electrically connecting the first metal pillar and the second metal particle by depositing a non-solidified material into the second aperture, then inserting the first metal pillar into the non-solidified material in the second aperture, and then hardening the non-solidified material to form a conductive interconnect that contacts and electrically connects the first metal pillar and the second metal particle within the second encapsulant. For instance, the non-solidified material can be solder paste, the conductive interconnect can be solder and the second metal particle can be copper.

An advantage of the present invention is that the three-dimensional package can be manufactured conveniently and cost effectively. Another advantage is that the package can contain ultra-thin, first-level, single-chip assemblies in an integrated module, and can be directly mounted on a printed circuit board. Another advantage is that the package can accommodate chips with varying sizes and thickness while maintaining reliable pillar connections. Another advantage is that the package is well-suited for testing, disassembly and reworking. Another advantage is that the metal particles can be pre-made rather than deposited on the routing lines by electroplating or electroless plating which improves uniformity and reduces manufacturing time and cost. Another advantage is that the connection joints can be made from a wide variety of materials and processes, thereby making advantageous use of mature connection joint technologies in a unique and improved manufacturing approach. Another advantage is that the assemblies need not include wire bonds or TAB leads, although the process is flexible enough to accommodate these techniques if desired. Another advantage is that the package can be manufactured using low temperature processes which reduces stress and improves reliability. A further advantage is that the package can be manufactured using well-controlled processes which can be easily implemented by circuit board, lead frame and tape manufacturers. Still another advantage is that the package can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–26A are cross-sectional views showing a method of making a semiconductor chip assembly in accordance with a first embodiment of the present invention;

FIGS. 1B–26B are top plan views corresponding to FIGS. 1A–26A, respectively;

FIGS. 1C–26C are bottom plan views corresponding to FIGS. 1A–26A, respectively;

FIGS. 57A–58A are cross-sectional views showing a method of making a three-dimensional stacked semiconductor package in accordance with a thirty-second embodiment of the present invention;

FIGS. 57B–58B are top plan views corresponding to FIGS. 57A–58A, respectively;

FIGS. 57C–58C are bottom plan views corresponding to FIGS. 57A–58A, respectively;

FIGS. 59A–61A are cross-sectional views showing a method of making a three-dimensional stacked semiconductor package in accordance with a thirty-third embodiment of the present invention;

FIGS. 59B–61B are top plan views corresponding to FIGS. 59A–61A, respectively;

FIGS. 59C–61C are bottom plan views corresponding to FIGS. 59A–61A, respectively;

FIGS. 62A–64A are cross-sectional views showing a method of making a three-dimensional stacked semiconductor package in accordance with a thirty-fourth embodiment of the present invention;

FIGS. 62B–64B are top plan views corresponding to FIGS. 62A–64A, respectively;

FIGS. 62C–64C are bottom plan views corresponding to FIGS. 62A–64A, respectively.

DETAILED DESCRIPTION OF THE PREFERRED EMBODIMENTS

FIGS. 1A–26A, 1B–26B and 1C–26C are cross-sectional, top and bottom views, respectively, of a method of making a semiconductor chip assembly in accordance with a first embodiment of the present invention.

Figure 1A:
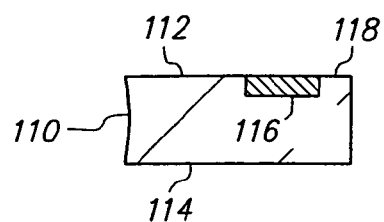
Figure 1B:
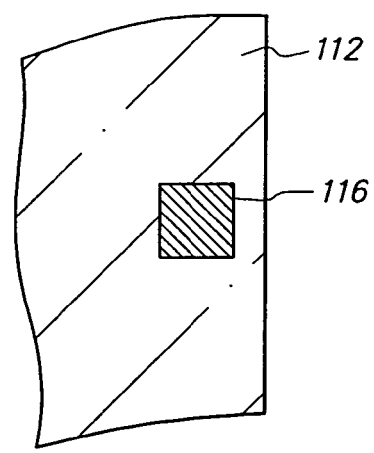
Figure 1C:
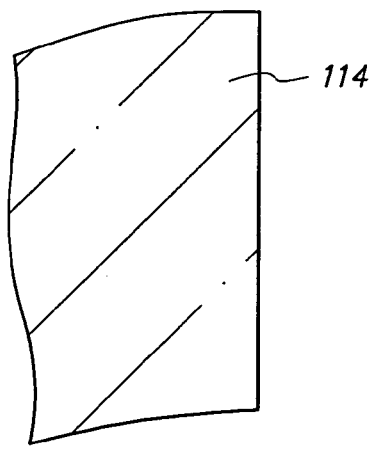

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, a connection joint is formed with electroplated copper. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
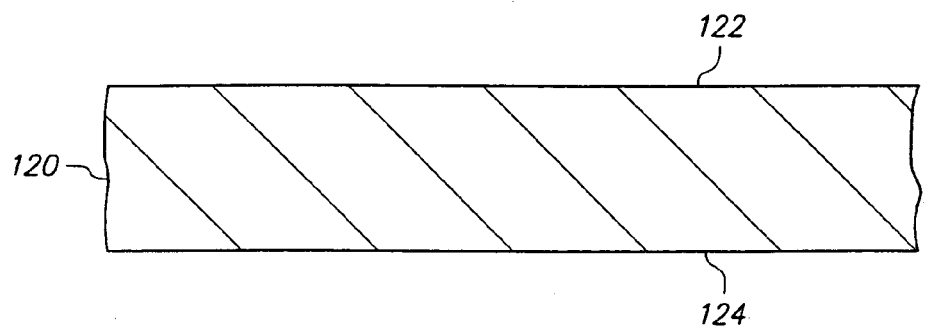
Figure 2B:
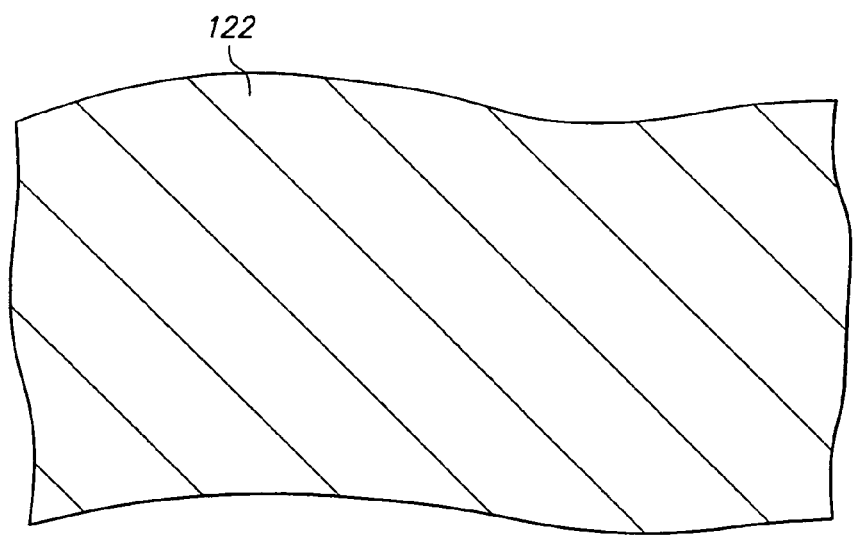
Figure 2C:
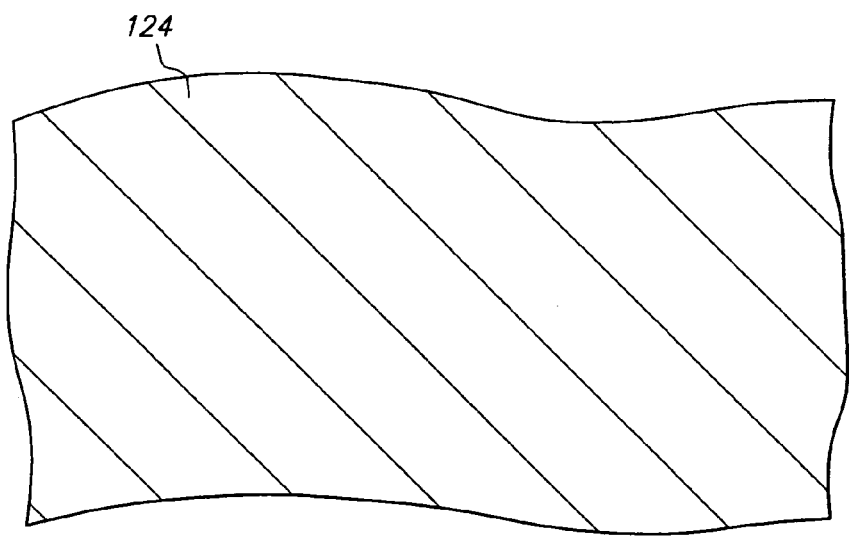

FIGS. 2A, 2B and 2C are cross-sectional, top and bottom views, respectively, of metal base 120 which includes opposing major surfaces 122 and 124. Metal base 120 is a copper plate with a thickness of 200 microns.

Figure 3A:
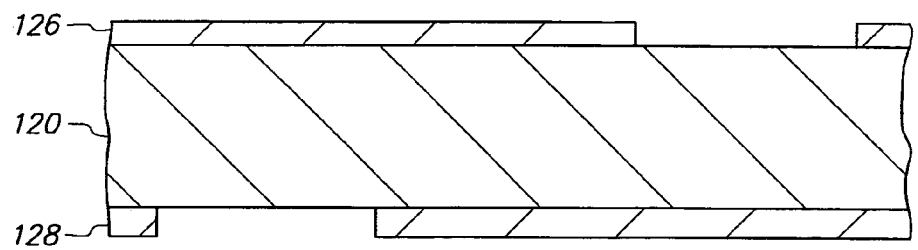
Figure 3B:
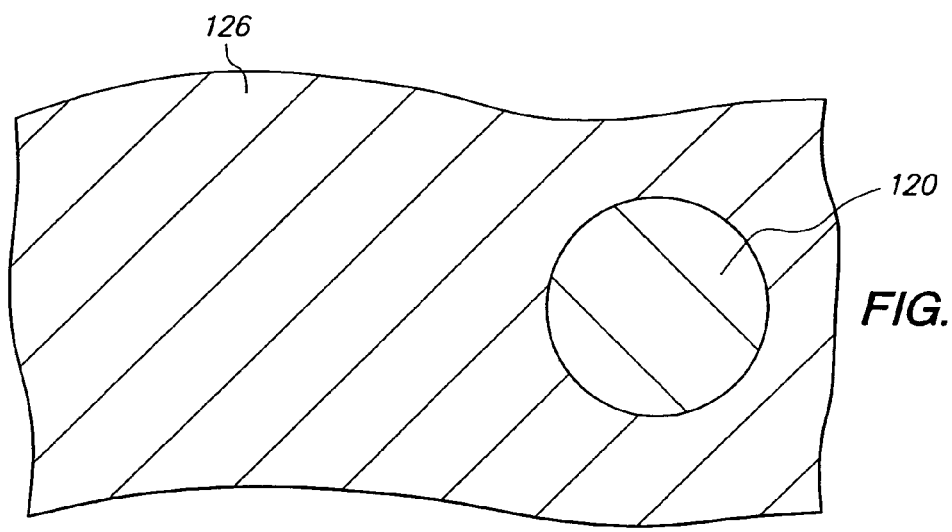
Figure 3C:
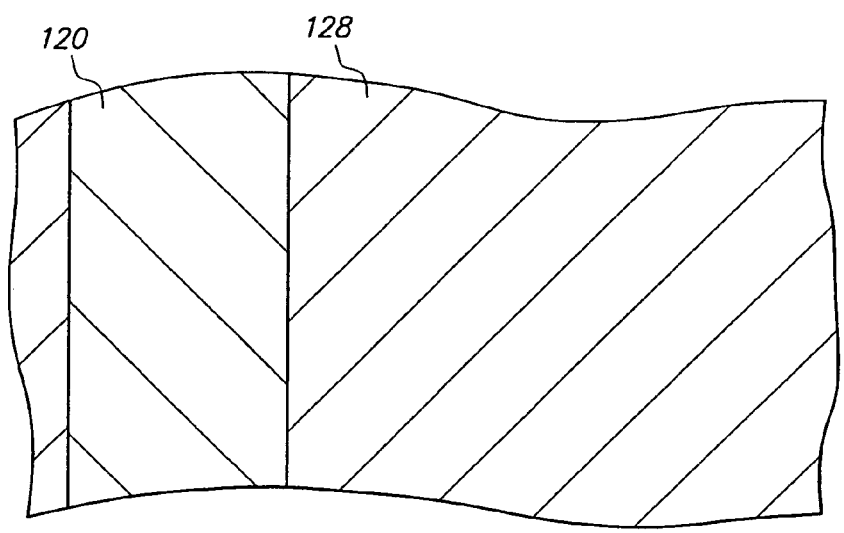

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. Reticles (not shown) are positioned proximate to photoresist layers 126 and 128. Thereafter, photoresist layers 126 and 128 are simultaneously patterned by selectively applying light through the reticles, applying a developer solution to remove the photoresist portions rendered soluble by the light, and then hard baking, as is conventional. As a result, photoresist layer 126 contains an opening that selectively exposes surface 122 of metal base 120, and photoresist layer 128 contains an opening that selectively exposes surface 124 of metal base 120. Photoresist layers 126 and 128 have a thickness of 25 microns beyond surfaces 122 and 124, respectively.

Figure 4A:
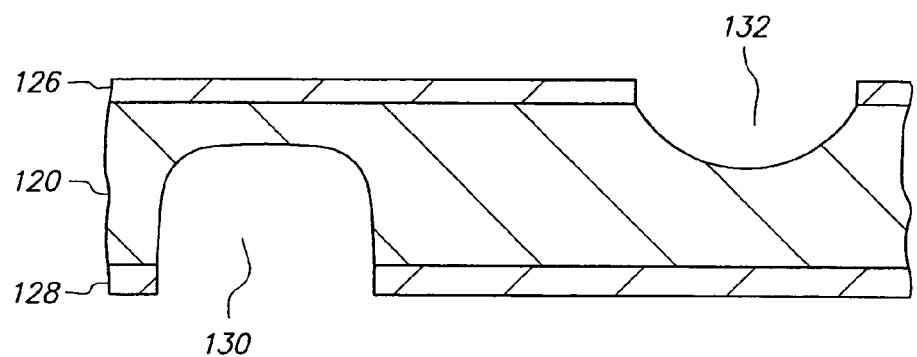
Figure 4B:
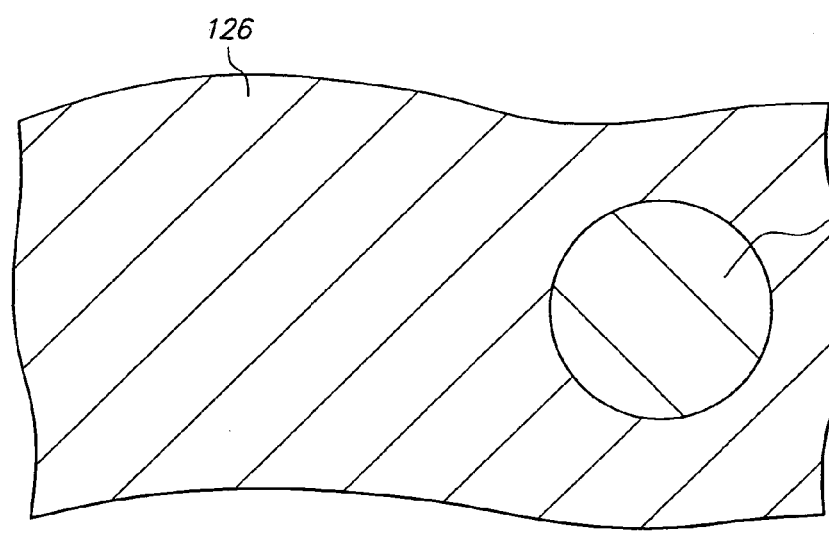
Figure 4C:
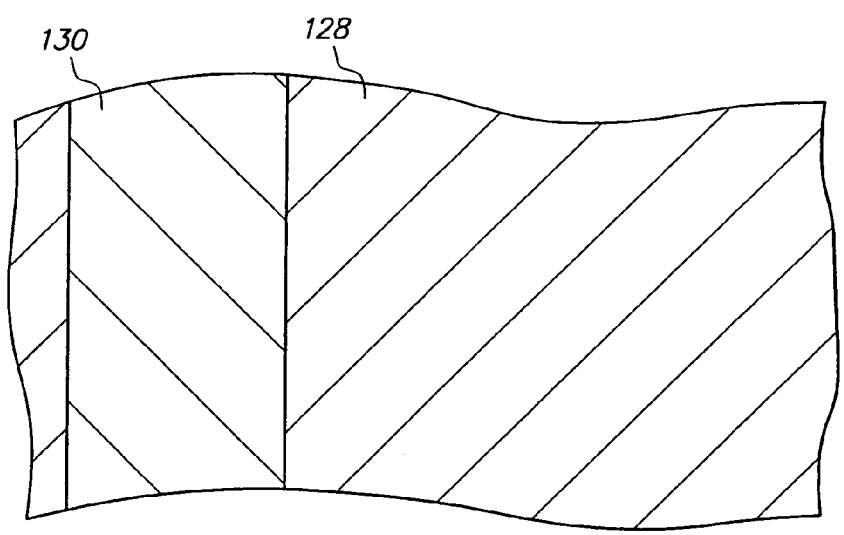

FIGS. 4A, 4B and 4C are cross-sectional, top and bottom views, respectively, of recess 130 and slot 132 formed in metal base 120.

Recess 130 is formed by applying a "front-side" wet chemical etch to the exposed portion of surface 122 using photoresist layer 126 as an etch mask and extends from surface 122 into but not through metal base 120, and slot 132 is formed by applying a "back-side" wet chemical etch to the exposed portion of surface 124 using photoresist layer 128 as an etch mask and extends from surface 124 into but not through metal base 120.

In this instance, surfaces 122 and 124 are exposed to a first wet chemical etch, and then surface 124 is exposed to a second wet chemical etch. In particular, top and bottom spray nozzles (not shown) simultaneously spray a first wet chemical etch on metal base 120 using photoresist layers 126 and 128 as etch masks. Thus, the first wet chemical etch provides front-side and back-side etches. The first wet chemical etch is highly selective of copper and etches 100 microns into metal base 120, thereby completely forming recess 130 and partially forming slot 132. At this stage, recess 130 and slot 132 each have a depth of 100 microns. Thereafter, the bottom spray nozzle sprays a second wet chemical etch on metal base 120 using photoresist layer 128 as an etch mask while the top spray nozzle is deactivated. Thus, the second wet chemical etch provides another back-side etch but does not provide a front-side etch. The second wet chemical etch is highly selective of copper and etches another 50 microns into metal base 120, thereby completely forming slot 132. At this stage, recess 130 has a depth of 100 microns, and slot 132 has a depth of 150 microns.

Recess 130 has a diameter of 300 microns at surface 122, and slot 132 has a width (orthogonal to its elongated length) of 1000 microns at surface 124. For convenience of illustration, slot 132 is shown with reduced lateral scale relative to the other features.

A suitable wet chemical etch for the first and second wet chemical etches can be provided by a solution containing alkaline ammonia. The optimal etch time for exposing metal base 120 to the first and second wet chemical etches in order to form recess 130 and slot 132 with the desired dimensions can be established through trial and error.

Figure 5A:
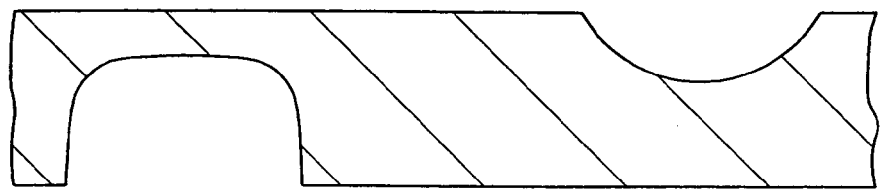
Figure 5B:
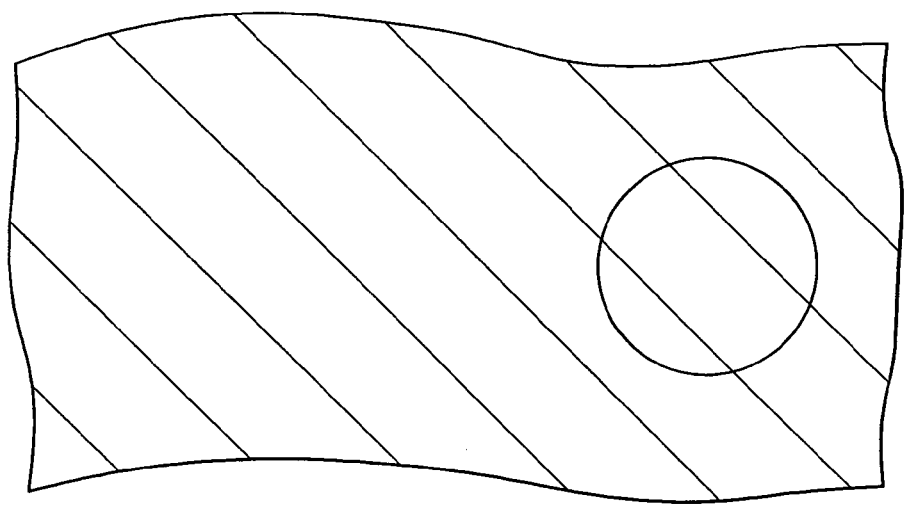
Figure 5C:
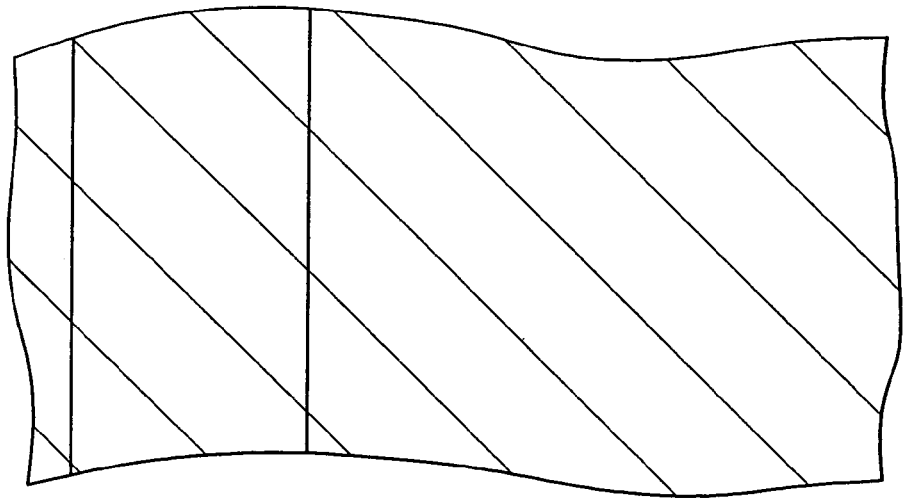

FIGS. 5A, 5B and 5C are cross-sectional, top and bottom views, respectively, of metal base 120 after photoresist layers 126 and 128 are stripped. Photoresist layers 126 and 128 are removed using a solvent, such as a mild alkaline solution with a pH of 9, that is highly selective of photoresist with respect to copper. Therefore, no appreciable amount of metal base 120 is removed.

Figure 6A:
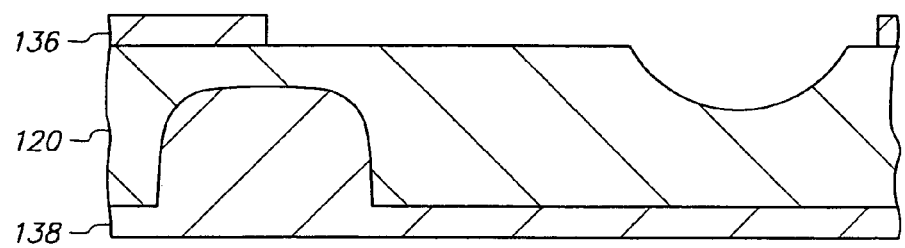
Figure 6B:
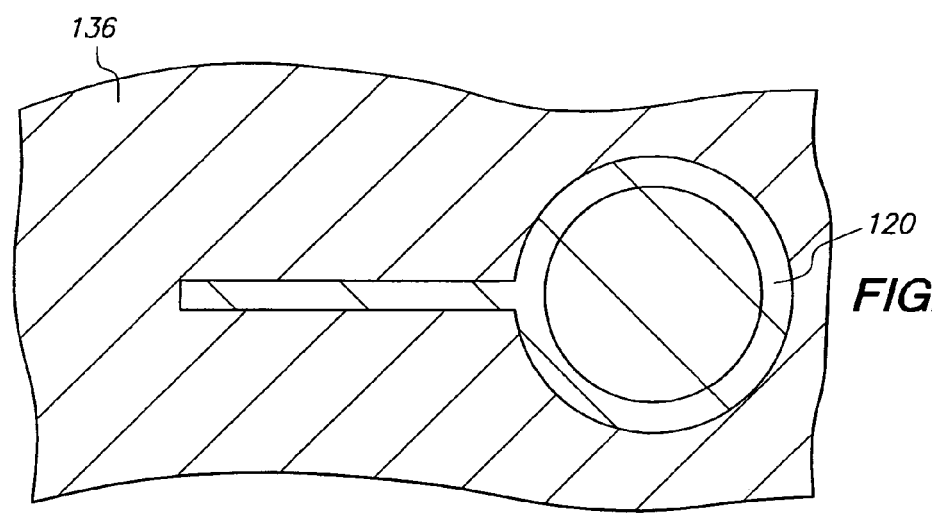
Figure 6C:
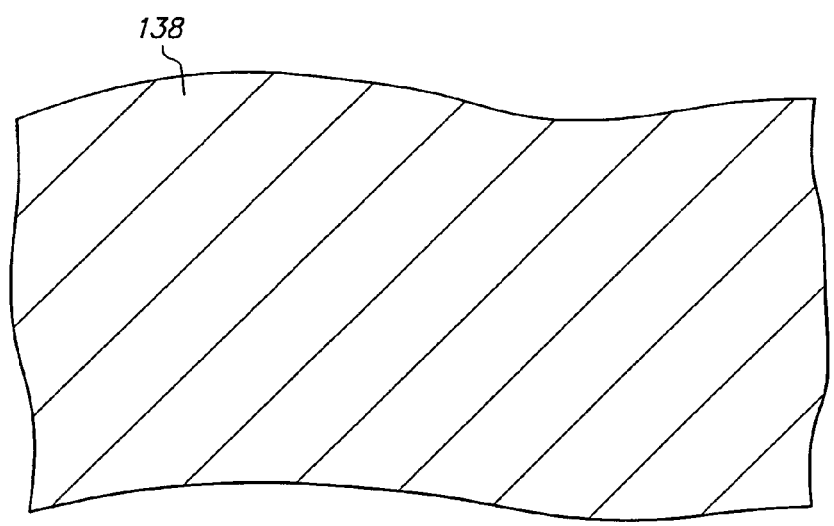

FIGS. 6A, 6B and 6C are cross-sectional, top and bottom views, respectively, of photoresist layers 136 and 138 formed on metal base 120. Photoresist layers 136 and 138 are deposited in liquid form using roller coating onto surfaces 122 and 124, respectively. A reticle (not shown) is positioned proximate to photoresist layer 136. Thereafter, photoresist layer 136 is patterned by selectively applying light through the reticle, applying a developer solution to remove the photoresist portion rendered soluble by the light, and then hard baking, as is conventional. As a result, photoresist layer 136 contains an opening that selectively exposes metal base 120, and photoresist layer 138 remains unpatterned. Photoresist layers 136 and 138 each have a thickness of 50 microns beyond surfaces 122 and 124, respectively.

Figure 7A:
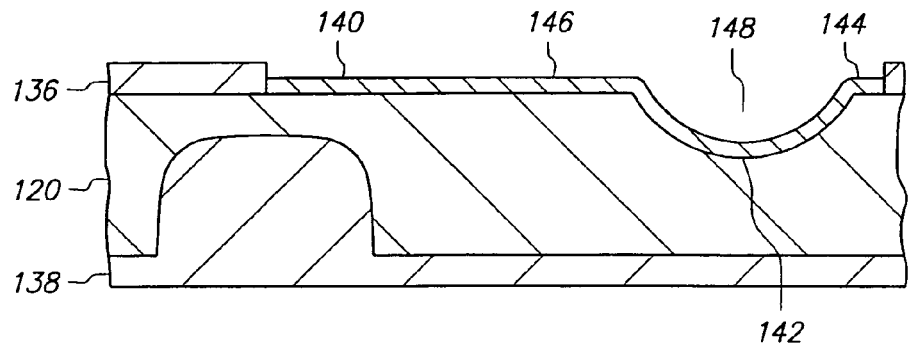
Figure 7B:
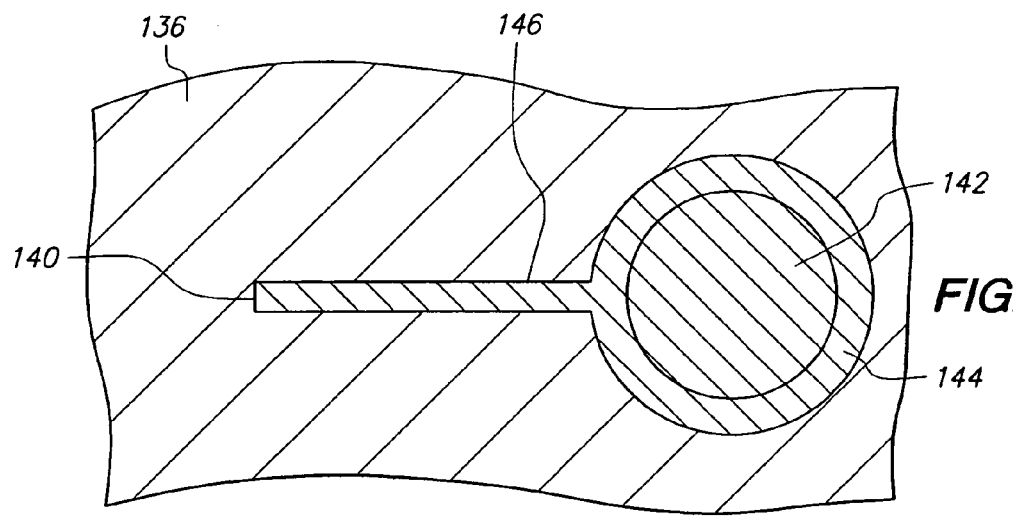
Figure 7C:
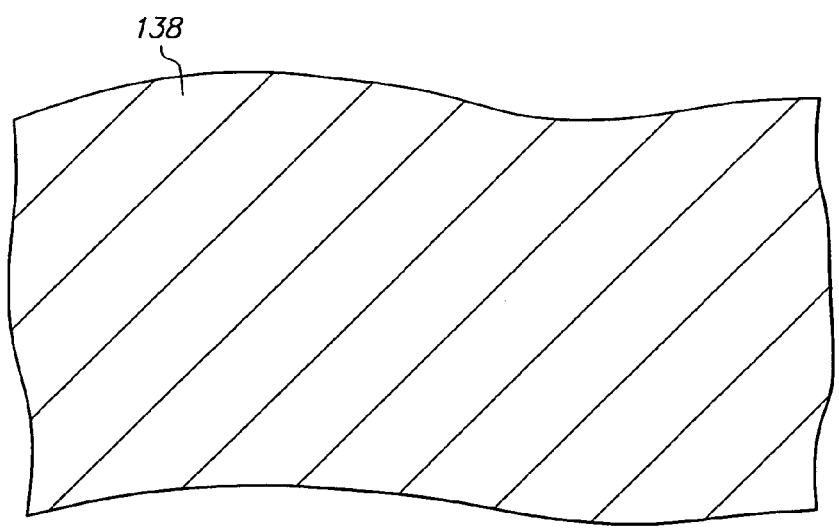

FIGS. 7A, 7B and 7C are cross-sectional, top and bottom views, respectively, of routing line 140 formed on metal base 120.

Routing line 140 includes bumped terminal 142, enlarged annular portion 144 and elongated routing portion 146. Bumped terminal 142 is formed in recess 130, enlarged annular portion 144 is formed outside recess 130 and is adjacent to and surrounds bumped terminal 142, and elongated routing portion 146 is formed outside recess 130, is adjacent to enlarged annular portion 144 and is spaced and separated from bumped terminal 142. Bumped terminal 142 extends below enlarged annular portion 144 and elongated routing portion 146, and enlarged annular portion 144 and elongated routing portion 146 are coplanar with one another. Bumped terminal 142 includes or defines cavity 148 that extends into and faces away from recess 130 and is exposed.

Routing line 140 is composed of a first nickel layer electroplated on metal base 120, a copper layer electroplated on the first nickel layer, a second nickel layer electroplated on the copper layer, and a gold layer electroplated on the second nickel layer. The first nickel layer contacts and is sandwiched between metal base 120 and the copper layer, the copper layer contacts and is sandwiched between the first and second nickel layers, the second nickel layer contacts and is sandwiched between the copper layer and the gold layer, and the gold layer contacts the second nickel layer. Thus, the copper layer, second nickel layer and gold layer are spaced and separated from metal base 120, the second nickel layer and gold layer are spaced and separated from the first nickel layer, the gold layer is exposed, and the copper layer and first and second nickel layers are buried beneath the gold layer. For convenience of illustration, the copper layer, gold layer and first and second nickel layers are shown as a single layer.

Routing line 140 is formed by an electroplating operation using photoresist layers 136 and 138 as plating masks. Thus, routing line 140 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The first nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The second nickel electroplating operation continues until the second nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the second nickel layer. The gold electroplating operation continues until the gold layer has the desired thickness. Thereafter, the structure is removed from the electrolytic gold plating solution and rinsed in distilled water to remove contaminants.

Routing line 140 has a thickness of 26.5 microns. In particular, the first and second nickel layers each have a thickness of 3 microns, the copper layer has a thickness of 20 microns, and the gold layer has a thickness of 0.5 microns. Bumped terminal 142 is a curved hollow dome with a downwardly extending height of 100 microns and a diameter of 300 microns, enlarged annular portion 144 is a ring with an inner diameter of 300 microns, an outer diameter of 500 microns and a width of 100 microns ((500−300)/2), and elongated routing portion 146 is a flat planar lead with a width (orthogonal to its elongated length) of 50 microns.

Figure 8A:
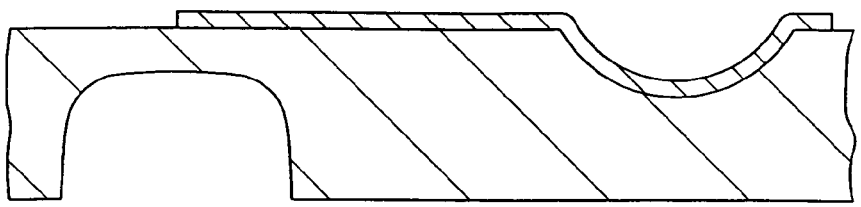
Figure 8B:
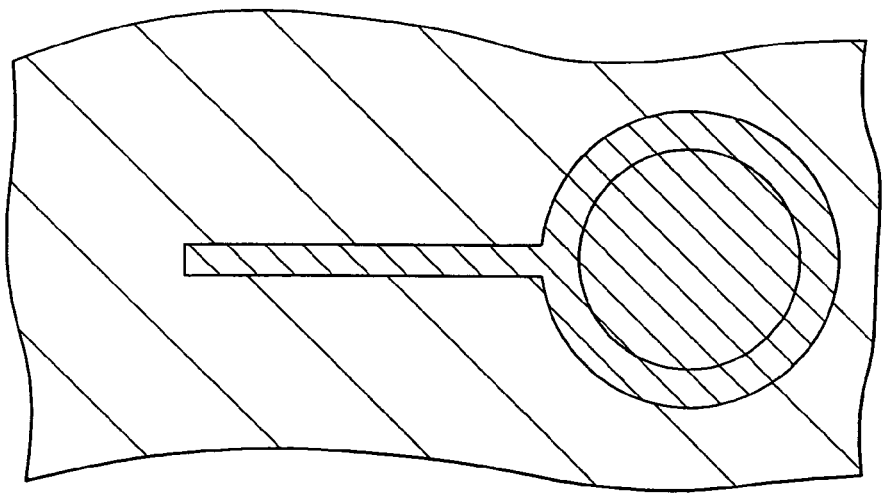
Figure 8C:
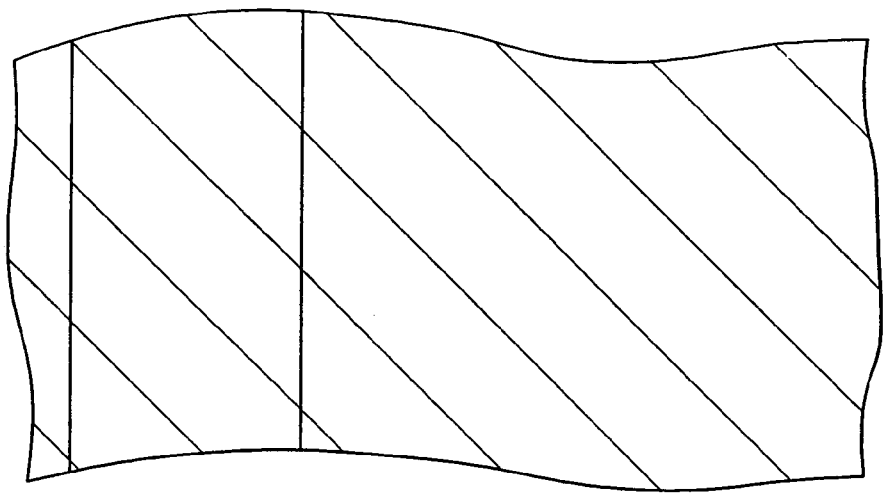

FIGS. 8A, 8B and 8C are cross-sectional, top and bottom views, respectively, of metal base 120 and routing line 140 after photoresist layers 136 and 138 are stripped.

Photoresist layers 136 and 138 are removed using a solvent, such as a mild alkaline solution with a pH of 9, that is highly selective of photoresist with respect to copper, nickel and gold. Therefore, no appreciable amount of metal base 120 or routing line 140 is removed.

Figure 9A:
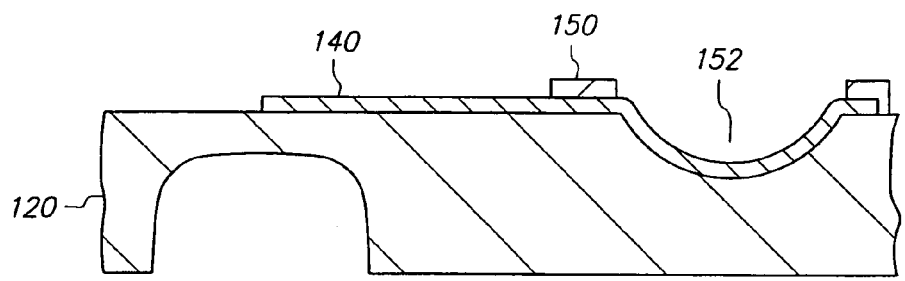
Figure 9B:
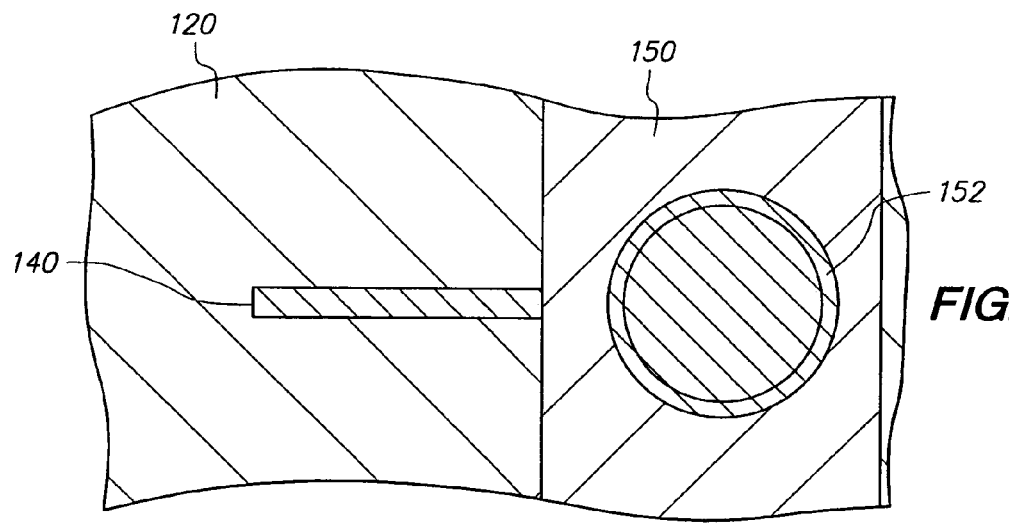
Figure 9C:
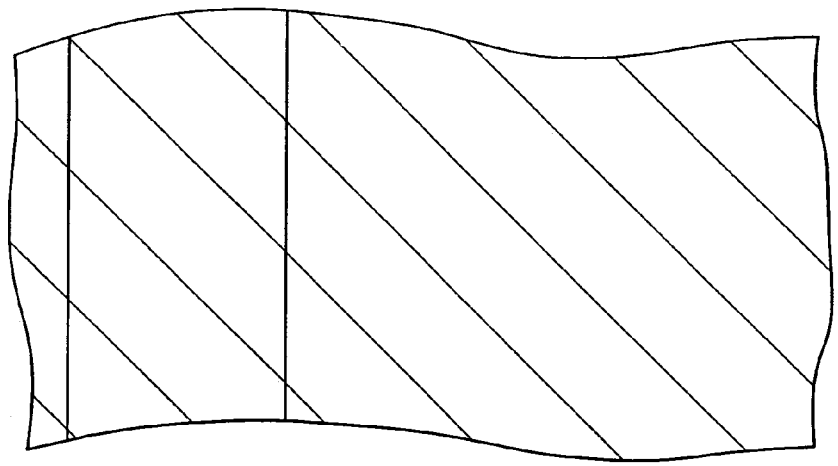

FIGS. 9A, 9B and 9C are cross-sectional, top and bottom views, respectively, of solder mask 150 formed on metal base 120 and routing line 140.

Solder mask 150 is initially a photoimageable liquid resin that is dispensed on metal base 120 and routing line 140. Thereafter, solder mask 150 is patterned by selectively applying light through a reticle (not shown), applying a developer solution to remove the solder mask portions rendered soluble by the light, and then hard baking, as is conventional. As a result, solder mask 150 contains opening 152 with a diameter of 400 microns that is vertically aligned with and exposes bumped terminal 142 and enlarged annular portion 144. Bumped terminal 142 and recess 148 are concentrically disposed within and exposed by opening 152, an inner annular region of enlarged annular portion 144 that extends between the middle and inner diameters of enlarged annular portion 144 and has a width of 50 microns ((400−300)/2) is exposed by opening 152, and an outer annular region of enlarged annular portion 144 that extends between the outer and middle diameters of enlarged annular portion 144 and has a width of 50 microns ((500–400)/2) is covered by solder mask 150. In addition, solder mask 150 extends 30 microns upwardly beyond routing line 140.

Figure 10A:
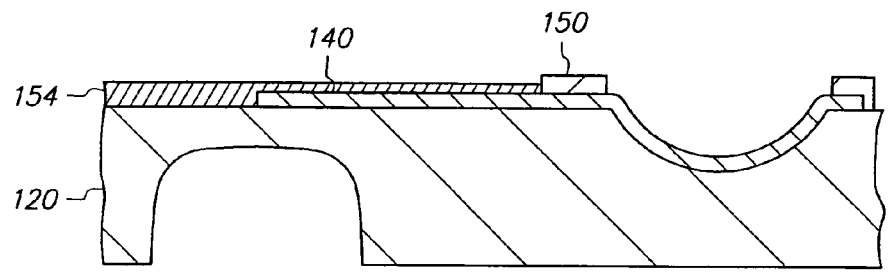
Figure 10B:
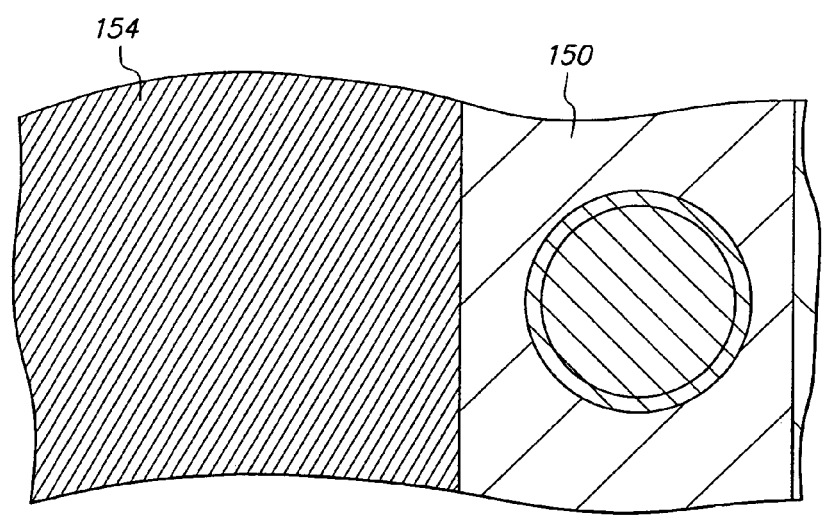
Figure 10C:
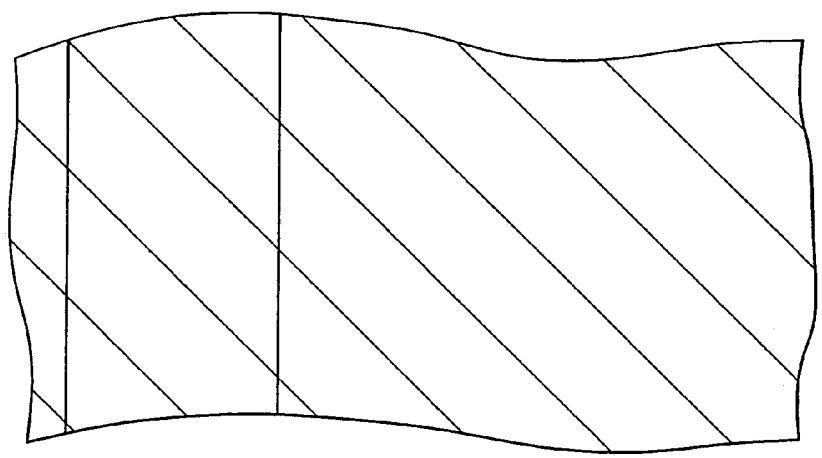

FIGS. 10A, 10B and 10C are cross-sectional, top and bottom views, respectively, of adhesive 154 formed on metal base 120 and routing line 140.

Adhesive 154 may include an organic surface protectant such as HK 2000 which is promptly applied to the structure after photoresist layer 136 is removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over metal base 120 and routing line 140 using stencil printing. During stencil printing, a stencil (not shown) is placed over metal base 120, routing line 140 and solder mask 150, a stencil opening is aligned with metal base 120 and routing line 140 and offset from solder mask 150, and then a squeegee (not shown) pushes the liquid resin along the surface of the stencil opposite metal base 120, routing line 140 and solder mask 150, through the stencil opening and onto metal base 120 and routing line 140 but not solder mask 150. The liquid resin is compliant enough at room temperature to conform to virtually any shape. Therefore, the liquid resin flows over and covers portions of metal base 120 and routing line 140 and flows laterally towards and contacts solder mask 150. However, solder mask 150 provides a dam that prevents the liquid resin from contacting bumped terminal 142 or entering cavity 148 or opening 152.

Figure 11A:
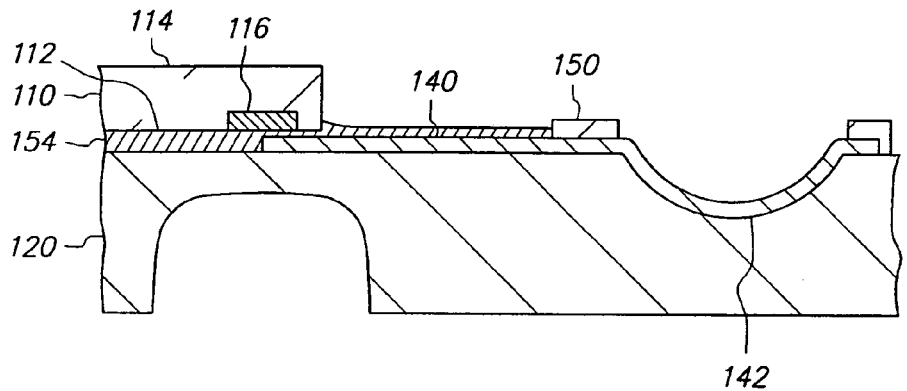
Figure 11B:
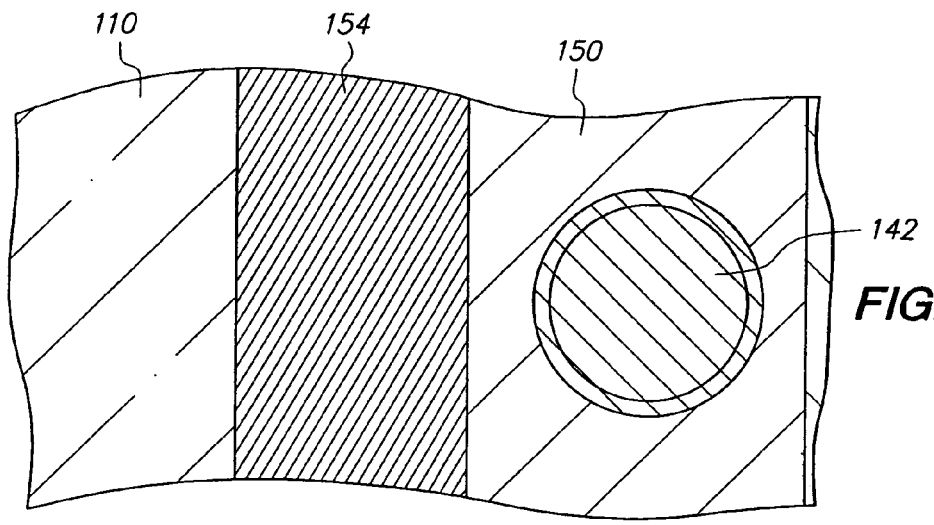
Figure 11C:
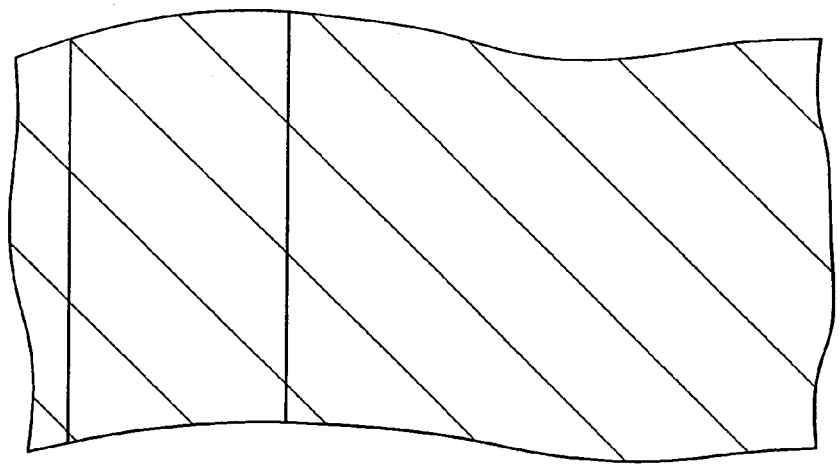

FIGS. 11A, 11B and 11C are cross-sectional, top and bottom views, respectively, of chip 110 mechanically attached to metal base 120 and routing line 140 by adhesive 154.

Adhesive 154 extends between and contacts chip 110 and metal base 120, and likewise, adhesive 154 extends between and contacts chip 110 and routing line 140. Surface 112 of chip 110 faces towards metal base 120 and routing line 140 and is covered by adhesive 154, and surface 114 of chip 110 faces away from metal base 120 and routing line 140 and is exposed. Chip 110 and metal base 120 do not contact one another, and chip 110 and routing line 140 do not contact one another.

Adhesive 154 is sandwiched between chip 110 and metal base 120 and between chip 110 and routing line 140 using relatively low pressure from a pick-up head that places chip 110 on adhesive 154, holds chip 110 against adhesive 154 for 5 seconds and then releases chip 110. The pick-up head is heated to a relatively low temperature such as 150° C., and adhesive 154 receives heat from the pick-up head transferred through chip 110. As a result, adhesive 154 proximate to chip 110 is partially polymerized (B stage) and forms a gel but is not fully cured, and adhesive 154 that is partially polymerized provides a loose mechanical bond between chip 110 and metal base 120 and between chip 110 and routing line 140.

Chip 110 and metal base 120 are positioned relative to one another so that chip 110 is disposed within the periphery of adhesive 154, pad 116 is disposed above and overlaps and is electrically isolated from routing line 140, and adhesive 154 contacts and is sandwiched between pad 116 and routing line 140. Chip 110 and metal base 120 can be aligned using an automated pattern recognition system.

Thereafter, the structure is placed in an oven and adhesive 154 is fully cured (C stage) at relatively low temperature in the range of 200 to 250° C. to form a solid adhesive insulative thermosetting polyimide layer that mechanically attaches chip 110 to metal base 120 and routing line 140. Adhesive 154 is 5 microns thick between pad 116 and routing line 140.

At this stage, routing line 140 extends within and outside the periphery of chip 110, extends downwardly beyond chip 110 and is unbent upwardly and downwardly, bumped terminal 142 is disposed outside the periphery of chip 110, adhesive 154 extends downwardly beyond chip 110, and metal base 120 covers and extends downwardly beyond chip 110, routing line 140, solder mask 150 and adhesive 154. In addition, surface 114 of chip 110 faces upwardly, and surface 112 of chip 110 faces downwardly.

Figure 11D:
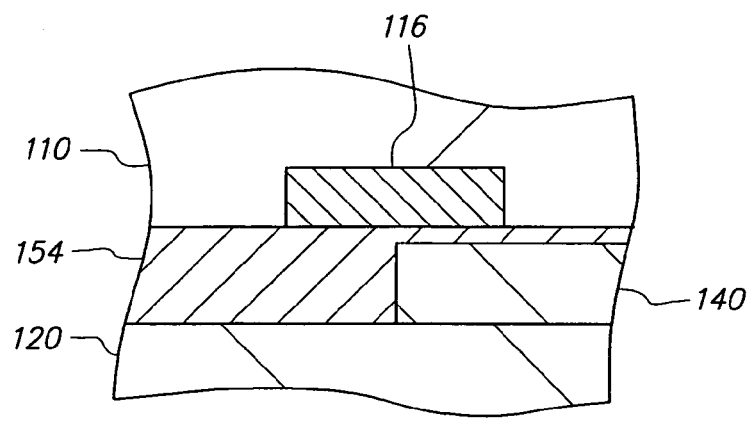
FIGS. 11D, 11E and 11F are enlarged cross-sectional, bottom and cross-sectional views, respectively, of the routing line and the pad in FIG. 11A.
Figure 11E:
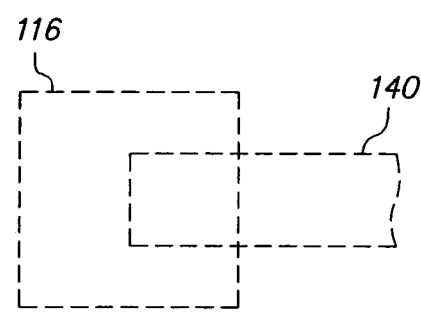
Figure 11F:
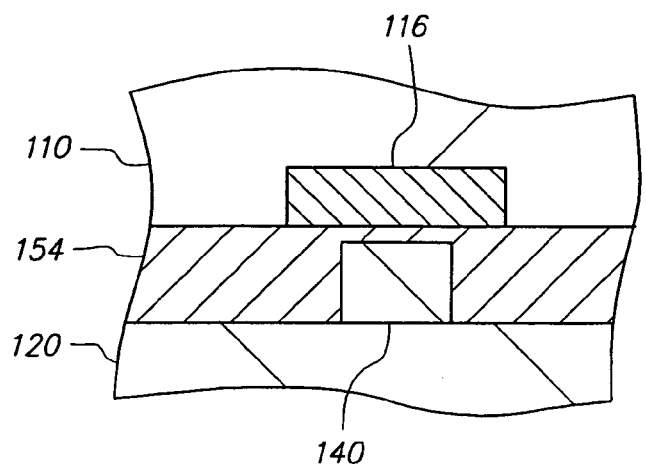

FIGS. 11D, 11E and 11F are enlarged cross-sectional, bottom and cross-sectional views, respectively, of pad 116 and routing line 140. FIG. 11F is oriented orthogonally with respect to FIG. 11D. As is seen, routing line 140 is proximate to pad 116 and a distal end of routing line 140 is within the periphery of pad 116. Routing line 140 extends across the center and one peripheral edge of pad 116 (but not the other three peripheral edges of pad 116), and peripheral sidewalls of routing line 140 extend within the periphery of pad 116. Since pad 116 and routing line 140 are not visible from the bottom view due to metal base 120, they are shown in phantom in FIG. 11E.

Figure 12A:
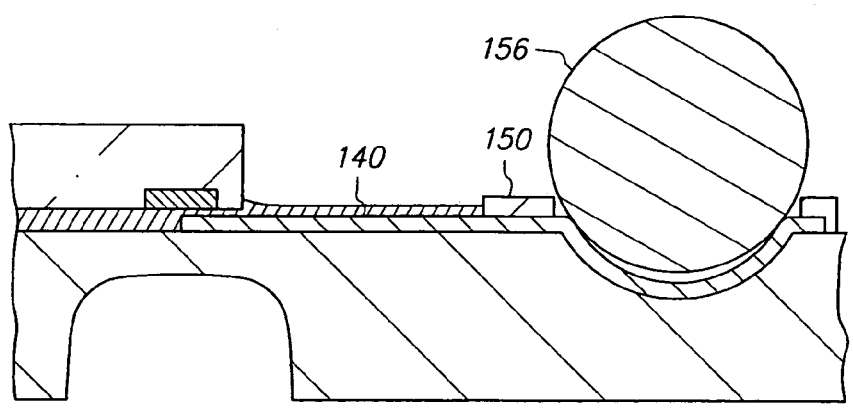
Figure 12B:
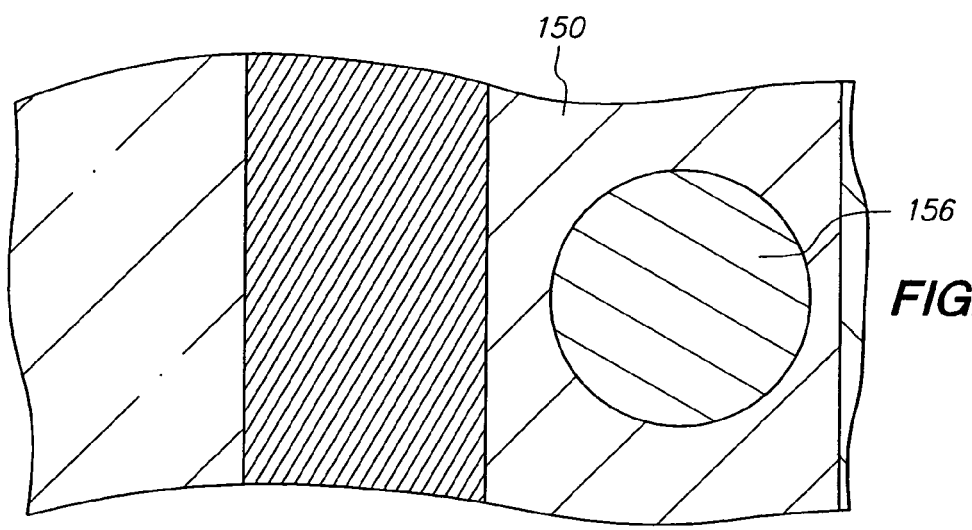
Figure 12C:
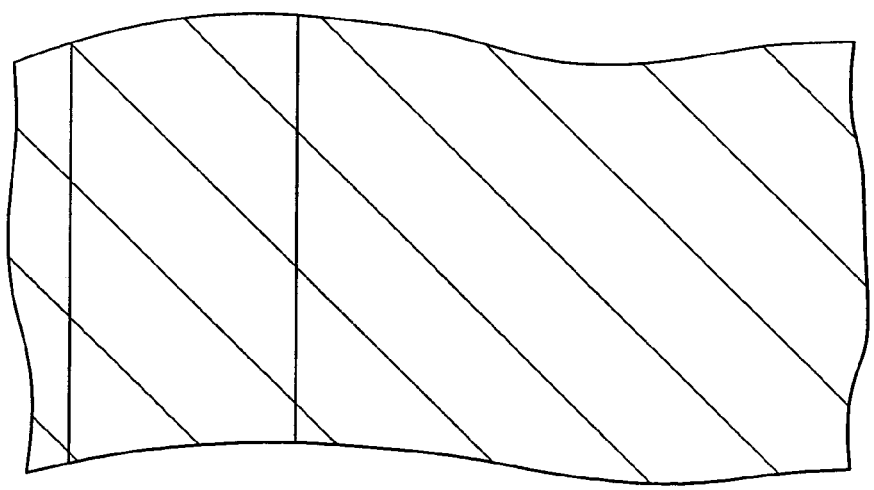

FIGS. 12A, 12B and 12C are cross-sectional, top and bottom views, respectively, of metal particle 156 mechanically attached to routing line 140. Metal particle 156 is initially a tin (96.5%)-silver (3.0%)-copper (0.5%) solder ball with a spherical shape and a diameter of 500 microns. Metal particle 156 is dipped in flux to provide metal particle 156 with a thin flux surface coating (not shown). Thereafter, metal particle 156 with the flux surface coating is removed from a ball boat and attached to a graphite fixture (not shown) by applying a vacuum through a drilled hole in the fixture that sucks metal particle 156 onto the drilled hole, then the fixture is inverted and positioned over solder mask 150 using a pick-up head such that metal particle 156 with the flux surface coating is disposed above and vertically aligned with opening 152, and then the vacuum is removed, thereby releasing metal particle 156 with the flux surface coating from the fixture, and the fixture is retracted.

Metal particle 156 with the flux surface coating is thus deposited on bumped terminal 142 and extends into cavity 148 and opening 152. Metal particle 156 weakly adheres to bumped terminal 142 in cavity 148 due to the flux surface coating.

Figure 13A:
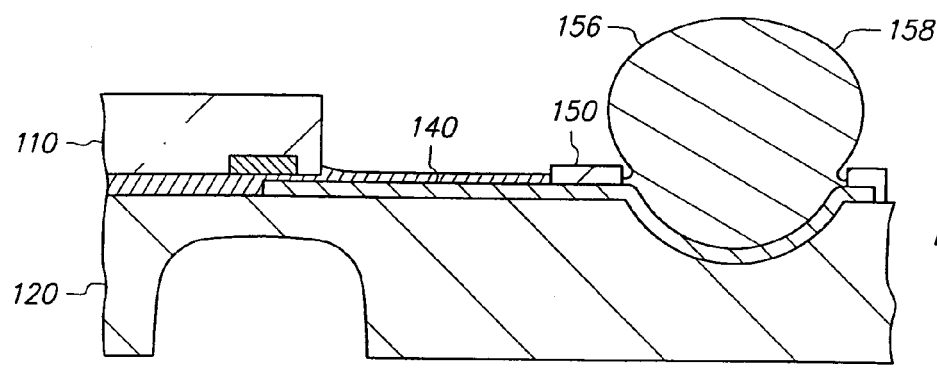
Figure 13B:
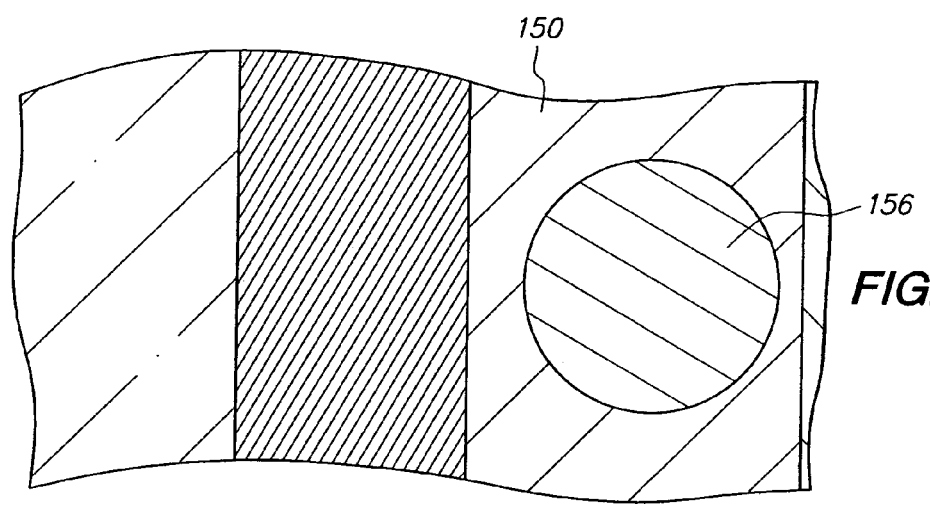
Figure 13C:
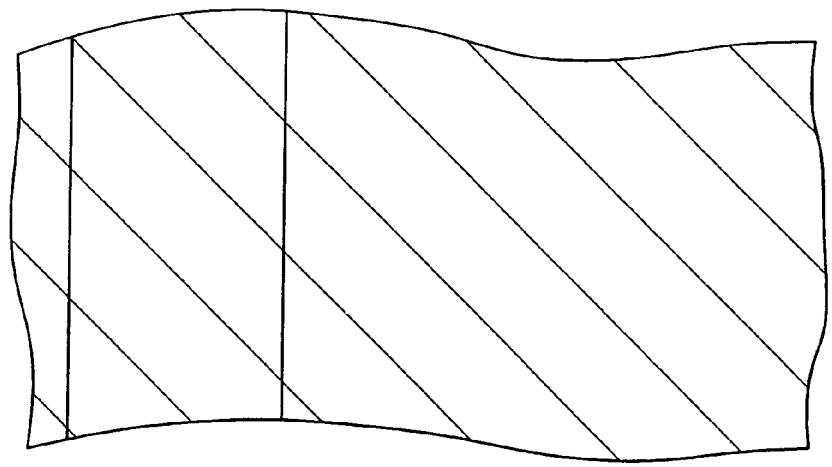

FIGS. 13A, 13B and 13C are cross-sectional, top and bottom views, respectively, of metal particle 156 electrically connected to routing line 140.

Heat is applied to reflow metal particle 156. Routing line 140 contains a gold surface layer that provides a wettable surface for solder reflow. As a result, metal particle 156 (composed of solder) wets and flows over routing line 140 (including bumped terminal 142 and enlarged annular portion 144) within opening 152 and fills any remaining space in cavity 148. However, solder mask 150 prevents metal particle 156 from wetting or flowing over routing line 140 (at enlarged annular portion 144 and elongated routing portion 146) outside opening 152. In addition, solder mask 150 prevents metal particle 156 from contacting metal base 120. The heat is then removed and metal particle 156 cools and solidifies into a hardened solder particle with a substantially spherical shape that contacts and is mechanically attached to and electrically connected to routing line 140. Metal particle 156 extends upwardly beyond chip 110 by 250 microns.

Conductive trace 158 includes routing line 140 and metal particle 156. Conductive trace 158 is adapted for providing horizontal and vertical routing between pad 116 and a next level assembly.

At this stage, routing line 140 extends laterally beyond metal particle 156 towards chip 110 and extends downwardly beyond metal particle 156, metal particle 156 is disposed outside the periphery of chip 110, extends across the thickness of chip 110 (between surfaces 112 and 114), extends upwardly and downwardly beyond chip 110 and extends upwardly beyond and overlaps routing line 140, and metal base 120 extends downwardly beyond metal particle 156.

Figure 14A:
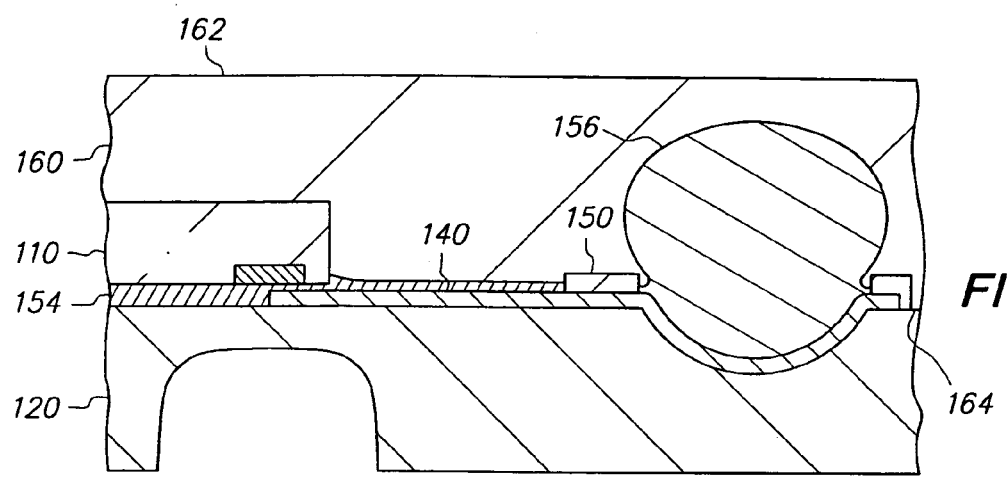
Figure 14B:
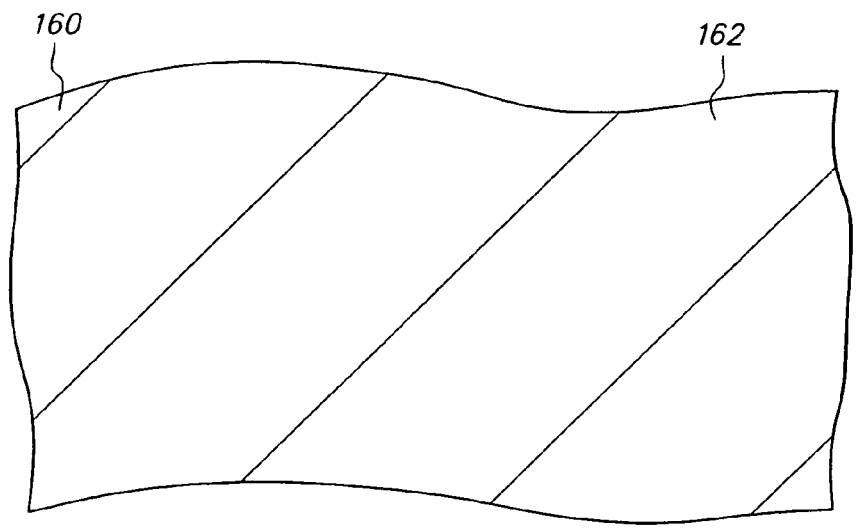
Figure 14C:
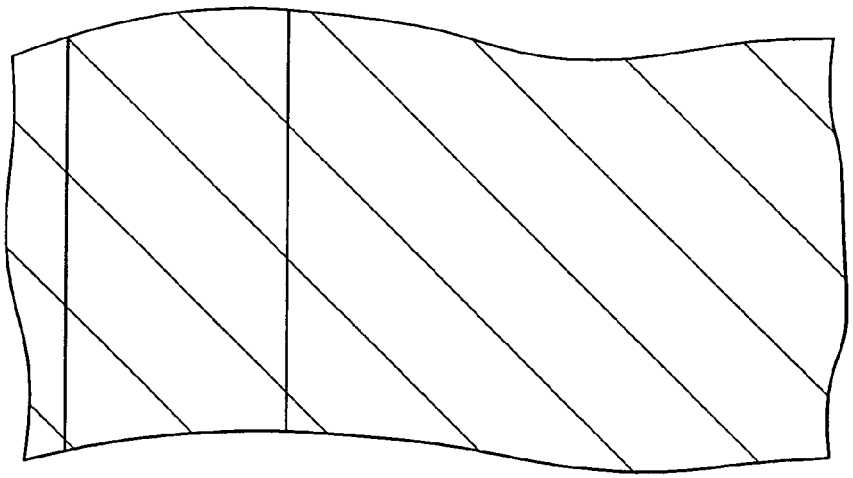

FIGS. 14A, 14B and 14C are cross-sectional, top and bottom views, respectively, of encapsulant 160 formed on chip 110, routing line 140, solder mask 150, adhesive 154 and metal particle 156.

Encapsulant 160 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from metal particle 156 by 100 microns. As a result, the molding compound contacts the exposed portions of the chip 110, metal base 120, solder mask 150, adhesive 154 and metal particle 156 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 160 contacts chip 110, metal base 120, solder mask 150, adhesive 154 and metal particle 156 and covers chip 110, metal base 120, routing line 140, solder mask 150, adhesive 154 and metal particle 156. More particularly, encapsulant 160 contacts surface 114 and the outer edges of chip 110, the exposed surfaces of metal particle 156, and the exposed upwardly facing surface portions of metal base 120, solder mask 150 and adhesive 154. However, encapsulant 160 is spaced from surface 112 of chip 110 (due to adhesive 154) and routing line 140 (due to solder mask 150, adhesive 154 and metal particle 156).

Encapsulant 160 is a solid adherent compressible protective layer that provides environmental protection such as moisture resistance and particle protection for chip 110 as well as mechanical support for conductive trace 158 outside the periphery of chip 110. Chip 110 and metal particle 156 are embedded in encapsulant 160.

Encapsulant 160 includes opposing surfaces 162 and 164. Surface 162 faces upwardly, and surface 164 faces downwardly. Encapsulant 160 extends upwardly beyond chip 110, metal base 120, routing line 140, solder mask 150, adhesive 154 and metal particle 156, has a thickness of 500 microns and extends 100 microns upwardly beyond metal particle 156.

Figure 15A:
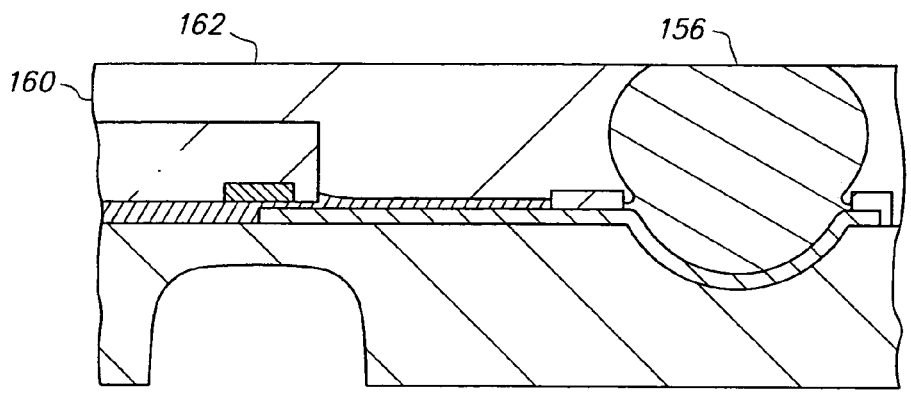
Figure 15B:
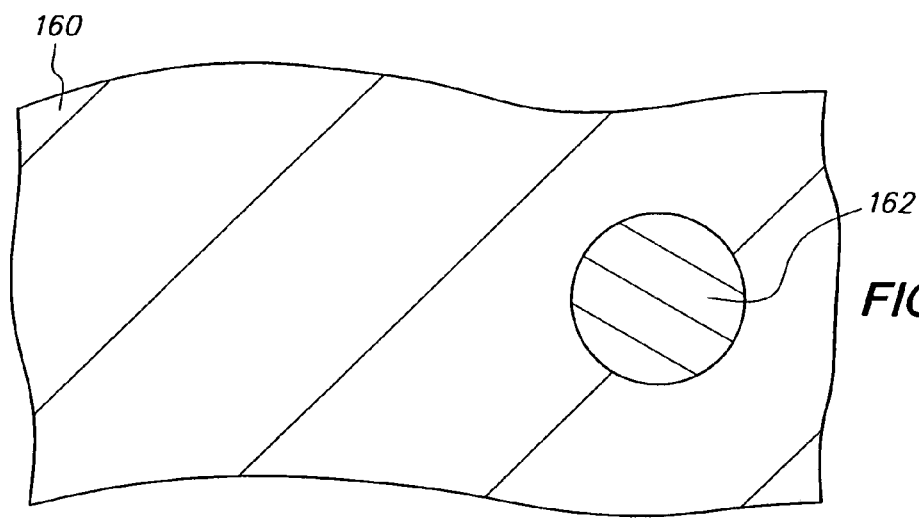
Figure 15C:
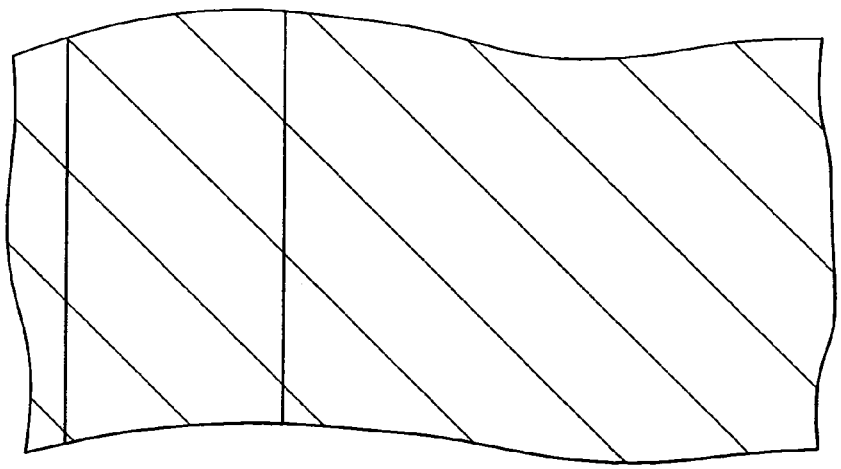

FIGS. 15A, 15B and 15C are cross-sectional, top and bottom views, respectively, of the structure after an upper portion of encapsulant 160 is removed.

The upper portion of encapsulant 160 is removed by grinding. In particular, a rotating diamond sand wheel and distilled water are applied to surface 162 of encapsulant 160. Initially, the diamond sand wheel grinds only encapsulant 160. As the grinding continues, encapsulant 160 becomes thinner as surface 162 migrates downwardly. Eventually the diamond sand wheel contacts metal particle 156, and as a result, begins to grind metal particle 156 as well. As the grinding continues, metal particle 156 and encapsulant 160 become thinner as their grinded surfaces migrate downwardly. The grinding continues until metal particle 156 and encapsulant 160 have the desired thickness, and then halts before it reaches chip 110, metal base 120, routing line 140, solder mask 150 or adhesive 154. Thereafter, the structure is rinsed in distilled water to remove contaminants.

Metal particle 156 and encapsulant 160 extend upwardly beyond chip 110 by 150 microns after the grinding operation. Thus, the grinding removes a 100 micron thick upper portion of metal particle 156 and a 200 micron thick upper portion of encapsulant 160.

At this stage, chip 110 and metal particle 156 remain embedded in encapsulant 160. Metal particle 156 and surface 162 of encapsulant 160 are laterally aligned with one another and exposed. Thus, an exposed planarized horizontal surface that faces upwardly includes metal particle 156 and encapsulant 160. Metal particle 156 and encapsulant 160 continue to extend upwardly beyond chip 110, metal base 120, routing line 140, solder mask 150 and adhesive 154, and encapsulant 160 continues to cover chip 110. Furthermore, metal particle 156 extends through surface 162 of encapsulant 160, and encapsulant 160 no longer covers metal particle 156. Stated differently, conductive trace 158 is exposed within the periphery of metal particle 156 in the upward direction, and neither encapsulant 160 nor any other insulative material of the assembly covers conductive trace 158 within the periphery of metal particle 156 in the upward direction.

Figure 16A:
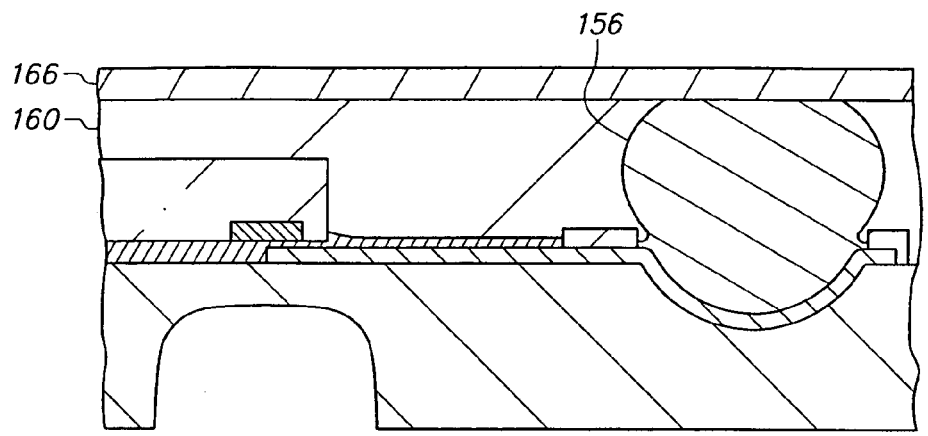
Figure 16B:
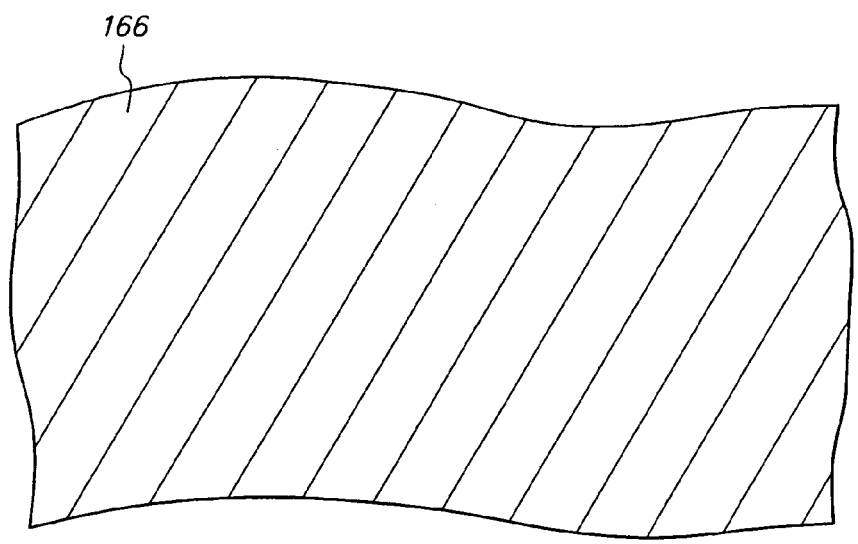
Figure 16C:
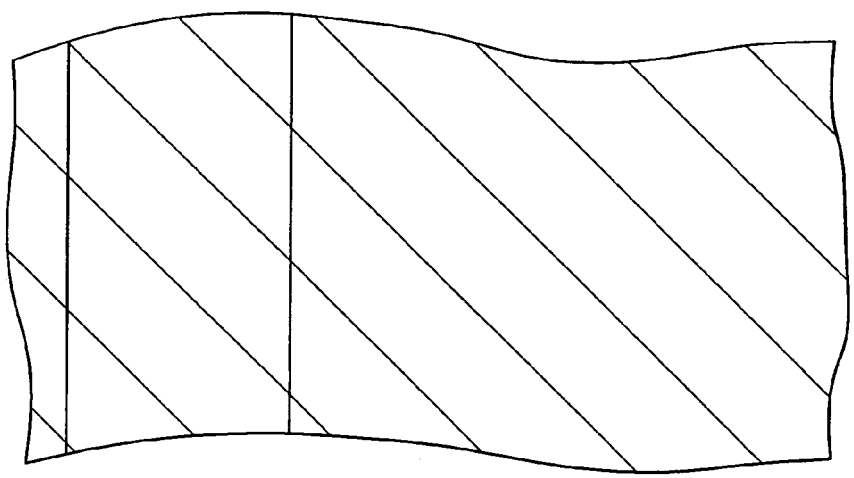

FIGS. 16A, 16B and 16C are cross-sectional, top and bottom views, respectively, of the protective mask 166 formed on the structure.

Protective mask 166 is taped on surface 162 of encapsulant 160, contacts metal particle 156 and encapsulant 160 and covers and extends upwardly beyond chip 110, metal base 120, routing line 140, solder mask 150, adhesive 154, metal particle 156 and encapsulant 160. Protective mask 166 weakly adheres to the structure since it is sticky. Protective mask 166 is composed of polyimide and has a thickness of 100 microns.

At this stage, metal particle 156 is no longer exposed, and therefore conductive trace 158 is no longer exposed, due to protective mask 166 that covers metal particle 156.

Figure 17A:
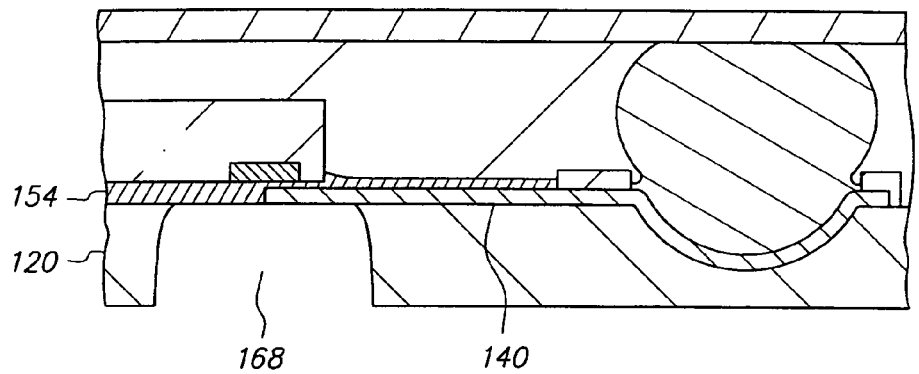
Figure 17B:
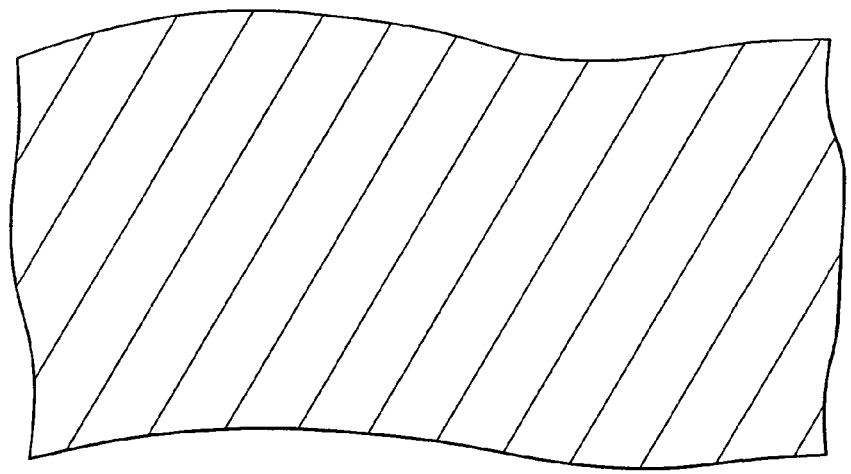
Figure 17C:
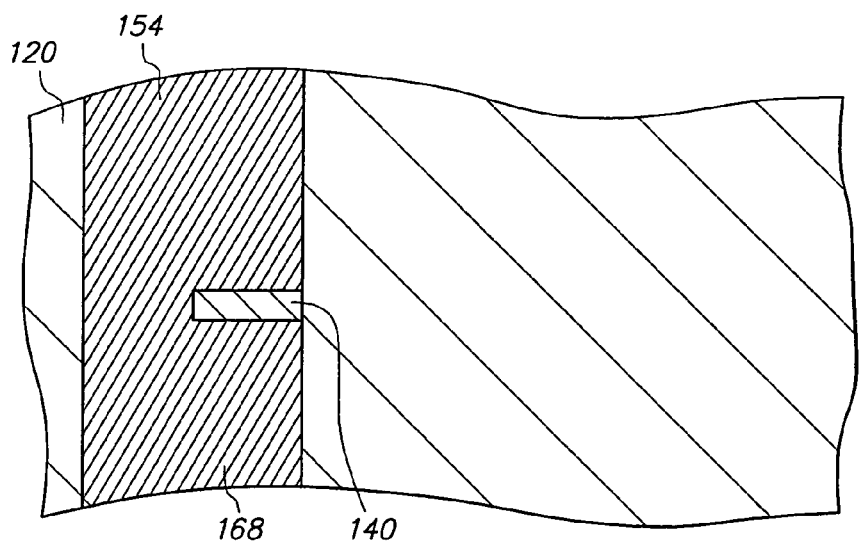

FIGS. 17A, 17B and 17C are cross-sectional, top and bottom views, respectively, of opening 168 that extends through metal base 120 and exposes routing line 140 and adhesive 154.

Opening 168 is formed by applying a blanket wet chemical etch to metal base 120. For instance, the bottom spray nozzle can spray another wet chemical etch on metal base 120 while the top spray nozzle is deactivated, or the structure can be dipped in the wet chemical etch since protective mask 166 covers metal particle 156. The wet chemical etch is highly selective of copper with respect to nickel and polyimide, and therefore, highly selective of metal base 120 with respect to the first nickel layer of routing line 140 and adhesive 154. Furthermore, the first nickel layer of routing line 140 and adhesive 154 protect the copper layer of routing line 140 from the wet chemical etch. Therefore, no appreciable amount of routing line 140 or adhesive 154 is removed.

The wet chemical etch etches 50 microns into metal base 120, thereby reducing the thickness of metal base 120 to 150 microns (200−50) and effecting a pattern transfer of slot 130 to form opening 168. That is, since slot 130 has a depth of 150 microns and is separated from routing line 140 and adhesive 154 by a 50 micron thick portion of metal base 120 before the wet chemical etch is applied, the wet chemical etch removes this 50 micron thick portion of metal base 120, thereby extending slot 130 through the remaining 50 microns of metal base 120 and converting slot 130 into opening 168 that extends through metal base 120 (between surfaces 122 and 124).

The wet chemical etch removes a portion of metal base 120 within the periphery of pad 116 that contacts routing line 140 without removing another portion of metal base 120 outside the periphery of chip 110 that contacts routing line 140, thereby reducing but not eliminating contact area between metal base 120 and routing line 140. Furthermore, the wet chemical etch does not expose routing line 140 outside opening 168. For instance, metal base 120 continues to contact and cover bumped terminal 142.

A suitable wet chemical etch can be provided by the same solution used for etching metal base 120 to form slot 130 and recess 132. The optimal etch time for exposing metal base 120 to the wet chemical etch in order to form opening 168 with the desired dimensions can be established through trial and error.

Figure 18A:
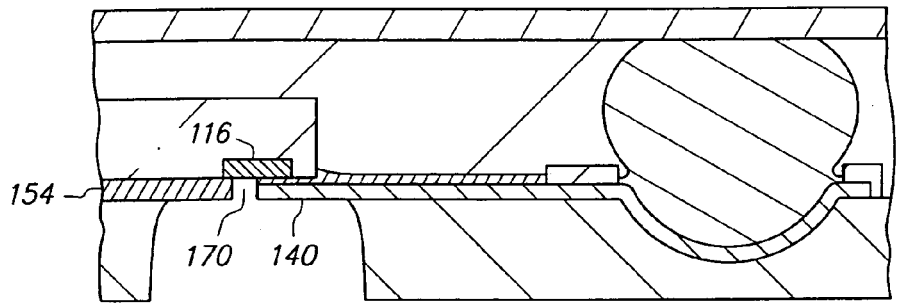
Figure 18B:
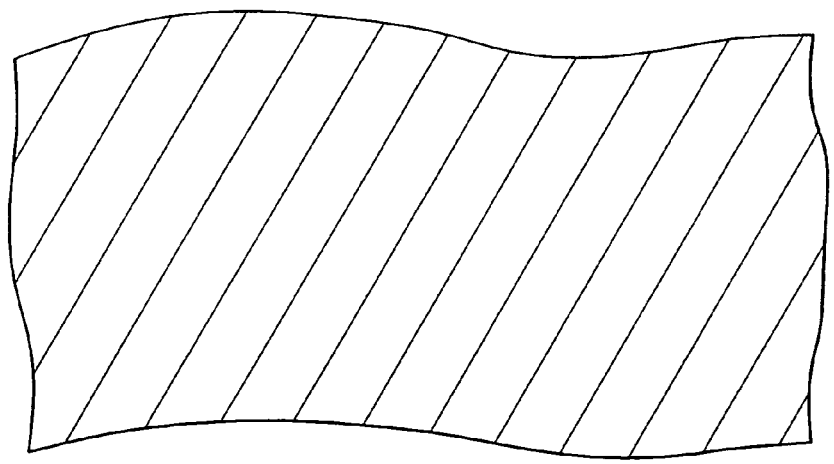
Figure 18C:
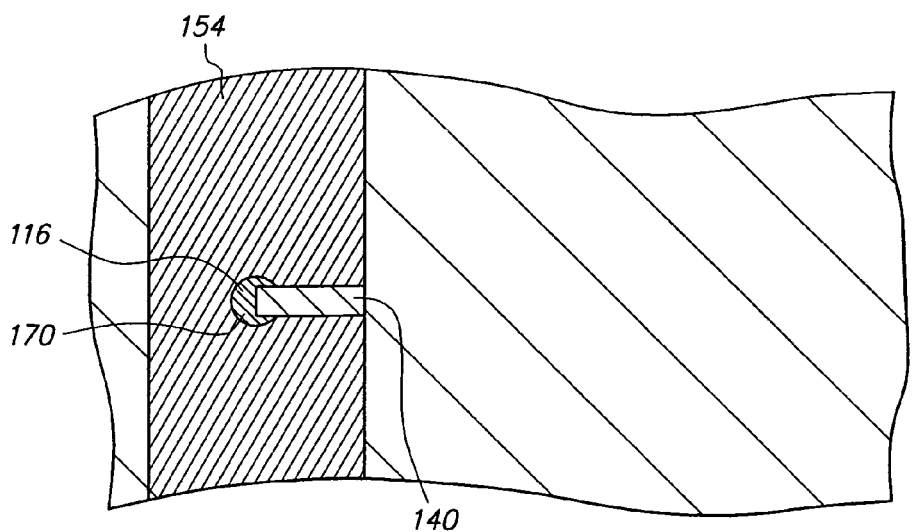

FIGS. 18A, 18B and 18C are cross-sectional, top and bottom views, respectively, of through-hole 170 that extends through adhesive 154 and exposes pad 116 and routing line 140.

Through-hole 170 is formed through adhesive 154 by applying a suitable etch that is highly selective of adhesive 154 with respect to pad 116 and routing line 140. In this instance, a selective TEA $CO_2$ laser etch is applied. The laser is directed at and vertically aligned with and centered relative to pad 116. The laser has a spot size of 70 microns, and pad 116 has a length and width of 100 microns. As a result, the laser strikes pad 116 and portions of routing line 140 and adhesive 154 that extend within the periphery of pad 116, and ablates adhesive 154.

The laser drills through and removes a portion of adhesive 154. However, portions of adhesive 154 that extend across the peripheral edges of pad 116 are outside the scope of the laser and remain intact. Likewise, routing line 140 shields a portion of adhesive 154 from the laser etch, and a portion of adhesive 154 sandwiched between pad 116 and routing line 140 remains intact. The laser etch is anisotropic, and therefore little or none of adhesive 154 sandwiched between pad 116 and routing line 140 is undercut or removed.

Thereafter, a brief cleaning step can be applied to remove oxides and debris that may be present on the exposed portions of pad 116 and routing line 140. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 116 and routing line 140 without damaging the structure.

Through-hole 170 is formed in and extends vertically through adhesive 154, is disposed within the peripheries of chip 110 and opening 168, is vertically aligned with and exposes pad 116, exposes elongated routing portion 146 of routing line 140, is spaced from bumped terminal 142 and metal particle 156 and has a diameter of 70 microns. Through-hole 170 is formed without damaging pad 116, passivation layer 118 or routing line 140 and does not extend into chip 110.

Through-hole 170 may slightly undercut adhesive 154 between pad 116 and routing line 140 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored.

Figure 18D:
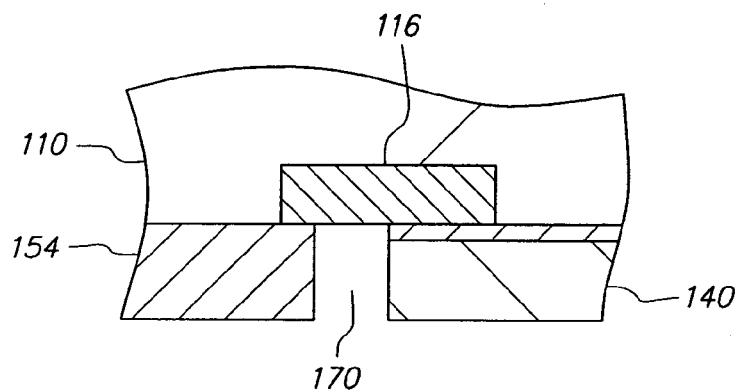
FIGS. 18D, 18E and 18F are enlarged cross-sectional, bottom and cross-sectional views, respectively, of the through-hole in FIG. 18A.
Figure 18E:
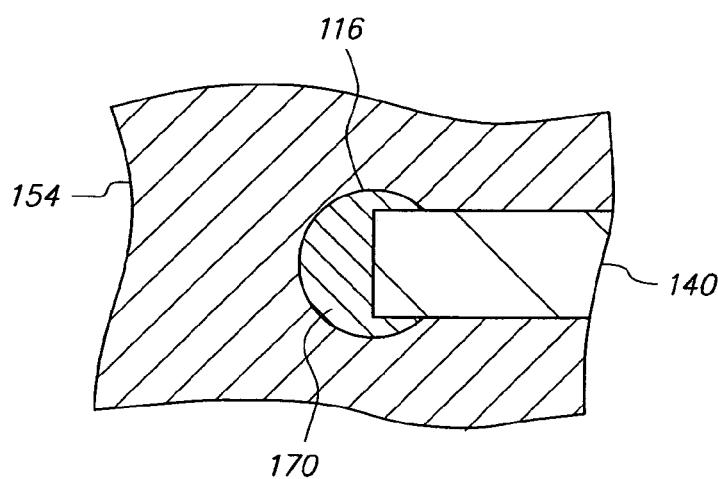
Figure 18F:
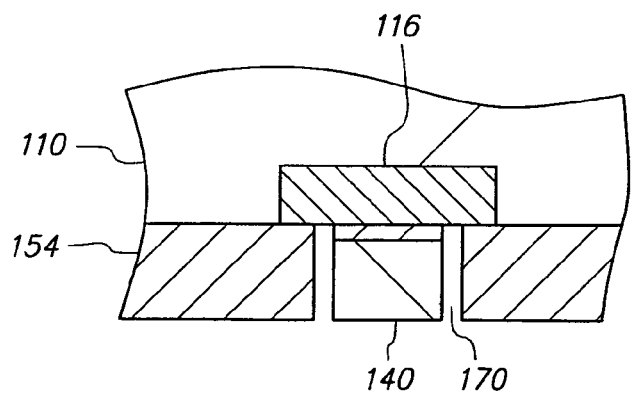

FIGS. 18D, 18E and 18F are enlarged cross-sectional, bottom and cross-sectional views, respectively, of through-hole 170. FIG. 18F is oriented orthogonally with respect to FIG. 18D. As is seen, through-hole 170 extends through adhesive 154 to pad 116 and exposes the downwardly facing surface and elongated peripheral sidewalls of routing line 140, and adhesive 154 remains in contact with and sandwiched between pad 116 and routing line 140.

Figure 19A:
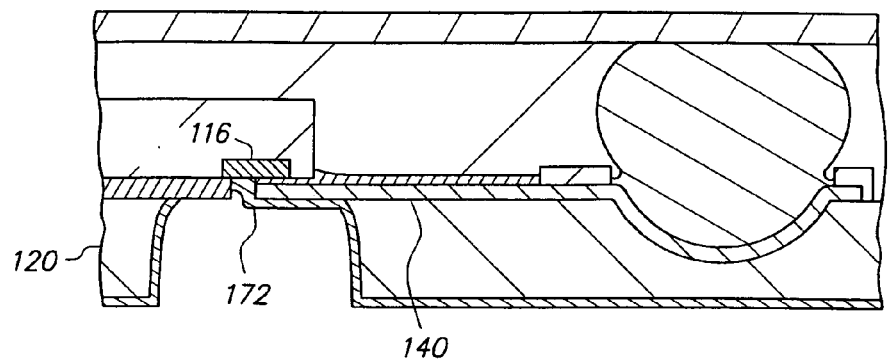
Figure 19B:
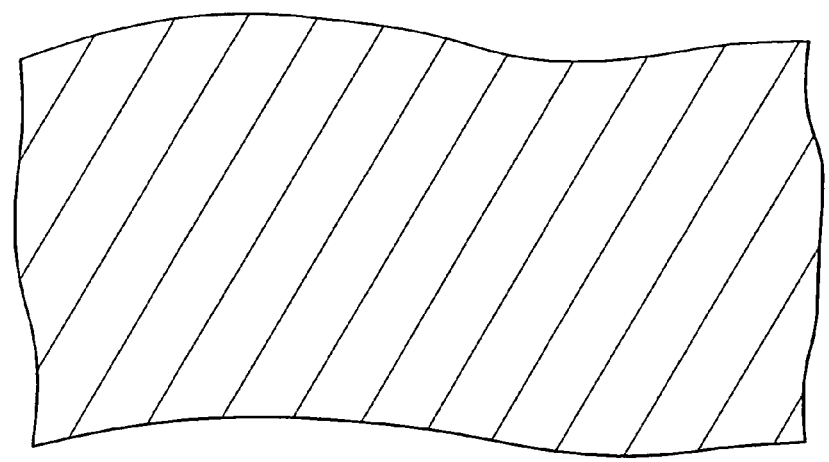
Figure 19C:
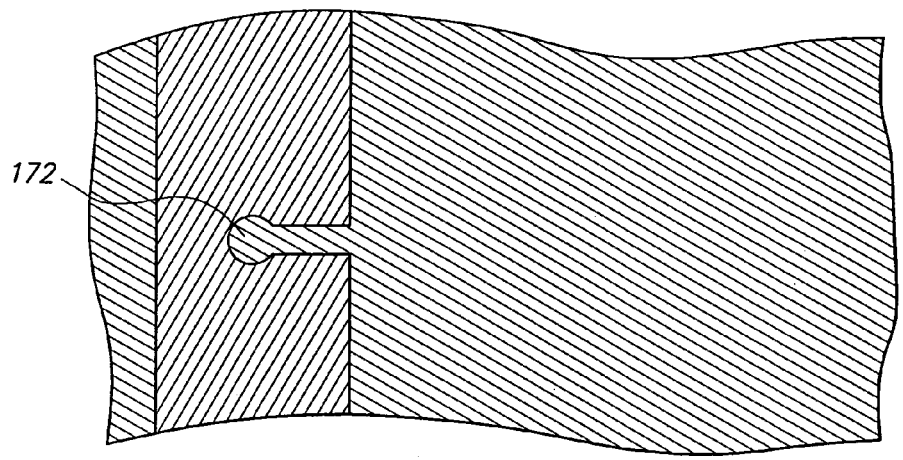

FIGS. 19A, 19B and 19C are cross-sectional, top and bottom views, respectively, of connection joint 172 formed on pad 116, metal base 120 and routing line 140.

Connection joint 172 is formed by an electroplating operation. Initially, metal base 120 is connected to a plating bus (not shown), current is applied to the plating bus from an external power source, and the structure is submerged in an electrolytic copper plating solution such as Sel-Rex CUBATH M™ at room temperature. As a result, connection joint 172 electroplates on the exposed portions of metal base 120. In addition, since the plating bus provides the current to metal base 120, which in turn provides the current to routing line 140, connection joint 172 electroplates on the exposed portions of routing line 140 in opening 168 and in through-hole 170. At the initial stage, since adhesive 154 is an electrical insulator and pad 116 is not connected to the plating bus, connection joint 172 does not electroplate on pad 116 and is spaced from pad 116. However, as the copper electroplating continues, connection joint 172 continues to plate on routing line 140, extends through adhesive 154 and contacts pad 116. As a result, pad 116 is connected to the plating bus by metal base 120, routing line 140 and connection joint 172, and therefore connection joint 172 begins to electroplate on pad 116 as well. The copper electroplating continues until connection joint 172 has the desired thickness. Thereafter, the structure is removed from the electrolytic copper plating solution and rinsed in distilled water to remove contaminants.

Connection joint 172 contacts and electrically connects pad 116 and routing line 140 in through-hole 170 and extends downwardly beyond chip 110 and routing line 140. Connection joint 172 contacts and covers portions of pad 116 and routing line 140 that were previously exposed by through-hole 170. Thus, connection joint 172 provides a robust, permanent electrical connection between pad 116 and routing line 140. Connection joint 172 is composed of copper. Connection joint 172 is the only electrical conductor external to chip 110 that contacts pad 116, adhesive 154 and connection joint 172 are the only materials external to chip 110 that contact pad 116, and adhesive 154 and connection joint 172 are the only materials that contact both pad 116 and routing line 140.

At this stage, conductive trace 158 includes routing line 140 and metal particle 156 and is electrically connected to pad 116 by connection joint 172.

Figure 19D:
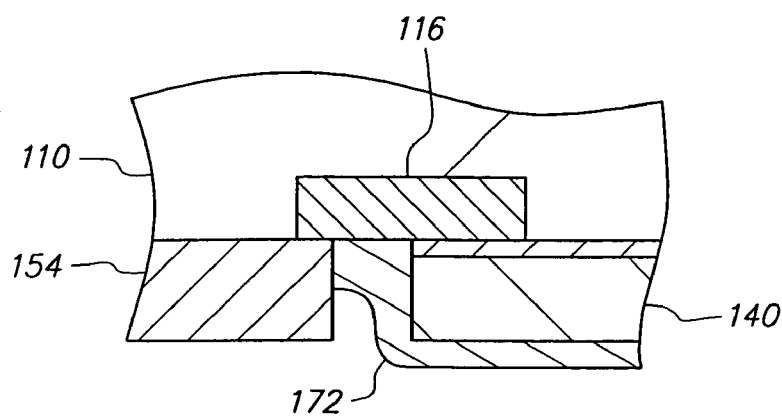
FIGS. 19D, 19E and 19F are enlarged cross-sectional, bottom and cross-sectional views, respectively, of the connection joint in FIG. 19A.
Figure 19E:
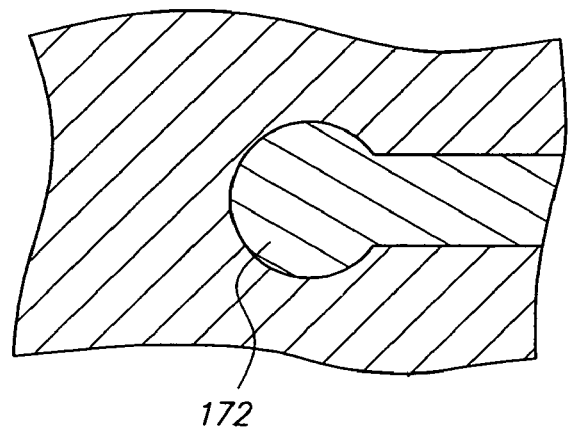
Figure 19F:
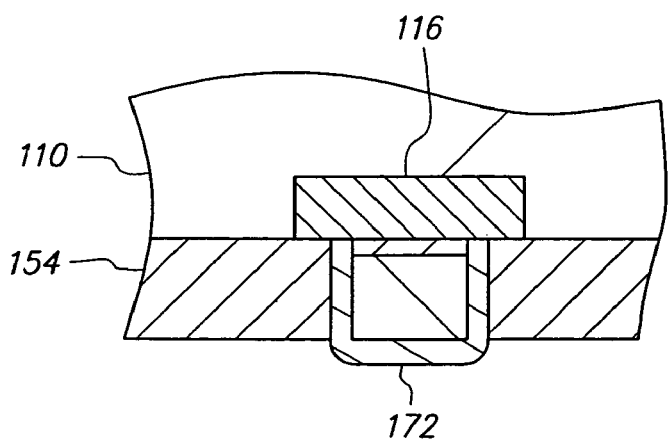

FIGS. 19D, 19E and 19F are enlarged cross-sectional, bottom and cross-sectional views, respectively, of connection joint 172. FIG. 19F is oriented orthogonally with respect to FIG. 19D. As is seen, connection joint 172 extends into through-hole 170 and contacts and electrically connects pad 116 and routing line 140. Furthermore, connection joint 172 contacts the downwardly facing surface and elongated peripheral sidewalls of routing line 140, and adhesive 154 remains in contact with and sandwiched between pad 116 and routing line 140.

Figure 20A:
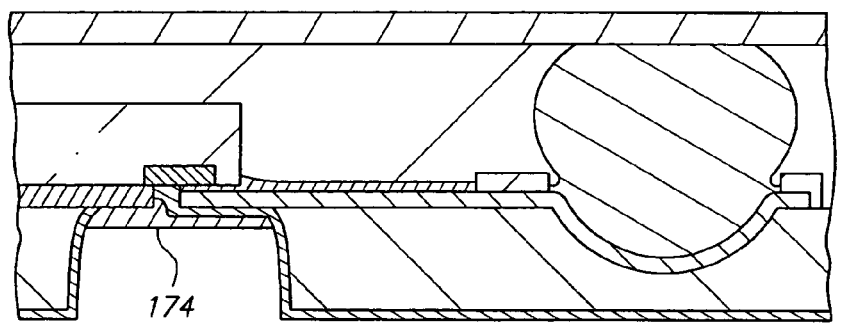
Figure 20B:
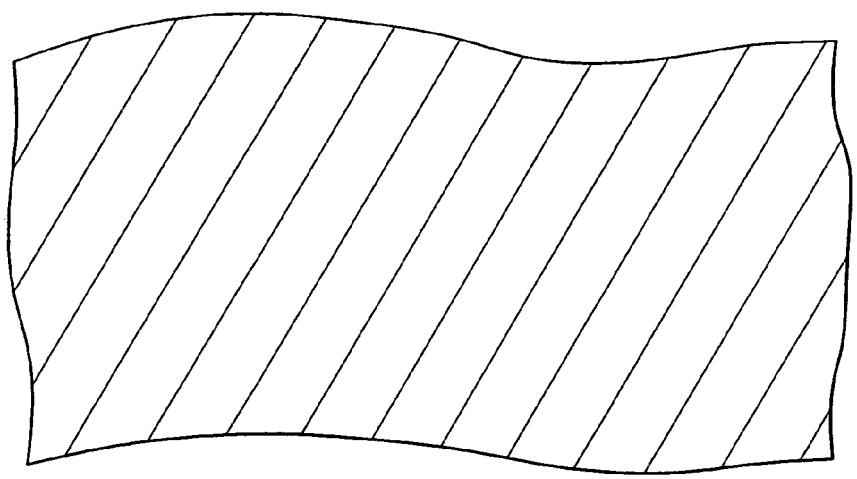
Figure 20C:
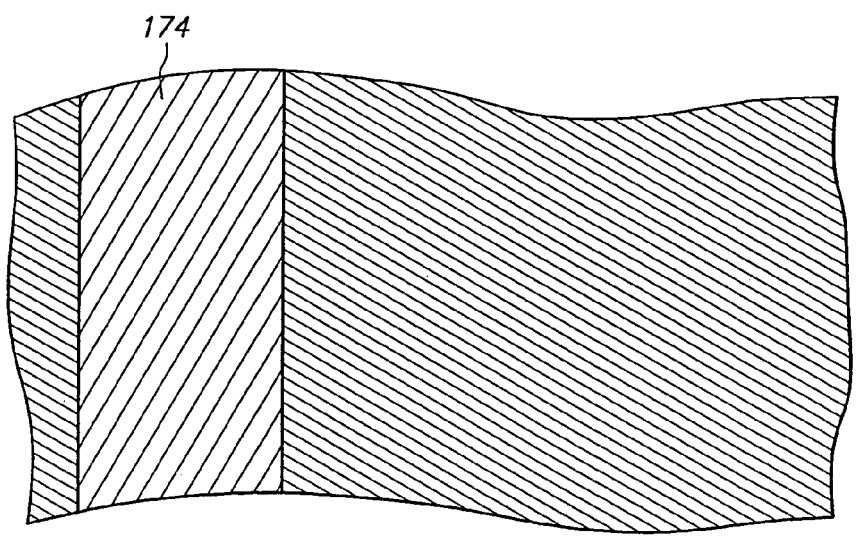

FIGS. 20A, 20B and 20C are cross-sectional, top and bottom views, respectively, of insulative plug 174 formed on adhesive 154 and connection joint 172 in opening 168.

Preferably, insulative plug 174 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited into opening 168 using stencil printing, and then the epoxy paste is cured or hardened at a relatively low temperature in the range of 100 to 250° C. to form a solid adherent insulator that provides a protective seal for connection joint 172 in through-hole 170.

Insulative plug 174 contacts and covers adhesive 154 and connection joint 172 proximate to pad 116 in opening 168, is disposed within opening 168 and has a thickness of 30 microns.

For convenience of illustration, insulative plug 174 is shown below chip 110 to retain a single orientation throughout the figures for ease of comparison between the figures, although in this step the structure would be inverted so that gravitational force would assist the epoxy paste deposition.

Figure 21A:
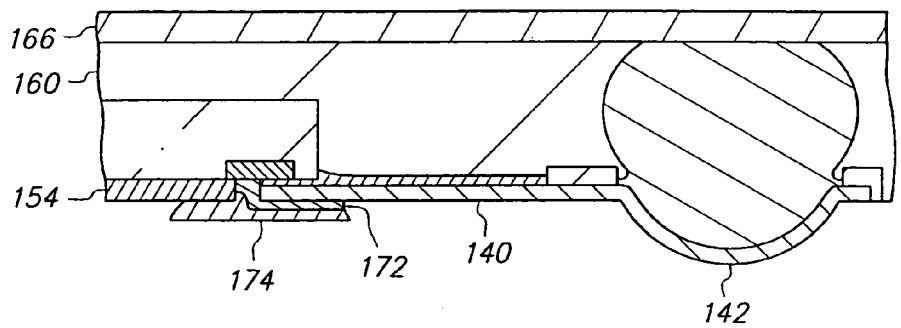
Figure 21B:
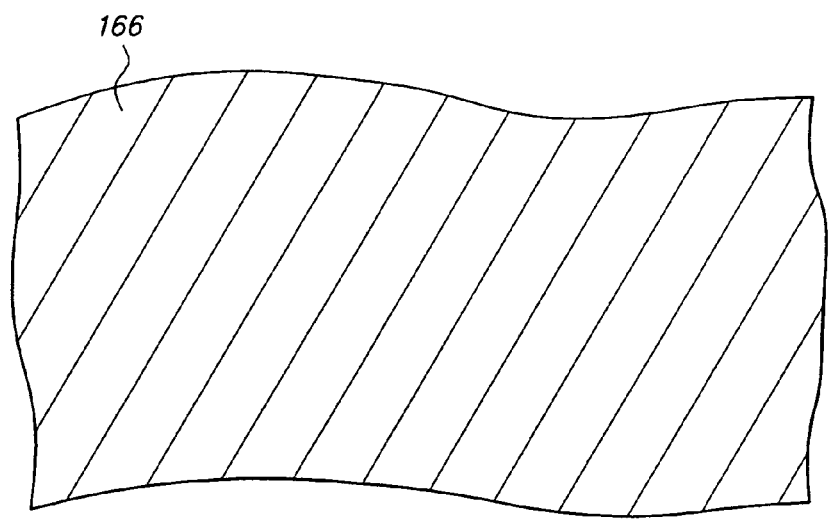
Figure 21C:
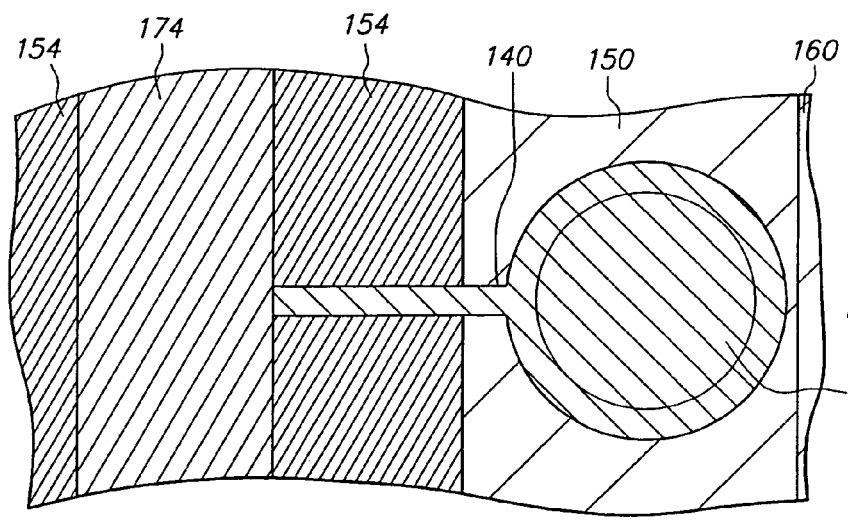

FIGS. 21A, 21B and 21C are cross-sectional, top and bottom views, respectively, of the structure after metal base 120 and a portion of connection joint 172 are removed.

Metal base 120 and a portion of connection joint 172 are removed by applying a blanket wet chemical etch. For instance, the bottom spray nozzle can spray another wet chemical etch on metal base 120 and a portion of connection joint 172 while the top spray nozzle is deactivated, or the structure can be dipped in the wet chemical etch since protective mask 166 covers metal particle 156. The wet chemical etch is highly is selective of copper with respect to nickel, polyimide, epoxy, the solder mask material and the molding compound, and therefore, highly selective of metal base 120 and connection joint 172 with respect to the first nickel layer of routing line 140, solder mask 150, adhesive 154, encapsulant 160 and insulative plug 174. Furthermore, the first nickel layer of routing line 140, solder mask 150 and adhesive 154 protect the copper layer of routing line 140 from the wet chemical etch, and insulative plug 174 protects connection joint 172 in through-hole 170 from the wet chemical etch. Therefore, no appreciable amount of routing line 140, solder mask 150, adhesive 154 or encapsulant 160 is removed. Likewise, the portion of connection joint 172 that contacts and electrically connects pad 116 and routing line 140 in through-hole 170 remains intact.

The wet chemical etch initially removes the exposed portion of connection joint 172, thereby exposing metal base 120. Thereafter, the wet chemical etch removes metal base 120. Thus, the wet chemical etch eliminates contact area between metal base 120 and routing line 140. Furthermore, the wet chemical etch exposes bumped terminal 142.

A suitable wet chemical etch can be provided by the same solution used for etching metal base 120 to form slot 130 and recess 132. The optimal etch time for exposing metal base 120 to the wet chemical etch in order to remove metal base 120 without excessively exposing routing line 140 to the wet chemical etch can be established through trial and error.

Advantageously, since metal base 120 and connection joint 172 are composed of copper, metal base 120 can be removed by a single wet chemical etch step using a copper etching solution. Another advantage is that encapsulant 160 provides mechanical support for the structure, and therefore reduces the mechanical strain on solder mask 150 and adhesive 154. The enhanced mechanical strength is particularly useful after metal base 120 is removed. Still another advantage is that insulative plug 174 protects connection joint 172 in through-hole 170 from the wet chemical etch, thereby permitting connection joint 172 to be copper.

At this stage, conductive trace 178 remains electrically connected to pad 116 by connection joint 172. Furthermore, an electrically conductive path between pad 116 and metal particle 156 not only includes but also requires routing line 140.

Figure 22A:
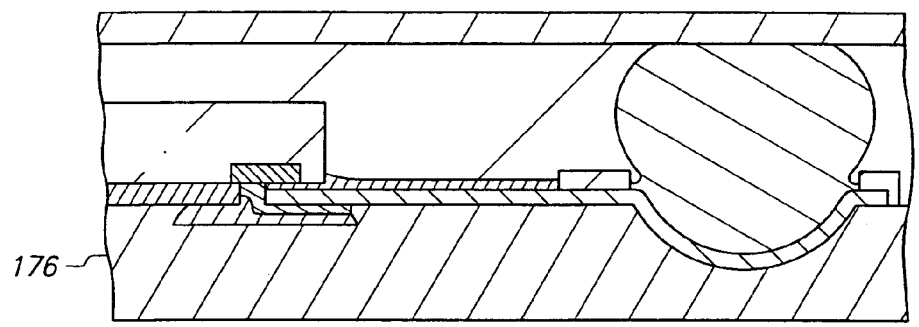
Figure 22B:
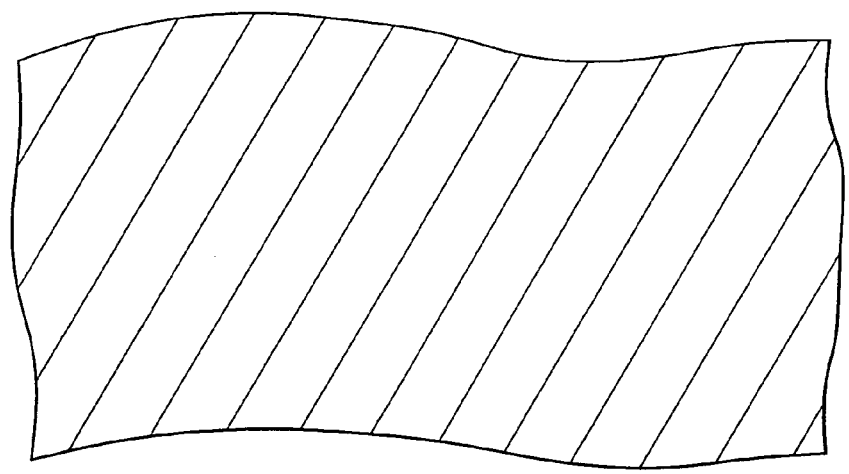
Figure 22C:
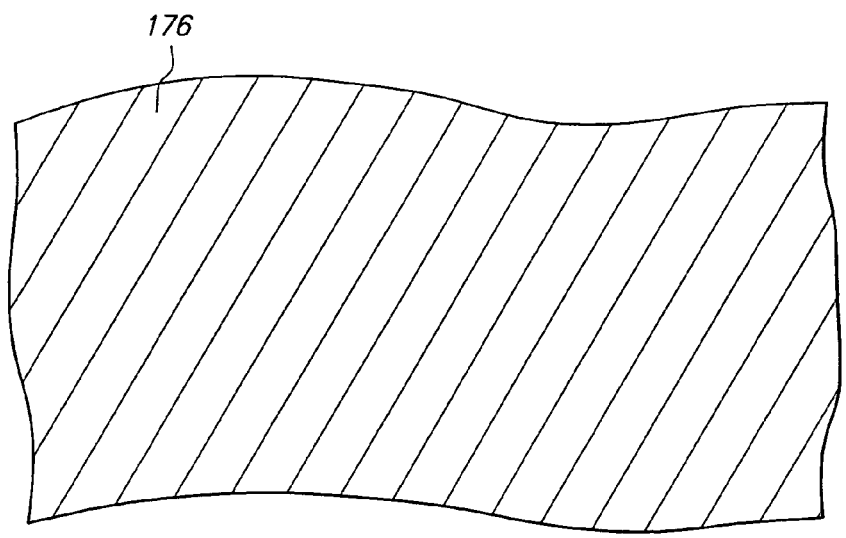

FIGS. 22A, 22B and 22C are cross-sectional, top and bottom views, respectively, of insulative base 176 formed on routing line 140, solder mask 150, adhesive 154, encapsulant 160 and insulative plug 174.

Preferably, insulative base 176 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on routing line 140, solder mask 150, adhesive 154, encapsulant 160 and insulative plug 174, and then the epoxy paste is cured or hardened at a relatively low temperature in the range of 100 to 250° C. to form a solid adherent insulator that provides a protective seal for routing line 140.

Insulative base 176 contacts and covers and extends downwardly beyond routing line 140, solder mask 150, adhesive 154, encapsulant 160 and insulative plug 174, covers and extends downwardly beyond and is spaced from chip 110 and metal particle 156, has a thickness of 150 microns and extends downwardly beyond bumped terminal 142 by 50 microns.

For convenience of illustration, insulative base 176 is shown below chip 110 to retain a single orientation throughout the figures for ease of comparison between the figures, although in this step the structure would be inverted so that gravitational force would assist the epoxy paste deposition.

Figure 23A:
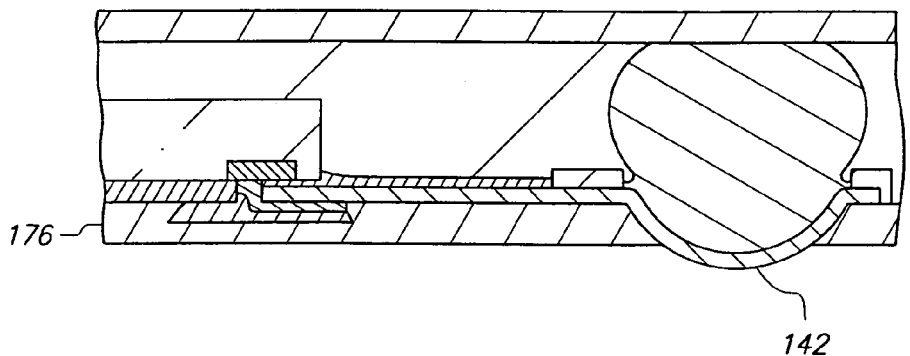
Figure 23B:
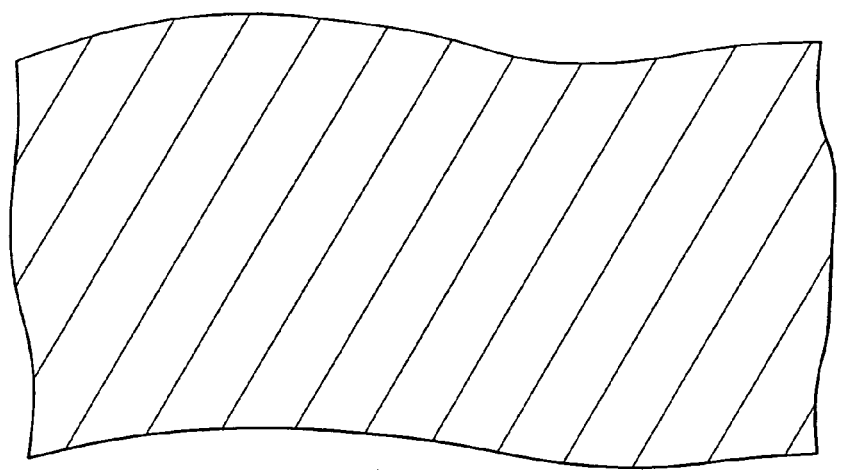
Figure 23C:
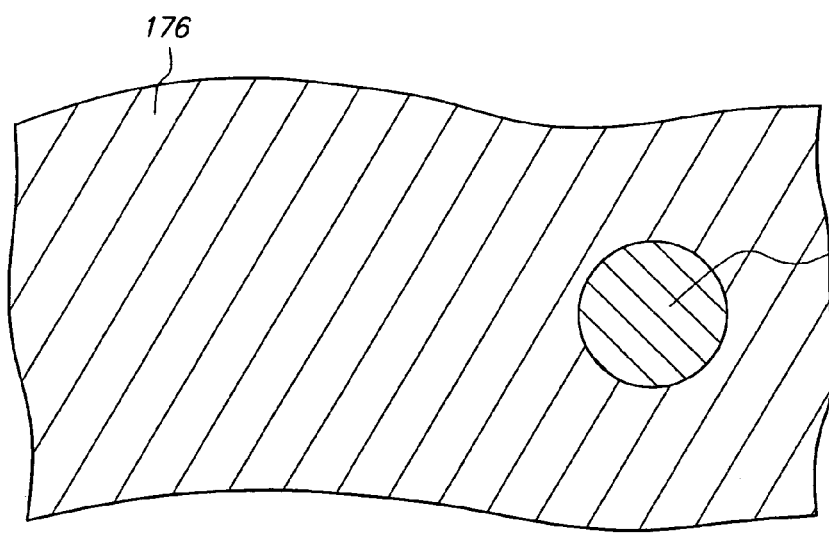

FIGS. 23A, 23B and 23C are cross-sectional, top and bottom views, respectively, of the structure after a lower portion of insulative base 176 is removed.

The lower portion of insulative base 176 is removed by applying a blanket plasma etch. The plasma etch continues until bumped terminal 142 is exposed, and then halts before it reaches enlarged annular portion 144, elongated routing portion 146, solder mask 150, adhesive 154, encapsulant 160 or insulative plug 174.

Bumped terminal 142 extends downwardly beyond insulative base 176 by 50 microns after the plasma etch. Thus, the plasma etch removes a 100 micron thick lower portion of insulative base 176, thereby reducing the thickness of insulative base 176 to 50 microns (150–100).

Figure 24A:
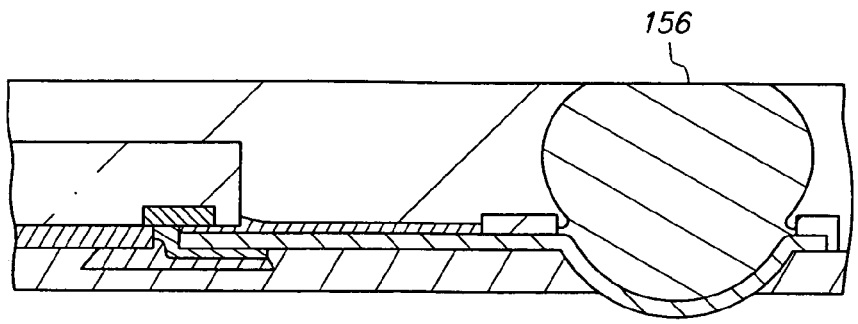
Figure 24B:
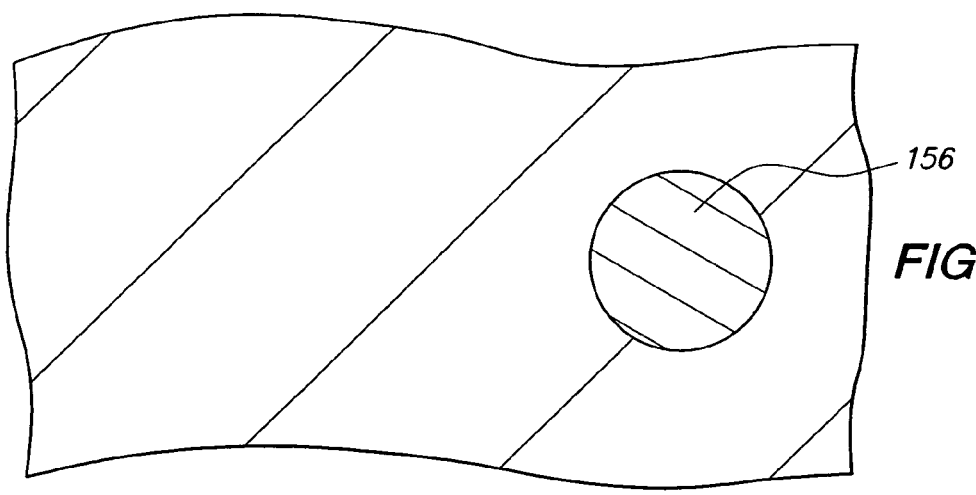
Figure 24C:
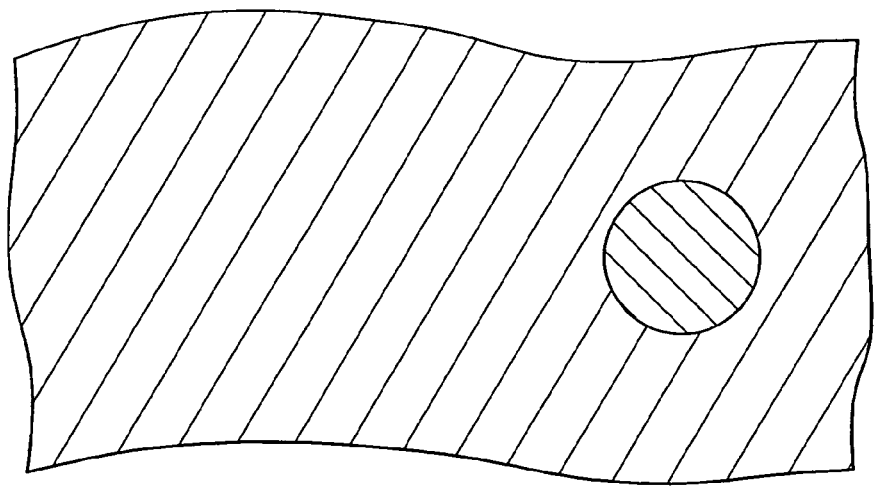

FIGS. 24A, 24B and 24C are cross-sectional, top and bottom views, respectively, of the structure after protective mask 166 is stripped.

Protective mask 166 is removed by being peeled off since it adheres relatively weakly to the structure and does not contain isolated segments, and the peeling off process is more economical and convenient than applying a selective etch. Thereafter, a brief oxygen plasma cleaning step is applied to remove any tape residue on metal particle 156. Therefore, metal particle 156 becomes exposed.

Figure 25A:
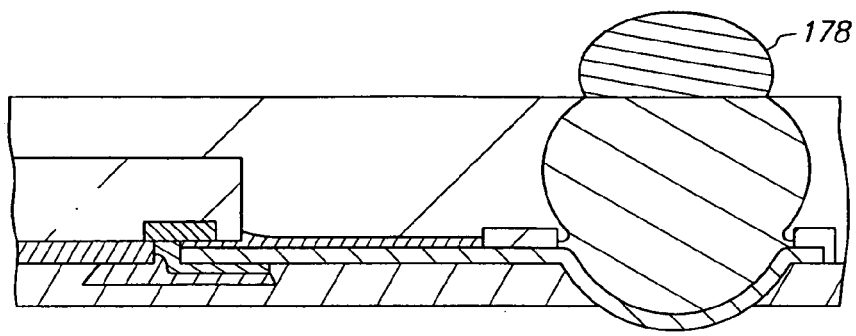
Figure 25B:
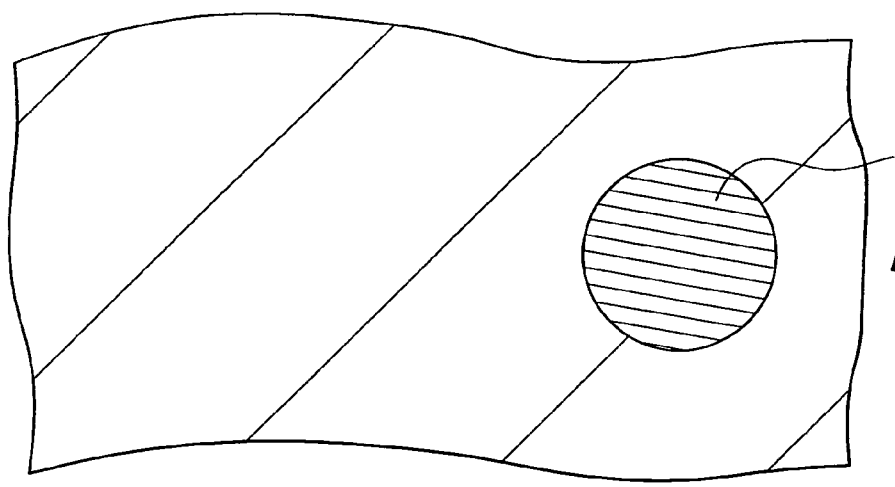
Figure 25C:
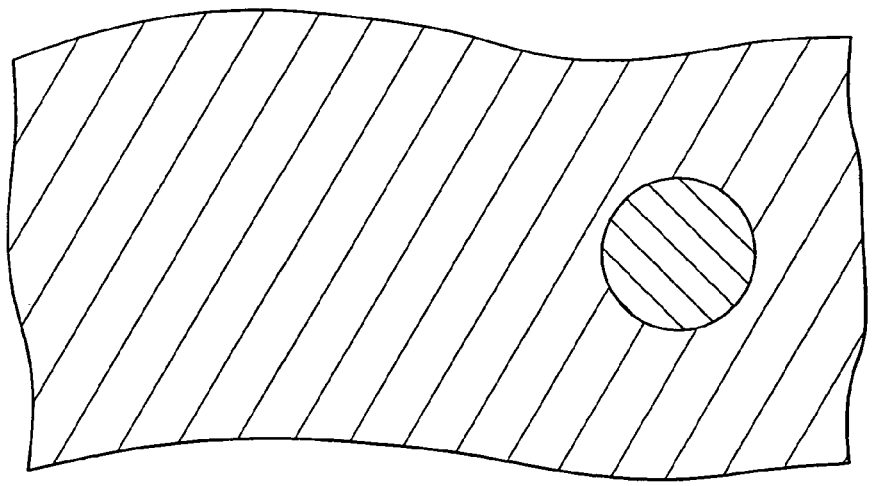

FIGS. 25A, 25B and 25C are cross-sectional, top and bottom views, respectively, of solder terminal 178 formed on metal particle 156.

Solder terminal 178 is initially a tin-lead solder ball with a spherical shape and a diameter of 200 microns. Solder terminal 178 is dipped in flux to provide solder terminal 178 with a thin flux surface coating (not shown). Thereafter, solder terminal 178 with the flux surface coating is deposited on metal particle 156 using a graphite fixture and a pick-up head, in a similar manner that metal particle 156 was deposited on bumped terminal 142, then heat is applied to reflow solder terminal 178, and then the heat is removed and solder terminal 178 cools and solidifies.

Solder terminal 178 contacts and is electrically connected to metal particle 156, spaced and separated from routing line 140 and connection joint 172, and extends upwardly beyond encapsulant 160. Thus, solder ball 178 provides a reflowable electrical connection to metal particle 156 that protrudes upwardly from metal particle 156 and is exposed. Solder terminal 178 has a substantially hemispherical shape with a diameter of 300 microns.

At this stage, conductive trace 158 includes routing line 140, metal particle 156 and solder terminal 178.

Figure 26A:
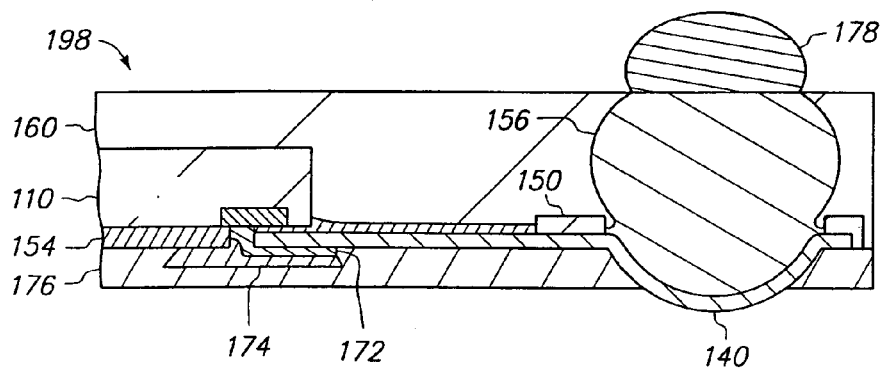
Figure 26B:
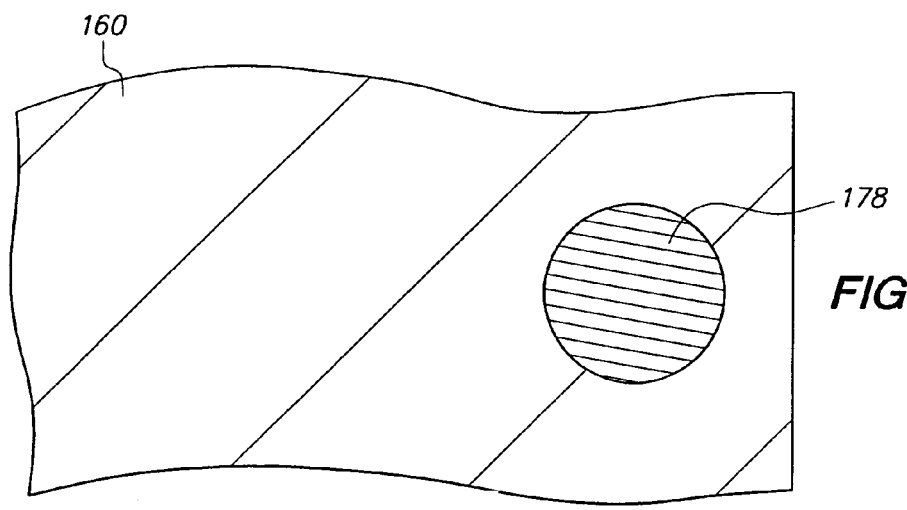
Figure 26C:
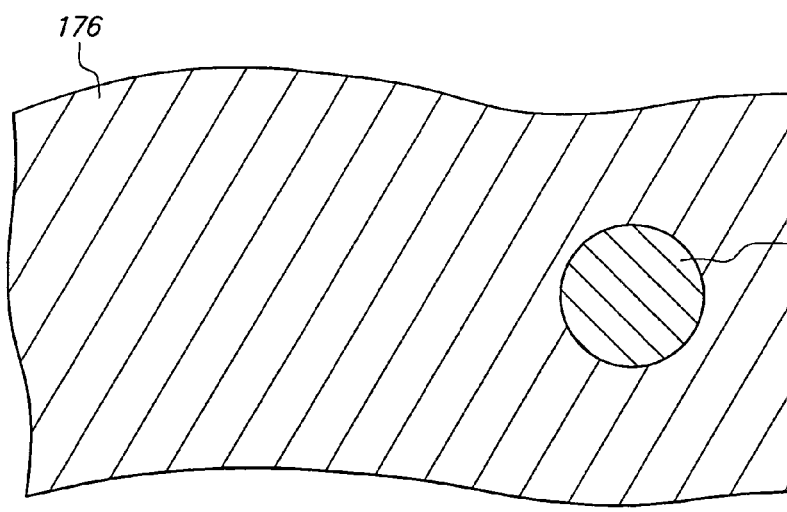

FIGS. 26A, 26B and 26C are cross-sectional, top and bottom views, respectively, of the structure after cutting encapsulant 160 and insulative base 176 with an excise blade to singulate the assembly from other assemblies.

At this stage, the manufacture of semiconductor chip assembly 198 that includes chip 110, routing line 140, solder mask 150, adhesive 154, metal particle 156, encapsulant 160, connection joint 172, insulative plug 174, insulative base 176 and solder terminal 178 can be considered complete.

Routing line 140 is mechanically coupled to chip 110 by adhesive 154, and is electrically coupled to chip 110 by connection joint 172. Routing line 140 extends beyond an outer edge of chip 110 and provides horizontal fan-out routing between pad 116 and external circuitry, and metal particle 156 extends across the thickness of chip 110 and provides vertical routing between pad 116 and external circuitry. Encapsulant 160 and insulative base 176 provide mechanical support and environmental protection for the assembly. Encapsulant 160 has most of surface 162 exposed in the upward direction and most of surface 164 covered in the downward direction by insulative base 176, and surface 164 is covered and unexposed in the downward direction.

The semiconductor chip assembly is a single-chip first-level package that is devoid of wire bonds and TAB leads.

The semiconductor chip assembly includes other conductive traces embedded in encapsulant 160, and only a single conductive trace 158 is shown for convenience of illustration. The conductive traces are spaced and separated and electrically isolated from one another. The conductive traces each include a respective routing line, metal particle and solder terminal. The conductive traces are each electrically connected to a respective pad on chip 110 by a respective connection joint. The conductive traces each extend beyond an outer edge of chip 110 and extend across the thickness of chip 110 to provide horizontal fan-out routing and vertical routing for their respective pads. Furthermore, the conductive traces each include an upwardly protruding solder terminal and a downwardly protruding bumped terminal to facilitate a three-dimensional stacked arrangement.

Chip 110 is designed with the pads electrically isolated from one another. However, the corresponding routing lines are initially electroplated on metal base 120 and electrically connected to one another by metal base 120. Furthermore, the connection joint (or joints) are initially electroplated on the routing lines and the corresponding pads in the corresponding through-holes, thereby electrically connecting the pads with one another. Thereafter, once metal base 120 is etched and removed, the routing lines are electrically isolated from one another, and therefore, the pads return to being electrically isolated from one another.

Advantageously, there is no plating bus or related circuitry that need be disconnected or severed from the conductive traces after the metal base is removed.

Figure 27A:
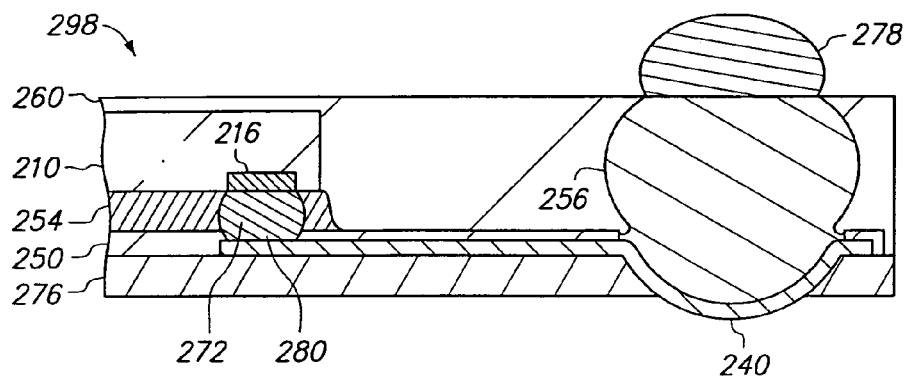
FIGS. 27A, 27B and 27C are cross-sectional, top and bottom views, respectively, of a semiconductor chip assembly in accordance with a second embodiment of the present invention.
Figure 27B:
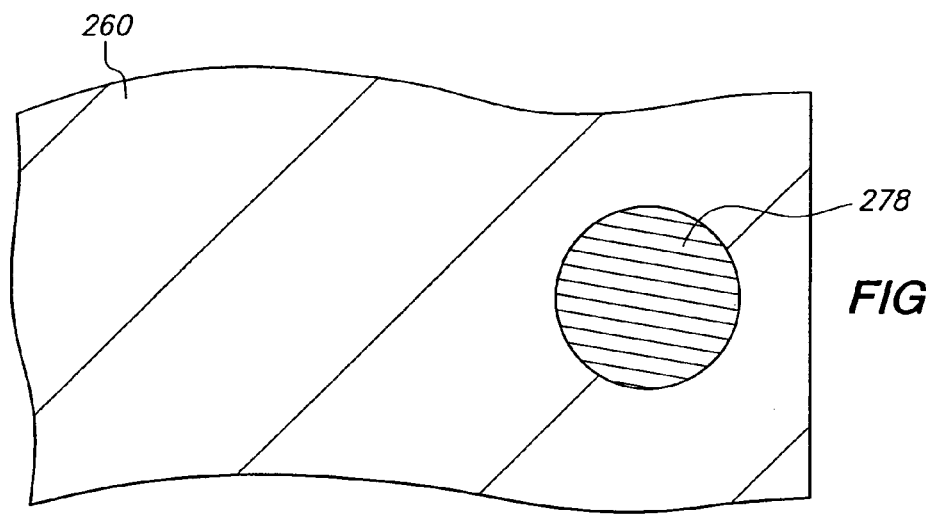
Figure 27C:
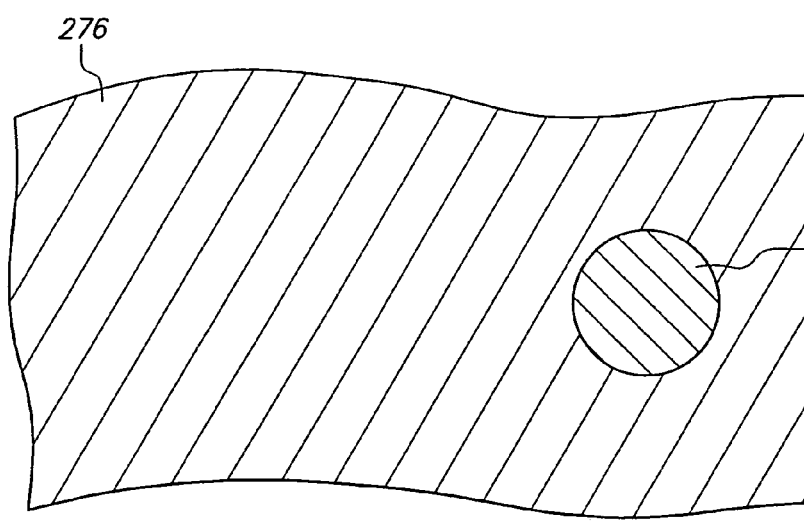

FIGS. 27A, 27B and 27C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 240 corresponds to routing line 140, etc.

Connection joint 272 is initially a solder bump deposited on pad 216. The solder bump has a hemispherical shape and a diameter of 100 microns. Routing line 240 extends laterally beyond metal particle 256 a slightly larger distance than routing line 140 extends laterally beyond metal particle 156. Solder mask 250 extends laterally beyond routing line 240 in the direction away from metal particle 256, extends 2 microns (rather than 30 microns) upwardly beyond routing line 240, and includes opening 280 that selectively exposes a portion of routing line 240 near the distal end of routing line 240 opposite metal particle 256.

Chip 210 is positioned such that routing line 240 extends laterally across pad 216 and connection joint 272 is aligned with and extends into opening 280 and contacts and is sandwiched between pad 216 and routing line 240. Thereafter, heat is applied to reflow connection joint 272, and then the heat is removed and connection joint 272 cools and solidifies into a hardened solder joint that mechanically attaches and electrically connects pad 216 and routing line 240. Furthermore, connection joint 272 exhibits localized wetting and does not collapse, and chip 210 remains spaced and separated from routing line 240 and solder mask 250.

Thereafter, adhesive 254 is dispensed into and underfills the open gap between chip 210 and solder mask 250, and then adhesive 254 is cured. As a result, adhesive 254 contacts and is sandwiched between chip 210 and solder mask 250, contacts connection joint 272 and is spaced and separated from pad 216. Thus, adhesive 254 is significantly thicker than and has a significantly smaller surface area than adhesive 154 but a slightly larger surface area than chip 210. A suitable underfill adhesive is Namics U8443.

Thereafter, encapsulant 260 is formed. Thus, adhesive 254 and encapsulant 260 are formed after connection joint 272.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 260 is formed.

Semiconductor chip assembly 298 includes chip 210, routing line 240, solder mask 250, adhesive 254, metal particle 256, encapsulant 260, connection joint 272, insulative base 276 and solder terminal 278.

Figure 28A:
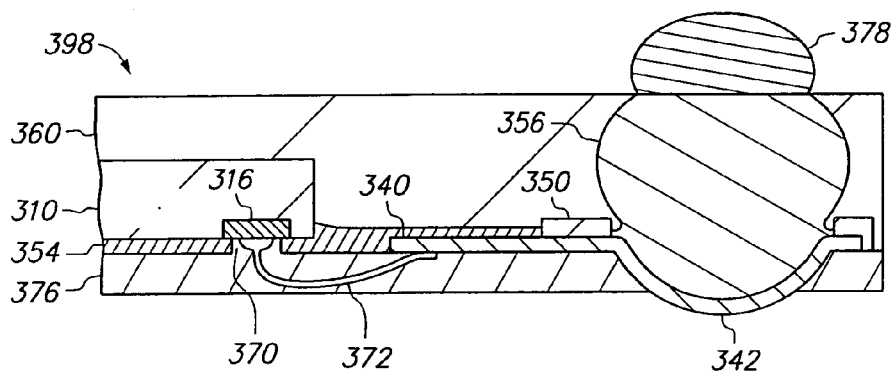
FIGS. 28A, 28B and 28C are cross-sectional, top and bottom views, respectively, of a semiconductor chip assembly in accordance with a third embodiment of the present invention.
Figure 28B:
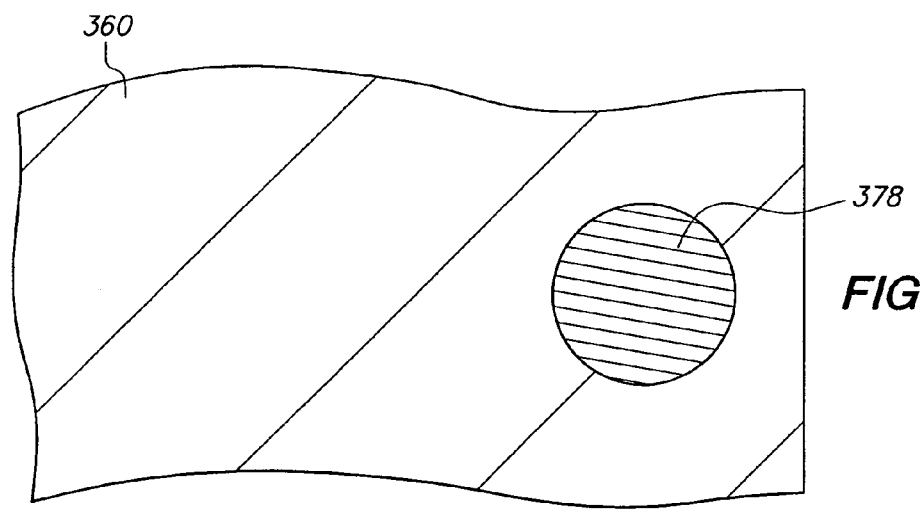
Figure 28C:
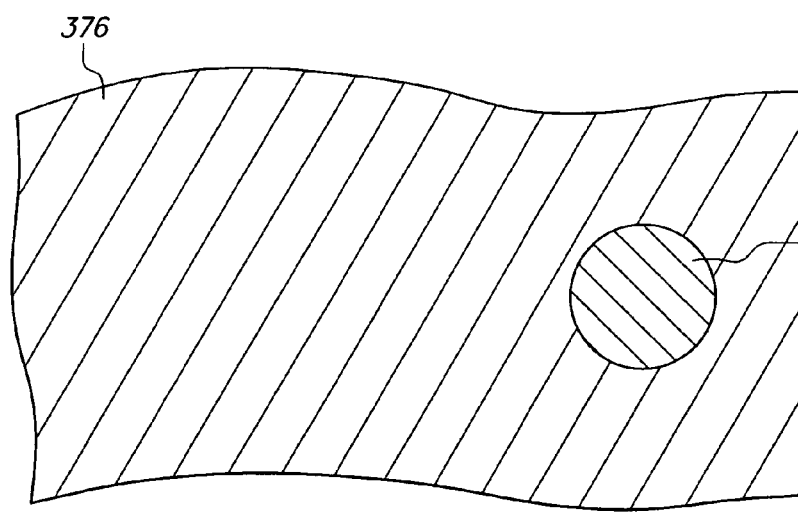

FIGS. 28A, 28B and 28C are cross-sectional, top and bottom views, respectively, of a semiconductor chip assembly in accordance with a third embodiment of the present invention. In the third embodiment, the connection joint is a wire bond. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 340 corresponds to routing line 140, etc.

Routing line 340 extends laterally beyond metal particle 356 a significantly smaller distance than routing line 140 extends laterally beyond metal particle 156. Furthermore, routing line 340 includes an elongated routing portion (corresponding to elongated routing portion 146) that is 100 microns wide and thus 50 microns wider than elongated routing portion 146. Routing line 340 includes an additional gold layer electroplated on the metal base (corresponding to metal base 120) before the first nickel layer is electroplated. Thus, routing line 340 is composed of gold-nickel-copper-nickel-gold (rather than nickel-copper-nickel-gold).

The metal base (corresponding to metal base 120) has a thickness of 300 microns and thus is 100 microns thicker than metal base 120, bumped terminal 342 has a thickness of 200 microns and thus is 100 microns thicker than bumped terminal 142, metal particle 356 has an initial diameter of 550 microns and thus is 50 microns wider than metal particle 156, and insulative base 376 has a thickness of 150 microns and thus is 100 microns thicker than insulative base 176.

Chip 310 is positioned such that routing line 340 is disposed outside the periphery of chip 310.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 360 is formed.

Connection joint 372 is a wire bond composed of gold that is ball bonded to pad 316 and then wedge bonded to routing line 340 near the distal end of routing line 340 opposite metal particle 356. Thus, connection joint 372 is electrically connected to pad 316 in through-hole 370 and to routing line 340 outside through-hole 370. Connection joint 372 extends downwardly beyond chip 310 by 100 microns.

Semiconductor chip assembly 398 includes chip 310, routing line 340, solder mask 350, adhesive 354, metal particle 356, encapsulant 360, connection joint 372, insulative base 376 and solder terminal 378.

Figure 29A:
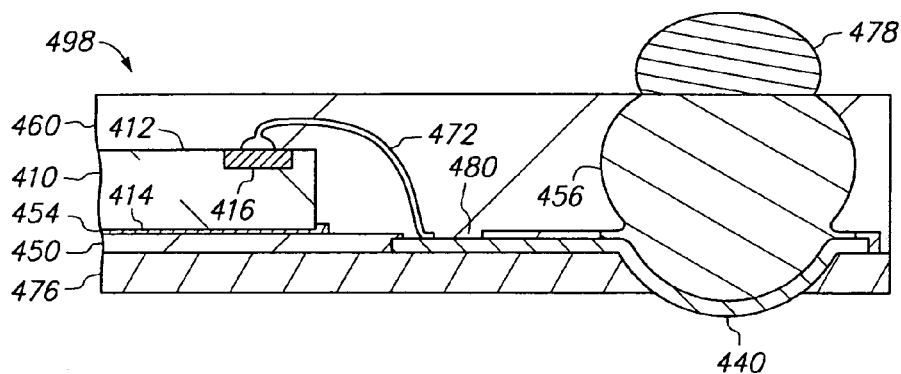
FIGS. 29A, 29B and 29C are cross-sectional, top and bottom views, respectively, of a semiconductor chip assembly in accordance with a fourth embodiment of the present invention.
Figure 29B:
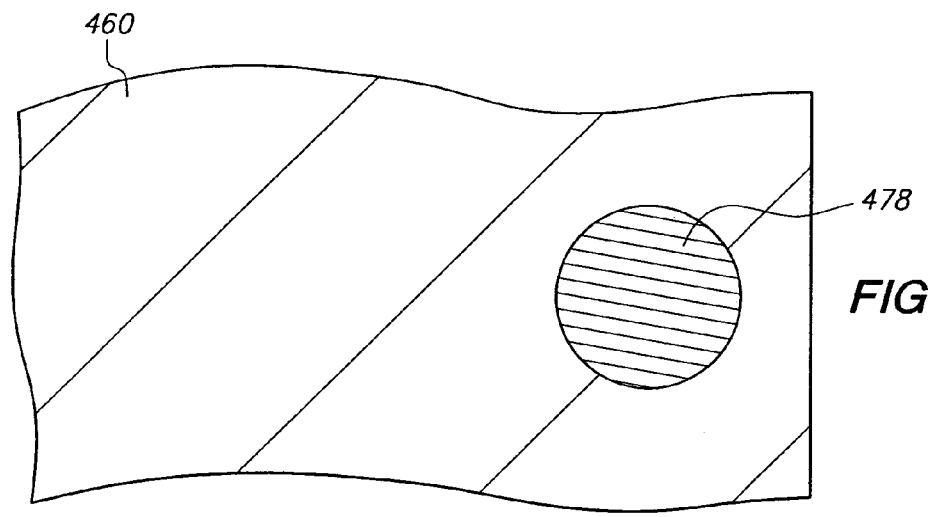
Figure 29C:
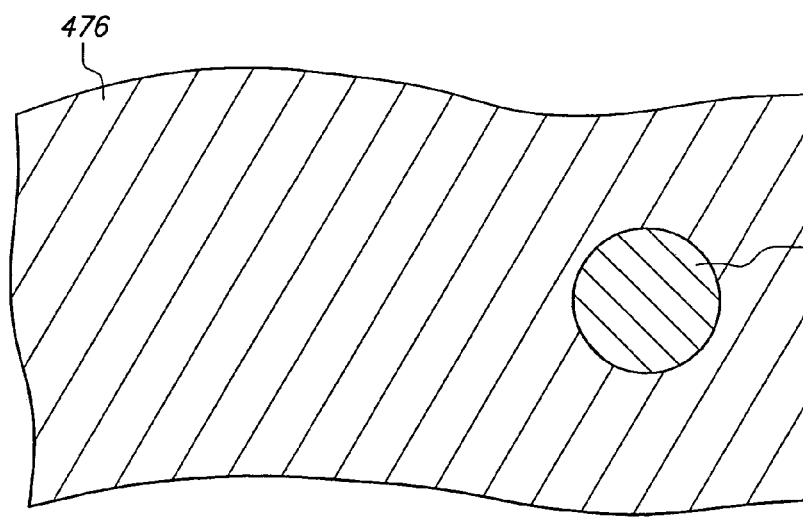

FIGS. 29A, 29B and 29C are cross-sectional, top and bottom views, respectively, of a semiconductor chip assembly in accordance with a fourth embodiment of the present invention. In the fourth embodiment, the connection joint is a wire bond. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 440 corresponds to routing line 140, etc.

Routing line 440 extends laterally beyond metal particle 456 a significantly smaller distance than routing line 140 extends laterally beyond metal particle 156. Furthermore, routing line 440 includes an elongated routing portion (corresponding to elongated routing portion 146) that is 100 microns wide and thus 50 microns wider than elongated routing portion 146.

Solder mask 450 extends laterally beyond routing line 440 in the direction away from metal particle 456, extends 2 microns (rather than 30 microns) upwardly beyond routing line 440, and includes opening 480 that selectively exposes a portion of routing line 440 near the distal end of routing line 440 opposite metal particle 456.

Adhesive 454 is deposited on solder mask 450 and does not contact or overlap routing line 440. Thus, adhesive 454 has a significantly smaller surface area than adhesive 154 but a slightly larger surface area than chip 410.

Chip 410 is positioned such that surface 412 faces upwardly, surface 414 faces downwardly and routing line 440 is disposed outside the periphery of chip 410.

Connection joint 472 is a wire bond composed of gold that is ball bonded to pad 416 and then wedge bonded to routing line 440 near the distal end of routing line 440 opposite metal particle 456. Thus, connection joint 472 is electrically connected to pad 416 outside opening 480 and to routing line 440 in opening 480. Connection joint 472 extends upwardly beyond chip 410 by 100 microns.

Thereafter, encapsulant 460 is formed. Encapsulant 460 contacts and extends upwardly beyond connection joint 472. Thus, encapsulant 460 is formed after connection joint 472.

The slot (corresponding to slot 132), opening (corresponding to opening 168), through-hole (corresponding to through-hole 170) and insulative plug (corresponding to insulative plug 174) are omitted. Likewise, the metal base (corresponding to metal base 120) is etched once (rather than twice) and removed after encapsulant 460 is formed.

Semiconductor chip assembly 498 includes chip 410, routing line 440, solder mask 450, adhesive 454, metal particle 456, encapsulant 460, connection joint 472, insulative base 476 and solder terminal 478.

Figure 30A:
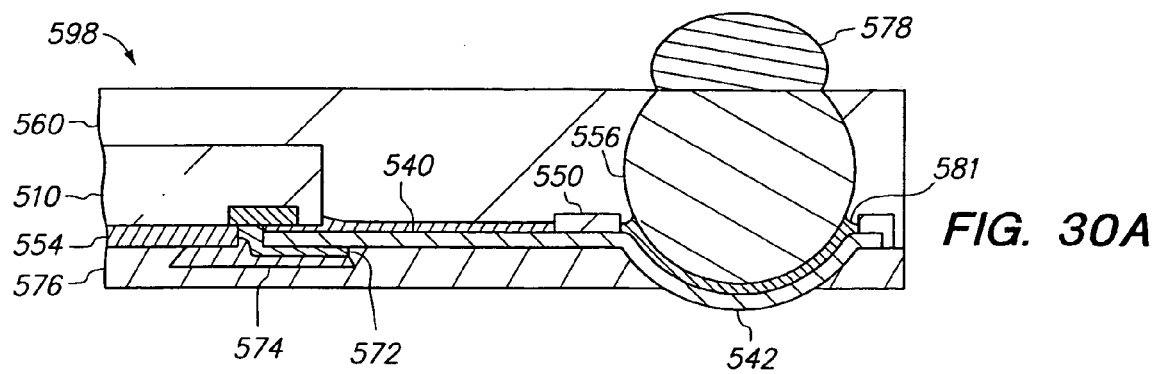
FIGS. 30A, 30B and 30C are cross-sectional, top and bottom views, respectively, of a semiconductor chip assembly in accordance with a fifth embodiment of the present invention.
Figure 30B:
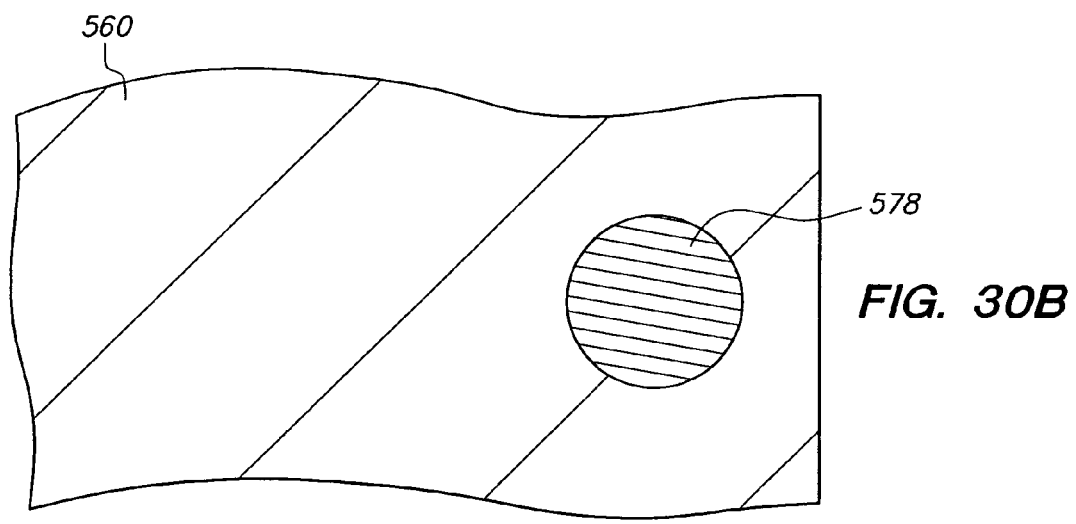
Figure 30C:
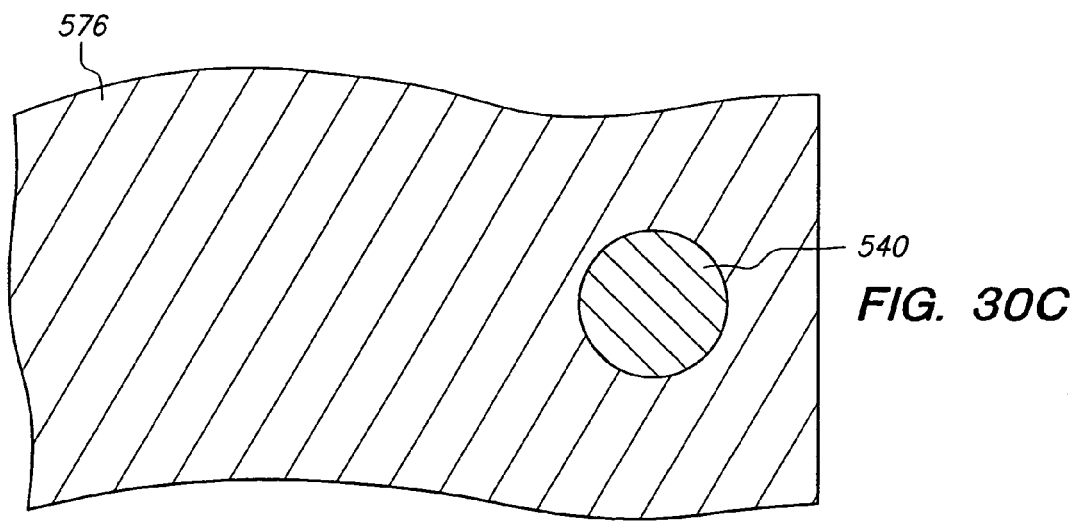

FIGS. 30A, 30B and 30C are cross-sectional, top and bottom views, respectively, of a semiconductor chip assembly in accordance with a fifth embodiment of the present invention. In the fifth embodiment, the metal particle is attached to the routing line using a conductive bond. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 540 corresponds to routing line 140, etc.

Metal particle 556 is initially a copper ball with a spherical shape and a diameter of 500 microns. Conductive bond 581 is initially solder paste that is deposited into the cavity (corresponding to cavity 148) of bumped terminal 542. Thereafter, metal particle 556 (without a flux surface coating) is deposited on conductive bond 581 (still solder paste) and extends into the cavity (corresponding to cavity 148) and the solder mask opening (corresponding to opening 152). Metal particle 556 weakly adheres to bumped terminal 542 in the cavity due to the solder paste.

Thereafter, heat is applied to reflow conductive bond 581, and then the heat is removed and conductive bond 581 cools and solidifies into a hardened solder bond that contacts and mechanically attaches and electrically connects routing line 540 and metal particle 556.

Semiconductor chip assembly 598 includes chip 510, routing line 540, solder mask 550, adhesive 554, metal particle 556, encapsulant 560, connection joint 572, insulative plug 574, insulative base 576, solder terminal 578 and conductive bond 581.

Figure 31A:
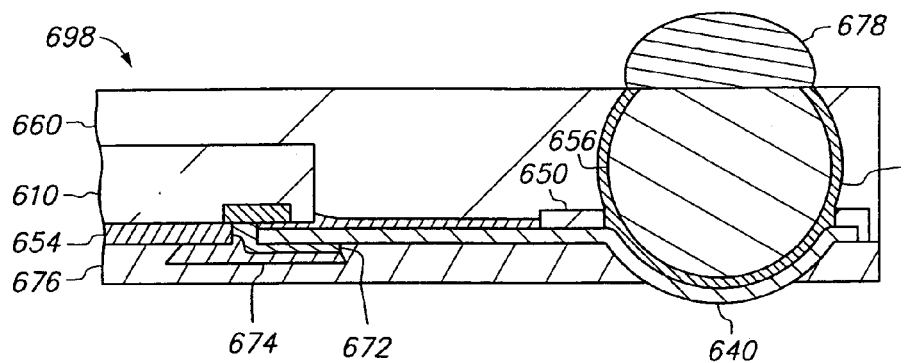
FIGS. 31A, 31B and 31C are cross-sectional, top and bottom views, respectively, of a semiconductor chip assembly in accordance with a sixth embodiment of the present invention.
Figure 31B:
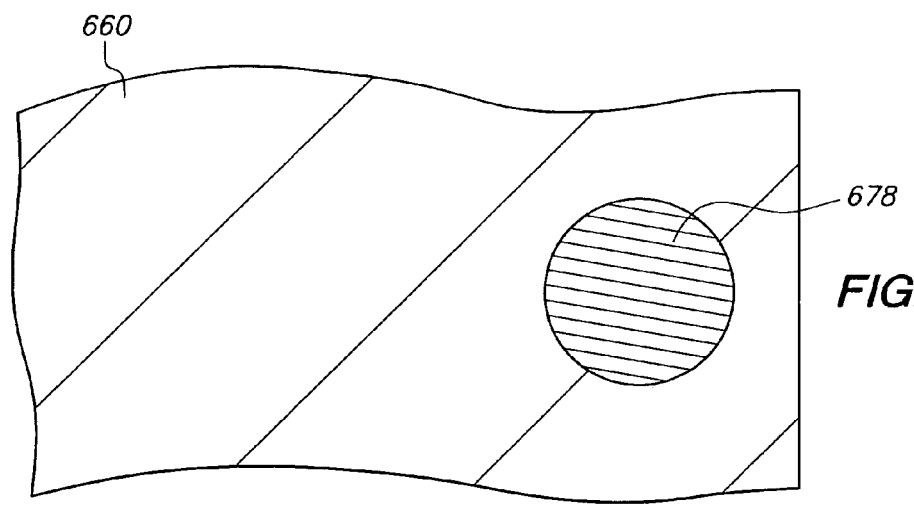
Figure 31C:
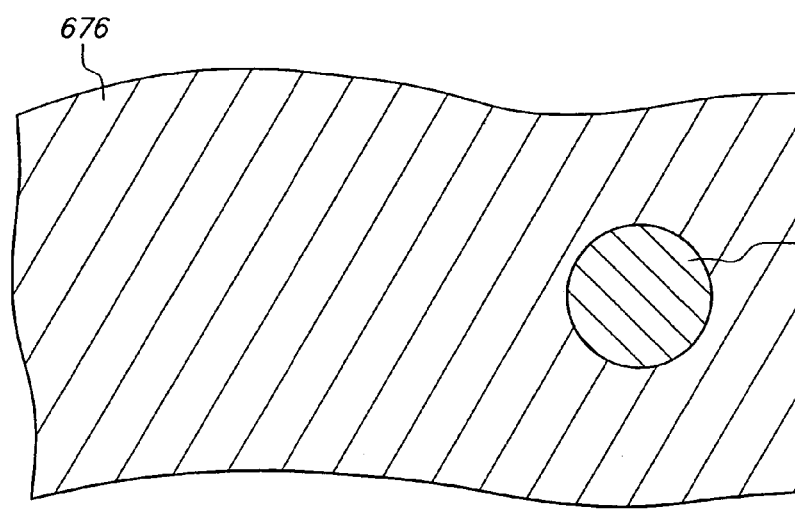

FIGS. 31A, 31B and 31C are cross-sectional, top and bottom views, respectively, of a semiconductor chip assembly in accordance with a sixth embodiment of the present invention. In the sixth embodiment, the metal particle is attached to the routing line using a conductive bond. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 640 corresponds to routing line 140, etc.

Metal particle 656 is initially a copper ball with a spherical shape and a diameter of 500 microns. Metal particle 656 is dipped in molten solder to provide metal particle 656 with conductive bond 681 as a thin solder surface coating. Thereafter, metal particle 656 with conductive bond 681 as a thin solder surface coating (and without a flux surface coating) is deposited into the cavity (corresponding to cavity 148) of bumped terminal 642.

Thereafter, heat is applied to reflow conductive bond 681, and then the heat is removed and conductive bond 681 cools and solidifies into a hardened solder bond that contacts and mechanically attaches and electrically connects routing line 640 and metal particle 656.

Semiconductor chip assembly 698 includes chip 610, routing line 640, solder mask 650, adhesive 654, metal particle 656, encapsulant 660, connection joint 672, insulative plug 674, insulative base 676, solder terminal 678 and conductive bond 681.

Figure 32A:
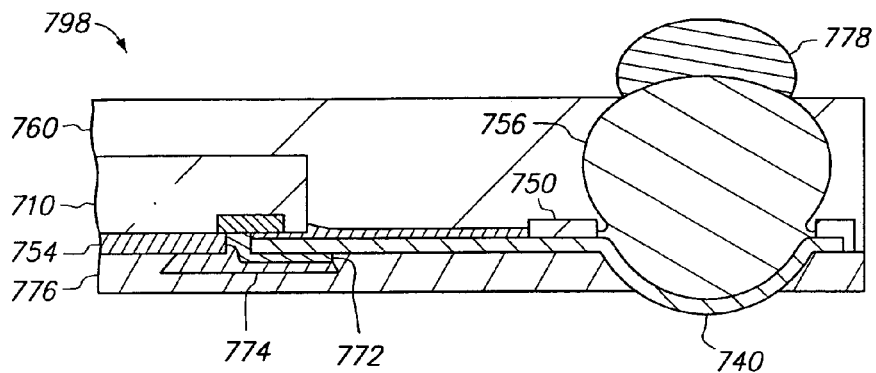
FIGS. 32A, 32B and 32C are cross-sectional, top and bottom views, respectively, of a semiconductor chip assembly in accordance with a seventh embodiment of the present invention.
Figure 32B:
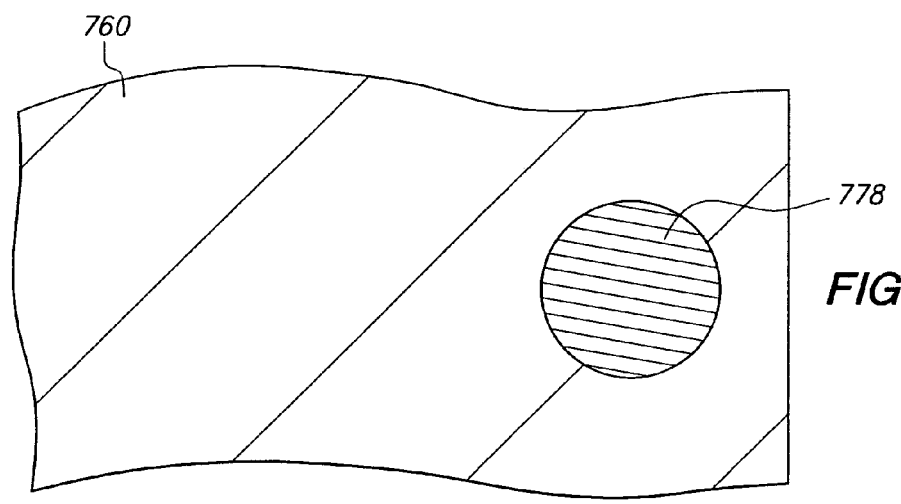
Figure 32C:
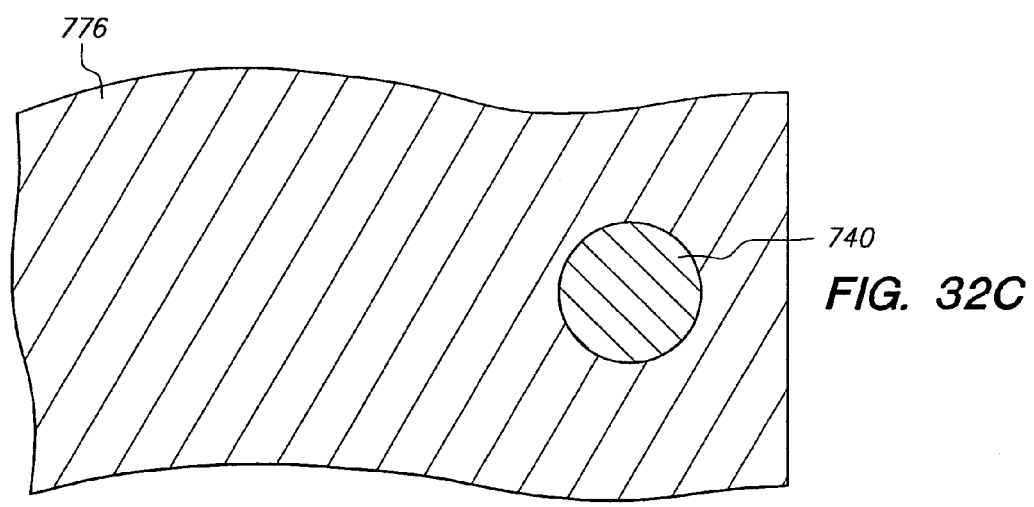

FIGS. 32A, 32B and 32C are cross-sectional, top and bottom views, respectively, of a semiconductor chip assembly in accordance with a seventh embodiment of the present invention. In the seventh embodiment, the encapsulant is formed to not cover the metal particle. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 740 corresponds to routing line 140, etc.

Encapsulant 760 is deposited on chip 710, solder mask 750, adhesive 754 and metal particle 756 by transfer molding. However, encapsulant 760 does not cover metal particle 756. Instead, metal particle 756 is exposed. This is accomplished by providing the upper mold section with a recess and inserting an upper portion of metal particle 756 into the recess while a lower portion of metal particle 756 is outside the recess such that a small gap (less than 20 microns) arises between the upper mold portion and the upper portion of metal particle 756 in the recess. The gap is large enough to prevent the upper mold section from striking metal particle 756 despite minor registration and alignment inaccuracies, and metal particle 756 remains spaced and separated from the upper mold section. However, the recess is generally shaped like and only slightly larger than the upper portion of metal particle 756, and the upper mold section contours to and shrouds the upper portion of metal particle 756. The molding compound does not flow through the small gap during transfer molding. As a result, encapsulant 760 does not contact or cover the upper portion of metal particle 756. Furthermore, metal particle 756 extends upwardly beyond encapsulant 760.

The upper portion of encapsulant 760 is not removed since metal particle 756 is never covered by encapsulant 760.

Semiconductor chip assembly 798 includes chip 710, routing line 740, solder mask 750, adhesive 754, metal particle 756, encapsulant 760, connection joint 772, insulative plug 774, insulative base 776 and solder terminal 778.

Figure 33A:
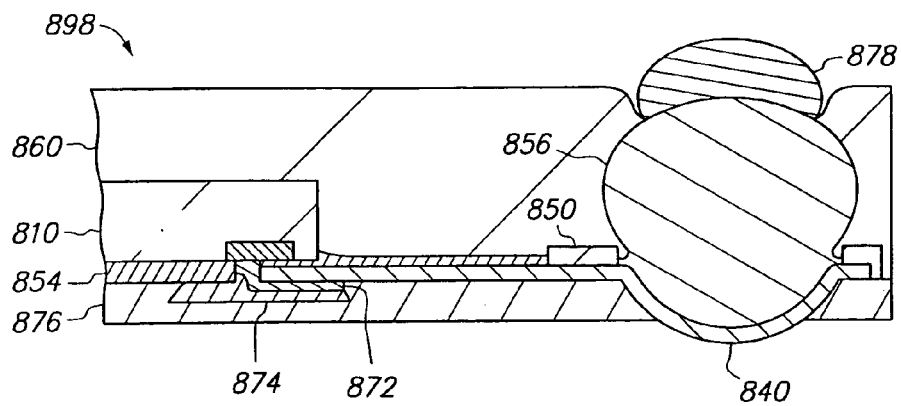
FIGS. 33A, 33B and 33C are cross-sectional, top and bottom views, respectively, of a semiconductor chip assembly in accordance with an eighth embodiment of the present invention.
Figure 33B:
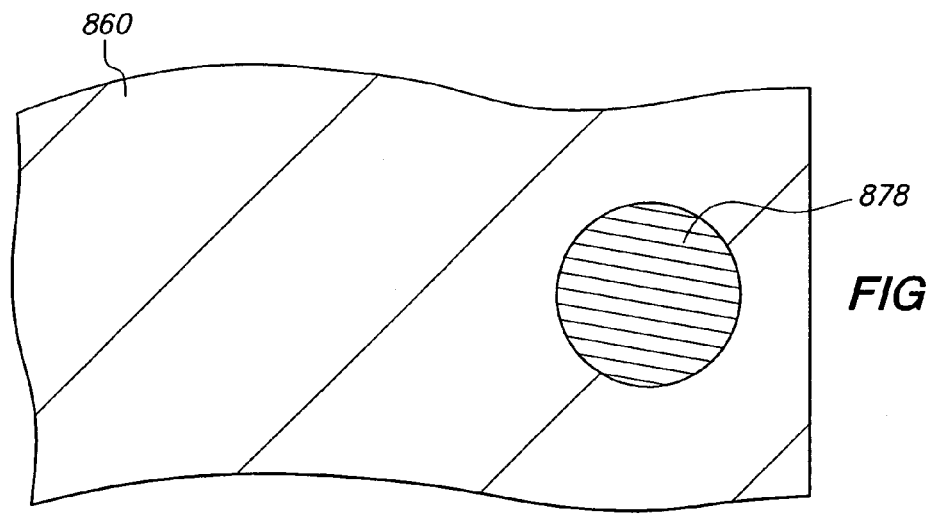
Figure 33C:
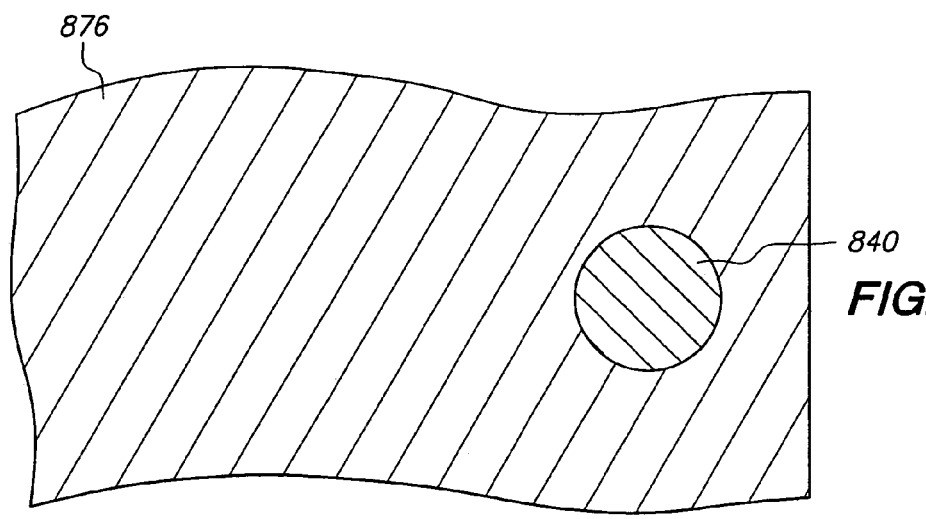

FIGS. 33A, 33B and 33C are cross-sectional, top and bottom views, respectively, of a semiconductor chip assembly in accordance with an eighth embodiment of the present invention. In the eighth embodiment, the encapsulant is formed to not cover the metal particle. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 840 corresponds to routing line 140, etc.

Encapsulant 860 is deposited on chip 810, solder mask 850, adhesive 854 and metal particle 856 by transfer molding. However, encapsulant 860 does not cover metal particle 856. Instead, metal particle 856 is exposed. This is accomplished by positioning metal particle 856 in close proximity to the upper mold section such that a small gap (less than 20 microns) arises between the upper mold section and metal particle 856. The gap is large enough to prevent the upper mold section from striking metal particle 856 despite minor registration and alignment inaccuracies, and metal particle 856 remains spaced and separated from the upper mold section. The molding compound does not flow through the small gap during transfer molding. As a result, encapsulant 860 does not contact or cover an upper portion of metal particle 856. Furthermore, encapsulant 860 extends upwardly beyond metal particle 856.

The upper portion of encapsulant 860 is not removed since metal particle 856 is never covered by encapsulant 860.

Semiconductor chip assembly 898 includes chip 810, routing line 840, solder mask 850, adhesive 854, metal particle 856, encapsulant 860, connection joint 872, insulative plug 874, insulative base 876 and solder terminal 878.

Figure 34A:
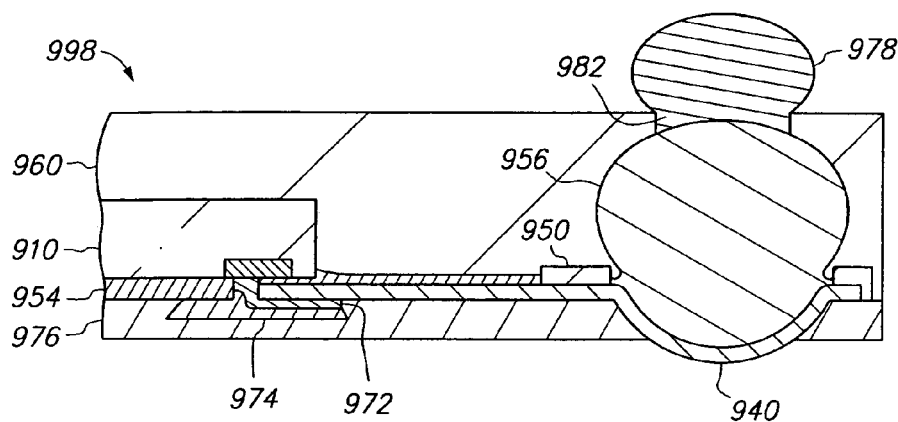
FIGS. 34A, 34B and 34C are cross-sectional, top and bottom views, respectively, of a semiconductor chip assembly in accordance with a ninth embodiment of the present invention.
Figure 34B:
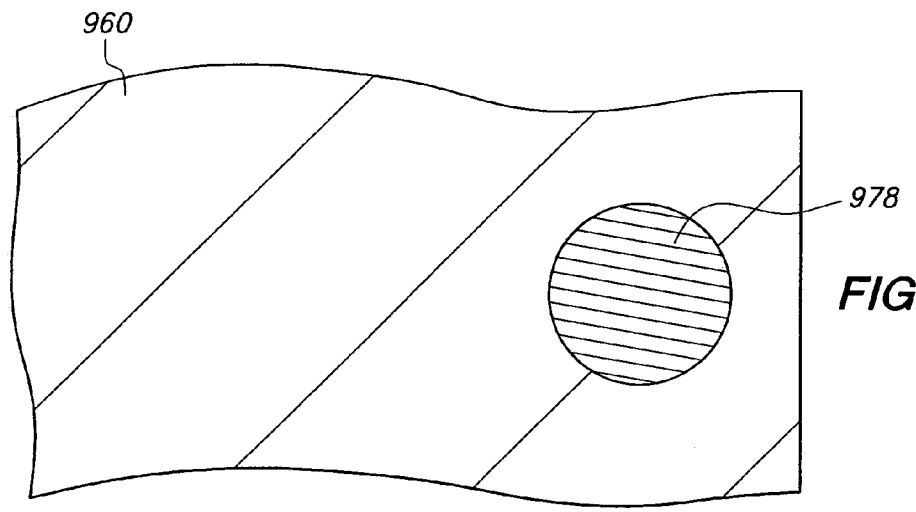
Figure 34C:
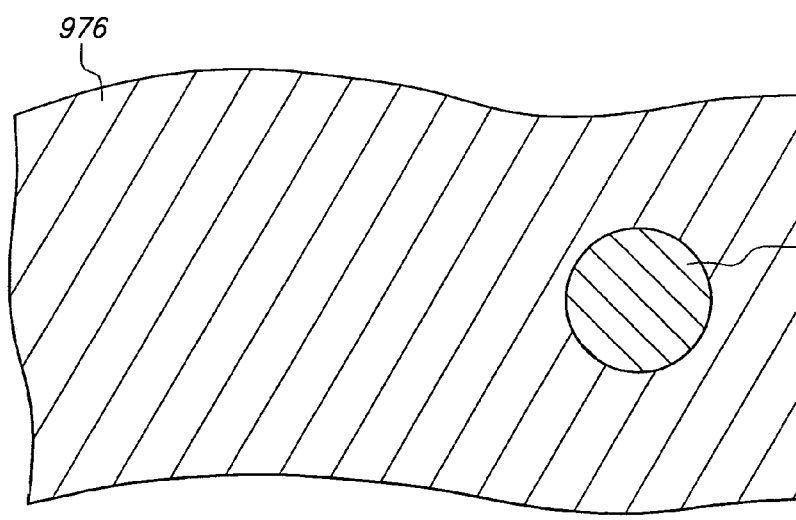

FIGS. 34A, 34B and 34C are cross-sectional, top and bottom views, respectively, of a semiconductor chip assembly in accordance with a ninth embodiment of the present invention. In the ninth embodiment, the encapsulant is selectively etched to expose the metal particle. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 940 corresponds to routing line 140, etc.

Encapsulant 960 is initially an epoxy in paste form that includes an epoxy resin, a curing agent and an accelerator. The epoxy paste is deposited over the structure using stencil printing, then the epoxy paste is cured or hardened at a relatively low temperature in the range of 100 to 250° C. to form a solid adherent insulator. Encapsulant 960 extends vertically beyond metal particle 956 by 20 microns. Furthermore, encapsulant 960 is more susceptible to laser ablation than encapsulant 160 since encapsulant 960 is composed of epoxy without a filler whereas encapsulant 160 is composed of molding compound with a filler.

Thereafter, instead of removing the upper portion of encapsulant 960 by grinding, a portion of encapsulant 960 is selectively removed to form opening 982 that exposes metal particle 956.

Opening 982 is formed by applying a suitable etch that is highly selective of encapsulant 960 with respect to metal particle 956. In this instance, a selective TEA $CO_2$ laser etch is applied using multiple laser direct writes. The laser is directed at metal particle 956. The laser has a spot size of 150 microns. Furthermore, the laser direct writes are offset relative to one another yet overlap so that the laser scans a central portion of metal particle 956 with a diameter of 200 microns. In this manner, the laser direct writes in combination are vertically aligned with and centered relative to metal particle 956. As a result, the laser strikes metal particle 956, a portion of encapsulant 960 that covers metal particle 956, and ablates encapsulant 960.

The laser drills through and removes a portion of encapsulant 960. However, a portion of encapsulant 960 that extends across the periphery of metal particle 956 is outside the scope of the laser and remains intact. Thus, encapsulant 960 continues to contact but no longer covers metal particle 956.

Thereafter, a brief cleaning step can be applied to remove oxides and debris that may be present on the exposed portion of metal particle 956. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of metal particle 956 without damaging the structure.

Opening 982 is formed in and extends vertically into but not through encapsulant 960, is disposed outside the periphery of chip 910, is vertically aligned with and exposes metal particle 956, is spaced from routing line 940, solder mask 950 and adhesive 954 and has a diameter of 200 microns. Opening 982 is formed without damaging or extending into metal particle 956.

Opening 982 may have a diameter that is slightly larger than 200 microns due to the beam angle of the laser, the thermal effects of the laser, and/or the isotropic nature of an oxygen plasma or wet chemical cleaning step. For convenience of explanation, this slight enlargement is ignored.

Thereafter, solder terminal 978 is formed on metal particle 956. Solder terminal 978 extends within and outside opening 982 and extends upwardly beyond metal particle 956 and encapsulant 960.

Semiconductor chip assembly 998 includes chip 910, routing line 940, solder mask 950, adhesive 954, metal particle 956, encapsulant 960, connection joint 972, insulative plug 974, insulative base 976 and solder terminal 978.

Figure 35A:
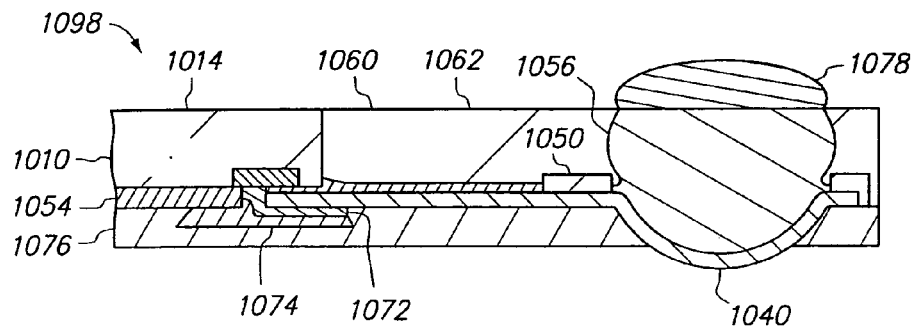
FIGS. 35A, 35B and 35C are cross-sectional, top and bottom views, respectively, of a semiconductor chip assembly in accordance with a tenth embodiment of the present invention.
Figure 35B:
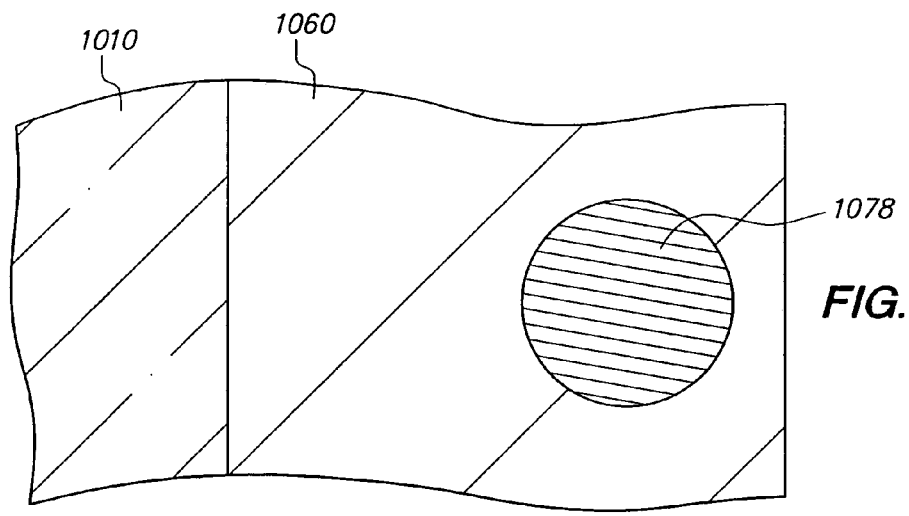
Figure 35C:
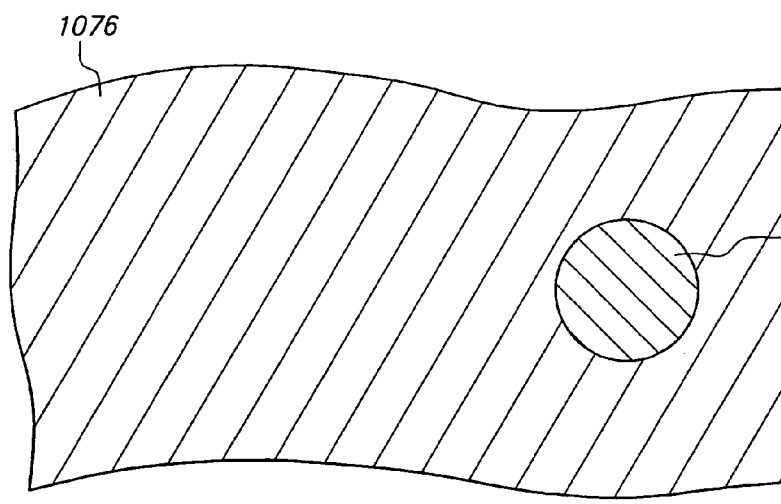

FIGS. 35A, 35B and 35C are cross-sectional, top and bottom views, respectively, of a semiconductor chip assembly in accordance with a tenth embodiment of the present invention. In the tenth embodiment, the chip is exposed. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1040 corresponds to routing line 140, etc.

The grinding is applied longer than in the first embodiment and removes portions of chip 1010, metal particle 1056 and encapsulant 1060. Initially, the diamond sand wheel grinds only encapsulant 1060. As the grinding continues, encapsulant 1060 becomes thinner as its grinded surface migrates downwardly. Eventually the diamond sand wheel contacts metal particle 1056, and as a result, begins to grind metal particle 1056 as well. As the grinding continues, metal particle 1056 and encapsulant 1060 become thinner as their grinded surfaces migrate downwardly. However, the grinding does not halt before it reaches chip 1010. Instead, the grinding continues and eventually the diamond sand wheel contacts chip 1010, and as a result, begins to grind chip 1010 as well. As the grinding continues, chip 1010, metal particle 1056 and encapsulant 1060 become thinner as their grinded surfaces migrate downwardly. The grinding continues until chip 1010, metal particle 1056 and encapsulant 1060 have the desired thickness, and then halts before it reaches active circuitry in chip 1010, routing line 1040, solder mask 1050 or adhesive 1054. Thereafter, the structure is rinsed in distilled water to remove contaminants.

The grinding removes a 50 micron thick upper portion of chip 1010 (at the back-side of the inverted chip 1010), a 300 micron thick upper portion of metal particle 1056 and a 400 micron thick upper portion of encapsulant 1060.

Chip 1010 and metal particle 1056 remain embedded in encapsulant 1060. Surface 1014 of chip 1010, the upper surface of metal particle 1056 and surface 1062 of encapsulant 1060 are laterally aligned with one another and exposed. Thus, an exposed planarized horizontal surface that faces upwardly includes surfaces 1014 and 1062 and metal particle 1056. Furthermore, chip 1010 and metal particle 1056 extend through surface 1062 of encapsulant 1060, and encapsulant 1060 no longer contacts or covers surface 1014 of chip 1010. Thus, surface 1014 of chip 1010 is not covered in the upward direction by another material of the assembly.

Semiconductor chip assembly 1098 includes chip 1010, routing line 1040, solder mask 1050, adhesive 1054, metal particle 1056, encapsulant 1060, connection joint 1072, insulative plug 1074, insulative base 1076 and solder terminal 1078.

Figure 36A:
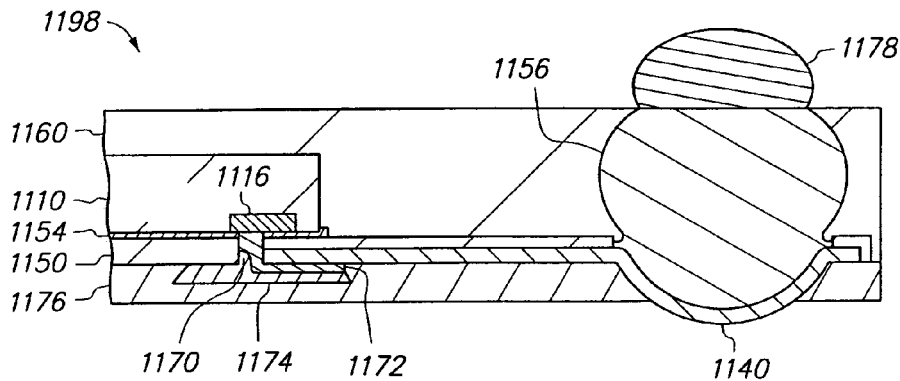
FIGS. 36A, 36B and 36C are cross-sectional, top and bottom views, respectively, of a semiconductor chip assembly in accordance with an eleventh embodiment of the present invention.
Figure 36B:
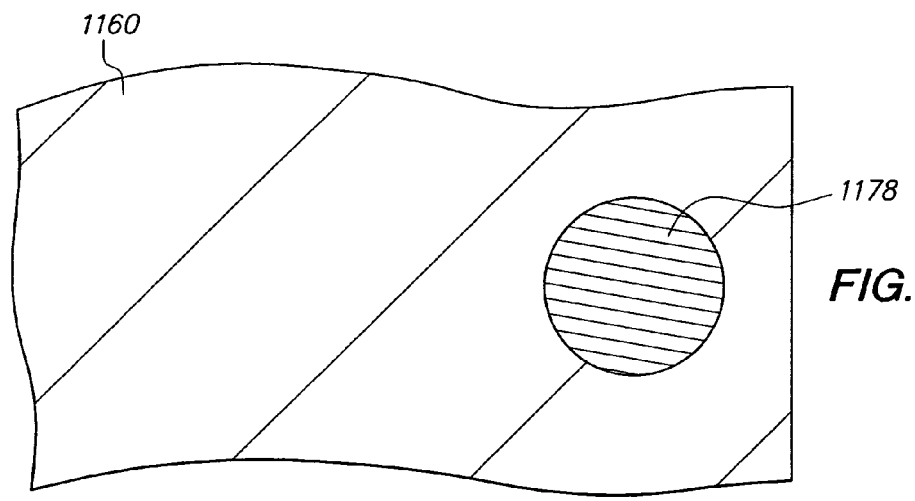
Figure 36C:
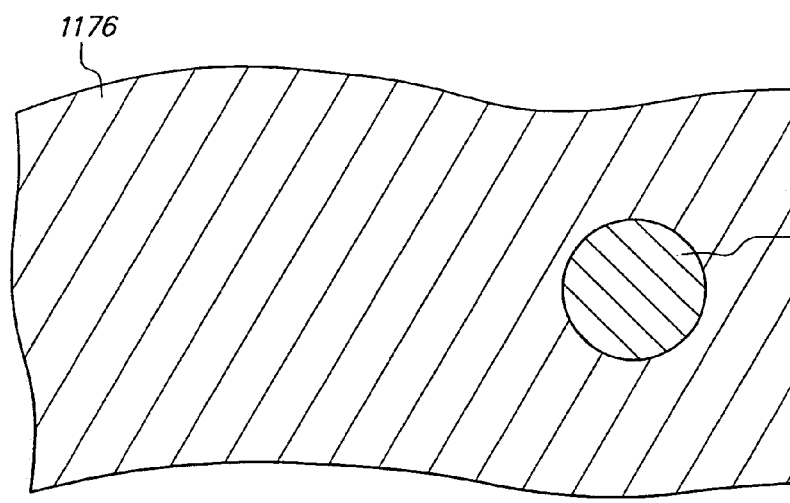

FIGS. 36A, 36B and 36C are cross-sectional, top and bottom views, respectively, of a semiconductor chip assembly in accordance with an eleventh embodiment of the present invention. In the eleventh embodiment, the solder mask extends beneath the chip. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1140 corresponds to routing line 140, etc.

Solder mask 1150 extends laterally beyond routing line 1140 in the direction away from metal particle 1156 and extends 2 microns (rather than 30 microns) upwardly beyond routing line 1140.

Adhesive 1154 is deposited on solder mask 1150 and does not contact routing line 1140. Thus, adhesive 1154 has a significantly smaller surface area than adhesive 154 but a slightly larger surface area than chip 1110.

Through-hole 1170 is formed through solder mask 1150 and adhesive 1154 in essentially the same manner as through-hole 170. Namely, a selective TEA CO$_2$ laser drills through and removes portions of solder mask 1150 and adhesive 1154, thereby exposing pad 1116. However, portions of solder mask 1150 and adhesive 1154 sandwiched between pad 1116 and routing line 1140 remain intact. Thus, through-hole 1170 is formed in and extends vertically through solder mask 1150 and adhesive 1154, is vertically aligned with and centered relative to and exposes pad 1116 and has a diameter of 70 microns.

Connection joint 1172 is formed through solder mask 1150 and adhesive 1154 in essentially the same manner as connection joint 172. Namely, connection joint 1172 is formed by a copper electroplating operation during which connection joint 1172 plates on routing line 1140, extends through solder mask 1150 and adhesive 1154 in through-hole 1170 and contacts pad 1116. Thus, connection joint 1172 extends vertically through solder mask 1150 and adhesive 1154 in through-hole 1170 and contacts and electrically connects pad 1116 and routing line 1140.

Semiconductor chip assembly 1198 includes chip 1110, routing line 1140, solder mask 1150, adhesive 1154, metal particle 1156, encapsulant 1160, connection joint 1172, insulative plug 1174, insulative base 1176 and solder terminal 1178.

Figure 37A:
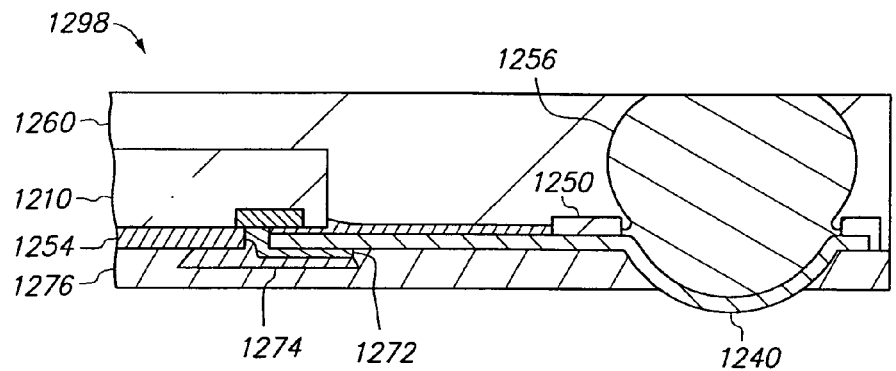
FIGS. 37A, 37B and 37C are cross-sectional, top and bottom views, respectively, of a semiconductor chip assembly in accordance with a twelfth embodiment of the present invention.
Figure 37B:
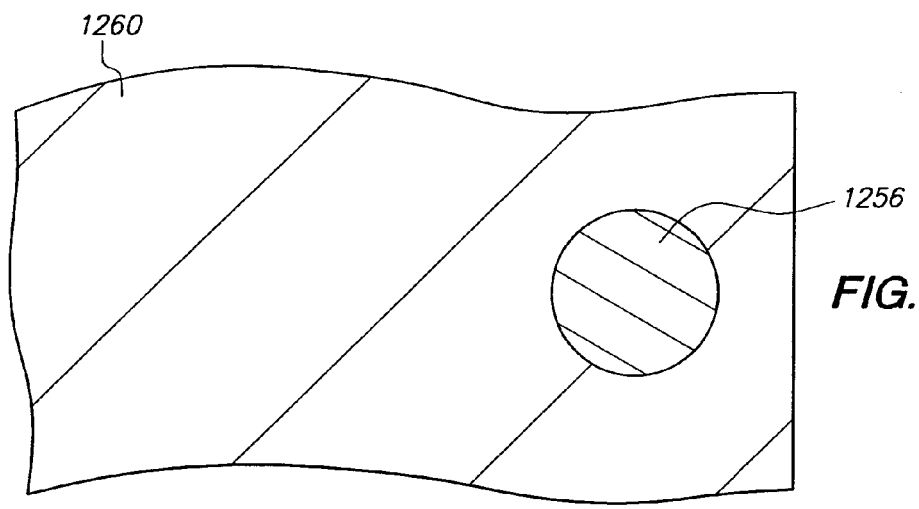
Figure 37C:
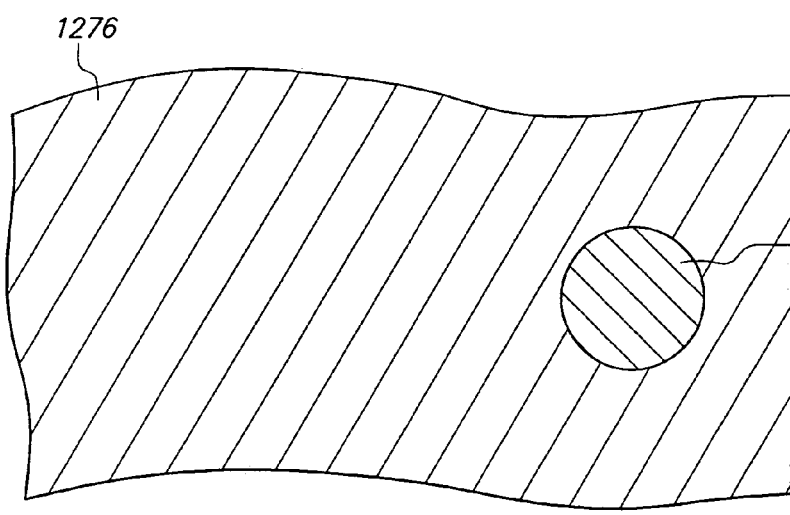

FIGS. 37A, 37B and 37C are cross-sectional, top and bottom views, respectively, of a semiconductor chip assembly in accordance with a twelfth embodiment of the present invention. In the twelfth embodiment, the solder terminal is omitted. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1240 corresponds to routing line 140, etc.

The solder terminal (corresponding to solder terminal 178) is omitted. Thus, metal particle 1256 remains exposed and is laterally aligned with encapsulant 1260 at the upwardly facing surface.

Semiconductor chip assembly 1298 includes chip 1210, routing line 1240, solder mask 1250, adhesive 1254, metal particle 1256, encapsulant 1260, connection joint 1272, insulative plug 1274 and insulative base 1276.

Figure 38A:
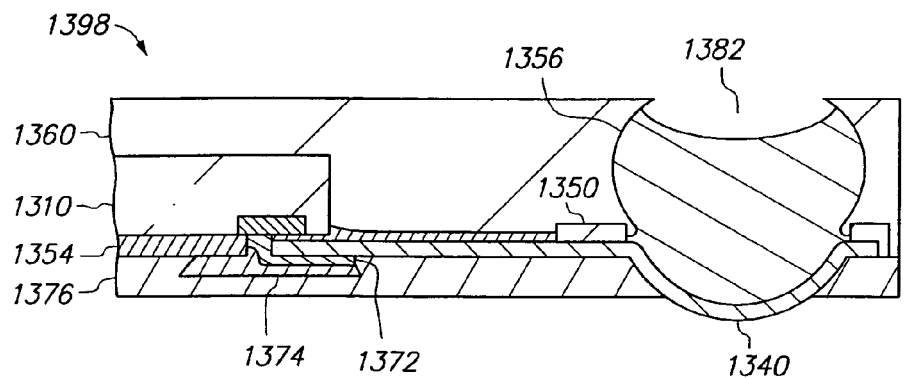
FIGS. 38A, 38B and 38C are cross-sectional, top and bottom views, respectively, of a semiconductor chip assembly in accordance with a thirteenth embodiment of the present invention.
Figure 38B:
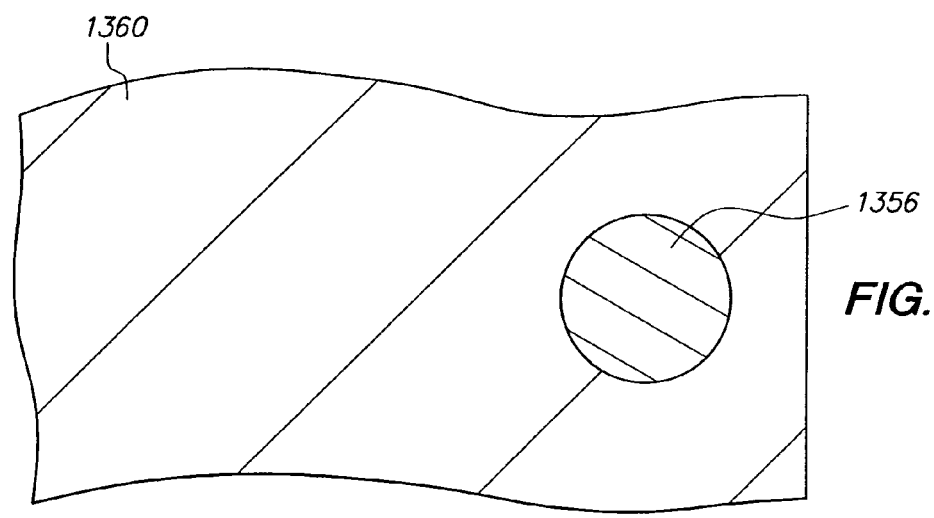
Figure 38C:
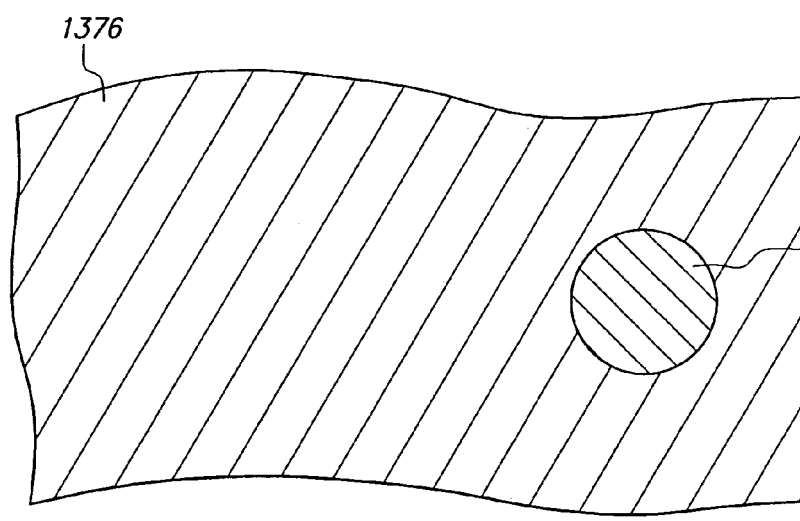

FIGS. 38A, 38B and 38C are cross-sectional, top and bottom views, respectively, of a semiconductor chip assembly in accordance with a thirteenth embodiment of the present invention. In the thirteenth embodiment, the metal particle is recessed relative to the encapsulant. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1340 corresponds to routing line 140, etc.

The solder terminal (corresponding to solder terminal 178) is omitted. Furthermore, after the protective mask (corresponding to protective mask 166) is removed, a blanket wet chemical etch is applied to metal particle 1356. For instance, the top spray nozzle can spray a front-side wet chemical etch on metal particle 1356 and encapsulant 1360 while the bottom spray nozzle is deactivated, or the structure can be dipped in the wet chemical etch before the lower portion of insulative base 1376 is removed. The wet chemical etch is highly selective of tin with respect to nickel, epoxy and the molding compound, and therefore, highly selective of metal particle 1356 with respect to routing line 1340, encapsulant 1360 and insulative base 1376. Therefore, no appreciable amount of routing line 1340, encapsulant 1360 or insulative base 1376 is removed.

The wet chemical etch etches partially into but not completely through metal particle 1356, thereby reducing the thickness of metal particle 1356 and receding metal particle 1356 relative to surface 1362 of encapsulant 1360. That is, the wet chemical etch removes an upper portion of metal particle 1356, thereby creating aperture 1382 that extends into encapsulant 1360 and exposes metal particle 1356. Aperture 1382 has a maximum depth of 75 microns relative to surface 1362 of encapsulant 1360. Furthermore, metal particle 1356 has an exposed upper surface with a concave, crater-like shape.

Thus, metal particle 1356 is recessed relative to encapsulant 1360, encapsulant 1360 continues to contact and not cover metal particle 1356, and aperture 1382 extends vertically into but not through encapsulant 1360, is disposed outside the periphery of chip 1310, is vertically aligned with and exposes metal particle 1356, exposes only metal particle 1356 and encapsulant 1360 and is spaced from routing line 1340, solder mask 1350 and adhesive 1354.

A suitable wet chemical etch can be provided by a solution containing 5% hydrochloric acid in ethanol. Although the solution is highly selective of tin with respect to silver and copper, and metal particle 1356 contains silver and copper, since metal particle 1356 contains primarily tin (96.5%) relative to silver (3.0%) and copper (0.5%), the wet chemical etch is highly selective of metal particle 1356.

The optimal etch time for exposing metal particle 1356 to the wet chemical etch in order to form metal particle 1356 with the desired dimensions can be established through trial and error.

Semiconductor chip assembly 1398 includes chip 1310, routing line 1340, solder mask 1350, adhesive 1354, metal particle 1356, encapsulant 1360, connection joint 1372, insulative plug 1374 and insulative base 1376.

Figure 39A:
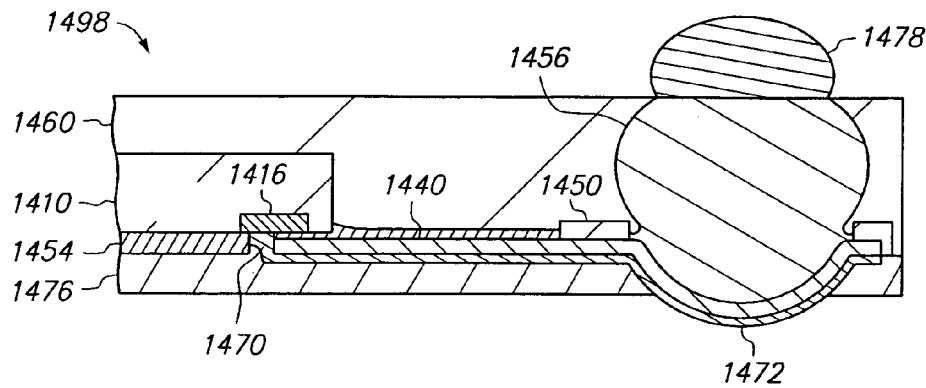
FIGS. 39A, 39B and 39C are cross-sectional, top and bottom views, respectively, of a semiconductor chip assembly in accordance with a fourteenth embodiment of the present invention.
Figure 39B:
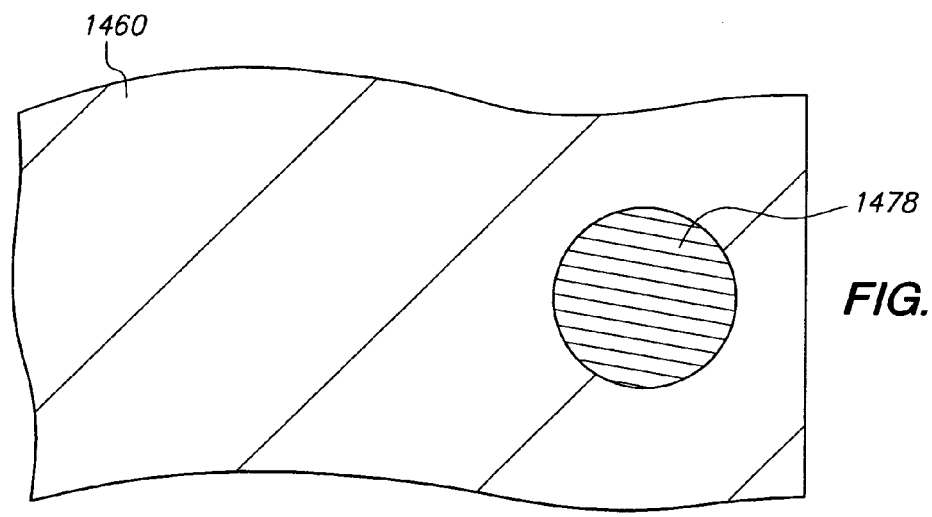
Figure 39C:
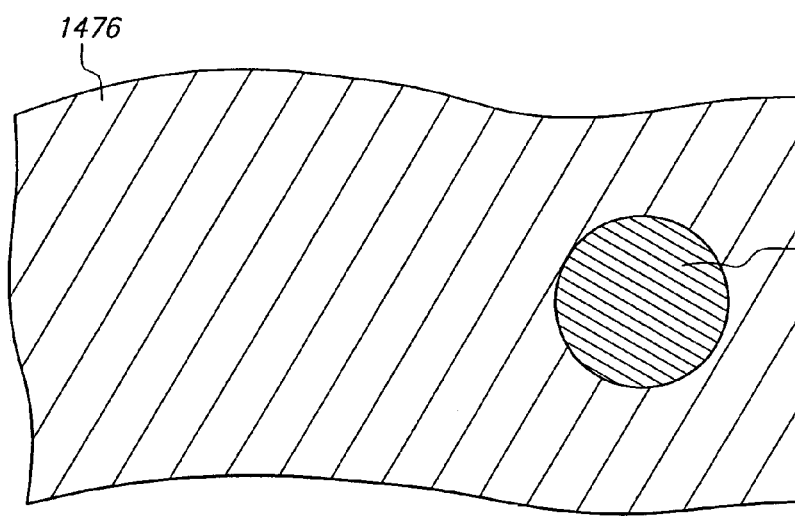

FIGS. 39A, 39B and 39C are cross-sectional, top and bottom views, respectively, of a semiconductor chip assembly in accordance with a fourteenth embodiment of the present invention. In the fourteenth embodiment, the connection joint is formed by electroless plating. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1440 corresponds to routing line 140, etc.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 1460 is formed.

Thereafter, connection joint 1472 is formed. Connection joint 1472 is composed of a nickel layer electrolessly plated on pad 1416 and routing line 1440 and a gold layer electrolessly plated on the nickel layer. In connection joint 1472, the nickel layer contacts and is sandwiched between pad 1416 and the gold layer and between routing line 1440 and the gold layer, and the gold layer is spaced and separated from pad 1416 and routing line 1440 and exposed. For convenience of illustration, the nickel and gold layers are shown as a single layer.

During the electroless plating operation, the structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pad 1416 and routing line 1440 each include an exposed nickel surface layer and therefore are catalytic to electroless nickel. Furthermore, solder mask 1450, adhesive 1454, encapsulant 1460 and the protective mask (corresponding to protective mask 166) are not catalytic to electroless nickel and therefore a plating mask is not necessary. As a result, connection joint 1472 begins to plate on pad 1416 and routing line 1440. Connection joint 1472 initially includes a first portion that begins to plate on pad 1416 and a second portion that begins to plate on routing line 1440, although the first and second connection joint portions do not contact one another and pad 1416 remains electrically isolated from routing line 1440. As the nickel electroless plating operation continues, and the connection joint portions continue to plate on pad 1416 and routing line 1440 and expand vertically in through-hole 1470 towards one another, the connection joint portions eventually contact one another inside through-hole 1470 and metallurgically merge into a single connection joint 1472 that contacts and electrically connects pad 1416 and routing line 1440.

Thereafter, the assembly is removed from the electroless nickel plating solution and briefly submerged in an electroless gold plating solution such as is MacDermid PLANAR™ at 70° C. Connection joint 1472 includes an exposed nickel surface layer and therefore is catalytic to electroless gold. Furthermore, solder mask 1450, adhesive 1454, encapsulant 1460 and the protective mask (corresponding to protective mask 166) are not catalytic to electroless gold and therefore a plating mask is not necessary. As a result, the gold deposits on the nickel surface layer. The gold electroless plating operation continues until the gold surface layer has the desired thickness. Thereafter, the structure is removed from the electroless gold plating solution and rinsed in distilled water.

Thereafter, insulative base 1476 is formed, and then the lower portion of insulative base 1476 is removed, thereby exposing connection joint 1472 (rather than routing line 1440).

Semiconductor chip assembly 1498 includes chip 1410, routing line 1440, solder mask 1450, adhesive 1454, metal particle 1456, encapsulant 1460, connection joint 1472, insulative base 1476 and solder terminal 1478.

Figure 40A:
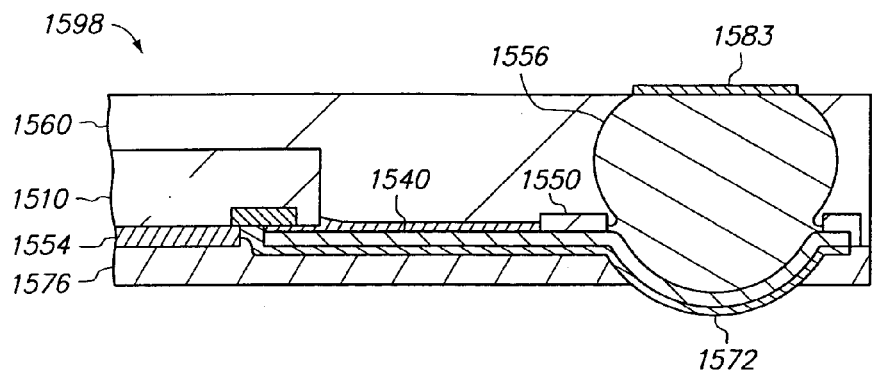
FIGS. 40A, 40B and 40C are cross-sectional, top and bottom views, respectively, of a semiconductor chip assembly in accordance with a fifteenth embodiment of the present invention.
Figure 40B:
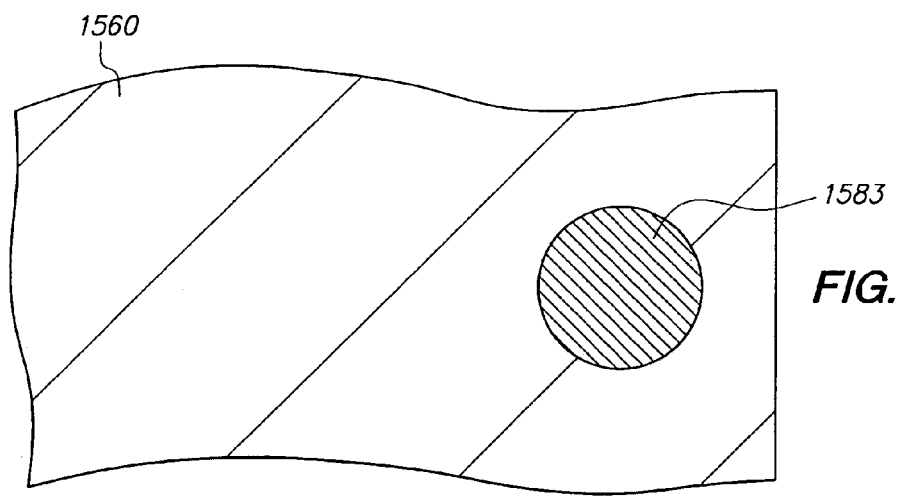
Figure 40C:
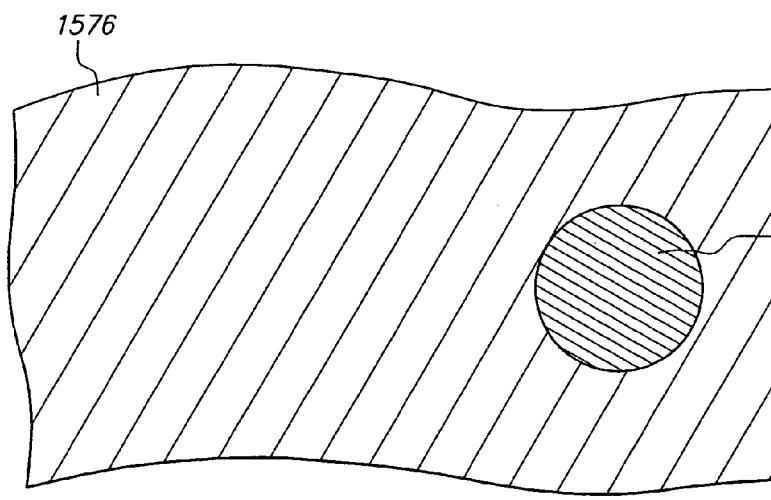

FIGS. 40A, 40B and 40C are cross-sectional, top and bottom views, respectively, of a semiconductor chip assembly in accordance with a fifteenth embodiment of the present invention. In the fifteenth embodiment, the connection joint is formed by electroless plating and a plated terminal is used. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chip 1510 corresponds to chip 110, routing line 1540 corresponds to routing line 140, etc.

The slot (corresponding to slot 132), opening (corresponding to opening 168) and insulative plug (corresponding to insulative plug 174) are omitted. Likewise, the metal base (corresponding to metal base 120) is etched once (rather than twice) and removed after encapsulant 1560 is formed.

Connection joint 1572 is formed by electroless plating in the same manner as connection joint 1472. Furthermore, the solder terminal (corresponding to solder terminal 178) is omitted, and the protective mask (corresponding to protective mask 166) is removed before the electroless plating operation begins.

During the nickel electroless plating operation, connection joint 1572 contacts routing line 1540 and changes the electrochemical potential of routing line 1540 by a small amount such as 0.2 volts. Likewise, since metal particle 1556 is electrically connected to routing line 1540, the electrochemical potential of metal particle 1556 also changes by a small amount such as 0.2 volts. As a result, metal particle 1556 becomes catalytic to electroless nickel and plated terminal 1583 plates on metal particle 1556.

In this manner, connection joint 1572 and plated terminal 1583 are simultaneously formed during a single electroless plating operation.

Plated terminal 1583 contacts and is electrically connected to metal particle 1556 extends upwardly beyond metal particle 1556 and encapsulant 1560. Thus, plated terminal 1583 provides a robust, permanent electrical connection to metal particle 1556 that protrudes upwardly from metal particle 1556 and is exposed. Plated terminal 1583 includes a buried nickel layer and a gold surface layer. The buried nickel layer provides the primary mechanical and electrical connection to metal particle 1556, and the gold surface layer provides a wettable surface to facilitate solder reflow. For convenience of illustration, the nickel and gold layers are shown as a single layer.

Semiconductor chip assembly 1598 includes chip 1510, routing line 1540, solder mask 1550, adhesive 1554, metal particle 1556, encapsulant 1560, connection joint 1572, insulative base 1576 and plated terminal 1583.

Figure 41A:
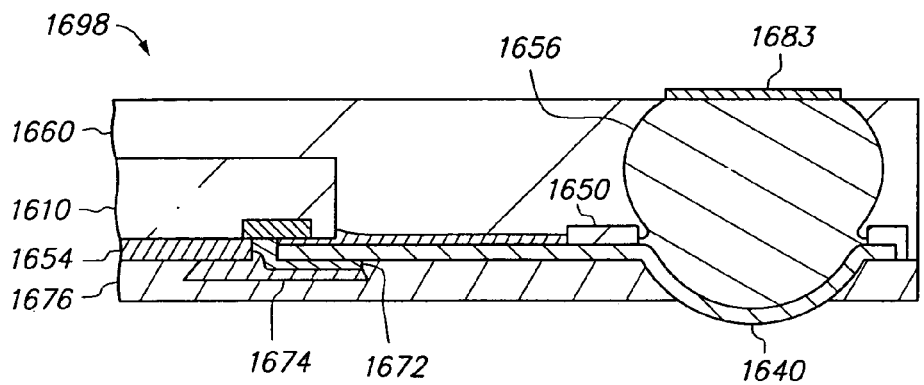
FIGS. 41A, 41B and 41C are cross-sectional, top and bottom views, respectively, of a semiconductor chip assembly in accordance with a sixteenth embodiment of the present invention.
Figure 41B:
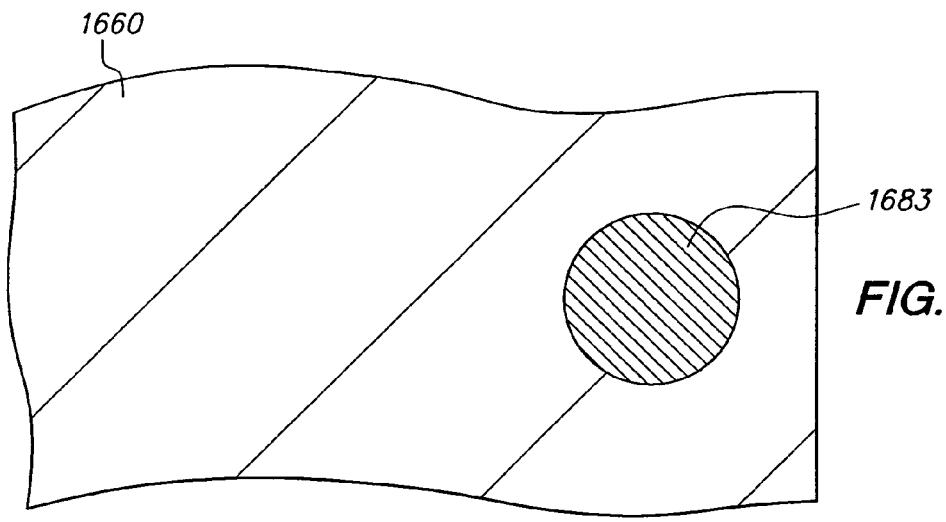
Figure 41C:
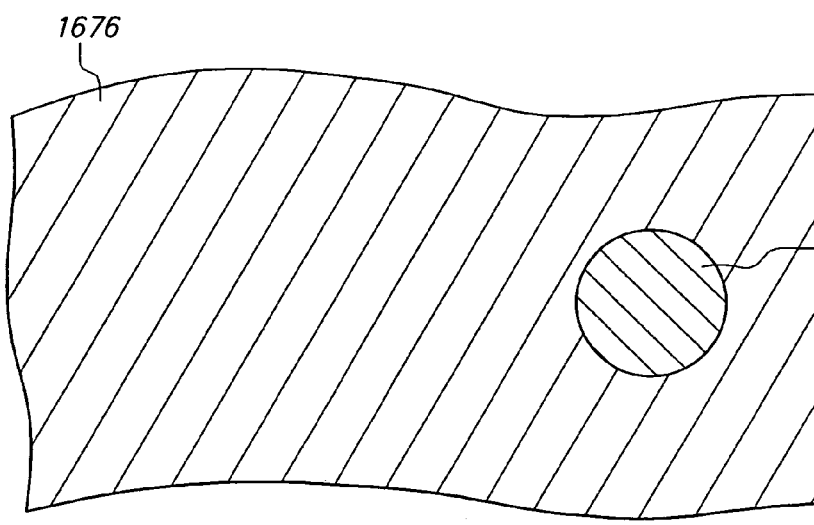

FIGS. 41A, 41B and 41C are cross-sectional, top and bottom views, respectively, of a semiconductor chip assembly in accordance with a sixteenth embodiment of the present invention. In the sixteenth embodiment, a plated terminal is used. For purposes of brevity, any description in the first embodiment is incorporated herein insofar as the same is applicable, and the same description need not be repeated. Likewise, elements of the sixteenth embodiment similar to those in the first embodiment have corresponding reference numerals indexed at sixteen-hundred rather than one-hundred. For instance, chip 1610 corresponds to chip 110, routing line 1640 corresponds to routing line 140, etc.

The solder terminal (corresponding to solder terminal 178) is omitted. Instead, after the protective mask (corresponding to protective mask 166) is removed, but before the lower portion of insulative base 1676 is removed, and while metal particle 1656 is exposed and routing line 1640 is not exposed, the structure is dipped in an activator solution such as dilute palladium chloride of approximately 0.1 grams of palladium chloride and 5 cubic centimeters of hydrochloric acid per liter of water to render metal particle 1656 catalytic to electroless nickel, then the structure is rinsed in distilled water to remove the palladium from encapsulant 1660 and insulative base 1676, and then plated terminal 1683 is electrolessly plated on metal particle 1656 in the same manner that plated terminal 1583 is electrolessly plated on metal particle 1556.

Thereafter, the lower portion of insulative base 1676 is removed, thereby exposing routing line 1640.

Semiconductor chip assembly 1698 includes chip 1610, routing line 1640, solder mask 1650, adhesive 1654, metal particle 1656, encapsulant 1660, connection joint 1672, insulative plug 1674, insulative base 1676 and plated terminal 1683.

Figure 42A:
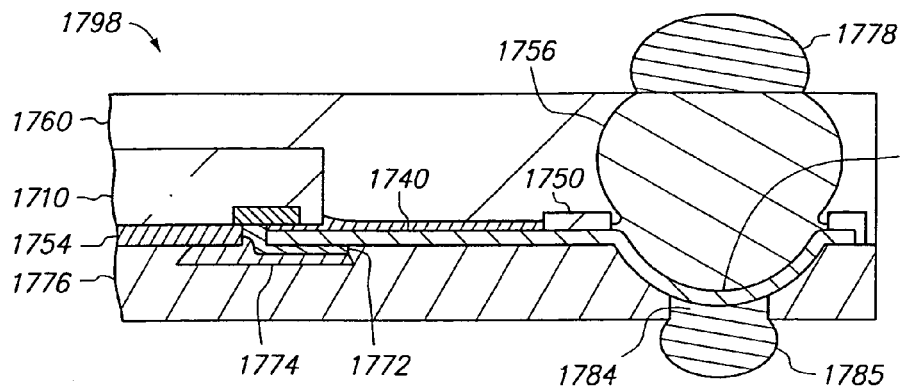
FIGS. 42A, 42B and 42C are cross-sectional, top and bottom views, respectively, of a semiconductor chip assembly in accordance with a seventeenth embodiment of the present invention.
Figure 42B:
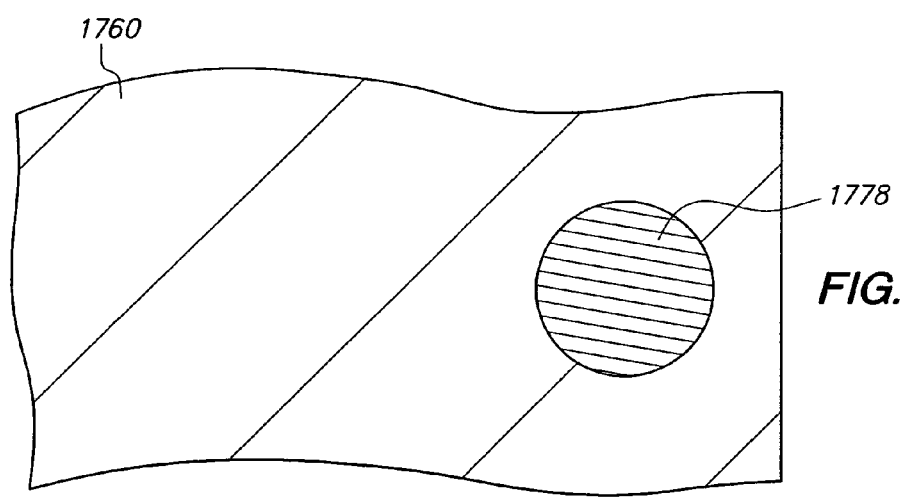
Figure 42C:
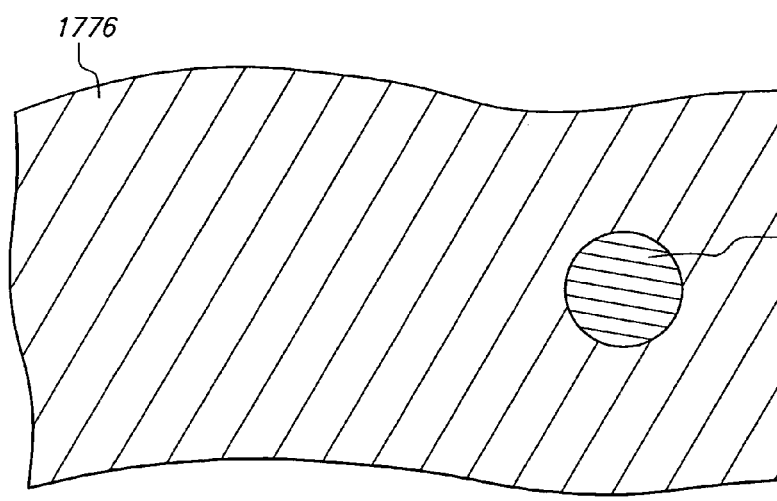

FIGS. 42A, 42B and 42C are cross-sectional, top and bottom views, respectively, of a semiconductor chip assembly in accordance with a seventeenth embodiment of the present invention. In the seventeenth embodiment, the conductive trace includes another solder terminal. For purposes of brevity, any description in the first embodiment is incorporated herein insofar as the same is applicable, and the same description need not be repeated. Likewise, elements of the seventeenth embodiment similar to those in the first embodiment have corresponding reference numerals indexed at seventeen-hundred rather than one-hundred. For instance, chip 1710 corresponds to chip 110, routing line 1740 corresponds to routing line 140, etc.

Routing line 1740 is formed as gold-nickel-copper-nickel-gold in the same manner as routing line 340.

Instead of removing the lower portion of insulative base 1776 by blanket plasma etching, a portion of insulative base 1776 is selectively removed to form opening 1784 that exposes bumped terminal 1742.

Opening 1784 is formed by applying a suitable etch that is highly selective of insulative base 1776 with respect to bumped terminal 1742. In this instance, a selective TEA $CO_2$ laser etch is applied using multiple laser direct writes. The laser is directed at bumped terminal 1742. The laser has a spot size of 150 microns. Furthermore, the laser direct writes are offset relative to one another yet overlap so that the laser scans a central portion of bumped terminal 1742 with a diameter of 200 microns. In this manner, the laser direct writes in combination are vertically aligned with and centered relative to bumped terminal 1742. As a result, the laser strikes bumped terminal 1742, a portion of insulative base 1776 that covers bumped terminal 1742, and ablates insulative base 1776.

The laser drills through and removes a portion of insulative base 1776 that covers bumped terminal 1742. However, a portion of insulative base 1776 that extends across the periphery of bumped terminal 1742 is outside the scope of the laser and remains intact. Thus, insulative base 1776 continues to contact but no longer covers bumped terminal 1742.

Thereafter, a brief cleaning step can be applied to remove oxides and debris that may be present on the exposed portion of bumped terminal 1742. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of bumped terminal 1742 without damaging the structure.

Opening 1784 is formed in and extends vertically into but not through insulative base 1776, is disposed outside the periphery of chip 1710, is vertically aligned with and exposes bumped terminal 1742, is spaced from solder mask 1750 and adhesive 1754 and has a diameter of 200 microns. Opening 1784 is formed without damaging or extending into bumped terminal 1742.

Opening 1784 may have a diameter that is slightly larger than 200 microns due to the beam angle of the laser, the thermal effects of the laser, and/or the isotropic nature of an oxygen plasma or wet chemical cleaning step. For convenience of explanation, this slight enlargement is ignored.

Thereafter, solder terminal 1785 is formed on bumped terminal 1742 in essentially the same manner that solder terminal 1778 is formed on metal particle 1756. In addition, solder terminal 1785 is reflowed at the same time that solder terminal 1778 is reflowed. Solder terminal 1785 contacts and is electrically connected to bumped terminal 1742, is spaced from metal particle 1756 and connection joint 1772, extends within and outside opening 1784, extends downwardly beyond bumped terminal 1742, encapsulant 1760 and insulative base 1776 and is exposed. Furthermore, solder terminals 1778 and 1785 are spaced and separated from one another and vertically aligned with one another.

Semiconductor chip assembly 1798 includes chip 1710, routing line 1740, solder mask 1750, adhesive 1754, metal particle 1756, encapsulant 1760, connection joint 1772, insulative plug 1774, insulative base 1776 and solder terminals 1778 and 1785.

Figure 43A:
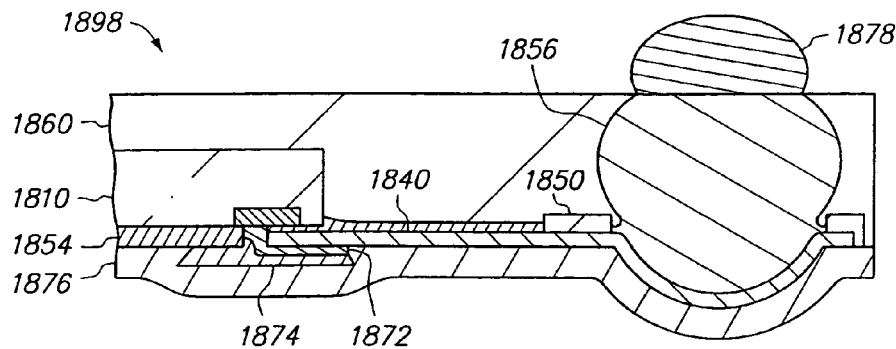
FIGS. 43A, 43B and 43C are cross-sectional, top and bottom views, respectively, of a semiconductor chip assembly in accordance with an eighteenth embodiment of the present invention.
Figure 43B:
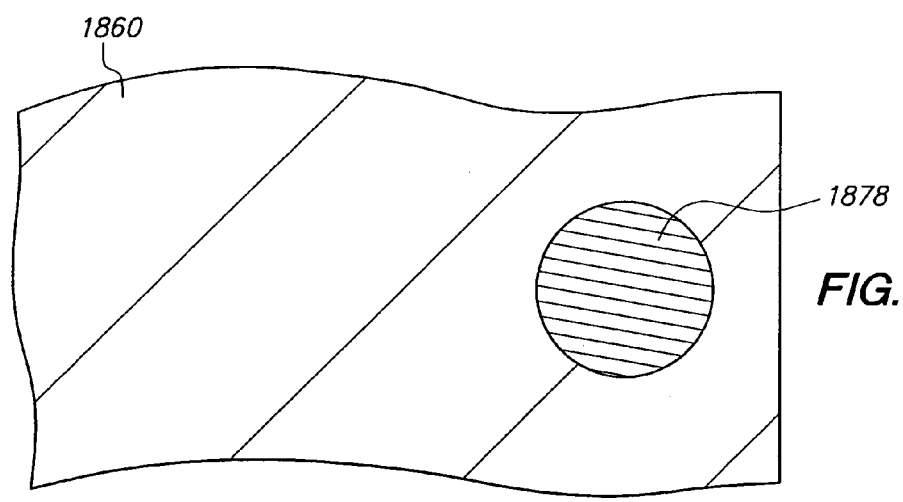
Figure 43C:
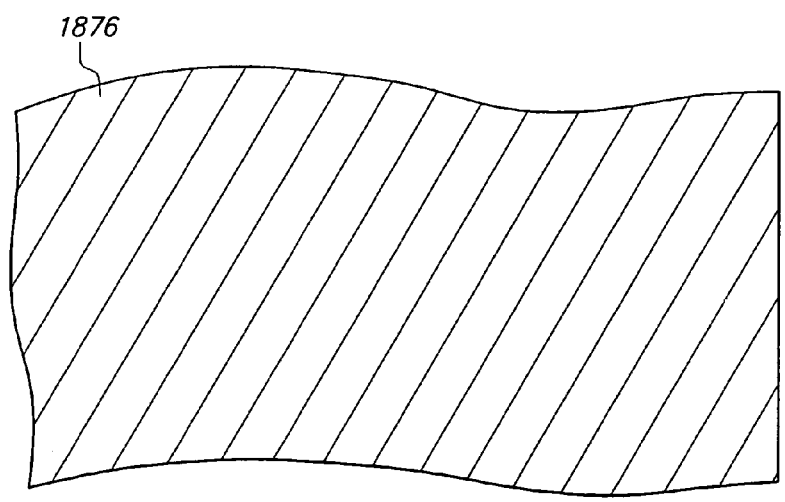

FIGS. 43A, 43B and 43C are cross-sectional, top and bottom views, respectively, of a semiconductor chip assembly in accordance with an eighteenth embodiment of the present invention. In the eighteenth embodiment, the insulative base covers the bumped terminal. For purposes of brevity, any description in the first embodiment is incorporated herein insofar as the same is applicable, and the same description need not be repeated. Likewise, elements of the eighteenth embodiment similar to those in the first embodiment have corresponding reference numerals indexed at eighteen-hundred rather than one-hundred. For instance, chip 1810 corresponds to chip 110, routing line 1840 corresponds to routing line 140, etc.

Insulative base 1876 is conformally deposited with a thickness of 50 microns (rather than 150 microns), and the lower portion of insulative base 1876 is not removed. Therefore, routing line 1840 does not extend through or downwardly beyond insulative base 1876 and is not exposed in the downward direction. Instead, insulative base 1876 extends downwardly beyond and covers routing line 1840.

Semiconductor chip assembly 1898 includes chip 1810, routing line 1840, solder mask 1850, adhesive 1854, metal particle 1856, encapsulant 1860, connection joint 1872, insulative plug 1874, insulative base 1876 and solder terminal 1878.

Figure 44A:
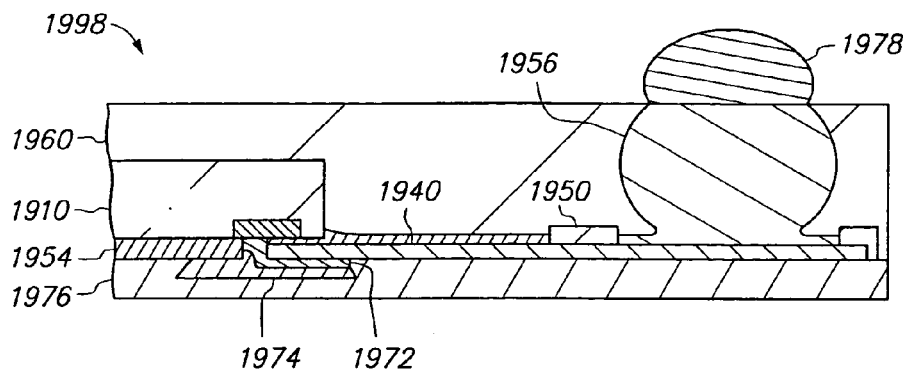
FIGS. 44A, 44B and 44C are cross-sectional, top and bottom views, respectively, of a semiconductor chip assembly in accordance with a nineteenth embodiment of the present invention.
Figure 44B:
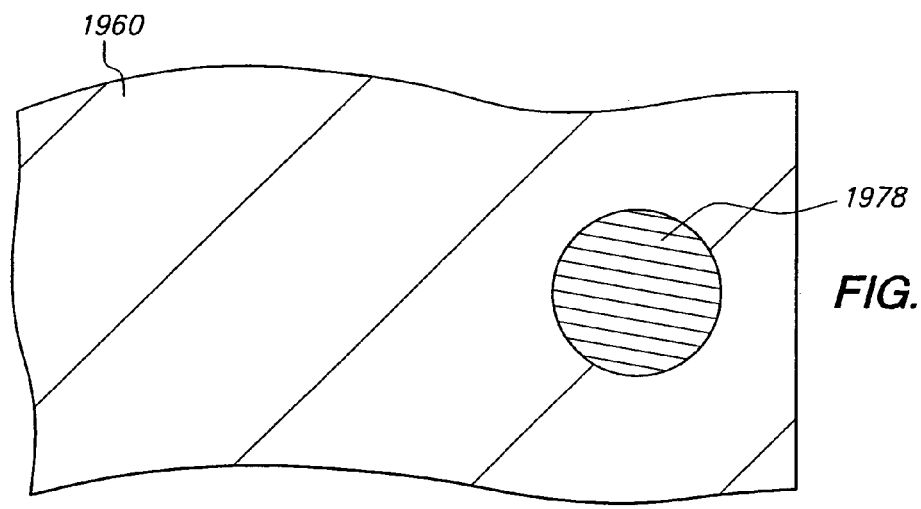
Figure 44C:
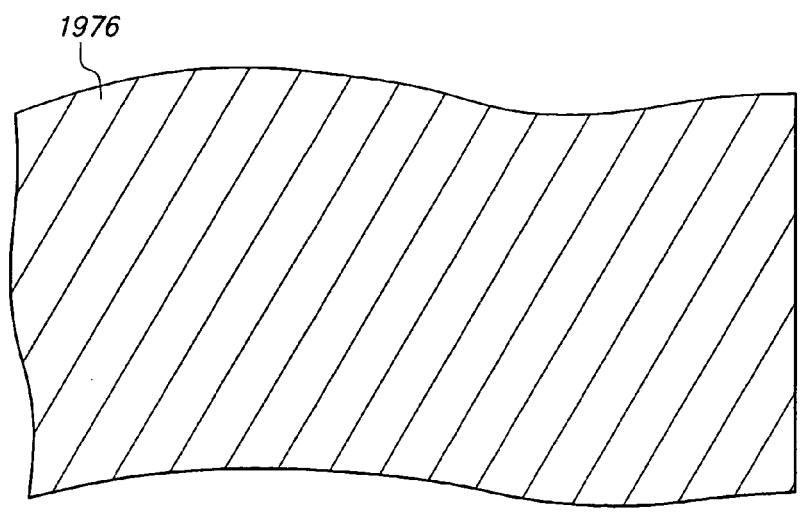

FIGS. 44A, 44B and 44C are cross-sectional, top and bottom views, respectively, of a semiconductor chip assembly in accordance with a nineteenth embodiment of the present invention. In the nineteenth embodiment, the routing line is bumpless. For purposes of brevity, any description in the first embodiment is incorporated herein insofar as the same is applicable, and the same description need not be repeated. Likewise, elements of the nineteenth embodiment similar to those in the first embodiment have corresponding reference numerals indexed at nineteen-hundred rather than one-hundred. For instance, chip 1910 corresponds to chip 110, routing line 1940 corresponds to routing line 140, etc.

Routing line 1940 is formed without a bumped terminal (corresponding to bumped terminal 142). Instead, routing line 1940 includes an enlarged circular region (similar to enlarged annular region 144 except that it is circular rather than annular). Routing line 1940 is manufactured without a bumped terminal by a slight adjustment to the manufacturing process. The photoresist layer (corresponding to photoresist layer 126) is patterned to cover rather than selectively expose the top surface (corresponding to surface 122) of the metal base (corresponding to metal base 120). As a result, the recess (corresponding to recess 130) is omitted, and therefore routing line 1940 does not extend into the metal base (corresponding to metal base 120) and includes an enlarged circular region that is flat and planar rather than a bumped terminal (corresponding to bumped terminal 142) and an enlarged annular region (corresponding to enlarged annular region 144). Likewise, since routing line 1940 excludes a bumped terminal, routing line 1940 does not include a cavity (corresponding to cavity 148).

Metal particle 1956 is deposited on routing line 1940 in essentially the same manner that metal particle 156 is deposited on routing line 140. However, since routing line 1940 lacks a cavity, routing line 1940 is disposed downwardly beyond metal particle 1956. Furthermore, metal particle 1956 initially has a diameter of 400 microns (rather than 500 microns).

Insulative base 1976 is formed with a thickness of 50 microns (rather than 150 microns), and the lower portion of insulative base 1976 is not removed. Therefore, routing line 1940 does not extend through or downwardly beyond insulative base 1976 and is not exposed in the downward direction. Instead, insulative base 1976 extends downwardly beyond and covers routing line 1940.

Semiconductor chip assembly 1998 includes chip 1910, routing line 1940, solder mask 1950, adhesive 1954, metal particle 1956, encapsulant 1960, connection joint 1972, insulative plug 1974, insulative base 1976 and solder terminal 1978.

Figure 45A:
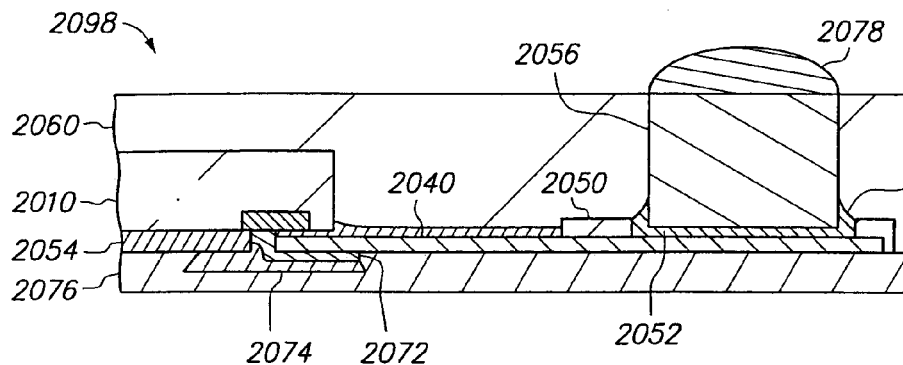
FIGS. 45A, 45B and 45C are cross-sectional, top and bottom views, respectively, of a semiconductor chip assembly in accordance with a twentieth embodiment of the present invention.
Figure 45B:
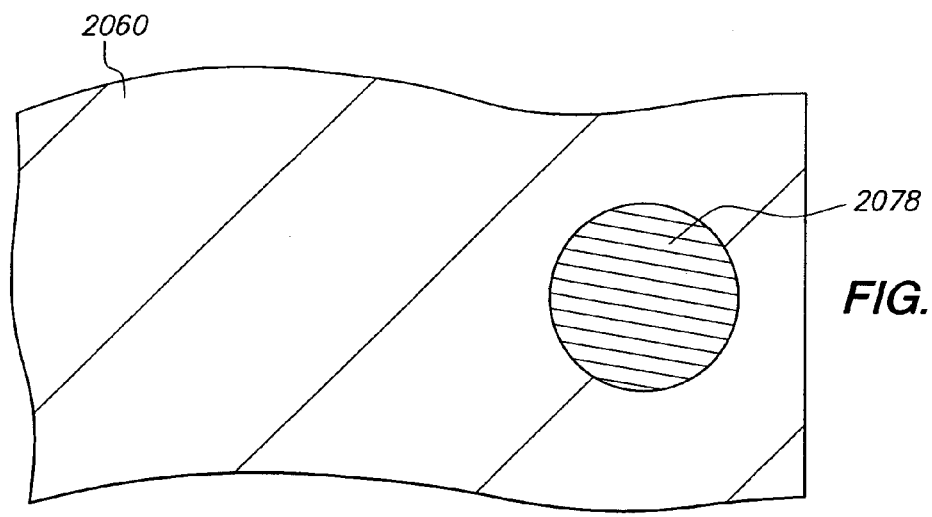
Figure 45C:
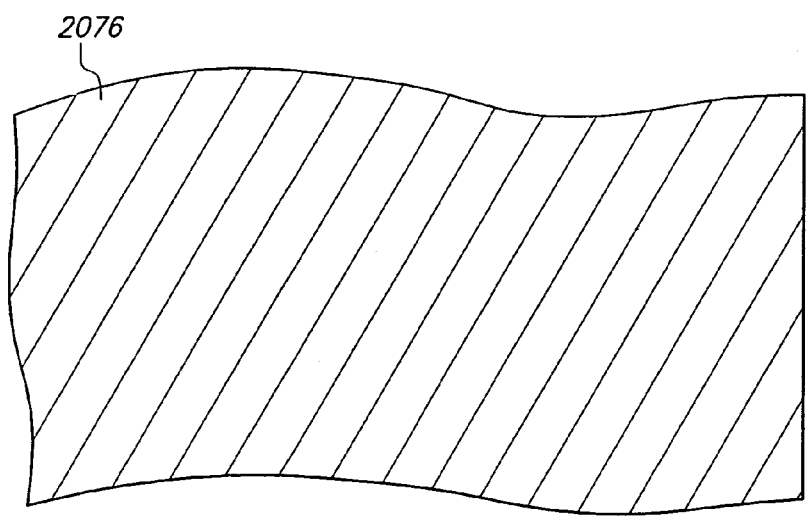

FIGS. 45A, 45B and 45C are cross-sectional, top and bottom views, respectively, of a semiconductor chip assembly in accordance with a twentieth embodiment of the present invention. In the twentieth embodiment, the metal particle is a wire segment. For purposes of brevity, any description in the first embodiment is incorporated herein insofar as the same is applicable, and the same description need not be repeated. Likewise, elements of the twentieth embodiment similar to those in the first embodiment have corresponding reference numerals indexed at two-thousand rather than one-hundred. For instance, chip 2010 corresponds to chip 110, routing line 2040 corresponds to routing line 140, etc.

Routing line 2040 is formed without a bumped terminal in the same manner as routing line 1940, except that routing line 2040 includes an enlarged circular region with a diameter of 600 microns (rather than 500 microns).

Solder mask 2050 contains opening 2052 with a diameter of 550 microns (rather than 400 microns) that is vertically aligned with and exposes the enlarged circular region of routing line 2040.

Metal particle 2056 is initially a copper wire segment that is sliced from a spool of copper wire. Metal particle 2056 initially has a cylindrical shape with a height of 800 microns and a diameter of 500 microns.

Conductive bond 2081 is initially solder paste that is deposited on routing line 2040 and into opening 2052.

Thereafter, a stencil (not shown) that is 100 microns thick and includes a drilled hole with a diameter of 550 microns is positioned over solder mask 2050 such that the drilled hole is vertically aligned with opening 2052, then metal particle 2056 is placed on the side of the stencil that faces away from solder mask 2050, then the stencil is vibrated so that metal particle 2056 (without a flux surface coating) falls into and extends through the drilled hole, extends into opening 2052 and is deposited on conductive bond 2081 (still solder paste). Metal particle 2056 weakly adheres to routing line 2040 due to the solder paste.

Thereafter, heat is applied to reflow conductive bond 2081, and then the heat is removed and conductive bond 2081 cools and solidifies into a hardened solder bond that contacts and mechanically attaches and electrically connects routing line 2040 and metal particle 2056.

Thereafter, encapsulant 2060 is formed with a thickness of 1000 microns (rather than 500 microns) so that encapsulant 2060 covers metal particle 2056 (with a height of 800 microns), and then the grinding is applied, thereby reducing the thickness of metal particle 2056 and encapsulant 2060 and exposing metal particle 2056, which retains a cylindrical shape.

Insulative base 2076 is formed in the same manner as insulative base 1976, and the lower portion of insulative base 2076 is not removed.

Semiconductor chip assembly 2098 includes chip 2010, routing line 2040, solder mask 2050, adhesive 2054, metal particle 2056, encapsulant 2060, connection joint 2072, insulative plug 2074, insulative base 2076, solder terminal 2078 and conductive bond 2081.

Figure 46A:
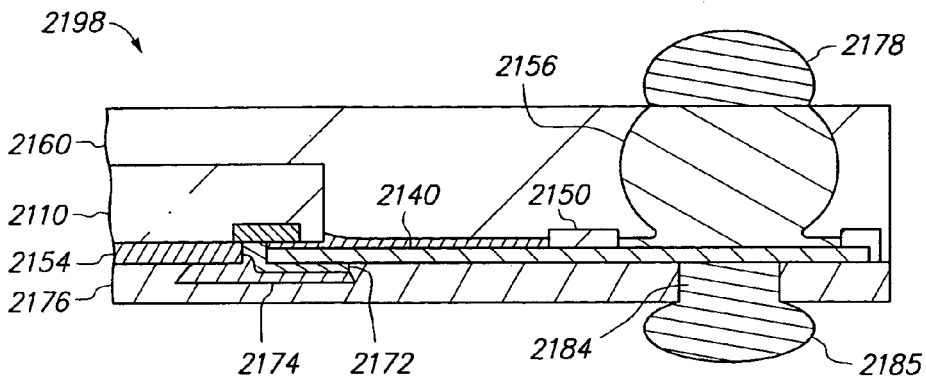
FIGS. 46A, 46B and 46C are cross-sectional, top and bottom views, respectively, of a semiconductor chip assembly in accordance with a twenty-first embodiment of the present invention.
Figure 46B:
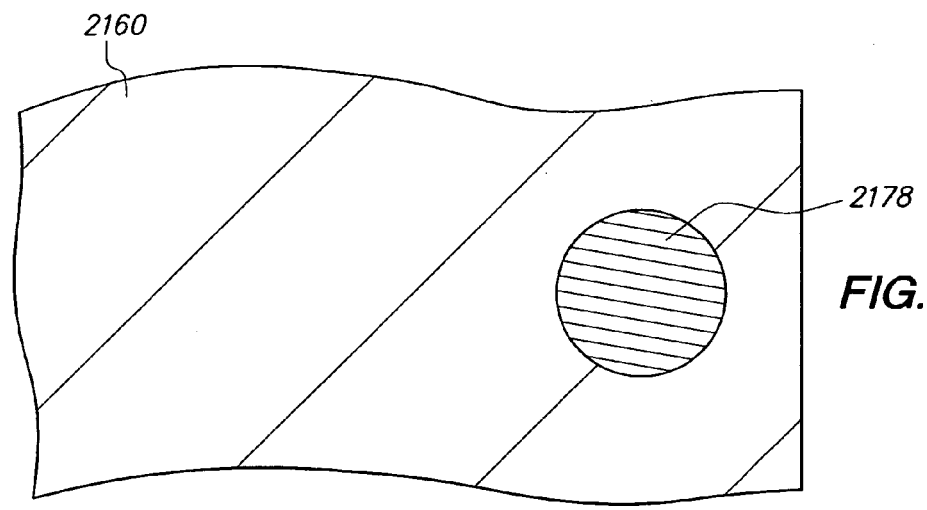
Figure 46C:
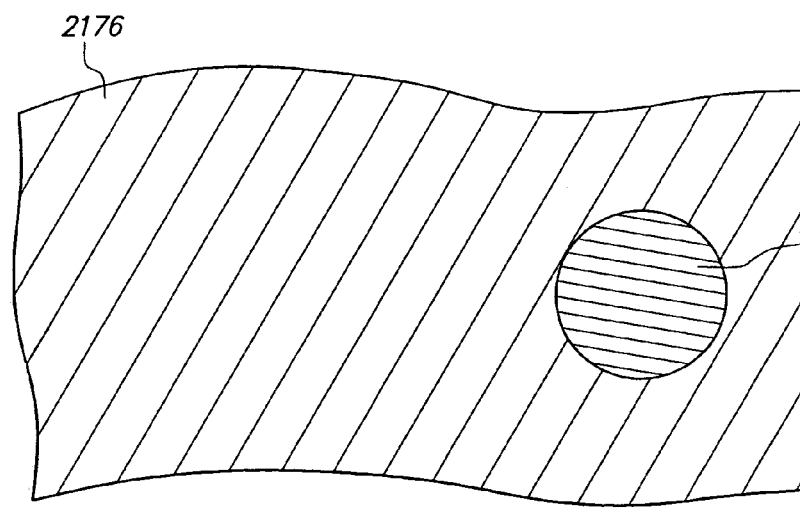

FIGS. 46A, 46B and 46C are cross-sectional, top and bottom views, respectively, of a semiconductor chip assembly in accordance with a twenty-first embodiment of the present invention. In the twenty-first embodiment, the conductive trace includes another solder terminal and the routing line is bumpless. For purposes of brevity, any description in the first embodiment is incorporated herein insofar as the same is applicable, and the same description need not be repeated. Likewise, elements of the twenty-first embodiment similar to those in the first embodiment have corresponding reference numerals indexed at twenty-one-hundred rather than one-hundred. For instance, chip 2110 corresponds to chip 110, routing line 2140 corresponds to routing line 140, etc.

Routing line 2140 is formed as gold-nickel-copper-nickel-gold in the same manner as routing line 340 and is formed without a bumped terminal in the same manner as routing line 1940. Furthermore, metal particle 2156 initially has a diameter of 400 microns (rather than 500 microns).

Insulative base 2176 is formed in the same manner as insulative base 1776. Instead of removing the lower portion of insulative base 2176 by blanket plasma etching, a portion of insulative base 2176 is selectively removed to form opening 2184 that extends through insulative base 2176 and exposes routing line 2140. Opening 2184 is formed in the same manner as opening 1784.

Thereafter, solder terminal 2185 is formed on routing line 2140 in the same manner that solder terminal 1785 is formed on routing line 1740. Furthermore, solder terminals 2178 and 2185 are vertically aligned with one another.

Semiconductor chip assembly 2198 includes chip 2110, routing line 2140, solder mask 2150, adhesive 2154, metal particle 2156, encapsulant 2160, connection joint 2172, insulative plug 2174, insulative base 2176 and solder terminals 2178 and 2185.

Figure 47A:
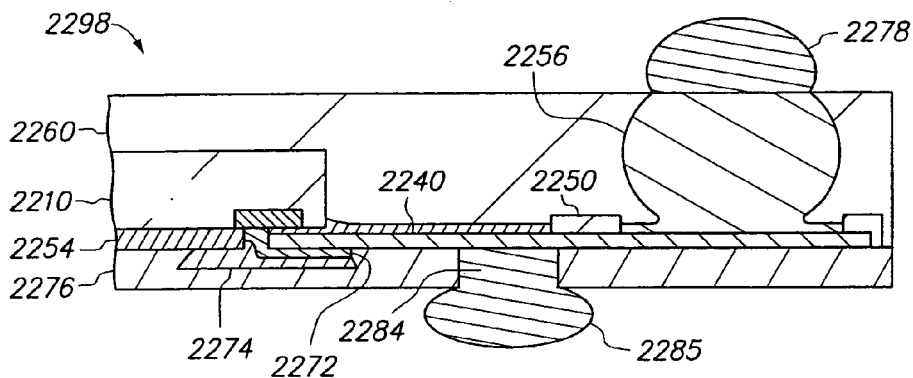
FIGS. 47A, 47B and 47C are cross-sectional, top and bottom views, respectively, of a semiconductor chip assembly in accordance with a twenty-second embodiment of is the present invention.
Figure 47B:
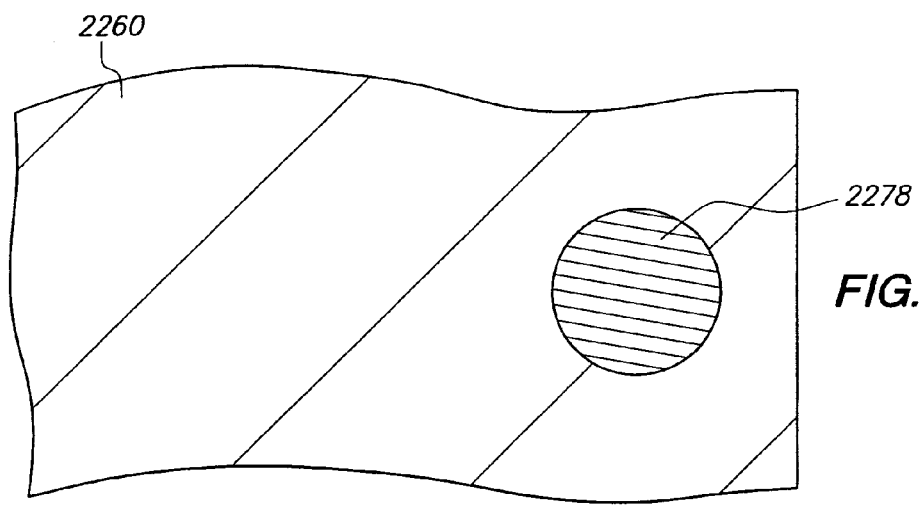
Figure 47C:
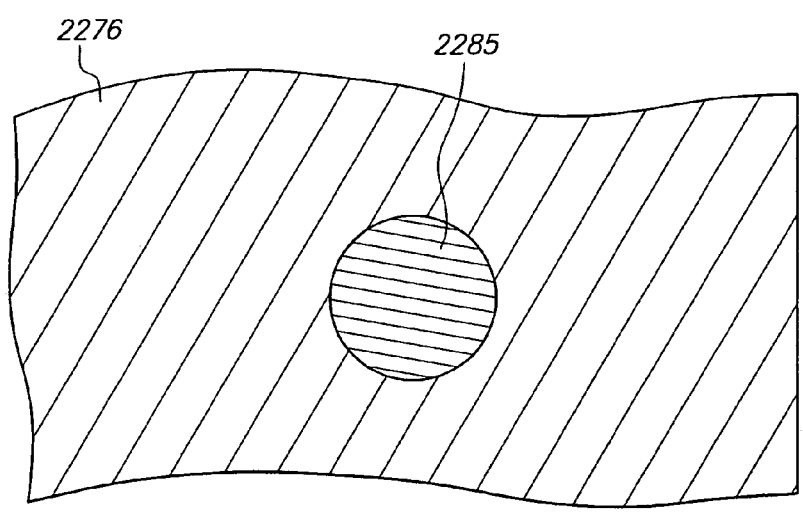

FIGS. 47A, 47B and 47C are cross-sectional, top and bottom views, respectively, of a semiconductor chip assembly in accordance with a twenty-second embodiment of the present invention. In the twenty-second embodiment, the conductive trace includes another solder terminal and the routing line is bumpless. For purposes of brevity, any description in the first embodiment is incorporated herein insofar as the same is applicable, and the same description need not be repeated. Likewise, elements of the twenty-second embodiment similar to those in the first embodiment have corresponding reference numerals indexed at twenty-two-hundred rather than one-hundred. For instance, chip 2210 corresponds to chip 110, routing line 2240 corresponds to routing line 140, etc.

Routing line 2240 is formed as gold-nickel-copper-nickel-gold in the same manner as routing line 340, is formed without a bumped terminal in the same manner as routing line 1940 and includes a second enlarged circular portion positioned laterally between chip 2210 and metal particle 2256. Furthermore, metal particle 2256 initially has a diameter of 400 microns (rather than 500 microns).

Insulative base 2276 is formed in the same manner as insulative base 1776. Instead of removing the lower portion of insulative base 2276 by blanket plasma etching, a portion of insulative base 2276 is selectively removed to form opening 2284 that extends through insulative base 2276 and exposes routing line 2240. Opening 2284 is formed in the same manner as opening 1784 except that opening 2284 is vertically aligned with the second enlarged circular portion of routing line 2240, and therefore, is positioned laterally between chip 2210 and metal particle 2256.

Thereafter, solder terminal 2285 is formed on routing line 2240 in the same manner that solder terminal 1785 is formed on routing line 1740 except that solder terminal 2285 is positioned laterally between chip 2210 and metal particle 2256. Thus, solder terminals 2278 and 2285 are laterally offset from (and not vertically aligned with) one another.

Semiconductor chip assembly 2298 includes chip 2210, routing line 2240, solder mask 2250, adhesive 2254, metal particle 2256, encapsulant 2260, connection joint 2272, insulative plug 2274, insulative base 2276 and solder terminals 2278 and 2285.

Figure 48A:
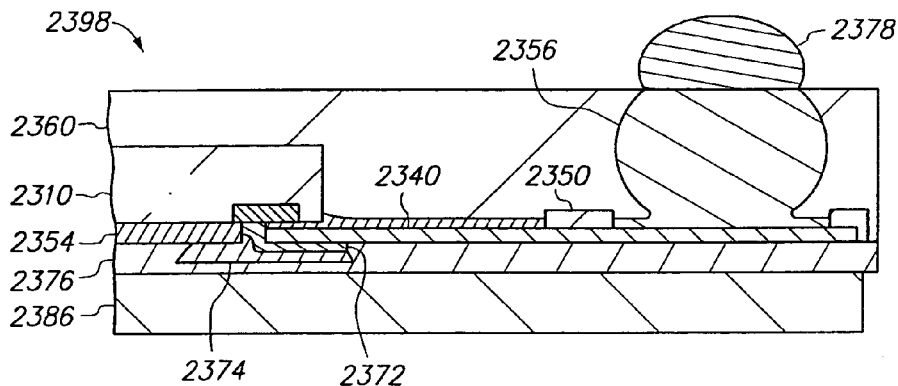
FIGS. 48A, 48B and 48C are cross-sectional, top and bottom views, respectively, of a semiconductor chip assembly in accordance with a twenty-third embodiment of the present invention.
Figure 48B:
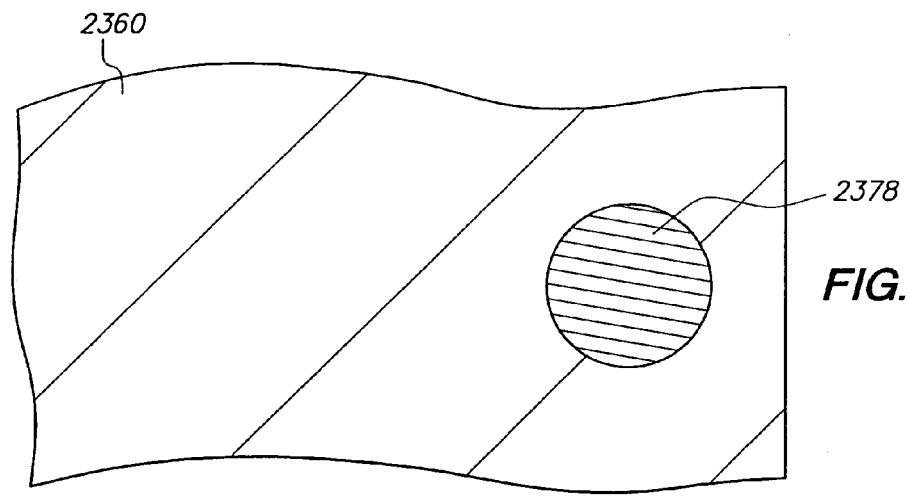
Figure 48C:
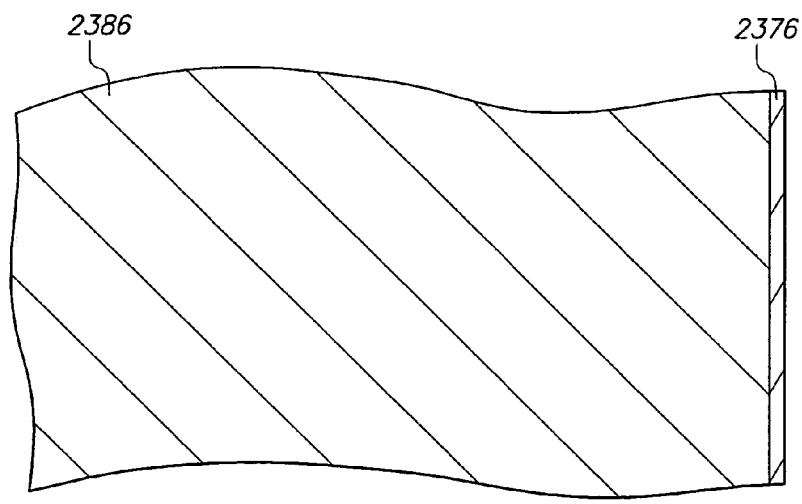

FIGS. 48A, 48B and 48C are cross-sectional, top and bottom views, respectively, of a semiconductor chip assembly in accordance with a twenty-third embodiment of the present invention. In the twenty-third embodiment, the assembly includes a heat sink. For purposes of brevity, any description in the first embodiment is incorporated herein insofar as the same is applicable, and the same description need not be repeated. Likewise, elements of the twenty-third embodiment similar to those in the first embodiment have corresponding reference numerals indexed at twenty-three-hundred rather than one-hundred. For instance, chip 2310 corresponds to chip 110, routing line 2340 corresponds to routing line 140, etc.

Routing line 2340 is formed without a bumped terminal in the same manner as routing line 1940, and metal particle 2356 initially has a diameter of 400 microns.

Insulative plug 2374 is formed with a thickness of 15 microns (rather than 30 microns), insulative base 2376 is formed with a thickness of 25 microns (rather than 150 microns), and the lower portion of insulative base 2376 is not removed. Furthermore, insulative plug 2374 and insulative base 2376 are a high thermal conductivity adhesive such as Hysol QMI 536HT.

Heat sink 2386 is a copper plate with a thickness of 150 microns covered by a nickel coating with a thickness of 2 microns to reduce corrosion. For convenience of illustration, the copper plate and the nickel coating are shown as a single layer.

Insulative base 2376 is initially a liquid resin (A stage) such as polyamic acid that is deposited on routing line 2340, solder mask 2350, adhesive 2354, encapsulant 2360 and insulative plug 2374 using stencil printing. Thereafter, the structure is placed in an oven and insulative base 2376 is heated to a relatively low temperature such as 100° C. As a result, insulative base 2376 is partially polymerized (B stage) and forms a gel but is not fully cured. Thereafter, heat sink 2386 is placed on insulative base 2376, and insulative base 2376 contacts and is sandwiched between routing line 2340 and heat sink 2386, between solder mask 2350 and heat sink 2386, between adhesive 2354 and heat sink 2386, between encapsulant 2360 and heat sink 2386, and between insulative plug 2374 and heat sink 2386 while insulative base 2376 is a gel. As a result, insulative base 2376 provides a loose mechanical bond between routing line 2340 and heat sink 2386, between solder mask 2350 and heat sink 2386, between adhesive 2354 and heat sink 2386, between encapsulant 2360 and heat sink 2386, and between insulative plug 2374 and heat sink 2386. Chip 2310 and heat sink 2386 are positioned relative to one another so that chip 2310 is disposed within the periphery of heat sink 2386. Chip 2310 and heat sink 2386 can be aligned using an automated pattern recognition system.

Thereafter, the structure is placed in an oven and insulative base 2376 is fully cured (C stage) at relatively low temperature in the range of 200 to 250° C. to form a solid adhesive insulative thermosetting polyimide layer that mechanically attaches heat sink 2386 to the structure.

Thereafter, encapsulant 2360 and insulative base 2376 are cut with an excise blade to singulate the assembly from other assemblies.

Heat sink 2386 is spaced and separated from, electrically isolated from and overlapped by chip 2310, routing line 2340, solder mask 2350, adhesive 2354, metal particle 2356, encapsulant 2360, connection joint 2372, insulative plug 2374 and solder terminal 2378, and is disposed downwardly beyond chip 2310, routing line 2340, solder mask 2350, adhesive 2354, metal particle 2356, encapsulant 2360, connection joint 2372, insulative plug 2374, insulative base 2376 and solder terminal 2378.

Semiconductor chip assembly 2398 includes chip 2310, routing line 2340, solder mask 2350, adhesive 2354, metal particle 2356, encapsulant 2360, connection joint 2372, insulative plug 2374, insulative base 2376, solder terminal 2378 and heat sink 2386.

Figure 49A:
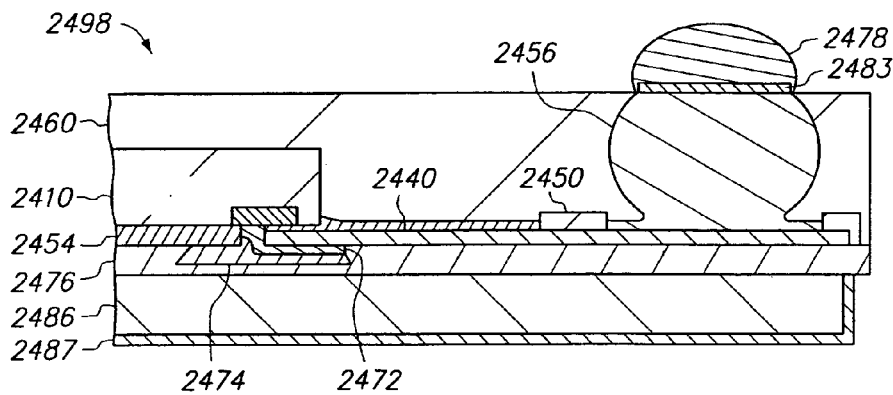
FIGS. 49A, 49B and 49C are cross-sectional, top and bottom views, respectively, of a semiconductor chip assembly in accordance with a twenty-fourth embodiment of the present invention.
Figure 49B:
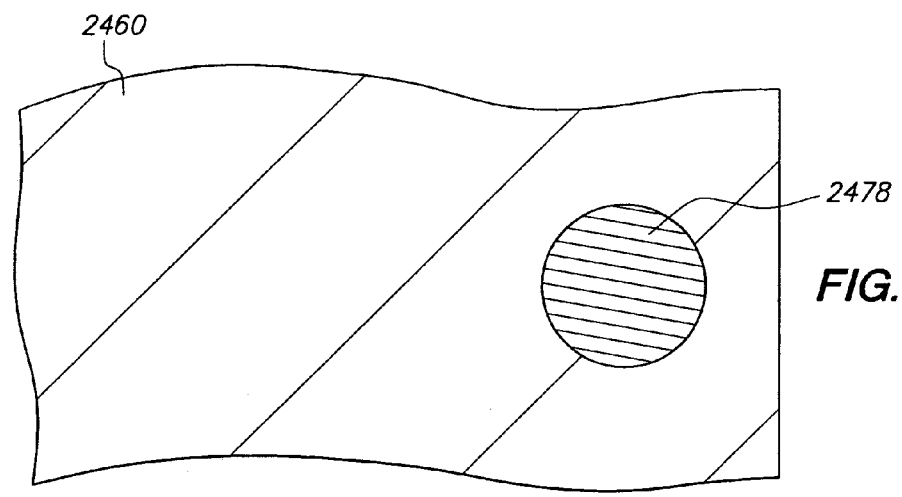
Figure 49C:
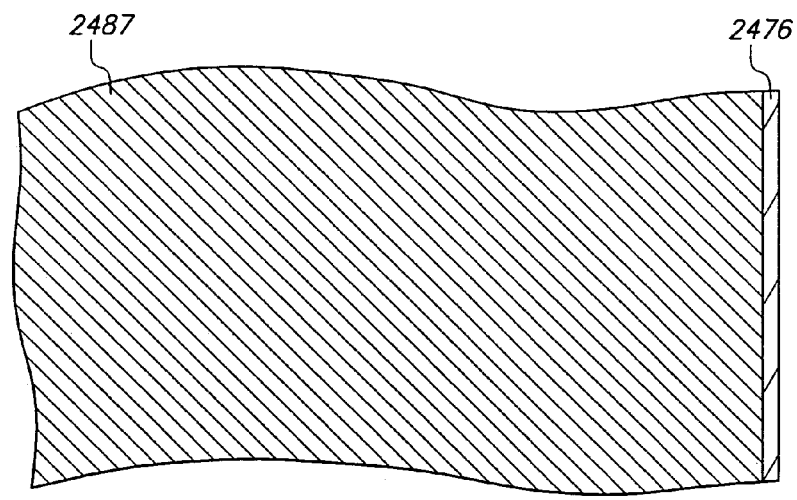

FIGS. 49A, 49B and 49C are cross-sectional, top and bottom views, respectively, of a semiconductor chip assembly in accordance with a twenty-fourth embodiment of the present invention. In the twenty-fourth embodiment, the assembly includes a heat sink. For purposes of brevity, any description in the first embodiment is incorporated herein insofar as the same is applicable, and the same description need not be repeated. Likewise, elements of the twenty-fourth embodiment similar to those in the first embodiment have corresponding reference numerals indexed at twenty-four-is hundred rather than one-hundred. For instance, chip 2410 corresponds to chip 110, routing line 2440 corresponds to routing line 140, etc.

Routing line 2440, metal particle 2456, insulative plug 2474, insulative base 2476 and heat sink 2486 are formed in the same manner as routing line 2340, metal particle 2356, insulative plug 2374, insulative base 2376 and heat sink 2386, respectively, except that heat sink 2486 is solely a copper plate (without the nickel coating).

After the protective mask (corresponding to protective mask 166) is removed, and while metal particle 2456 is exposed, the structure is dipped in an activator solution such as dilute palladium chloride of approximately 0.1 grams of palladium chloride and 5 cubic centimeters of hydrochloric acid per liter of water to render metal particle 2456 and heat sink 2486 catalytic to electroless nickel, then the structure is rinsed in distilled water to remove the palladium from encapsulant 2460, and then plated terminal 2483 and metallic coating 2487 are electrolessly plated on metal particle 2456 and heat sink 2486, respectively, in the same manner that plated terminal 1583 is electrolessly plated on metal particle 1556.

Thereafter, solder terminal 2478 is formed on plated terminal 2483, and then encapsulant 2460 and insulative base 2476 are cut with an excise blade to singulate the assembly from other assemblies.

Semiconductor chip assembly 2498 includes chip 2410, routing line 2440, solder mask 2450, adhesive 2454, metal particle 2456, encapsulant 2460, connection joint 2472, insulative plug 2474, insulative base 2476, solder terminal 2478, plated terminal 2483, heat sink 2486 and metallic coating 2487.

Figure 50A:
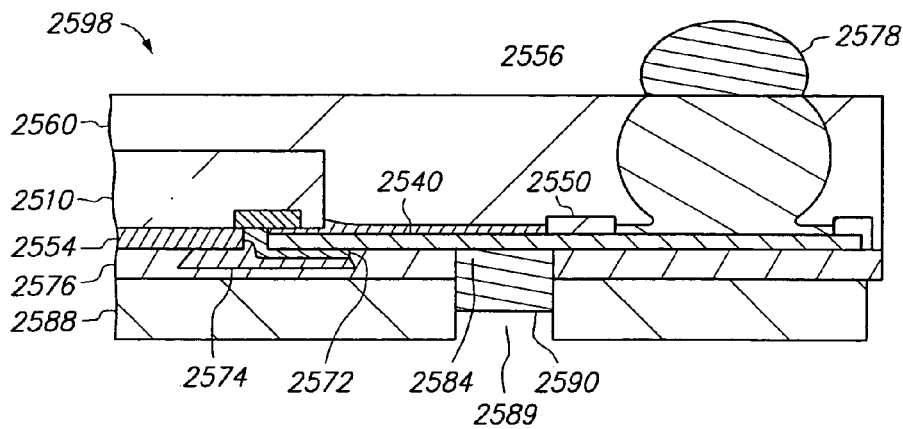
FIGS. 50A, 50B and 50C are cross-sectional, top and bottom views, respectively, of a semiconductor chip assembly in accordance with a twenty-fifth embodiment of the present invention.
Figure 50B:
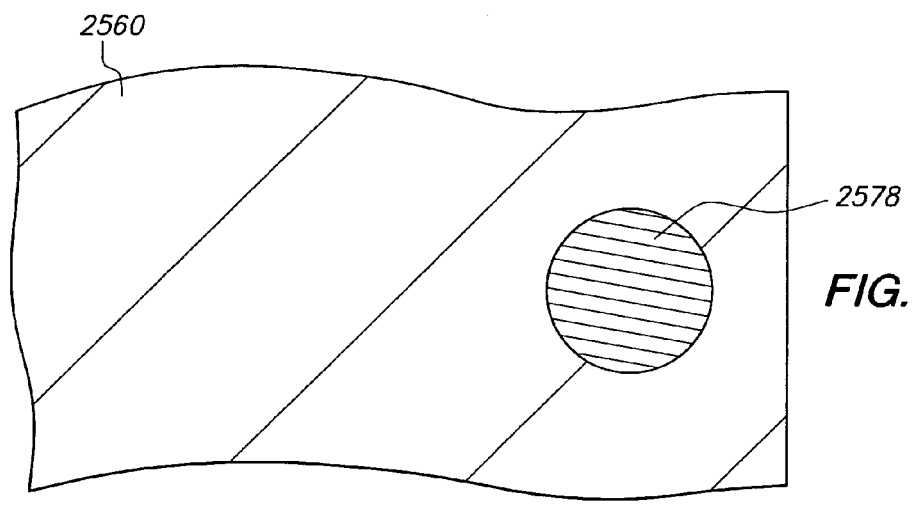
Figure 50C:
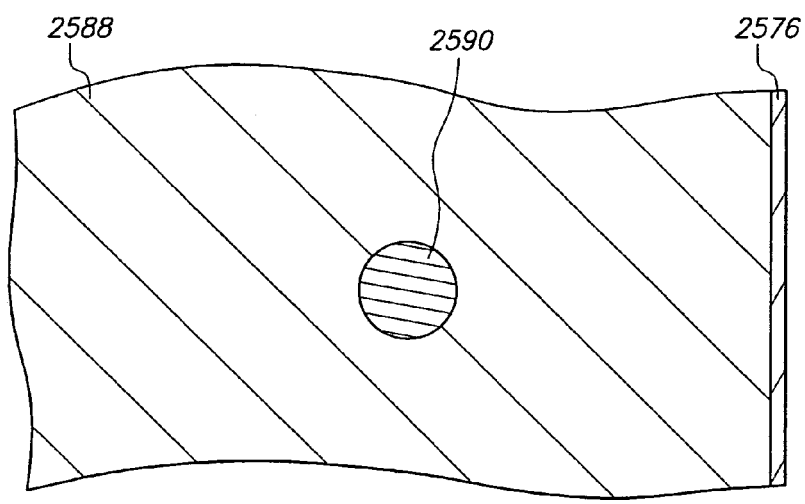

FIGS. 50A, 50B and 50C are cross-sectional, top and bottom views, respectively, of a semiconductor chip assembly in accordance with a twenty-fifth embodiment of the present invention. In the twenty-fifth embodiment, the assembly includes a ground plane. For purposes of brevity, any description in the first embodiment is incorporated herein insofar as the same is applicable, and the same description need not be repeated. Likewise, elements of the twenty-fifth embodiment similar to those in the first embodiment have corresponding reference numerals indexed at twenty-five-hundred is rather than one-hundred. For instance, chip 2510 corresponds to chip 110, routing line 2540 corresponds to routing line 140, etc.

Routing line 2540 is formed as gold-nickel-copper-nickel-gold, with a second enlarged circular portion positioned laterally between chip 2510 and metal particle 2556 and without a bumped terminal in the same manner as routing line 2240. Furthermore, metal particle 2456 initially has a diameter of 400 microns.

Insulative plug 2574, insulative base 2576 and ground plane 2588 are formed in the same manner as insulative plug 2374, insulative base 2376 and heat sink 2386, respectively, except that ground plane 2588 includes opening 2589 with a diameter of 200 microns that is vertically aligned with and centered relative to the second enlarged circular portion of routing line 2540.

Thereafter, opening 2584 is formed through insulative base 2576 and exposes the second enlarged circular portion of routing line 2540. Opening 2584 is formed in essentially the same manner as opening 2284. Namely, the laser drills through and removes portions of insulative base 2576 within the surface area of opening 2589, thereby effecting a pattern transfer of opening 2589 through insulative base 2576 to routing line 2540. A brief cleaning step can then be applied to remove oxides and debris that may be present on the exposed portion of routing line 2540.

Thereafter, solder paste is deposited into openings 2584 and 2589, solder terminal 2578 is deposited on metal particle 2556, and then the solder paste and solder terminal 2578 are heated and reflowed. The solder paste cools and solidifies into a hardened solder joint that provides interconnect 2590 that contacts and electrically connects routing line 2540 and ground plane 2588 in openings 2584 and 2589.

Thereafter, encapsulant 2560 and insulative base 2576 are cut with an excise blade to singulate the assembly from other assemblies.

Ground plane 2588 is electrically connected to routing line 2540, metal particle 2556 and solder terminal 2578, is spaced and separated from and overlapped by chip 2510, routing line 2540, solder mask 2550, adhesive 2554, metal particle 2556, encapsulant 2560, connection joint 2572, insulative plug 2574 and solder terminal 2578, and is disposed downwardly beyond chip 2510, routing line 2540, solder mask 2550, adhesive 2554, metal particle 2556, encapsulant 2560, connection joint 2572, insulative plug 2574, insulative base 2576 and solder terminal 2578.

Semiconductor chip assembly 2598 includes chip 2510, routing line 2540, solder mask 2550, adhesive 2554, metal particle 2556, encapsulant 2560, connection joint 2572, insulative plug 2574, insulative base 2576, solder terminal 2578, ground plane 2588 and interconnect 2590.

Figure 51A:
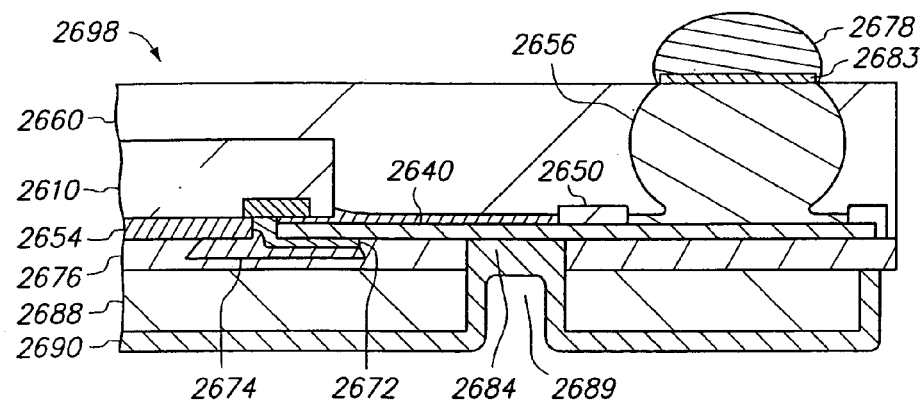
FIGS. 51A, 51B and 51C are cross-sectional, top and bottom views, respectively, of a semiconductor chip assembly in accordance with a twenty-sixth embodiment of the present invention.
Figure 51B:
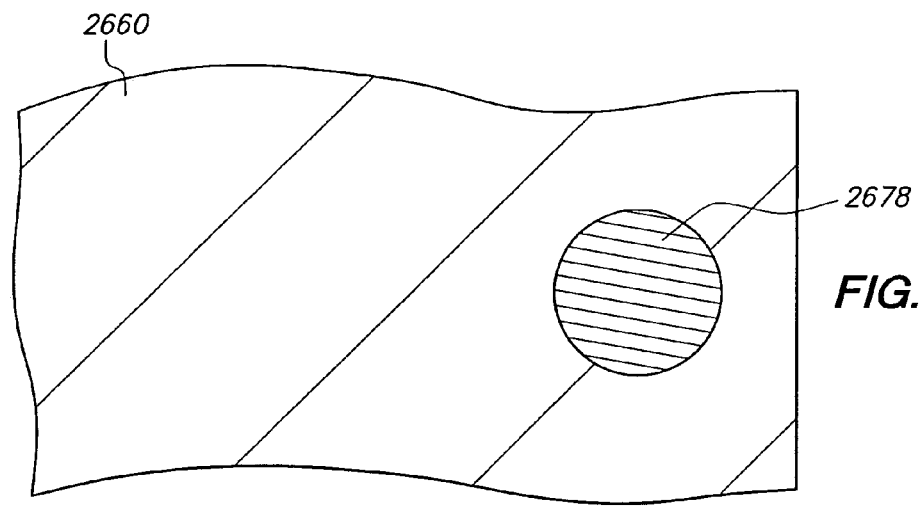
Figure 51C:
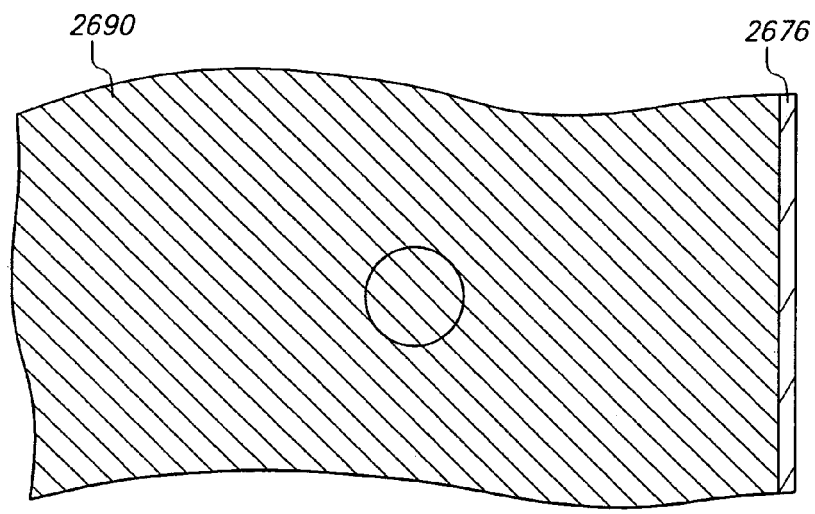

FIGS. 51A, 51B and 51C are cross-sectional, top and bottom views, respectively, of a semiconductor chip assembly in accordance with a twenty-sixth embodiment of the present invention. In the twenty-sixth embodiment, the assembly includes a ground plane. For purposes of brevity, any description in the first embodiment is incorporated herein insofar as the same is applicable, and the same description need not be repeated. Likewise, elements of the twenty-sixth embodiment similar to those in the first embodiment have corresponding reference numerals indexed at twenty-six-hundred rather than one-hundred. For instance, chip 2610 corresponds to chip 110, routing line 2640 corresponds to routing line 140, etc.

Routing line 2640, metal particle 2656, insulative plug 2674, insulative base 2676, opening 2684 and ground plane 2688 are formed in the same manner as routing line 2540, metal particle 2556, insulative plug 2574, insulative base 2576, opening 2584 and ground plane 2588, respectively, except that ground plane 2688 is solely a copper plate (without the nickel coating).

After the protective mask (corresponding to protective mask 166) is removed, and while metal particle 2656 is exposed, the structure is dipped in an activator solution such as dilute palladium chloride of approximately 0.1 grams of palladium chloride and 5 cubic centimeters of hydrochloric acid per liter of water to render metal particle 2656 and ground plane 2688 catalytic to electroless nickel, then the structure is rinsed in distilled water to remove the palladium from encapsulant 2660, and then plated terminal 2683 is electrolessly plated on metal particle 2656 and interconnect 2690 (similar to metallic coating 2487) is electrolessly plated on routing line 2640 and ground plane 2688 in the same manner that plated terminal 2483 is electrolessly plated on metal particle 2456 and metallic coating 2487 is electrolessly plated on heat sink 2486, except that plated terminal 2683 and interconnect 2690 are thicker than plated terminal 2483 and metallic coating 2487, respectively. Furthermore, interconnect 2690 contacts and electrically connects routing line 2640 and ground plane 2688 in openings 2684 and 2689.

Thereafter, solder terminal 2678 is formed on plated terminal 2683, and then encapsulant 2660 and insulative base 2676 are cut with an excise blade to singulate the assembly from other assemblies.

Semiconductor chip assembly 2698 includes chip 2610, routing line 2640, solder mask 2650, adhesive 2654, metal particle 2656, encapsulant 2660, connection joint 2672, insulative plug 2674, insulative base 2676, solder terminal 2678, plated terminal 2683, ground plane 2688 and interconnect 2690.

Figure 52A:
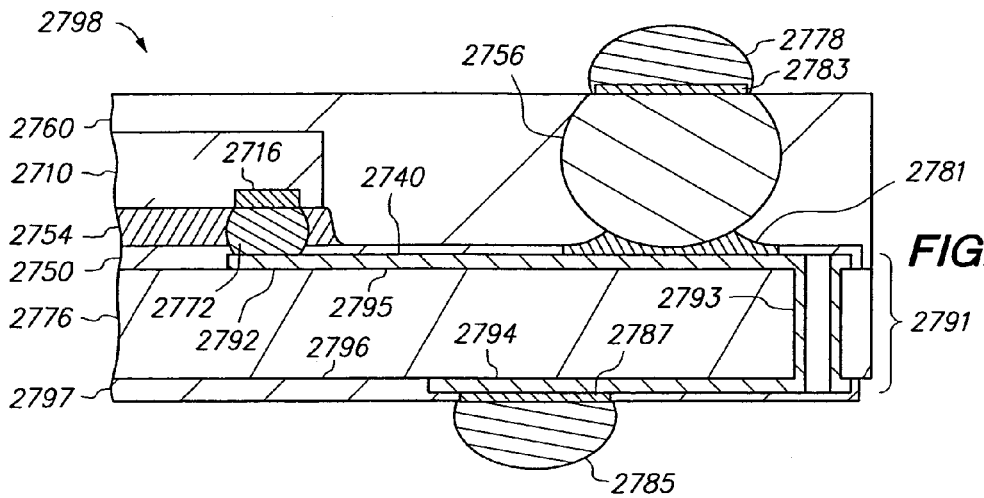
FIGS. 52A, 52B and 52C are cross-sectional, top and bottom views, respectively, of a semiconductor chip assembly in accordance with a twenty-seventh embodiment of the present invention.
Figure 52B:
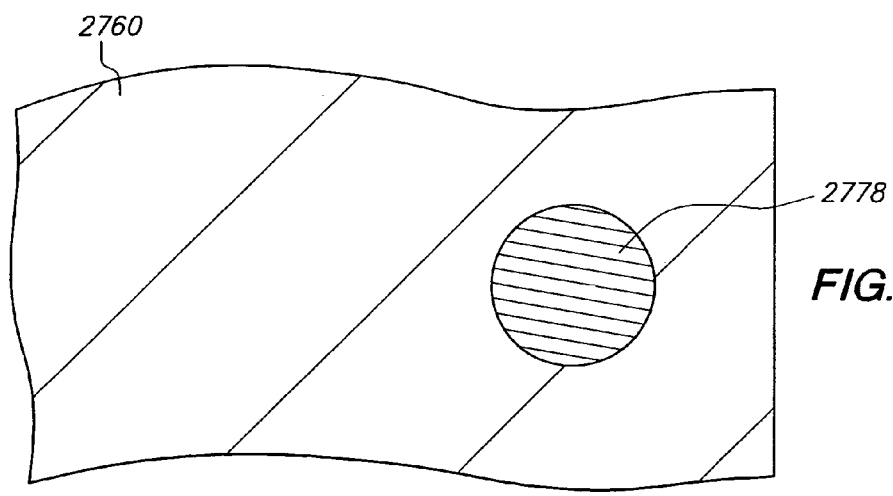
Figure 52C:
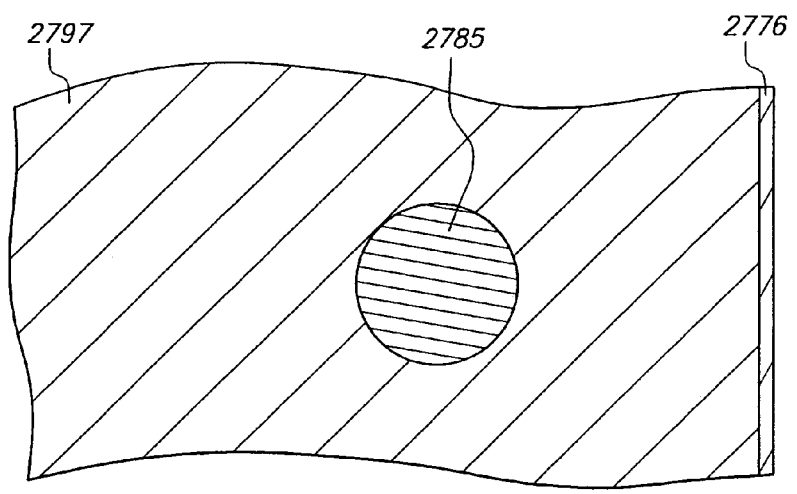

FIGS. 52A, 52B and 52C are cross-sectional, top and bottom views, respectively, of a semiconductor chip assembly in accordance with a twenty-seventh embodiment of the present invention. In the twenty-seventh embodiment, the routing line is formed on the insulative base and the metal base is omitted. For purposes of brevity, any description in the first embodiment is incorporated herein insofar as the same is applicable, and the same description need not be repeated. Likewise, elements of the twenty-seventh embodiment similar to those in the first embodiment have corresponding reference numerals indexed at twenty-seven-hundred rather than one-hundred. For instance, chip 2710 corresponds to chip 110, routing line 2740 corresponds to routing line 140, etc.

The metal base (corresponding to metal base 120) is omitted, and thus the recess (corresponding to recess 130), slot (corresponding to slot 132) opening (corresponding to opening 168) and metal base etches and removal are omitted. Likewise, the bumped terminal (corresponding to bumped terminal 142), protective mask (corresponding to protective mask 166), through-hole (corresponding to through-hole 170) and insulative plug (corresponding to insulative plug 174) are omitted. Substrate 2791 includes routing line 2740 and insulative base 2776. Substrate 2791 is provided before chip 2710 or metal particle 2756 is attached to routing line 2740. Routing line 2740 is composed of copper, and insulative base 2776 is composed of insulative glass-reinforced FR4 epoxy. Routing line 2740 includes front-side routing portion 2792, vertical connection 2793 and back-side routing portion 2794. Insulative base 2776 includes opposing major surfaces 2795 and 2796.

Front-side routing portion 2792 is disposed at surface 2795, back-side routing portion 2794 is disposed at surface 2796, and vertical connection 2793 is contiguous with front-side routing portion 2792 at surface 2795 and back-side routing portion 2794 at surface 2796 and extends through insulative base 2776 to surfaces 2795 and 2796. Thus, routing line 2740 provides horizontal routing at surfaces 2795 and 2796 and vertical routing between surfaces 2795 and 2796. In addition, front-side routing portion 2792 is flat and protrudes from insulative base 2776 at surface 2795, and back-side routing portion 2794 is flat and protrudes from insulative base 2776 at surface 2796.

Front-side routing portion 2792 includes an elongated routing portion with a width (orthogonal to its elongated length) of 100 microns and an enlarged circular portion with a diameter of 500 microns, back-side routing portion 2794 includes an elongated routing portion with a width (orthogonal to its elongated length) of 100 microns and an enlarged circular portion with a diameter of 500 microns, and vertical connection 2793 is an enlarged annular region with a diameter of 200 microns. Front-side routing portion 2792 and back-side routing portion 2794 have a thickness of 18 microns, and insulative base 2776 has a thickness of 400 microns.

Substrate 2791 is manufactured by providing insulative base 2776, laminating first and second copper layers on surfaces 2795 and 2796, respectively, of insulative base 2776, mechanically drilling a through-hole through the metal layers and insulative base 2776, performing a plating operation to form a plated through-hole (PTH) that provides vertical connection 2793, depositing first and second etch masks on the first and second metal layers, respectively, providing a wet chemical etch that selectively etches an exposed portion of the first copper layer through an opening in the first etch mask to form front-side routing portion 2792 from an unetched portion of the first metal layer and that selectively etches an exposed portion of the second copper layer through an opening in the second etch mask to form back-side routing portion 2794 from an unetched portion of the second metal layer, and then stripping the etch masks.

Solder mask 2750 is formed on front-side routing portion 2792 and surface 2795 of insulative base 2776 in the same manner that solder mask 250 is formed on routing line 240 and the metal base (corresponding to metal base 120), and solder mask 2797 is formed on back-side routing portion 2794 and surface 2796 of insulative base 2776 in the same manner as solder mask 2750. Solder mask 2750 includes an opening (corresponding to opening 252) that exposes the enlarged circular portion of front-side routing portion 2792 and another opening (corresponding to opening 280) that exposes a portion of front-side routing portion 2792 near the distal end of front-side routing portion 2792, and likewise, solder mask 2797 includes an opening that exposes the enlarged circular portion of back-side routing portion 2794.

Connection joint 2772 is formed as a solder bump on chip 2710 in the same manner that connection joint 272 is formed on chip 210. Thereafter, chip 2710 is flip-chip mounted on routing line 2740 such that connection joint 2772 contacts and mechanically attaches and electrically connects pad 2716 and routing line 2740 in the same manner that chip 210 is flip-chip mounted on routing line 240, then adhesive 2754 is dispensed into and underfills the open gap between chip 2710 and solder mask 2750 and is cured in the same manner as adhesive 254 is dispensed and cured, then conductive bond 2781 is deposited on routing line 2740 in the same manner than conductive bond 581 is deposited on routing line 540, then metal particle 2756 (with a diameter of 400 microns) is attached to routing line 2740, then encapsulant 2760 is formed, and then metal particle 2756 and encapsulant 2760 are grinded thereby exposing metal particle 2756.

Thereafter, while metal particle 2756 and back-side routing portion 2794 are exposed, the structure is dipped in an activator solution such as dilute palladium chloride of approximately 0.1 grams of palladium chloride and 5 cubic centimeters of hydrochloric acid per liter of water to render metal particle 2756 and back-side routing portion 2794 catalytic to electroless nickel, then the structure is rinsed in distilled water to remove the palladium from encapsulant 2760, insulative base 2776 and solder mask 2797, and then plated terminal 2783 is electrolessly plated on metal particle 2756 and plated terminal 2787 (similar to metallic coating 2487) is electrolessly plated on back-side routing portion 2794 in the same manner that plated terminal 2483 is electrolessly plated on metal particle 2456 and metallic coating 2487 is electrolessly plated on heat sink 2486.

Thereafter, solder terminal 2778 is formed on plated terminal 2783, solder terminal 2785 is formed on plated terminal 2787 and then encapsulant 2760 and insulative base 2776 are cut with an excise blade to singulate the assembly from other assemblies.

Semiconductor chip assembly 2798 includes chip 2710, routing line 2740, solder mask 2750, adhesive 2754, metal particle 2756, encapsulant 2760, connection joint 2772, insulative base 2776, solder terminal 2778, conductive bond 2781, plated terminal 2783, solder terminal 2785, plated terminal 2787 and solder mask 2797.

Figure 53A:
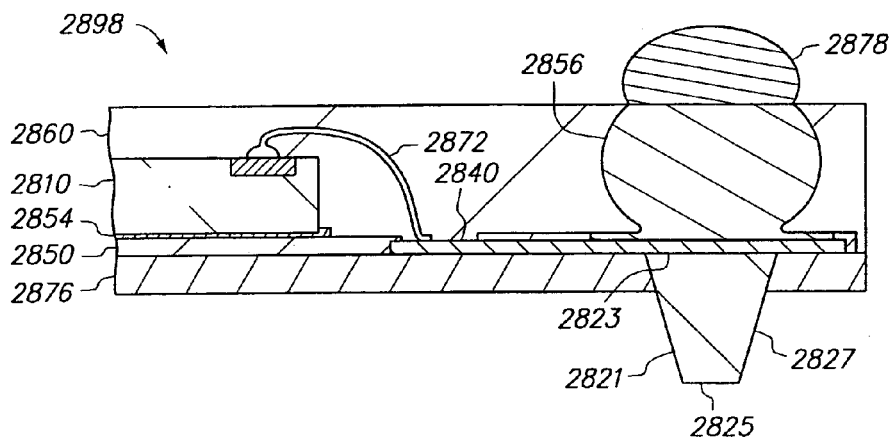
FIGS. 53A, 53B and 53C are cross-sectional, top and bottom views, respectively, of a semiconductor chip assembly in accordance with a twenty-eighth embodiment of the present invention.
Figure 53B:
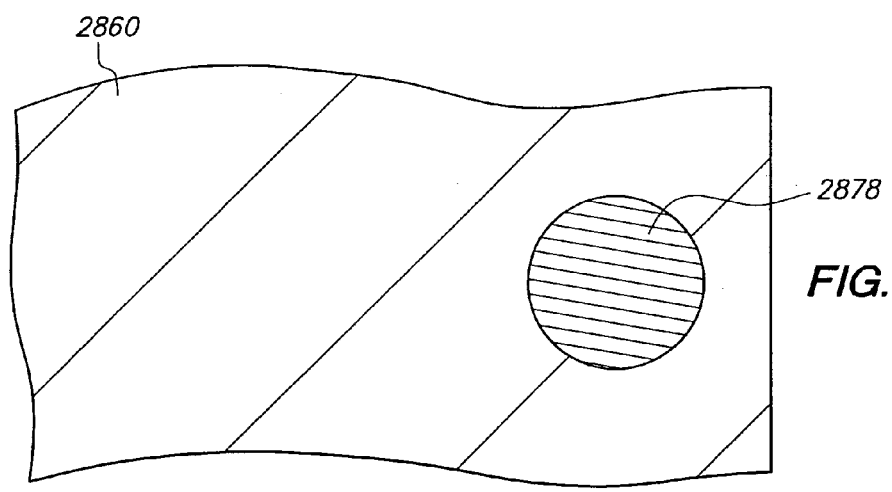
Figure 53C:
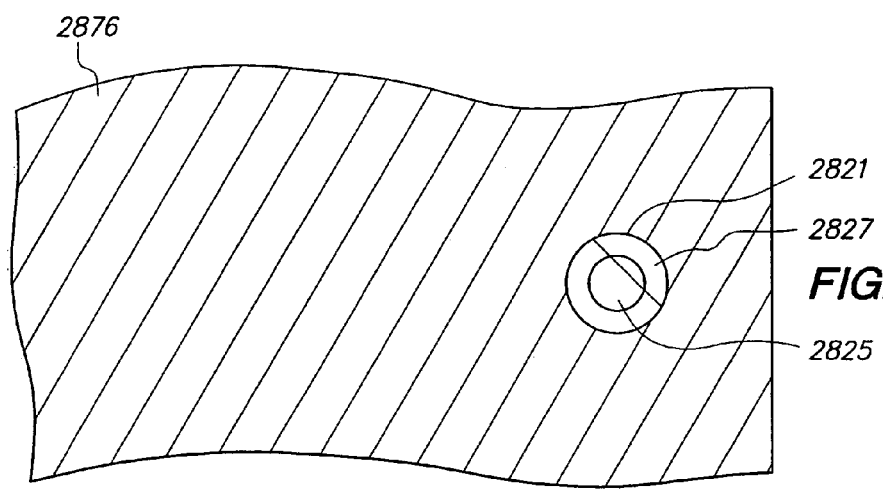

FIGS. 53A, 53B and 53C are cross-sectional, top and bottom views, respectively, of a semiconductor chip assembly in accordance with a twenty-eighth embodiment of the present invention. In the twenty-eighth embodiment, the conductive trace includes a pillar. For purposes of brevity, any description in the first embodiment is incorporated herein insofar as the same is applicable, and the same description need not be repeated. Likewise, elements of the twenty-eighth embodiment similar to those in the first embodiment have corresponding reference numerals indexed at twenty-eight-hundred rather than one-hundred. For instance, chip 2810 corresponds to chip 110, routing line 2840 corresponds to routing line 140, etc.

Routing line 2840 is formed without a bumped terminal (corresponding to bumped terminal 142) on the top surface (corresponding to surface 122) of the metal base (corresponding to metal base 120) and an etch mask (not shown) is formed on the bottom surface (corresponding to surface 124) of the metal base (corresponding to metal base 120) during an electroplating operation. As a result, routing line 2840 includes an enlarged circular region (similar to enlarged annular region 144 except that it is circular rather than annular), and the etch mask is vertically aligned with and centered relative to the enlarged circular region and has a diameter of 300 microns.

Routing line 2840 and the etch mask are manufactured by a slight adjustment to the manufacturing process. The photoresist layers (corresponding to photoresist layers 126 and 128) and related metal base etch steps are omitted. As a result, the recess (corresponding to recess 130) and slot (corresponding to slot 132) are omitted. In addition, the photoresist layer (corresponding to photoresist layer 138) is patterned to selectively expose rather than cover the bottom surface (corresponding to surface 124) of the metal base (corresponding to metal base 120), and the electroplating operation simultaneously forms routing line 2840 on the top surface (corresponding to surface 122) of the metal base (corresponding to metal base 120) and the etch mask on the bottom surface (corresponding to surface 124) of the metal base (corresponding to metal base 120).

Routing line 2840 is formed to extend laterally beyond metal particle 2856 a significantly smaller distance and have a wider elongated routing portion in the same manner as routing line 450 and without a bumped terminal in the same manner as routing line 1940.

Solder mask 2850 is formed on routing line 2840 and the metal base (corresponding to metal base 120) in the same manner that solder mask 450 is formed on routing line 440 and the metal base (corresponding to metal base 120), adhesive 2854 is formed on solder mask 2850 in the same manner that adhesive 454 is formed on solder mask 450, chip 2810 is mounted on adhesive 2854 in the same manner that chip 410 is mounted on adhesive 454, and then chip 2810 is wire bonded to routing line 2840 by connection joint 2872 in the same manner that chip 410 is wire bonded to routing line 440 by connection joint 472. Thereafter, metal particle 2856 (with a diameter of 400 microns) is attached to routing line 2840, then encapsulant 2860 is formed, then metal particle 2856 and encapsulant 2860 are grinded thereby exposing metal particle 2856, and then a protective mask (corresponding to protective mask 166) is formed on metal particle 2856 and encapsulant 2860.

Thereafter, pillar 2821 is formed by applying a wet chemical etch to the metal base using the etch mask to selectively protect the metal base. Thus, pillar 2821 is an unetched portion of the metal base defined by the etch mask that is formed subtractively and contacts routing line 2840.

For instance, the bottom spray nozzle can spray another wet chemical etch on the metal base while the top spray nozzle is deactivated, or the structure can be dipped in the wet chemical etch since the protective mask covers metal particle 2856. The wet chemical etch is highly selective of copper with respect to nickel, the solder mask material and the molding compound, and therefore, highly selective of the metal base with respect to the first nickel layer of routing line 2840, the first nickel layer of the etch mask, solder mask

2850 and encapsulant 2860. Furthermore, the first nickel layer of routing line 2840 and solder mask 2850 protect the copper layer of routing line 2840 from the wet chemical etch. Therefore, no appreciable amount of routing line 2840, solder mask 2850 or encapsulant 2860 is removed. Although the wet chemical etch is highly selective of the copper layer of the etch mask and removes the copper layer (and consequently the gold layer and second nickel layer) of the etch mask, and the etch mask becomes much thinner, this is relatively unimportant since the first nickel layer of the etch mask contacts the metal base and remains intact.

The wet chemical etch etches completely through the metal base, thereby effecting a pattern transfer of the etch mask onto the metal base, removing a portion of the metal base within the periphery of chip 2810 without removing another portion of the metal base outside the periphery of chip 2810, exposing routing line 2840 and solder mask 2850, reducing but not eliminating contact area between the metal base and routing line 2840, and reducing and eliminating contact area between the metal base and solder mask 2850. Furthermore, the wet chemical etch electrically isolates routing line 2840 from the other routing lines that are initially electroplated on and electrically connected to one another by the metal base.

The wet chemical etch laterally undercuts the metal base adjacent to the etch mask, causing pillar 2821 to taper inwardly as it extends downwardly. A suitable taper is between 45 and slightly less than 90 degrees, such as approximately 75 degrees.

A suitable wet chemical etch can be provided by the same solution used for etching metal base 120 to form slot 130 and recess 132. The optimal etch time for exposing the metal base to the wet chemical etch in order to form pillar 2821 with the desired dimensions without excessively exposing the nickel layers to the wet chemical etch can be established through trial and error.

Pillar 2821 includes opposing surfaces 2823 and 2825 and tapered sidewalls 2827 therebetween. Surface 2823 of pillar 2821 constitutes an unetched portion of the top surface (corresponding to surface 122) of the metal base (corresponding to metal base 120), and surface 2825 of pillar 2821 constitutes an unetched portion of the bottom surface (corresponding to surface 124) of the metal base (corresponding to metal base 120). Surface 2823 contacts and faces towards routing line 2840 and is spaced from and faces away from the etch mask, and surface 2825 contacts and faces towards the etch mask and is spaced from and faces away from routing line 2840. Surfaces 2823 and 2825 are flat and parallel to one another. Tapered sidewalls 2827 are adjacent to surfaces 2823 and 2825 and slant inwardly towards surface 2825.

Pillar 2821 has a conical shape with a height (between surfaces 2823 and 2825) of 200 microns and a diameter that decreases as the height increases (away from surface 2823 and towards surface 2825). Surface 2823 has a circular shape with a diameter of 300 microns, and surface 2825 has a circular shape with a diameter of 150 microns. Thus, surface 2823 provides the base of pillar 2821, and surface 2825 provides the tip of pillar 2821.

Pillar 2821 contacts routing line 2840, is spaced and separated from metal particle 2856 and connection joint 2872, is overlapped by and vertically aligned with routing line 2840 and metal particle 2856, is disposed outside the periphery of chip 2810 and is disposed downwardly beyond chip 2810, routing line 2840, solder mask 2850, adhesive 2854, metal particle 2856, encapsulant 2860 and connection joint 2872. Furthermore, pillar 2821 and routing line 2840 contact one another, adhere to one another, are adjacent to one another, are metallurgically bonded to one another and are not integral with one another.

Surfaces 2823 and 2825 are vertically aligned with the etch mask, the enlarged circular portion of routing line 2840, metal particle 2856 and one another. In addition, surface 2825 is concentrically disposed within the surface areas of surface 2823, the etch mask, the enlarged circular portion of routing line 2840 and metal particle 2856.

Thereafter, the etch mask is removed. The etch mask, which at this stage consists of a nickel layer, is removed by wet chemical etching using a nickel etching solution, such as a dilute mixture of nitric and hydrochloric acid, that is highly selective of nickel with respect to the solder mask material and the molding compound. The wet chemical etch also removes the exposed portion of the first nickel layer of routing line 2840 (that extends laterally beyond pillar 2821 and downwardly beyond the copper layer of routing line 2840), and the elongated routing portion of routing line 2840 becomes slightly thinner. However, no appreciable amount of solder mask 2850 or encapsulant 2860 is removed.

Since the etch mask is extremely thin relative to pillar 2821, and the structure is removed from the nickel etching solution soon after the etch mask is stripped, it is not critical that the nickel etching solution be highly selective of nickel with respect to copper. In fact, the nickel etching solution is also selective of copper. As a result, the nickel etching solution also removes a slight amount of the exposed copper surfaces. However, the nickel etching solution is not applied long enough to appreciably affect the copper features.

The nickel etching solution has no significant impact on pillar 2821 or routing line 2840. In addition, the protective mask protects metal particle 2856 from the nickel etching solution. The optimal etch time for exposing the etch mask to the wet chemical etch in order to remove the etch mask without significantly impacting pillar 2821 or routing line 2840 can be established through trial and error.

The nickel etching solution converts routing line 2840 from a flat, planar lead to an essentially flat, planar lead due to the slight recess (not shown) previously occupied by a portion of the nickel layer that extended laterally beyond pillar 2821 and a lower portion of a portion of the copper layer that extended laterally beyond pillar 2821. In addition, the nickel etching solution exposes surface 2825 of pillar 2821.

The through-hole (corresponding to through-hole 170) and insulative plug (corresponding to insulative plug 174) are omitted. Likewise, the metal base (corresponding to metal base 120) is etched once (rather than twice) to form pillar 2821 after encapsulant 2860 is formed.

Thereafter, insulative base 2876 is formed with a thickness of 250 microns (rather than 150 microns), then the lower portion of insulative base 2876 is removed such that pillar 2821 extends downwardly beyond insulative base 2876 by 150 microns, and then the protective mask (corresponding to protective mask 166) is removed.

Semiconductor chip assembly 2898 includes chip 2810, pillar 2821, routing line 2840, solder mask 2850, adhesive 2854, metal particle 2856, encapsulant 2860, connection joint 2872, insulative base 2876 and solder terminal 2878.

Figure 54A:
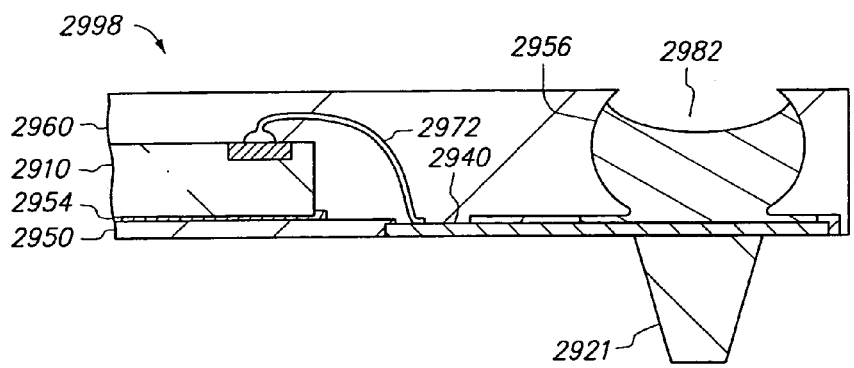
FIGS. 54A, 54B and 54C are cross-sectional, top and bottom views, respectively, of a semiconductor chip assembly in accordance with a twenty-ninth embodiment of the present invention.
Figure 54B:
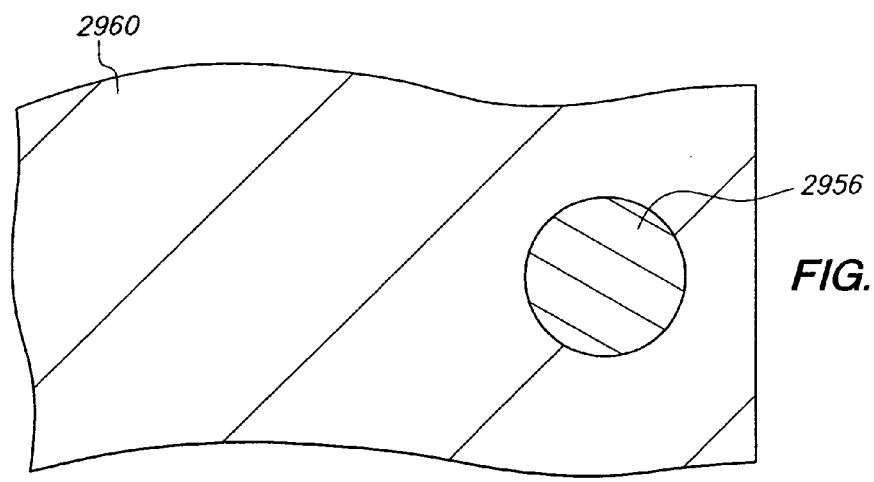
Figure 54C:
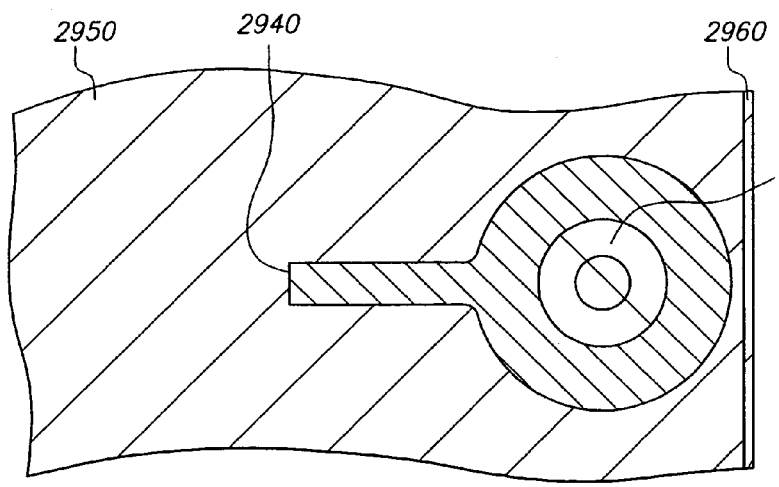

FIGS. 54A, 54B and 54C are cross-sectional, top and bottom views, respectively, is of a semiconductor chip assembly in accordance with a twenty-ninth embodiment of the present invention. In the twenty-ninth embodiment, the conductive trace includes a pillar. For purposes of brevity, any description in the first embodiment is incorporated herein insofar as the same is applicable, and the same description need not be repeated. Likewise, elements of the twenty-ninth embodiment similar to those in the first embodiment have corresponding reference numerals indexed at twenty-nine-hundred rather than one-hundred. For instance, chip 2910 corresponds to chip 110, routing line 2940 corresponds to routing line 140, etc.

Semiconductor chip assembly 2998 is formed in the same manner as semiconductor chip assembly 2898, except that metal particle 2956 is etched to form aperture 2982 in the same manner that metal particle 1356 is etched to form aperture 1382, and the insulative base (corresponding to insulative base 2876) and solder terminal (corresponding to solder terminal 2878) are omitted.

Semiconductor chip assembly 2998 includes chip 2910, pillar 2921, routing line 2940, solder mask 2950, adhesive 2954, metal particle 2956, encapsulant 2960 and connection joint 2972.

Figure 55A:
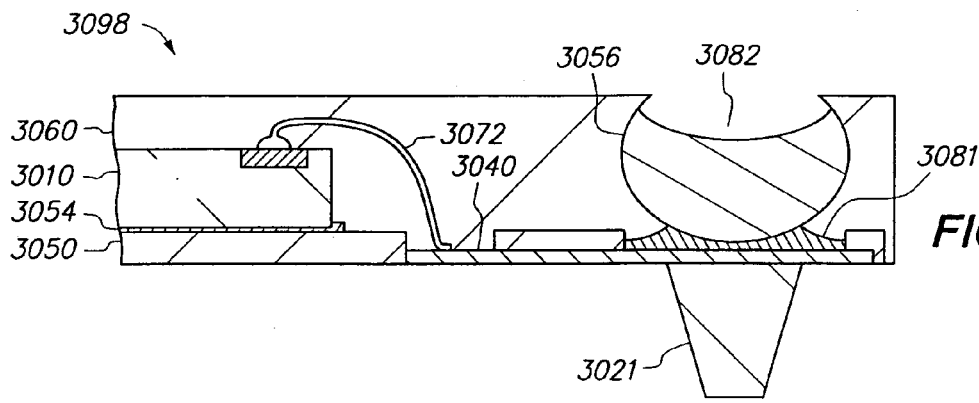
FIGS. 55A, 55B and 55C are cross-sectional, top and bottom views, respectively, of a semiconductor chip assembly in accordance with a thirtieth embodiment of the present invention.
Figure 55B:
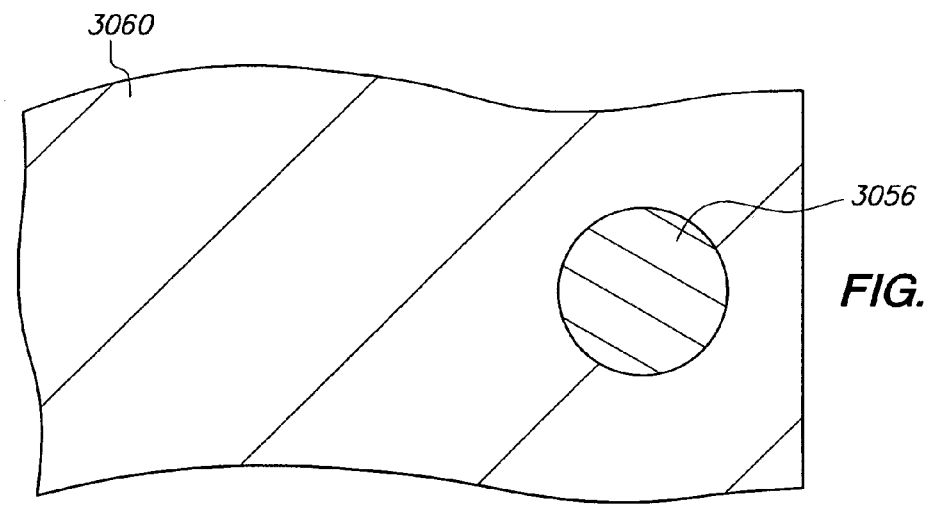
Figure 55C:
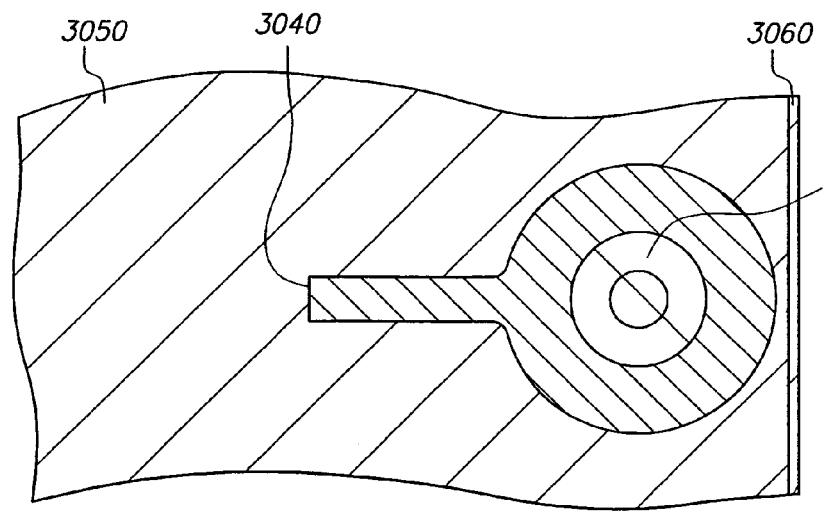

FIGS. 55A, 55B and 55C are cross-sectional, top and bottom views, respectively, of a semiconductor chip assembly in accordance with a thirtieth embodiment of the present invention. In the thirtieth embodiment, the conductive trace includes a pillar. For purposes of brevity, any description in the first embodiment is incorporated herein insofar as the same is applicable, and the same description need not be repeated. Likewise, elements of the thirtieth embodiment similar to those in the first embodiment have corresponding reference numerals indexed at three-thousand rather than one-hundred. For instance, chip 3010 corresponds to chip 110, routing line 3040 corresponds to routing line 140, etc.

Semiconductor chip assembly 3098 is formed in the same manner as semiconductor chip assembly 2998, except that solder mask 3050 extends 30 microns (rather than 2 microns) upwardly beyond routing line 3040, metal particle 3056 and conductive bond 3081 are formed in the same manner as metal particle 556 and conductive bond 581, respectively, and metal particle 3056 is etched to form aperture 3082 using a copper etching solution such as the same solution used for etching metal base 120 to form slot 130 and recess 132. Thus, metal particle 3056 is a copper ball, conductive bond 3081 is a solder bond, and the insulative base (corresponding to insulative base 2876) and solder terminal (corresponding to solder terminal 2878) are omitted.

Pillar 3021 and aperture 3082 can be formed in a variety sequences. For instance, the top spray nozzle can spray a wet chemical etch on metal particle 3056 while the bottom spray nozzle is deactivated, thereby forming aperture 3082, and then the bottom spray nozzle can spray another wet chemical etch on the metal base while the top spray nozzle is deactivated, thereby forming pillar 3021. As another example, the bottom spray nozzle can spray another wet chemical etch on the metal base while the top spray nozzle is deactivated, thereby forming pillar 3021, and then the top spray nozzle can spray a wet chemical etch on metal particle 3056 while the bottom spray nozzle is deactivated, thereby forming aperture 3082. As another example, the structure can be dipped in a first wet chemical etch that forms aperture 3082 and partially forms pillar 3021, and then the bottom spray nozzle can spray another wet chemical etch on the metal base while the top spray nozzle is deactivated, thereby completing the formation of pillar 3021. As another example, the structure can be dipped in a first wet chemical etch that forms aperture 3082 and partially forms pillar 3021, then a protective mask (corresponding to protective mask 166) can be formed on metal particle 3056 and encapsulant 3060, then the structure can be dipped in a second wet chemical etch, thereby completing the formation of pillar 3021, and then the protective mask can be removed.

Semiconductor chip assembly 3098 includes chip 3010, pillar 3021, routing line 3040, solder mask 3050, adhesive 3054, metal particle 3056, encapsulant 3060, connection joint 3072 and conductive bond 3081.

Figure 56A:
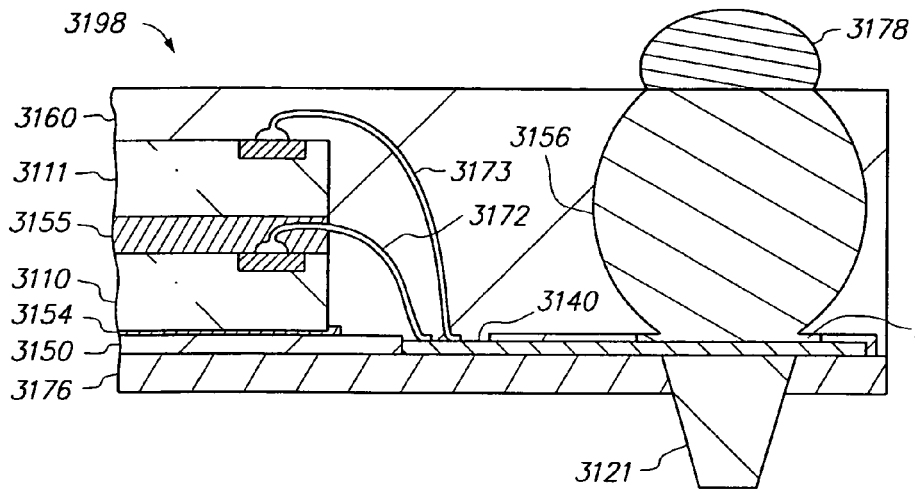
FIGS. 56A, 56B and 56C are cross-sectional, top and bottom views, respectively, of a semiconductor chip assembly in accordance with a thirty-first embodiment of the present invention.
Figure 56B:
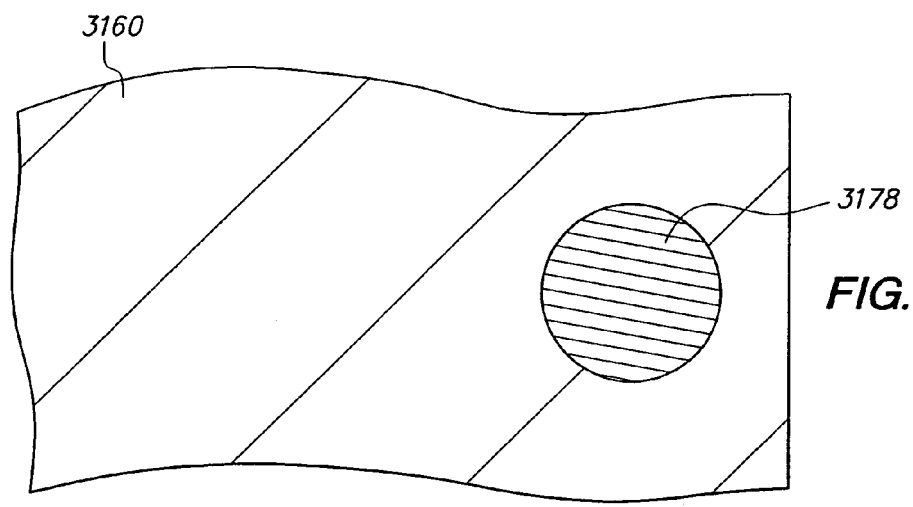
Figure 56C:
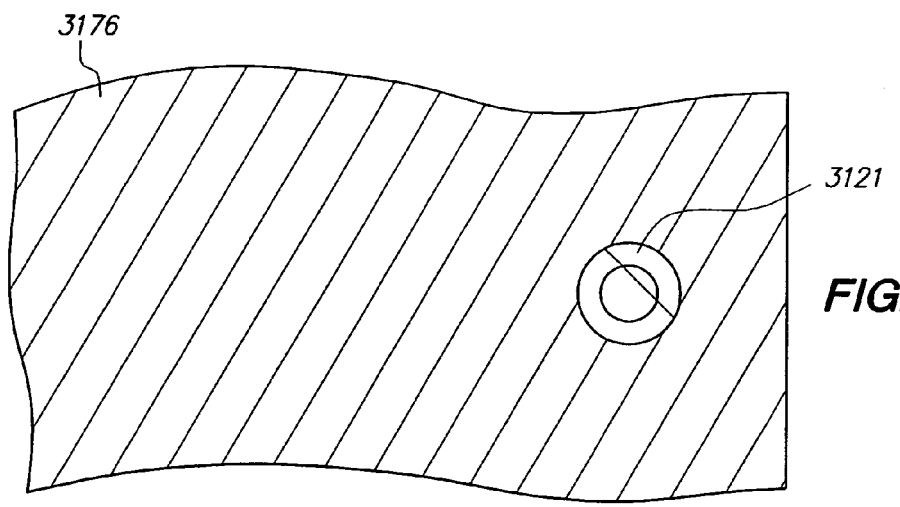

FIGS. 56A, 56B and 56C are cross-sectional, top and bottom views, respectively, of a semiconductor chip assembly in accordance with a thirty-first embodiment of the present invention. In the thirty-first embodiment, the assembly is a multi-chip package. For purposes of brevity, any description in the first embodiment is incorporated herein insofar as the same is applicable, and the same description need not be repeated. Likewise, elements of the thirty-first embodiment similar to those in the first embodiment have corresponding reference numerals indexed at thirty-one-hundred rather than one-hundred. For instance, chip 3110 corresponds to chip 110, routing line 3140 corresponds to routing line 140, etc.

Routing line 3140 is formed without a bumped terminal in the same manner as routing line 2840, except that routing line 3140 includes an enlarged circular region with a diameter of 600 microns (rather than 500 microns). Furthermore, an etch mask is formed on the metal base (corresponding to metal base 120) in the same manner as the etch mask formed with routing line 2840.

Solder mask 3150 is formed on routing line 3140 and the metal base (corresponding to metal base 120) in the same manner that solder mask 2850 is formed on routing line 2840 and the metal base (corresponding to metal base 120), except that solder mask 3150 contains opening 3152 with a diameter of 550 microns (rather than 400 microns) that is vertically aligned with and exposes the enlarged circular region of routing line 3140.

Thereafter, metal particle 3156 with a diameter of 600 microns (rather than 500 microns) is attached to routing line 3140.

Thereafter, adhesive 3154 is formed on solder mask 3150 in the same manner that adhesive 2854 is formed on solder mask 2850, chip 3110 is mounted on adhesive 3154 in the same manner that chip 2810 is mounted on adhesive 2854, and then chip 3110 is wire bonded to routing line 3140 by connection joint 3172 in the same manner that chip 2810 is wire bonded to routing line 2840 by connection joint 2872.

Thereafter, adhesive 3155 is deposited as a spacer paste that includes silicon spacers on chip 3110, then chip 3111 (which includes pad 3117 and is essentially identical to chip 3110) is placed on adhesive 3155 such that adhesive 3155 contacts and is sandwiched between chips 3110 and 3111, and then the structure is placed in an oven and adhesive 3155 is fully cured (C stage) at relatively low temperature in the range of 200 to 250° C. to form a solid adhesive insulative layer that mechanically attaches chips 3110 and 3111. Adhesive 3155 is 100 microns thick between chips 3110 and 3111, and chips 3110 and 3111 are spaced and separated from and vertically aligned with one another. A suitable spacer paste is Hysol QMI 500.

Thereafter, chip 3111 is wire bonded to routing line 3140 by connection joint 3173 in the same manner that chip 3110 is wire bonded to routing line 3140 by connection joint 3172.

Thereafter, encapsulant 3160 with a thickness of 800 microns (rather than 500 microns) is formed so that encapsulant 3160 contacts and covers chips 3110 and 3111, metal particle 3156 and connection joints 3172 and 3173, then metal particle 3156 and encapsulant 3160 are grinded thereby exposing metal particle 3156, then a protective mask (corresponding to protective mask 166) is formed on metal particle 3156 and encapsulant 3160, then pillar 3121 is formed in the same manner as pillar 2821, then the etch mask is removed, and then insulative base 3176 is formed in the same manner as insulative base 2876.

The semiconductor chip assembly is a multi-chip first-level package. Chips 3110 and 3111 are embedded in encapsulant 3160. Metal particle 3156 extends across the thicknesses of chips 3110 and 3111. Furthermore, an electrically conductive path between pad 3116 and metal particle 3156 not only includes but also requires routing line 3140, and an electrically conductive path between pad 3117 and metal particle 3156 not only includes but also requires routing line 3140. Thus, chips 3110 and 3111 are both embedded in encapsulant 3160 and electrically connected to metal particle 3156 by an electrically conductive path that includes routing line 3140.

Semiconductor chip assembly 3198 includes chips 3110 and 3111, pillar 3121, routing line 3140, solder mask 3150, adhesives 3154 and 3155, metal particle 3156, encapsulant 3160, connection joints 3172 and 3173, insulative base 3176 and solder terminal 3178.

FIGS. 57A–58A, 57B–58B and 57C–58C are cross-sectional, top and bottom views, respectively, of a method of making a three-dimensional stacked semiconductor package in accordance with a thirty-second embodiment of the present invention. In the thirty-second embodiment, the semiconductor package includes first and second semiconductor chip assemblies. For purposes of brevity, any description in the first embodiment is incorporated herein insofar as the same is applicable, and the same description need not be repeated. Likewise, elements of the thirty-second embodiment similar to those in the first embodiment have corresponding reference numerals is indexed at thirty-two-hundred rather than one-hundred and followed by the suffix "A" or "B". For instance, chip 3210A corresponds to chip 110, chip 3210B corresponds to chip 110, routing line 3240A corresponds to routing line 140, routing line 3240B corresponds to routing line 140, etc.

Figure 57A:
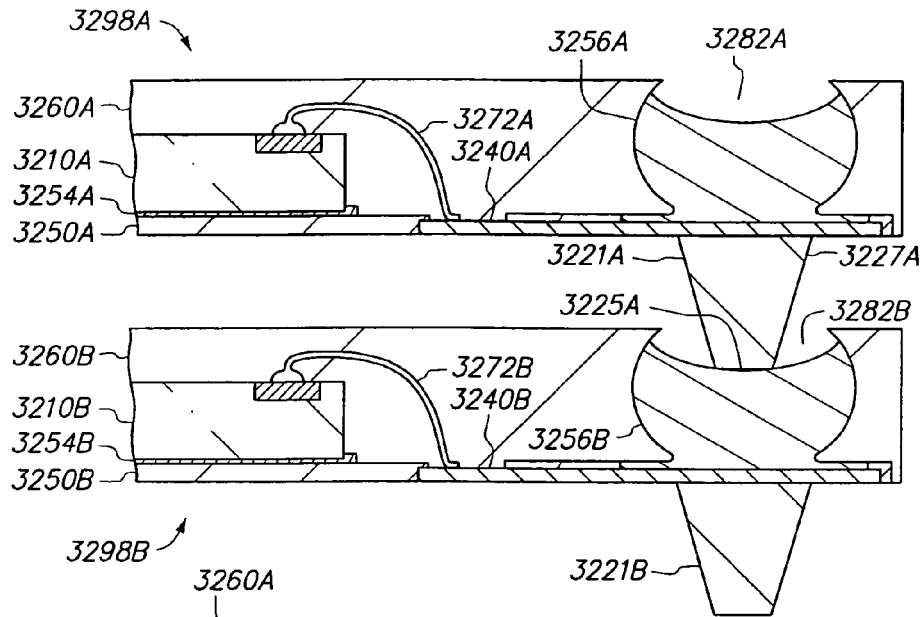
Figure 57B:
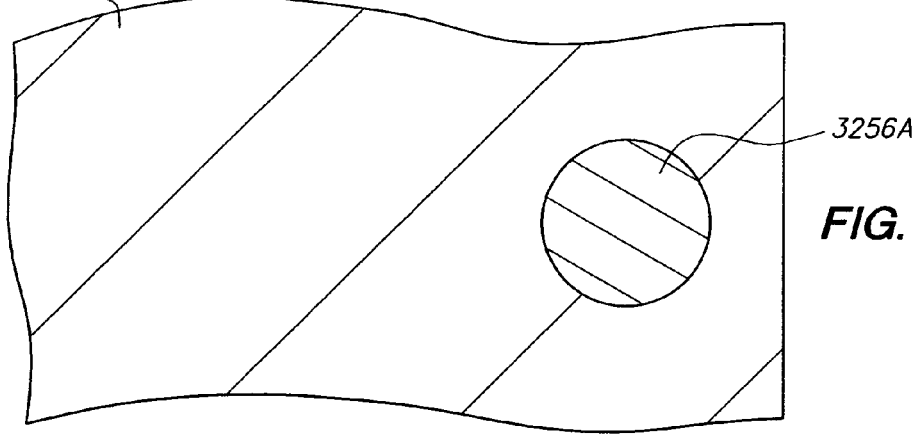
Figure 57C:
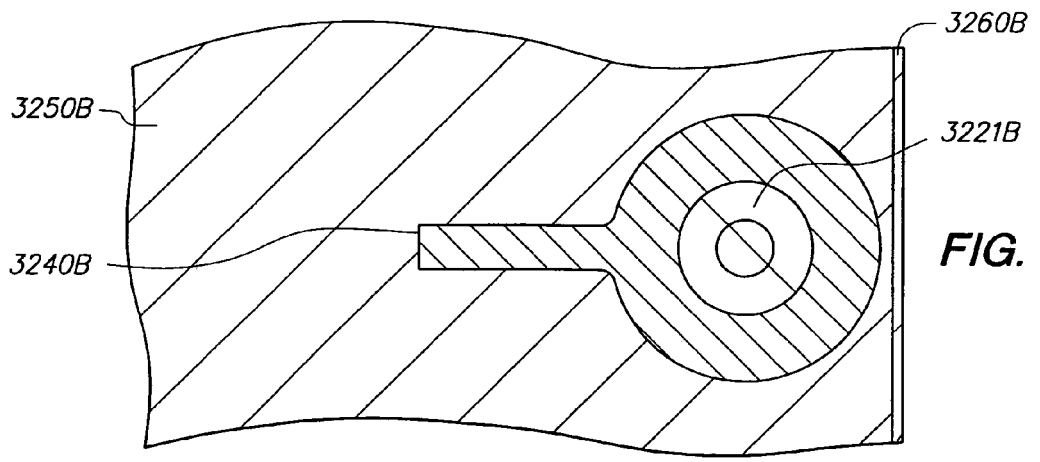

FIGS. 57A, 57B and 57C are cross-sectional, top and bottom views, respectively, of semiconductor chip assembly 3298A stacked on semiconductor chip assembly 3298B before a solder reflow operation.

Semiconductor chip assemblies 3298A and 3298B are formed in the same manner as semiconductor chip assembly 2998 and are essentially identical to one another.

Semiconductor chip assemblies 3298A and 3298B are positioned relative to one another using a surface mount placement machine such that assembly 3298A is placed on but not mechanically attached to assembly 3298B, chips 3210A and 3210B are vertically aligned with one another, pillars 3221A and 3221B are vertically aligned with one another, routing lines 3240A and 3240B are vertically aligned with one another, metal particles 3256A and 3256B are vertically aligned with one another, and apertures 3282A and 3282B are vertically aligned with one another in a vertically stacked arrangement. Pillar 3221A extends into aperture 3282B, contacts metal particle 3256B and is spaced and separated from encapsulant 3260B, and solder mask 3250A is spaced and separated from encapsulant 3260B by an open gap. In addition, surface 3225A of pillar 3221A contacts metal particle 3256B, and tapered sidewalls 3227A of pillar 3221A are spaced and separated from metal particle 3256B.

Figure 58A:
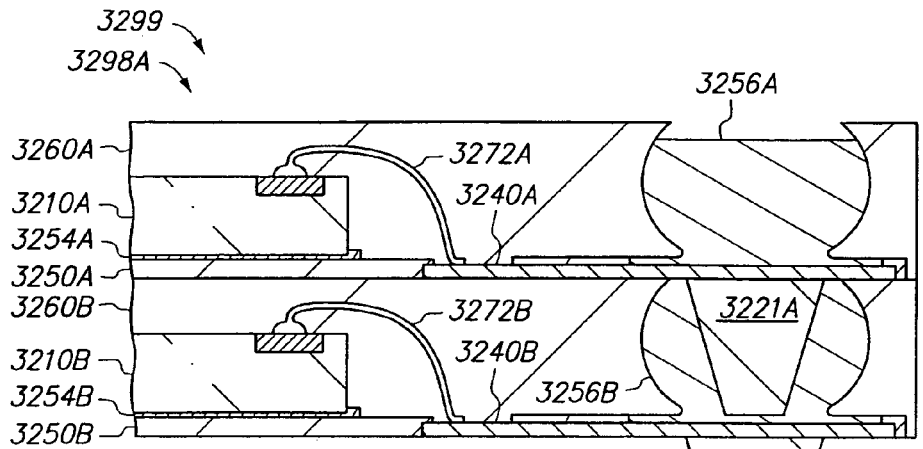
Figure 58B:
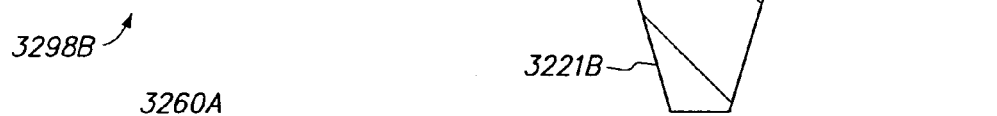
Figure 58C:
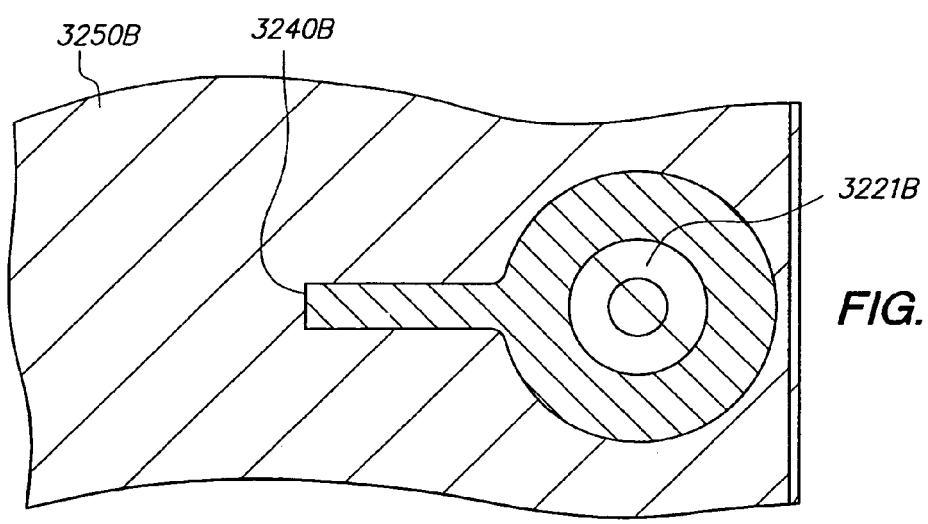

FIGS. 58A, 58B and 58C are cross-sectional, top and bottom views, respectively, of semiconductor chip assembly 3298A stacked on semiconductor chip assembly 3298B after a solder reflow operation.

Heat is applied to reflow metal particle 3256B. The heat renders metal particle 3256B molten and compliant enough to conform to virtually any shape, and assembly 3298A moves downwardly towards (but not laterally relative to) assembly 3298B without applying external pressure. As a result, pillar 3221A tunnels into metal particle 3256B and moves downwardly towards routing line 3240B, tapered sidewalls 3227A extend into and contact metal particle 3256B, and metal particle 3256B deforms and contours to pillar 3221A and is squeezed upwardly in aperture 3282B towards metal particle 3256A. Assembly 3298A continues to move downwardly towards assembly 3298B until solder mask 3250A contacts encapsulant 3260B, at which time the movement stops.

The heat is then removed and metal particle 3256B cools and solidifies into a hardened solder bond that contacts and mechanically attaches and electrically connects pillar 3221A and routing line 3240B, and routing lines 3240A and 3240B. The solder reflow operation also transforms a loose unsecured relation between assemblies 3298A and 3298B into a secure mechanical attachment between assemblies 3298A and 3298B.

Pillar 3221A extends into and is embedded in metal particle 3256B and remains spaced and separated from routing line 3240B and encapsulant 3260B, essentially all of pillar 3221A extends into metal particle 3256B and encapsulant 3260B, essentially all of metal particle 3256B remains embedded in encapsulant 3260B, and pillar 3221A and metal particle 3256B fill essentially all remaining space in aperture 3282B. Furthermore, surface 3225A of pillar 3221A is located between surfaces 3212B and 3214B of chip 3210B outside the periphery of chip 3210B.

Metal particle 3256B has a mass that falls within a narrow tolerance such that there is enough solder to provide a large contact area and a robust mechanical and electrical connection between pillar 3221A and metal particle 3256B during the solder reflow operation without providing so much solder as to substantially overflow outside aperture 3282B or create a bridge or short between metal particle 3256B and an adjacent pillar or metal particle.

Advantageously, the compliant and deformable nature of metal particle 3256B during the solder reflow operation provides a flexible vertical interconnection that can accommodate a wide range of process variations. For instance, an essentially identical package arises despite size and shape variations in pillar 3221A and metal particle 3256B which may occur due to wet chemical etching variations (such as etch flows, concentrations and times) during the manufacture of assemblies 3298A and 3298B, respectively. The process need not be customized (e.g., trimming the pillar height) to accommodate these variations. As a result, the process is well-suited for cost-effective volume manufacturing.

Semiconductor chip assembly 3298A includes chip 3210A, pillar 3221A, routing line 3240A, solder mask 3250A, adhesive 3254A, metal particle 3256A, encapsulant 3260A and connection joint 3272A. Semiconductor chip assembly 3298B includes chip 3210B, pillar 3221B, routing line 3240B, solder mask 3250B, adhesive 3254B, metal particle 3256B, encapsulant 3260B and connection joint 3272B. Three-dimensional stacked semiconductor package 3299 includes semiconductor chip assemblies 3298A and 3298B.

FIGS. 59A–61A, 59B–61B and 59C–61C are cross-sectional, top and bottom views, respectively, of a method of making a three-dimensional stacked semiconductor package in accordance with a thirty-third embodiment of the present invention. In the thirty-third embodiment, the semiconductor package includes first and second semiconductor chip assemblies. For purposes of brevity, any description in the first embodiment is incorporated herein insofar as the same is applicable, and the same description need not be repeated. Likewise, elements of the thirty-third embodiment similar to those in the first embodiment have corresponding reference numerals indexed at thirty-three-hundred rather than one-hundred and followed by the suffix "A" or "B". For instance, chip 3310A corresponds to chip 110, chip 3310B corresponds to chip 110, routing line 3340A corresponds to routing line 140, routing line 3340B corresponds to routing line 140, etc.

Figure 59A:
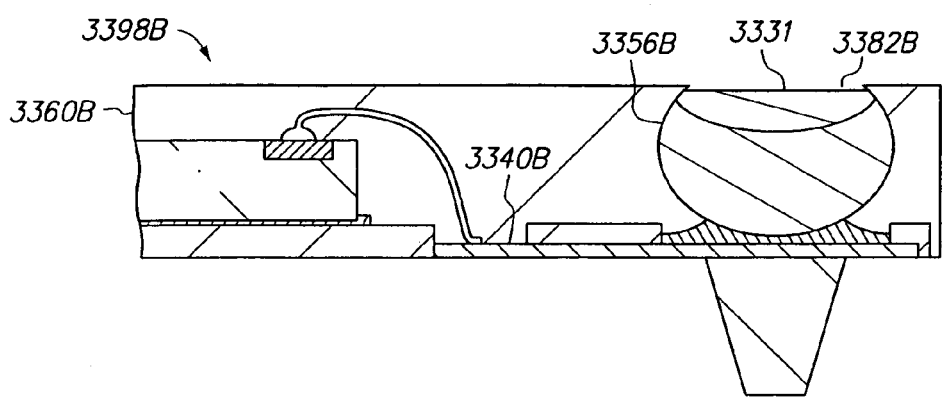
Figure 59B:
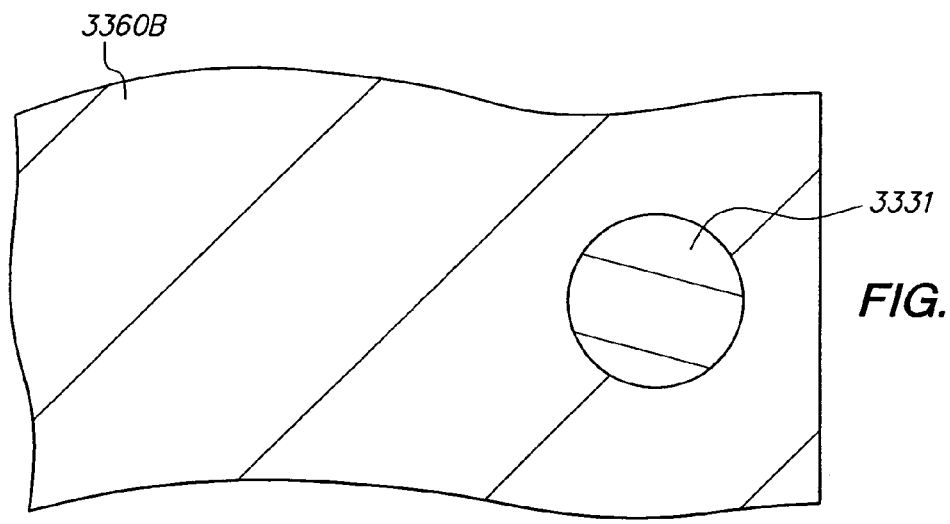
Figure 59C:
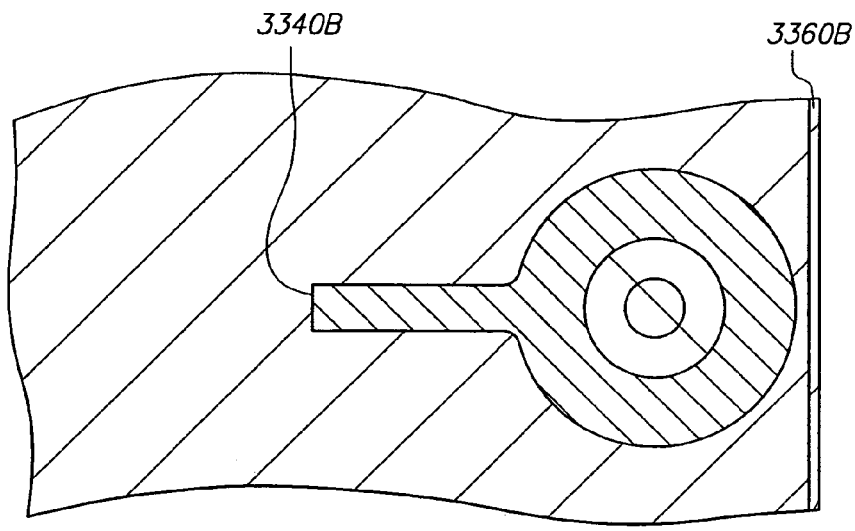

FIGS. 59A, 59B and 59C are cross-sectional, top and bottom views, respectively, of solder paste 3331 and semiconductor chip assembly 3398B.

Semiconductor chip assembly 3398B is formed in the same manner as semiconductor chip assembly 3098. Thereafter, solder paste 3331 is deposited into aperture 3382B. Solder paste 3331 is compliant enough at room temperature to conform to virtually any shape. As a result, solder paste 3331 contacts metal particle 3356B and encapsulant 3360B in aperture 3382B, and fills most of the remaining space in aperture 3382B. However, solder paste 3331 is spaced and separated from routing line 3340B and does not extend outside aperture 3382B.

Figure 60A:
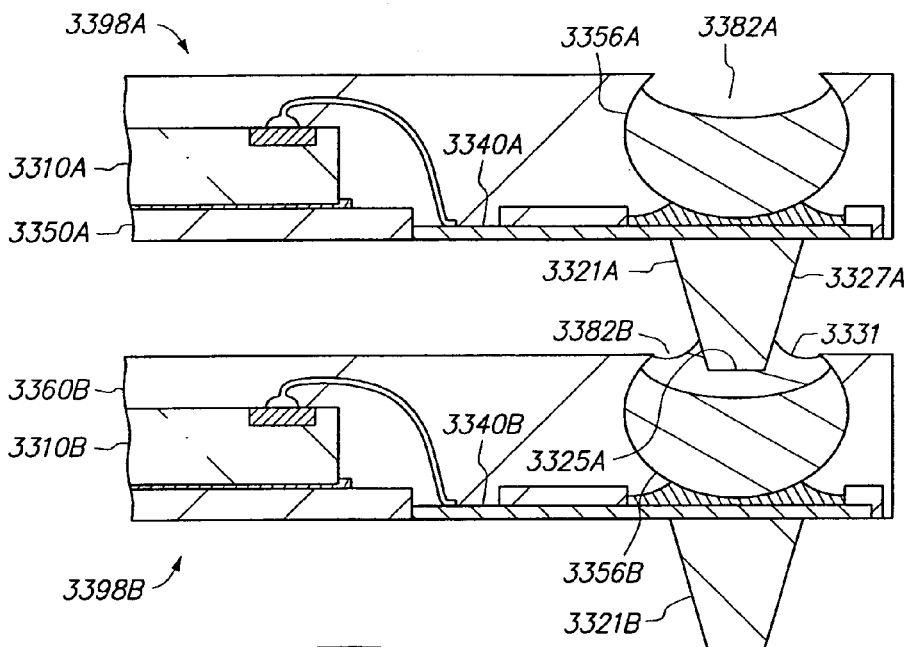
Figure 60B:
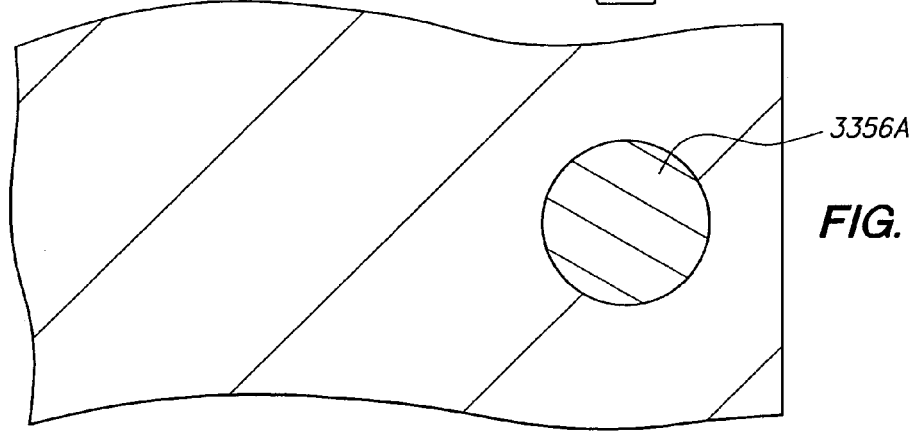
Figure 60C:
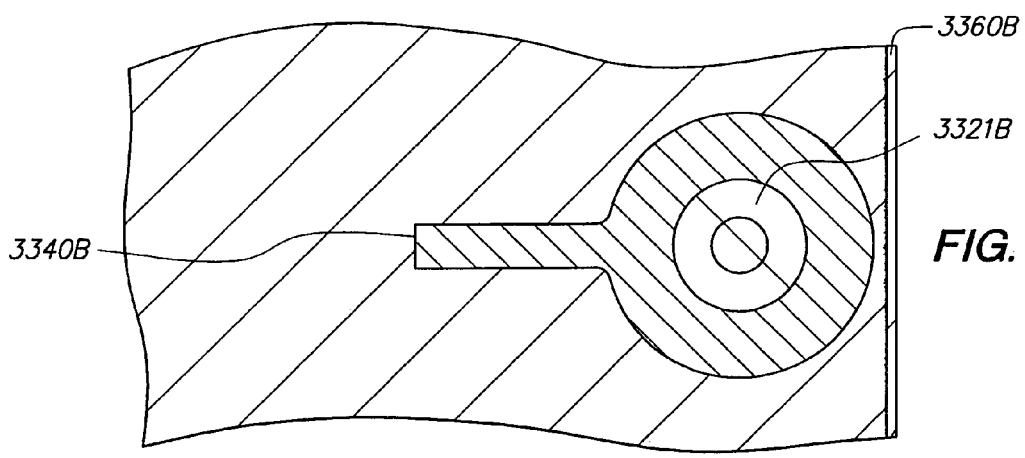

FIGS. 60A, 60B and 60C are cross-sectional, top and bottom views, respectively, of semiconductor chip assembly 3398A stacked on semiconductor chip assembly is 3398B before a solder reflow operation.

Semiconductor chip assembly 3398A is formed in the same manner as semiconductor chip assembly 3098, and semiconductor chip assemblies 3398A and 3398B are essentially identical to one another.

Semiconductor chip assemblies 3398A and 3398B are positioned relative to one another using a surface mount placement machine such that assembly 3398A is placed on but not firmly mechanically attached to assembly 3398B, chips 3310A and 3310B are vertically aligned with one another, pillars 3321A and 3321B are vertically aligned with one another, routing lines 3340A and 3340B are vertically aligned with one another, metal particles 3356A and 3356B are vertically aligned with one another, and apertures 3382A and 3382B are vertically aligned with one another in a vertically stacked arrangement. Pillar 3321A extends into aperture 3382B, tunnels into and extends into and contacts and is embedded in solder paste 3331 in aperture 3382B and is spaced and separated from metal particle 3356B and encapsulant 3360B, and solder mask 3350A is spaced and separated from encapsulant 3360B by an open gap. In addition, surface 3325A of pillar 3321A contacts and is embedded in and covered by solder paste 3331, tapered sidewalls 3327A of pillar 3221A contact and extend into but are not covered by solder paste 3331, and solder paste 3331 deforms and contours to pillar 3321A and is squeezed upwardly in aperture 3382B towards metal particle 3356A. Furthermore, pillar 3321A weakly adheres to metal particle 3356B due to solder paste 3331.

Figure 61A:
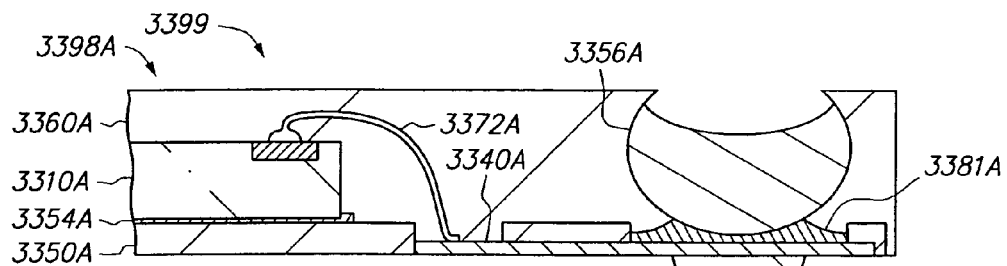
Figure 61B:
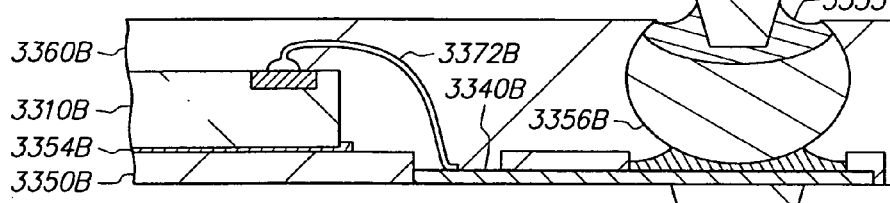
Figure 61C:
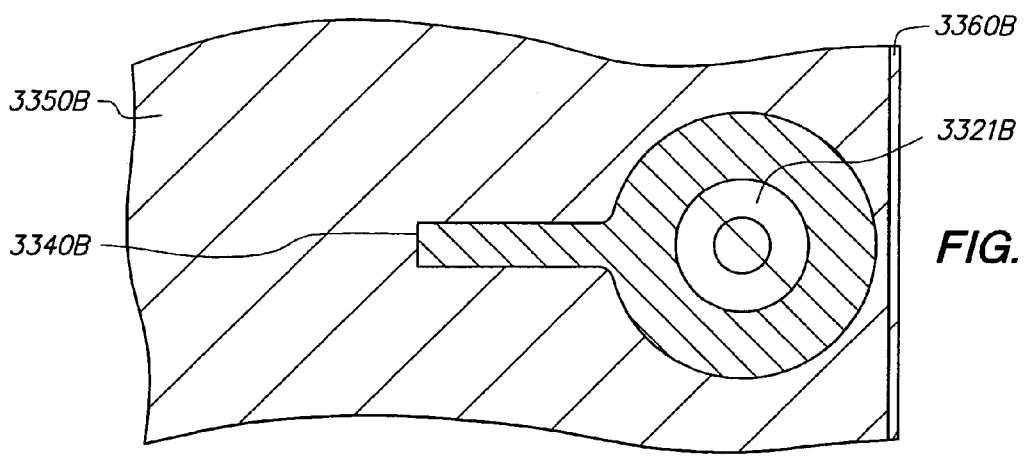

FIGS. 61A, 61B and 61C are cross-sectional, top and bottom views, respectively, of semiconductor chip assembly 3398A stacked on semiconductor chip assembly 3398B after a solder reflow operation.

Heat is applied to reflow solder paste 3331. Solder paste 3331 includes finely powdered tin-lead solder particles mixed in a viscous organic resin containing a fluxing agent. The heat causes the flux in solder paste 3331 to react with and remove oxides from pillar 3321A and metal particle 3356B and the solder particles in solder paste 3331, renders the solder particles in solder paste 3331 molten such that they coalesce, and vaporizes the organic resin in solder paste 3331. As a result, solder paste 3331 wets pillar 3321A and metal particle 3356B in aperture 3382B, and solder reflow occurs. Furthermore, assembly 3398A moves slightly downwardly towards (but not laterally relative to) assembly 3398B without applying external pressure. As a result, pillar 3321A tunnels slightly further into solder paste 3331 and moves slightly downwardly towards metal particle 3356B.

The heat is then removed and solder paste 3331 cools and solidifies into a hardened solder bond which provides conductive interconnect 3333 that contacts and mechanically attaches and electrically connects pillar 3321A and metal particle 3356B and is spaced from routing line 3340A. The solder reflow operation also transforms a loose unsecured relation between assemblies 3398A and 3398B into a secure mechanical attachment between assemblies 3398A and 3398B.

Pillar 3321A extends into and is embedded in conductive interconnect 3333 and remains spaced and separated from metal particle 3356B and encapsulant 3360B, pillar 3321A extends into encapsulant 3360B at aperture 3382B, and pillar 3321A and conductive interconnect 3333 fill essentially all remaining space in aperture 3382B. Furthermore, solder mask 3350A and encapsulant 3360B remain spaced and separated from one another by an open gap, and pillars 3321A and 3321B remain vertically aligned with one another.

Conductive interconnect 3333 has a mass that falls within a narrow tolerance such that there is enough solder to provide a large contact area and a robust mechanical and electrical connection between pillar 3321A and metal particle 3356B during the solder reflow operation without providing so much solder as to substantially overflow outside aperture 3382B or create a bridge or short between pillar 3321A and an adjacent pillar or conductive interconnect.

Advantageously, the compliant and deformable nature of conductive interconnect 3333 during the solder reflow operation provides a flexible vertical interconnection that can accommodate a wide range of process variations. For instance, an essentially identical package arises despite size and shape variations in pillar 3321A and metal particle 3356B which may occur due to wet chemical etching variations (such as etch flows, concentrations and times) during the manufacture of assemblies 3398A and 3398B, respectively. The process need not be customized (e.g., trimming the pillar height) to accommodate these variations. As a result, the process is well-suited for cost-effective volume manufacturing.

Semiconductor chip assembly 3398A includes chip 3310A, pillar 3321A, routing line 3340A, solder mask 3350A, adhesive 3354A, metal particle 3356A, encapsulant 3360A, connection joint 3372A and conductive bond 3381A. Semiconductor chip assembly 3398B includes chip 3310B, pillar 3321B, routing line 3340B, solder mask 3350B, adhesive 3354B, metal particle 3356B, encapsulant 3360B, connection joint 3372B and conductive bond 3381B. Three-dimensional stacked semiconductor package 3399 includes conductive interconnect 3333 and semiconductor chip assemblies 3398A and 3398B.

FIGS. 62A–64A, 62B–64B and 62C–64C are cross-sectional, top and bottom views, respectively, of a method of making a three-dimensional stacked semiconductor package in accordance with a thirty-fourth embodiment of the present invention. In the thirty-fourth embodiment, the semiconductor package includes first and second semiconductor chip assemblies. For purposes of brevity, any description in the first embodiment is incorporated herein insofar as the same is applicable, and the same description need not be repeated. Likewise, elements of the thirty-fourth embodiment similar to those in the first embodiment have corresponding reference numerals indexed at thirty-four-hundred rather than one-hundred and followed by the suffix "A" or "B". For instance, chip 3410A corresponds to chip 110, chip 3410B corresponds to chip 110, routing line 3440A corresponds to routing line 140, routing line 3440B corresponds to routing line 140, etc.

Figure 62A:
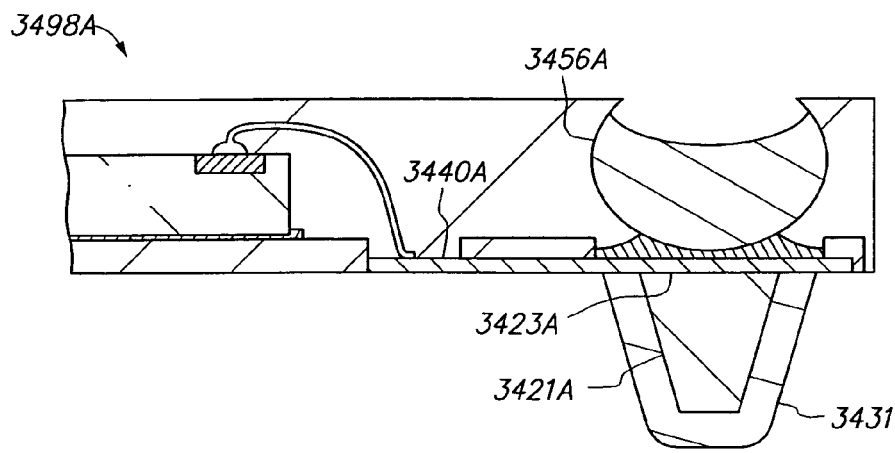
Figure 62B:
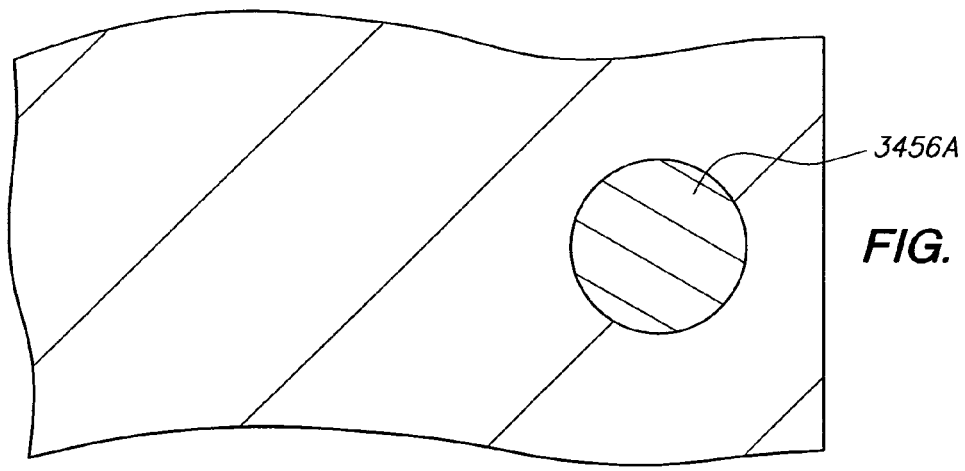
Figure 62C:
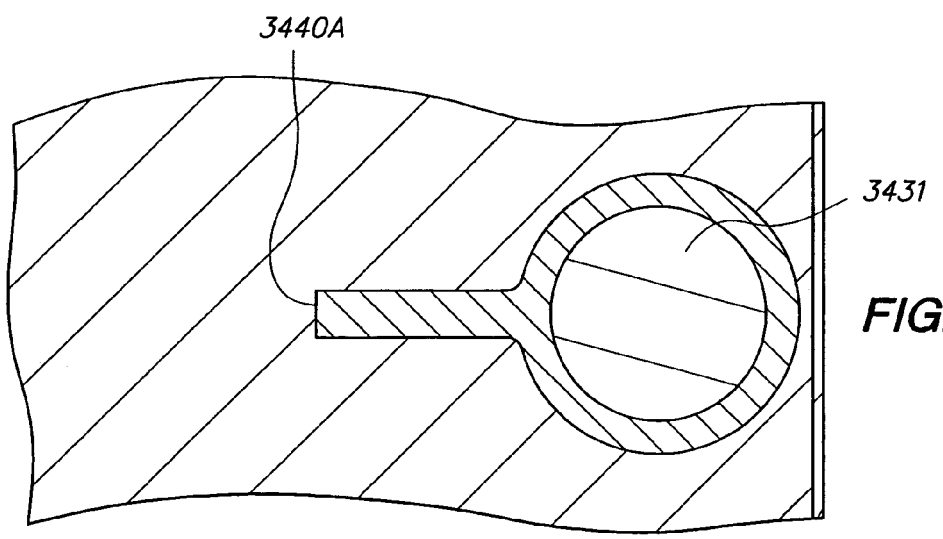

FIGS. 62A, 62B and 62C are cross-sectional, top and bottom views, respectively, of solder paste 3431 and semiconductor chip assembly 3498A.

Semiconductor chip assembly 3498A is formed in the same manner as semiconductor chip assembly 3098. Thereafter, solder paste 3431 is deposited on pillar 3421A. Solder paste 3431 is compliant enough at room temperature to conform to virtually any shape. As a result, solder paste 3431 contacts and covers pillar 3421A, and contacts routing line 3440A adjacent to surface 3423A of pillar 3421A. However, solder paste 3431 is spaced and separated from metal particle 3456A.

For convenience of illustration, solder paste 3431 is shown below metal particle 3456A to retain a single orientation throughout the figures for ease of comparison between the figures, although in this step the structure would be inverted to assist the solder paste printing process.

Figure 63A:
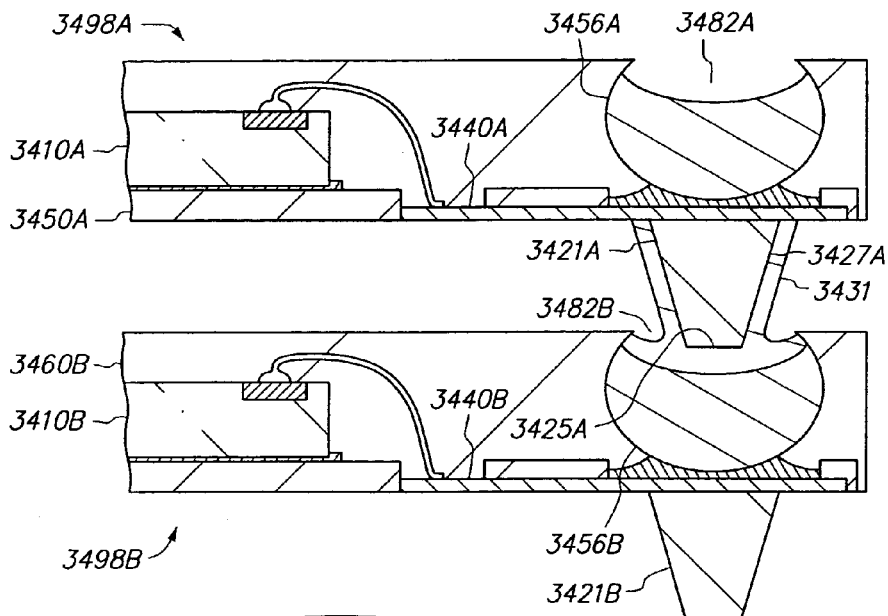
Figure 63B:
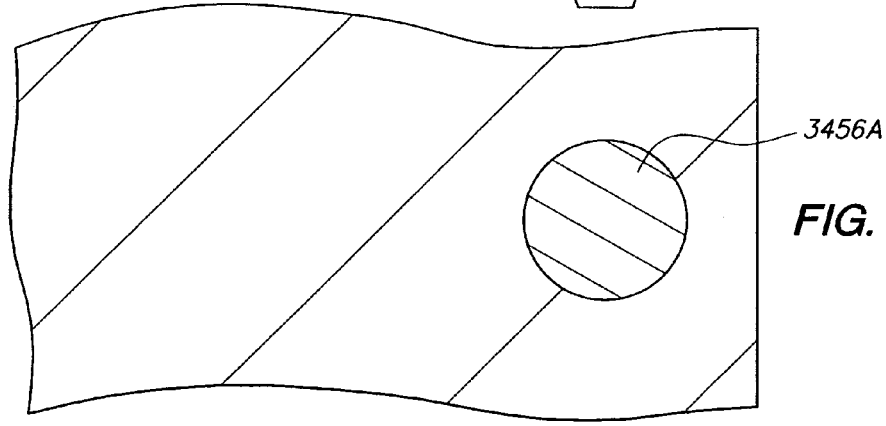
Figure 63C:
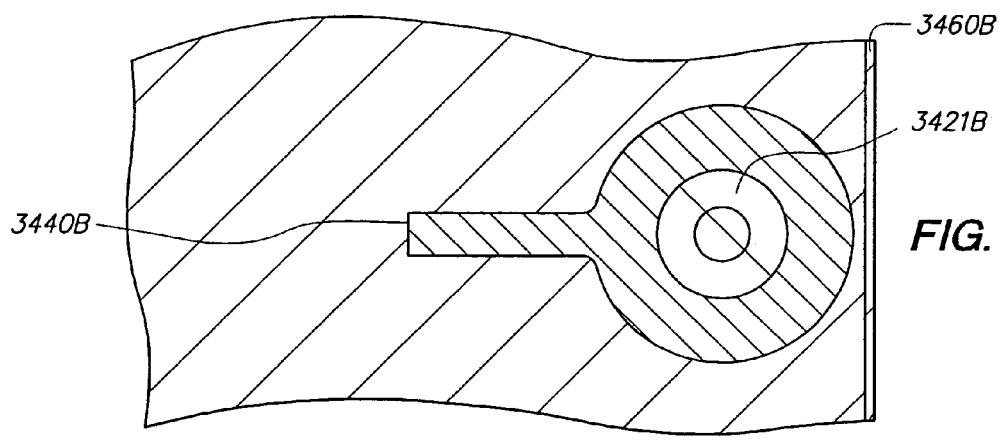

FIGS. 63A, 63B and 63C are cross-sectional, top and bottom views, respectively, of semiconductor chip assembly 3498A stacked on semiconductor chip assembly 3498B before a solder reflow operation.

Semiconductor chip assembly 3498B is formed in the same manner as semiconductor chip assembly 3098, and semiconductor chip assemblies 3498A and 3498B are essentially identical to one another.

Semiconductor chip assemblies 3498A and 3498B are positioned relative to one another using a surface mount placement machine such that assembly 3498A is placed on but not firmly mechanically attached to assembly 3498B, chips 3410A and 3410B are vertically aligned with one another, pillars 3421A and 3421B are vertically aligned with one another, routing lines 3440A and 3440B are vertically aligned with one another, metal particles 3456A and 3456B are vertically aligned with one another, and apertures 3482A and 3482B are vertically aligned with one another in a vertically stacked arrangement. Pillar 3421A extends into aperture 3482B, contacts and remains covered by solder paste 3431 and is spaced and separated from metal particle 3456B and encapsulant 3460B, solder paste 3431 extends into aperture 3482B and contacts metal particle 3456B, and solder mask 3450A is spaced and separated from encapsulant 3460B by an open gap. In addition, surface 3425A and tapered sidewalls 3427A of pillar 3421A remain covered by solder paste 3431, and solder paste 3431 deforms and contours to and covers the previously exposed upper surface of metal particle 3456B and is squeezed upwardly in aperture 3482B towards metal particle 3456A. Furthermore, pillar 3421A weakly adheres to metal particle 3456B due to solder paste 3431.

Figure 64A:
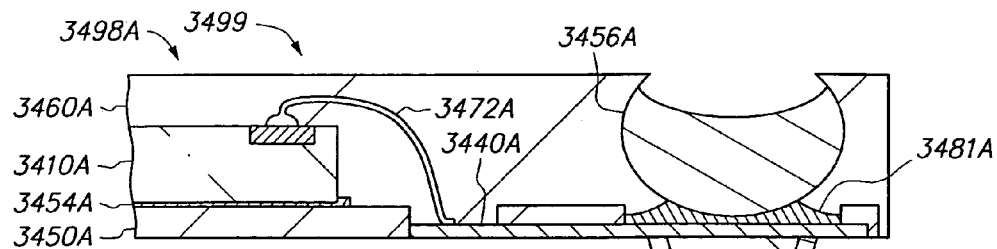
Figure 64B:
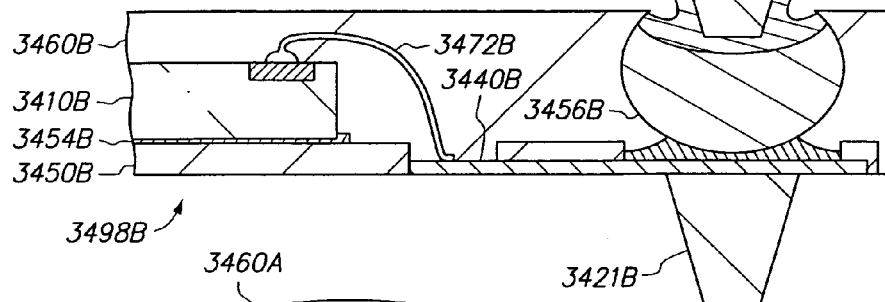
Figure 64B:
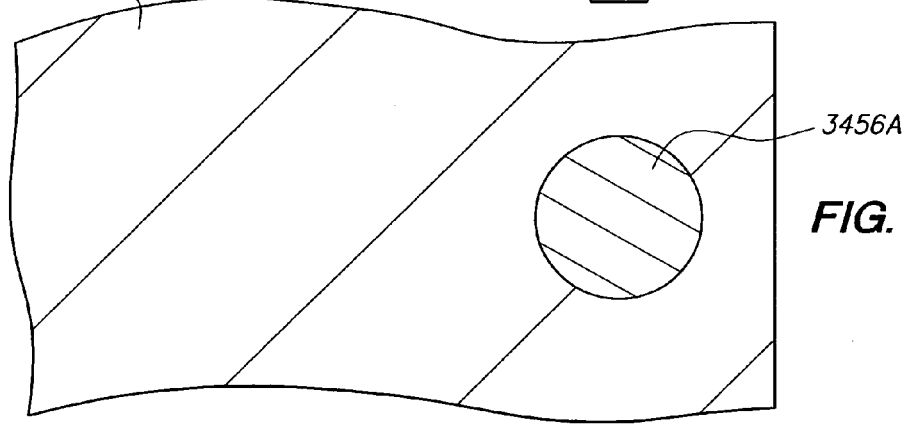
Figure 64C:
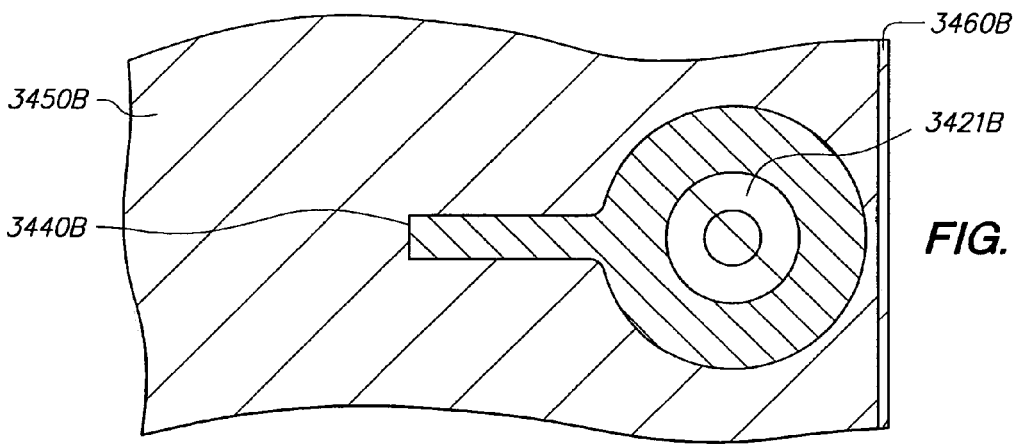

FIGS. 64A, 64B and 64C are cross-sectional, top and bottom views, respectively, of semiconductor chip assembly 3498A stacked on semiconductor chip assembly 3498B after a solder reflow operation.

Heat is applied to reflow solder paste 3431. Solder paste 3431 includes finely powdered tin-lead solder particles mixed in a viscous organic resin containing a fluxing agent. The heat causes the flux in solder paste 3431 to react with and remove oxides from pillar 3421A and metal particle 3456B and the solder particles in solder paste 3431, renders the solder particles in solder paste 3431 molten such that they coalesce, and vaporizes the organic resin in solder paste 3431. As a result, solder paste 3431 wets pillar 3421A inside and outside aperture 3482B and wets metal particle 3456B in aperture 3482B, and solder reflow occurs. Furthermore, assembly 3498A moves slightly downwardly towards (but not laterally relative to) assembly 3498B without applying external pressure. As a result, pillar 3421A tunnels slightly further into solder paste 3431 and moves slightly downwardly towards metal particle 3456B.

The heat is then removed and solder paste 3431 cools and solidifies into a hardened solder bond which provides conductive interconnect 3433 that contacts and mechanically attaches and electrically connects pillar 3421A and metal particle 3456B, and routing line 3440A and metal particle 3456B. The solder reflow operation also transforms a loose unsecured relation between assemblies 3498A and 3498B into a secure mechanical attachment between assemblies 3498A and 3498B.

Pillar 3421A extends into and is embedded in conductive interconnect 3433 and remains spaced and separated from metal particle 3456B and encapsulant 3460B, pillar 3421A extends into encapsulant 3460B at aperture 3482B, and pillar 3421A and conductive interconnect 3433 fill essentially all remaining space in aperture 3482B. Furthermore, solder mask 3450A and encapsulant 3460B remain spaced and separated from one another by an open gap, and pillars 3421A and 3421B remain vertically aligned with one another.

Conductive interconnect 3433 has a mass that falls within a narrow tolerance such that there is enough solder to provide a large contact area and a robust mechanical and electrical connection between pillar 3421A and metal particle 3456B during the solder reflow operation without providing so much solder as to substantially overflow outside aperture 3482B or create a bridge or short between pillar 3421A and an adjacent pillar or conductive interconnect.

Advantageously, the compliant and deformable nature of conductive interconnect 3433 during the solder reflow operation provides a flexible vertical interconnection that can accommodate a wide range of process variations. For instance, an essentially identical package arises despite size and shape variations in pillar 3421A and metal particle 3456B which may occur due to wet chemical etching variations (such as etch flows, concentrations and times) during the manufacture of assemblies 3498A and 3498B, respectively. The process need not be customized (e.g., trimming the pillar height) to accommodate these variations. As a result, the process is well-suited for cost-effective volume manufacturing.

Semiconductor chip assembly 3498A includes chip 3410A, pillar 3421A, routing line 3440A, solder mask 3450A, adhesive 3454A, metal particle 3456A, encapsulant 3460A, connection joint 3472A and conductive bond 3481A. Semiconductor chip assembly 3498B includes chip 3410B, pillar 3421B, routing line 3440B, solder mask 3450B, adhesive 3454B, metal particle 3456B, encapsulant 3460B, connection joint 3472B and conductive bond 3481B. Three-dimensional stacked semiconductor package 3499 includes conductive interconnect 3433 and semiconductor chip assemblies 3498A and 3498B.

The semiconductor chip assemblies described above are merely exemplary. Numerous other embodiments are contemplated. For instance, the solder terminal(s), insulative base and/or metal base can be omitted. In addition, the embodiments described above can generally be combined with one another. For instance, the electroplated connection joint in the first embodiment can be used in the twenty-seventh to thirty-fourth embodiments. Likewise, the flip-chip in the second embodiment can be used in the fifth to thirteenth and sixteenth to thirty-fourth embodiments. Likewise, the wire bond in the fourth embodiment can be used in the fifth to ninth, eleventh to thirteenth and sixteenth to thirty-fourth embodiments but not in the tenth embodiment since the chip's active surface should not be grinded. Likewise, the conductive bonds in the fifth and sixth embodiments can be used in the other embodiments. Likewise, the encapsulant deposition in the seventh and eighth embodiments and the selective encapsulant removal in the ninth embodiment can be used in the other embodiments. Likewise, the chip grinding in the tenth embodiment can be used in the other embodiments (including the twenty-eighth to thirty-fourth embodiments with the chip inverted) except for the fourth embodiment since the chip's active surface should not be grinded. Likewise, the solder mask in the eleventh embodiment can be used in the other embodiments. Likewise, the exposed metal particle in the twelfth embodiment can be used in the other embodiments except for the sixteenth embodiment since the plated terminal covers the metal particle. Likewise, the etched metal particle in the thirteenth embodiment can be used in the other embodiments. Likewise, the electrolessly plated connection joint in the fourteenth embodiment can be used in the other embodiments except for the second to fourth embodiments since flip-chip or wire bonding is used. Likewise, the plated terminal in the sixteenth embodiment can be used in the other embodiments except for the twelfth, twenty-ninth and thirtieth embodiments since the metal particle is exposed. Likewise, the second solder terminal in the seventeenth embodiment can be used in the other embodiments except for the eighteenth and twenty-third to twenty-sixth embodiments since the conductive trace is not selectively exposed in the downward direction. Likewise, the insulative base that covers the conductive trace in the eighteenth embodiment can be used in the other embodiments except for the seventeenth, twenty-first, twenty-second and twenty-eighth to thirtieth embodiments since the conductive trace is exposed in the downward direction. Likewise, the bumpless routing line in the nineteenth embodiment can be used in the other embodiments. Likewise, the wire segment in the twentieth embodiment can be used in the other embodiments. Likewise, the heat sinks and the ground planes in the twenty-third to twenty-sixth embodiments can be used the other embodiments except for the seventeenth, twenty-first, twenty-second and twenty-eighth to thirtieth embodiments since the conductive trace is selectively exposed in the downward direction. Likewise, the insulative base attached to the routing line before the chip and the metal particle are attached to the routing line in the twenty-seventh embodiment can be used in the other embodiments. Likewise, the pillar in the twenty-eighth to thirtieth embodiments can be used in the other embodiments except for the eighteenth and twenty-third to twenty-sixth embodiments since the conductive trace is not selectively exposed in the downward direction. Likewise, the multi-chip assembly in the thirty-first embodiment can be used in the other embodiments. Finally, the stacked packages in the thirty-second to thirty-fourth embodiments can be provided by the assemblies in the other embodiments although certain embodiments may not be suitable for certain assemblies in the stack; for instance, the eighteenth and twenty-third to twenty-sixth embodiments are suitable for the lowest assembly in the stack since the conductive trace need not be selectively exposed in the downward direction, but are not suitable for the assemblies above the lowest assembly in the stack since the conductive trace is not selectively exposed in the downward direction. The embodiments described above can be mixed-and-matched with one another and with other embodiments depending on design and reliability considerations.

The metal base can be various metals such as copper, copper alloys, nickel, iron-nickel alloys, aluminum, and so on, and can be a single layer or multiple layers.

The opening in the metal base can be formed before or after forming the routing line, and before or after attaching the metal base to the chip. In addition, the opening in the metal base can be formed by selectively etching the metal base through an etch mask or by blanketly etching a slot in the metal base. Furthermore, the opening in the metal base can expose a single pad or a plurality of pads. For instance, the opening in the metal base can expose multiple through-holes in the adhesive which each expose a respective routing line and a respective pad, thereby facilitating the flow of electrolytic plating solution for the connection joints. Thereafter, multiple connection joints can be formed which each contact and electrically connect a respective routing line and a respective pad, the insulative plug can be formed in the opening in the metal base and on the connection joints, and then the metal base can be etched, for instance to form the pillar or be removed, while the insulative plug protects the connection joints from the wet chemical etch.

The metal base need not necessarily be removed. For instance, a portion of the metal base that extends across the pad can be selectively etched to permit formation of the through-hole, and another portion of the metal base that is disposed within the periphery of the chip can remain intact and provide a heat sink. Likewise, a portion of the metal base within the periphery of the chip can be selectively etched, and another portion of the metal base that is disposed outside the periphery of the chip can remain intact and provide the pillar.

The etch mask that defines the pillar can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base and before or after the encapsulant is formed, can be disposed on a planar surface of the metal base or in a recess in the metal base, and if disposed in a recess need not necessarily fill the recess. Furthermore, the etch mask can remain permanently attached to the pillar or be removed after the pillar is formed.

The etch mask that defines the pillar is undercut by a wet chemical etch that forms the pillar but can subsequently be confined to the tip of the pillar, for instance by dislodging a portion of the etch mask outside the tip of the pillar by mechanical brushing, sand blasting, air blowing or water rinsing, or by reflowing a solder etch mask when the metal particle does not provide a wettable surface. Alternatively, a solder etch mask can be reflowed to conformally coat the pillar, for instance by depositing flux on the pillar so that the pillar provides a wettable surface before the solder reflow operation.

Further details regarding a pillar that is etched from a metal base and contacts a routing line are disclosed in U.S. application Ser. No. 10/714,794 filed Nov. 17, 2003 by Chuen Rong Leu et al. entitled "Semiconductor Chip Assembly with Embedded Metal Pillar" which is incorporated by reference.

Figure 65:
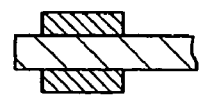
FIGS. 65–69 are bottom plan views of routing line variations in accordance with the present invention.
Figure 66:
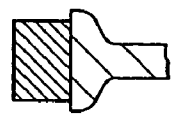
Figure 67:
Figure 68:
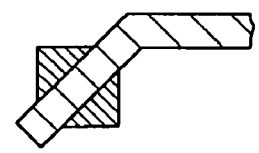
Figure 69:
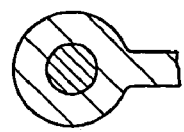

The routing line can have various shapes and sizes. The routing line can extend across various portions of the pad, such as one peripheral edge and the center of the pad (FIG. 11E), two opposing peripheral edges and the center of the pad (FIG. 65), three peripheral edges but not the center of the pad (FIGS. 66 and 67), two corners and the center of the pad (FIG. 68) or four peripheral edges but not the center of the pad (FIG. 69).

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as is well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. The routing line can also be spot plated away from the pad to make it compatible with receiving the metal particle. For instance, a copper routing line can be spot plated with nickel and then gold to facilitate solder reflow of a solder ball metal particle.

The metal particle can be solder, or alternatively, another metal such as copper, tin, nickel, gold or silver. The metal particle can have a substantially spherical or cylindrical shape. For instance, the metal particle can be provided as a ball or a wire segment sliced from a wire before it is attached to the routing line. Furthermore, the metal particle can be mechanically attached and electrically connected to the routing line in numerous manners. For instance, the metal particle can include solder, then be coated with flux, then be deposited on the routing line, and then heated and reflowed. Alternatively, a conductive bond such as solder, solder paste or conductive adhesive can be deposited on the routing line, then the metal particle can be deposited on the conductive bond, and then the conductive bond can be reflowed, solidified or cured. Alternatively, the metal particle can be coated with a conductive bond such as solder, solder paste or conductive adhesive, then the coated metal particle can be deposited on the routing line, and then the conductive bond can be reflowed, solidified or cured.

The conductive trace can include solder or conductive adhesive that contacts and overlaps the routing line and extends within a periphery of the metal particle. For instance, the metal particle can be solder and contact the routing line and the conductive trace can be devoid of conductive adhesive, or alternatively, the metal particle can be solder and a conductive bond that is solder or conductive adhesive can contact the routing line and the metal particle, or alternatively, the metal particle can be devoid of solder and conductive adhesive and a conductive bond that is solder or conductive adhesive can contact the routing line and the metal particle.

The conductive trace can be uncovered within the periphery of the metal particle in the upward direction by the encapsulant or any other insulative material of the assembly. For instance, the metal particle can be exposed in the upward direction, or alternatively, the metal particle can be unexposed in the upward direction and a solder terminal that contacts and overlaps the metal particle can be exposed in the upward direction, or alternatively, the metal particle can be unexposed in the upward direction and a plated terminal that contacts and overlaps the metal particle can be exposed in the upward direction, or alternatively, the metal particle can be unexposed in the upward direction, a plated terminal that contacts and overlaps the metal particle can be unexposed in the upward direction, and a solder terminal that contacts and overlaps the plated terminal and overlaps and is spaced and separated from the metal particle can be exposed in the upward direction, or alternatively, the conductive trace can be covered within the periphery of the metal particle in the upward direction due to a material external to the assembly such as another semiconductor chip assembly in a stacked arrangement.

In every case, the metal particle is not covered in the upward direction by the encapsulant or any other insulative material of the assembly, and therefore, the conductive trace is not covered within the periphery of the metal particle in the upward direction by the encapsulant or any other insulative material of the assembly. This is true regardless of whether the exposed surface of the conductive trace is the metal particle, the solder terminal, the plated terminal or another electrical conductor, regardless of whether the exposed surface of the conductive trace protrudes from, is aligned with, or is recessed relative to the encapsulant or any other insulative material of the assembly in the upward direction, regardless of whether other portions of the metal particle (such as the periphery of the metal particle) are covered in the upward direction by the encapsulant or another insulative material of the assembly, and regardless of whether an external component (e.g., assembly 3298A) covers the metal particle (e.g., metal particle 3256B) in the upward direction such that the conductive trace is covered and unexposed in the upward direction.

The conductive trace can be provided to include the routing line and the metal particle, to be electrically connected to the pad and to be exposed within the periphery of the metal particle in the upward direction after forming the encapsulant and the connection joint. This is true regardless of whether the conductive trace is also provided to include the routing line and the metal particle, to be electrically connected to the pad and to be exposed within the periphery of the metal particle in the upward direction before or during forming the encapsulant and/or before or during forming the connection joint. For instance, the conductive trace can be electrically connected to the pad during forming the connection joint. This also true regardless of whether the conductive trace is temporarily or permanently provided to include the routing line and the metal particle, to be electrically connected to the pad and to be exposed within the periphery of the metal particle in the upward direction after forming the encapsulant and the connection joint. For instance, the conductive trace can be subsequently covered in the upward direction by another semiconductor chip assembly. This also true regardless of whether the conductive trace is immediately or subsequently provided to include the routing line and the metal particle, to be electrically connected to the pad and to be exposed within the periphery of the metal particle in the upward direction after forming the encapsulant and the connection joint. For instance, the conductive trace can be subsequently exposed in the upward direction by grinding the encapsulant. In other words, providing the conductive trace with certain features and characteristics "after" forming the encapsulant and the connection joint need only occur at some instant in time subsequent to forming the encapsulant and the connection joint and does not preclude the occurrence at other times.

The conductive trace can function as a signal, power or ground layer depending on the purpose of the associated chip pad.

The pad can have numerous shapes including a flat rectangular shape and a bumped shape. For instance, a bump-shaped pad may extend into the through-hole. The pad can either be partially or completely exposed prior to forming the connection joint. The pad can have a length and width that are larger than, equal to, or smaller than the diameter of the through-hole. Preferably, a substantial portion of the pad is directly above the through-hole. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to the metal base or the solder mask and then contacted to the chip or a single layer that is applied to the chip and then contacted to the metal base or the solder mask. Similarly, the adhesive can be multiple layers with a first layer applied to the metal base or the solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The through-hole that extends through the adhesive and/or the solder mask and exposes the pad can be formed either before or after mechanically attaching the chip to the routing line. For instance, the adhesive can be applied as a liquid or paste (A stage) over the routing line, the adhesive can be partially cured (B stage), an etch can form the through-hole in the adhesive and/or the solder mask, the partially cured adhesive can be brought into contact with the chip, and then the adhesive can be fully cured (C stage). Alternatively, the liquid or paste adhesive can be sandwiched between the chip and the routing line, the adhesive can be fully cured thereby mechanically fastening the chip to the routing line, and then an etch can form the through-hole.

The through-hole can be formed using laser ablation (including laser direct write without a mask and projection laser ablation with a mask) or plasma etching. Similarly, the through-hole can be formed by a combination of laser ablation and plasma etching. See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The through-hole can have a circular, ovular, square, rectangular or other shape (as viewed from the bottom surface of the assembly). The through-hole can be aligned with and expose a single pad or multiple pads and may expose one or more peripheral edges of the pad or just a central portion of the pad spaced from the peripheral edges of the pad. Furthermore, the through-hole can have a wide variety of shapes and slopes including vertical sidewalls, tapered sidewalls, continuous sidewalls and stepped sidewalls.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wis. are suitable.

The insulative base can be deposited in numerous manners, including printing and transfer molding. Furthermore, the insulative base can be formed before or after attaching the chip and the metal particle to the routing line.

The encapsulant can be deposited using a wide variety of techniques including printing and transfer molding. For instance, the encapsulant can be printed on the chip and the metal particle as an epoxy paste and then cured or hardened to form a solid adherent protective layer. The encapsulant can be any of the adhesives mentioned above. Moreover, the encapsulant need not necessarily contact the chip or the metal particle. For instance, a glob-top coating can be deposited on the chip after attaching the chip to the routing line, and then the encapsulant can be formed on the glob-top coating. Likewise, a coating (such as flux or solder) can be deposited on the metal particle, and then the encapsulant can be formed on the coating.

The encapsulant can have its upper portion removed using a wide variety of techniques including grinding (including mechanical polishing and chemical-mechanical is polishing), blanket laser ablation and blanket plasma etching. Likewise, the encapsulant can have a selected portion above the metal particle removed using a wide variety of techniques including selective laser ablation, selective plasma etching and photolithography.

The encapsulant can be laterally aligned with the metal particle along an upwardly facing surface that faces and extends vertically beyond the chip by grinding the encapsulant without grinding the chip or the metal particle, and then grinding the encapsulant and the metal particle without grinding the chip, and then discontinuing the grinding before reaching the chip.

The encapsulant can be laterally aligned with the chip and the metal particle along an upwardly facing surface by grinding the encapsulant without grinding the chip or the metal particle, then grinding the encapsulant and the metal particle without grinding the chip, and then grinding the encapsulant, the chip and the metal particle (if the metal particle extends upwardly beyond the chip before the grinding occurs), or alternatively, by grinding the encapsulant without grinding the chip or the metal particle, then grinding the encapsulant and the chip without grinding the metal particle, and then grinding the encapsulant, the chip and the metal particle (if the chip extends upwardly beyond the metal particle before the grinding occurs).

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as after-forming the through-hole and is before forming the connection joint to clean the routing line and the pad.

The conductive interconnect can be formed from a wide variety of materials and processes and can have a wide variety of shapes and sizes. Preferably, the conductive interconnect is formed by depositing a non-solidified material on the pillar of the upper assembly or the metal particle of the lower assembly, then inserting the pillar into the aperture above the metal particle in the lower assembly, and then applying energy to transform the non-solidified material into the conductive interconnect. More preferably, the conductive interconnect is formed by solder reflowing or conductive adhesive curing.

The conductive interconnect formed by solder reflowing involves depositing a non-solidified solder-containing material and then applying energy to reflow the solder and form a hardened solder interconnect. Suitable solder-containing materials include solder paste, liquid solder and solder particles. The solder can be a tin-lead alloy, although lead-free compositions such as tin-bismuth are becoming increasingly popular due to environmental concerns over lead usage in the electronics industry. Suitable deposition processes include screen printing, stencil printing, meniscus coating, liquid solder jetting and solder particle placement. Heat can be supplied by a convection oven, although other techniques such as infrared (IR) continuous belt reflow, hot nitrogen gas, a laser beam and vapor-phase reflow can be used. The preferred deposition and reflow techniques depend on the solder-containing material employed.

The conductive interconnect formed by conductive adhesive curing involves depositing a non-solidified conductive adhesive and then applying energy to cure the conductive adhesive and form a hardened conductive adhesive interconnect. Suitable conductive adhesives include (1) a polymer binder (or matrix) and a filler metal powder, and (2) intrinsic conductive polymer. For instance, conductive epoxy paste includes an epoxy binder and silver flakes. Isotropic conductive adhesives in which the electrical conductivity is identical along the three coordinate axes are generally preferred. Suitable deposition processes include screen printing and stencil printing. Heat can be supplied by a convection oven, although other energy sources such as microwaves and UV light can be used. The preferred deposition and curing techniques depend on the conductive adhesive employed.

It is understood that, in the context of the present invention, any chip embedded in the encapsulant is electrically connected to the metal particle by an electrically conductive path that includes the routing line means that the routing line is in an electrically conductive path between the metal particle and any chip embedded in the encapsulant. This is true regardless of whether a single chip is embedded in the encapsulant (in which case the chip is electrically connected to the metal particle by an electrically conductive path that includes the routing line) or multiple chips are embedded in the encapsulant (in which case each of the chips is electrically connected to the metal particle by an electrically conductive path that includes the routing line). This is also true regardless of whether the electrically conductive path includes or requires a conductive bond between the metal particle and the routing line. This is also true regardless of whether the electrically conductive path includes or requires a connection joint between the routing line and the chip. This is also true regardless of whether the electrically conductive path includes or requires a passive component such as a capacitor or a resistor. This is also true regardless of whether multiple chips are electrically connected to the routing line by multiple connection joints, and the multiple connection joints are electrically connected to one another only by the routing line. This is also true regardless of whether multiple chips are electrically connected to the metal particle by different electrically conductive paths (such as the multiple connection joint example described above) as long as each of the electrically conductive paths includes the routing line.

It is also understood that, in the context of the present invention, the metal particle extends across most or all of a thickness of the chip and any other chip embedded in the encapsulant means that the metal particle extends across most or all of a thickness of any chip embedded in the encapsulant. This is true regardless of whether a single chip is embedded in the encapsulant (in which case the metal particle extends across most or all of a thickness of the chip) or multiple chips are embedded in the encapsulant (in which case the metal particle extends across most or all of a thickness of each of the chips).

The "upward" and "downward" vertical directions do not depend on the orientation of the assembly, as will be readily apparent to those skilled in the art. For instance, the metal particle extends vertically beyond the routing line in the "upward" direction, the encapsulant extends vertically beyond the routing line in the "upward" direction, the pillar extends vertically beyond the routing line in the "downward" direction, and the insulative base extends vertically beyond the chip in the "downward" direction, regardless of whether the assembly is inverted and/or mounted on a printed circuit board. Likewise, the routing line extends "laterally" beyond the metal particle towards the chip regardless of whether the assembly is inverted, rotated or slated. Thus, the "upward" and "downward" directions are opposite one another and orthogonal to the "lateral" direction, and the "laterally aligned" surfaces are coplanar with one another in a lateral plane orthogonal to the upward and downward directions. Moreover, the metal particle is shown above the routing line, the chip is shown above the routing line and the insulative base, and the encapsulant is shown above the routing line and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single insulative base and a single encapsulant and then separated from one another. For example, routing lines for multiple assemblies can be simultaneously electroplated on the metal base, then separate spaced adhesives for the respective assemblies can be selectively disposed on the metal base, then the chips can be disposed on the corresponding adhesives, then the adhesives can be simultaneously fully cured, then the metal particles can be disposed on the corresponding routing lines, then the encapsulant can be deposited and then grinded, then the protective mask can be deposited on the metal particles and the encapsulant, then the metal base can be etched to form the openings for the respective assemblies, then the through-holes can be formed, then the connection joints can be simultaneously electroplated, then separate spaced insulative plugs for the respective assemblies can be formed in the corresponding openings, then the metal base can be etched and removed, then the insulative base can be formed and then etched to expose the bumped terminals, then the protective mask can be removed, then the solder terminals can be deposited and simultaneously reflowed on the respective metal particles, and then the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package (such as the first to thirtieth embodiments) or a multi-chip package (such as the thirty-first embodiment). Furthermore, a multi-chip first-level package can include chips that are stacked and vertically aligned with one another or are coplanar and laterally aligned with one another.

The three-dimensional stacked semiconductor package (such as the thirty-second to thirty-fourth embodiments) can include two, three or more stacked semiconductor chip assemblies. Furthermore, the three-dimensional stacked semiconductor package can include semiconductor chip assemblies that are vertically aligned with and essentially identical to one another. For instance, all assemblies in the stack can be vertically aligned with and essentially identical to one another, or alternatively, all assemblies in the stack can be vertically aligned with one another and the assemblies above the lowest assembly in the stack can be essentially identical to one another, or alternatively, all assemblies in the stack can be vertically aligned with one another and the assemblies between the highest and lowest assemblies in the stack can be essentially identical to one another.

Advantageously, the three-dimensional stacked semiconductor package of the present invention is reliable and inexpensive. The chips need not be specifically designed for stacking during wafer manufacturing. The pillars can be tapered to yield enhanced reliability for the next level assembly that exceeds that of conventional BGA packages. Furthermore, the metal particles and/or the conductive interconnects can be rendered non-solidified and deformed as the pillars are inserted into and aligned with the encapsulant apertures to accommodate thickness variations in the assemblies. The metal particles and/or the conductive interconnects can be reworkable to permit rework and reassembly. Furthermore, the package can have a wide variety of packaging formats as required by the next level assembly. As a result, the package of the present invention significantly enhances throughput, yield, performance characteristics, standardization and cost-effectiveness compared to conventional packaging techniques.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a three-dimensional stacked semiconductor package, comprising:
   providing a first semiconductor chip assembly that includes:
     a first semiconductor chip that includes first and second opposing surfaces, wherein the first surface of the first chip includes a first conductive pad;
     a first conductive trace that includes a first routing line and a first metal pillar and is electrically connected to the first pad; and
     a first encapsulant that includes first and second opposing surfaces, wherein the first surface of the first encapsulant faces in a first direction, the second surface of the first encapsulant faces in a second direction opposite the first direction, the first chip is embedded in the first encapsulant, the first routing line overlaps the first metal pillar and extends laterally beyond the first metal pillar towards the first chip, and the first metal pillar is devoid of solder and conductive adhesive, is disposed outside a periphery of the first chip and extends vertically beyond the first chip, the first routing line and the first encapsulant in the second direction;
   providing a second semiconductor chip assembly that includes:
     a second semiconductor chip that includes first and second opposing surfaces, wherein the first surface of the second chip includes a second conductive pad;
     a second conductive trace that includes a second routing line and a second metal particle and is electrically connected to the second pad; and
     a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, the second chip and the second metal particle are embedded in the second encapsulant, the second routing line extends laterally beyond the second metal particle towards the second chip, and the second metal particle overlaps the second routing line, is disposed outside a periphery of the second chip and extends vertically across at least some of a thickness of the second chip between the first and second surfaces of the second chip; then
   positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture;
   reflowing the second metal particle such that the first metal pillar extends into and is embedded in the second metal particle; and
   electrically connecting the first metal pillar and the second metal particle within the second encapsulant.

2. The method of claim 1, wherein forming the first routing line and the first metal pillar includes selectively depositing the first routing line on a first metal base, and then etching the first metal base, thereby forming the first metal pillar from an unetched portion of the first metal base.

3. The method of claim 2, wherein selectively depositing the first routing line includes providing a plating mask on the first metal base, wherein the plating mask includes an opening that exposes a portion of the first metal base, and then electroplating the first routing line on the exposed portion of the first metal base through the opening in the plating mask.

4. The method of claim 2, wherein etching the first metal base removes a first portion of the first metal base that contacts the first routing line without removing a second portion of the first metal base that contacts the first routing line, thereby reducing but not eliminating contact area between the first metal base and the first routing line.

5. The method of claim 1, wherein forming the second aperture includes etching the second metal particle after forming the second encapsulant.

6. The method of claim 5, wherein etching the second metal particle includes applying a wet chemical etch that is selective of the second metal particle relative to the second encapsulant.

7. The method of claim 5, wherein etching the second metal particle includes receding the second metal particle relative to the first surface of the second encapsulant.

8. The method of claim 1, wherein positioning the first and second assemblies includes contacting the first metal pillar and the second metal particle.

9. The method of claim 1, wherein reflowing the second metal particle includes moving the first metal pillar towards the second routing line.

10. The method of claim 1, wherein reflowing the second metal particle transforms a loose unsecured relation between the first metal pillar and the second metal particle into a secure mechanical attachment between the first metal pillar and the second metal particle.

11. The method of claim 1, wherein the first surfaces of the first and second chips face in the first direction, and the second surfaces of the first and second chips face in the second direction.

12. The method of claim 1, wherein the first surfaces of the first and second chips face in the second direction, and the second surfaces of the first and second chips face in the first direction.

13. The method of claim 1, wherein the first chip is the only chip embedded in the first encapsulant, and the second chip is the only chip embedded in the second encapsulant.

14. The method of claim 1, wherein the first chip and another chip are embedded in the first encapsulant, and the second chip and another chip are embedded in the second encapsulant.

15. The method of claim 1, wherein any chip embedded in the first encapsulant extends vertically beyond the first routing line in the first direction, and any chip embedded in the second encapsulant extends vertically beyond the second routing line in the first direction.

16. The method of claim 1, wherein any chip embedded in the first encapsulant is electrically connected to the first metal pillar by an electrically conductive path that includes the first routing line, and any chip embedded in the second encapsulant is electrically connected to the second metal particle by an electrically conductive path that includes the second routing line.

17. The method of claim 1, wherein the first routing line is disposed vertically beyond the first chip in the second direction, and the second routing line is disposed vertically beyond the second chip in the second direction.

18. The method of claim 1, wherein the first routing line is unbent in the first and second directions, and the second routing line is unbent in the first and second directions.

19. The method of claim 1, wherein the second routing line is disposed vertically beyond the second metal particle in the second direction.

20. The method of claim 1, wherein the second routing line includes a second cavity that is disposed outside the periphery of the second chip and faces in the first direction, and the second metal particle extends into the second cavity.

21. The method of claim 1, wherein the first metal pillar includes first and second opposing surfaces that are flat and parallel to one another and first tapered sidewalls therebetween, the first surface of the first metal pillar faces towards and contacts the first routing line and is disposed outside the second aperture, the second surface of the first metal pillar faces away from and is spaced from the first routing line and is disposed within the second aperture, and the first tapered sidewalls slant inwardly towards the second surface of the first metal pillar.

22. The method of claim 21, wherein the first and second surfaces of the first metal pillar have a circular shape.

23. The method of claim 21, wherein the second surface of the first metal pillar is concentrically disposed within a surface area of the first surface of the first metal pillar.

24. The method of claim 21, wherein the second surface of the first metal pillar is concentrically disposed within a surface area of the second metal particle.

25. The method of claim 21, wherein a surface area of the first surface of the first metal pillar is at least 20 percent larger than a surface area of the second surface of the first metal pillar.

26. The method of claim 21, wherein the first metal pillar is copper and has a conical shape.

27. The method of claim 1, wherein the first metal pillar contacts and is non-integral with the first routing line.

28. The method of claim 1, wherein the first metal pillar is disposed vertically beyond the first chip, the first routing line and the first encapsulant in the second direction and is disposed vertically beyond the second routing line in the first direction.

29. The method of claim 1, wherein the first metal pillar extends into and contacts and is embedded in the second metal particle within the second encapsulant.

30. The method of claim 29, wherein the second metal particle is solder.

31. The method of claim 29, wherein the second metal particle is the only material external to the first assembly that contacts the first metal pillar.

32. The method of claim 29, wherein the first routing line and the second metal particle are the only materials that contact the first metal pillar.

33. The method of claim 1, wherein the first metal pillar extends into and contacts and is embedded in the second metal particle outside the first encapsulant and within the second encapsulant.

34. The method of claim 33, wherein the second metal particle is solder.

35. The method of claim 33, wherein the second metal particle is the only material between the first metal pillar and the second encapsulant.

36. The method of claim 33, wherein the second metal particle is the only material external to the first assembly that contacts the first metal pillar.

37. The method of claim 33, wherein the first routing line and the second metal particle are the only materials that contact the first metal pillar.

38. The method of claim 1, wherein the first metal pillar extends vertically beyond one of the first and second surfaces of the second chip in the second direction.

39. The method of claim 1, wherein most or all of the first metal pillar extends into the second aperture.

40. The method of claim 1, wherein essentially all of the first metal pillar extends into the second aperture.

41. The method of claim 1, wherein the first metal pillar contacts only solder in the second aperture.

42. The method of claim 41, wherein the second metal particle is the solder.

43. The method of claim 41, wherein the first routing line and the second metal particle are the only materials that contact the first metal pillar.

44. The method of claim 1, wherein the second metal particle is solder.

45. The method of claim 44, wherein the second metal particle is the only material external to the first assembly that contacts the first metal pillar.

46. The method of claim 44, wherein the first routing line and the second metal particle are the only materials that contact the first metal pillar.

47. The method of claim 44, wherein most or all of the first metal pillar is embedded in the second metal particle.

48. The method of claim 44, wherein essentially all of the first metal pillar is embedded in the second metal particle.

49. The method of claim 1, wherein the second metal particle includes a first surface that faces in the first direction and has a concave, crater-like shape.

50. The method of claim 1, wherein the second metal particle extends vertically beyond the second chip in the first direction.

51. The method of claim 1, wherein the second metal particle extends vertically beyond the second chip in the second direction.

52. The method of claim 1, wherein the second metal particle extends vertically beyond the second chip in the first and second directions.

53. The method of claim 1, wherein the second metal particle extends vertically across most or all of the thickness of the second chip.

54. The method of claim 1, wherein the second metal particle extends vertically across most or all of a thickness of any chip embedded in the second encapsulant.

55. The method of claim 1, wherein the second metal particle is recessed relative to the first surface of the second encapsulant.

56. The method of claim 1, wherein the first encapsulant covers the first chip in the first direction, and the second encapsulant covers the second chip in the first direction.

57. The method of claim 1, wherein the first encapsulant covers the first chip in the first direction and does not overlap the first chip in the second direction, and the second encapsulant covers the second chip in the first direction and does not overlap the second chip in the second direction.

58. The method of claim 1, wherein the first encapsulant contacts the first chip, and the second encapsulant contacts the second chip.

59. The method of claim 1, wherein the first encapsulant contacts the first chip, and the second encapsulant contacts the second chip and the second metal particle.

60. The method of claim 1, wherein the first surface of the first encapsulant is laterally aligned with the second surface of the first chip and the second surface of the first chip is not covered in the first direction by another material of the first assembly, and the first surface of the second encapsulant is laterally aligned with the second surface of the second chip and the second surface of the second chip is not covered in the first direction by another material of the second assembly.

61. The method of claim 1, wherein most or all of the first surface of the first encapsulant is not covered in the first direction by another material of the first assembly and most or all of the second surface of the first encapsulant is covered in the second direction by another material of the first assembly, and most or all of the first surface of the second encapsulant is not covered in the first direction by another material of the second assembly and most or all of the second surface of the second encapsulant is covered in the second direction by another material of the second assembly.

62. The method of claim 1, wherein the second aperture is disposed outside the periphery of the second chip.

63. The method of claim 1, wherein the second aperture is vertically aligned with the first metal pillar.

64. The method of claim 1, wherein the second aperture is vertically aligned with the second metal particle.

65. The method of claim 1, wherein the second aperture extends into but not through the second encapsulant and is spaced from the second routing line.

66. The method of claim 1, wherein the second aperture has a diameter that increases as the second aperture extends from the first surface of the second encapsulant to the second metal particle.

67. The method of claim 1, wherein the second aperture is disposed outside the periphery of the second chip, is vertically aligned with the first metal pillar and the second metal particle, extends into but not through the second encapsulant, is spaced from the second routing line, and has a diameter that increases as the second aperture extends from the first surface of the second encapsulant to the second metal particle.

68. The method of claim 1, wherein the first conductive trace includes a first metal particle that is embedded in the first encapsulant, disposed outside the periphery of the first chip, overlaps the first routing line and the first metal pillar and extends vertically across at least some of a thickness of the first chip between the first and second surfaces of the first chip.

69. The method of claim 1, wherein the second conductive trace includes a second metal pillar that is devoid of solder and conductive adhesive, is disposed outside the periphery of the second chip, is overlapped by the second routing line and the second metal particle and extends vertically beyond the second chip, the second routing line, the second metal particle and the second encapsulant in the second direction.

70. The method of claim 1, wherein the first assembly includes a first connection joint that contacts and electrically connects the first routing line and the first pad, and the second assembly includes a second connection joint that contacts and electrically connects the second routing line and the second pad.

71. The method of claim 1, wherein the first assembly includes a first insulative base that contacts the first routing line, is spaced from and overlapped by the first chip and extends vertically beyond the first chip, the first routing line and the first encapsulant in the second direction, and the second assembly includes a second insulative base that contacts the second routing line, is spaced from and overlapped by the second chip and the second metal particle and extends vertically beyond the second chip, the second routing line and the second encapsulant in the second direction.

72. The method of claim 1, wherein the first assembly includes a first insulative adhesive that contacts the first chip and the first encapsulant and extends vertically beyond the first chip in the second direction, and the second assembly includes a second insulative adhesive that contacts the second chip and the second encapsulant and extends vertically beyond the second chip in the second direction.

73. The method of claim 1, wherein the first assembly is a first-level package that is devoid of a heat sink, and the second assembly is a first-level package that includes a heat sink that is mechanically attached to the second chip, electrically isolated from the second chip, overlapped by the second chip and disposed vertically beyond the second chip and the second conductive trace in the second direction.

74. The method of claim 1, wherein the first assembly is a first-level package that is devoid of a ground plane, and the second assembly is a first-level package that includes a ground plane that is mechanically attached to the second routing line, electrically connected to the second routing line, overlapped by the second routing line and disposed vertically beyond the second chip and the second routing line in the second direction.

75. The method of claim 1, wherein the first and second assemblies are mechanically attached to one another solely by electrical conductors.

76. The method of claim 1, wherein the first and second chips are essentially identical to and vertically aligned with one another.

77. The method of claim 1, wherein the first and second routing lines are essentially identical to and vertically aligned with one another.

78. The method of claim 1, wherein the first and second conductive traces are essentially identical to and vertically aligned with one another.

79. The method of claim 1, wherein the first and second encapsulants are essentially identical to and vertically aligned with one another.

80. The method of claim 1, wherein the first and second assemblies are essentially identical to and vertically aligned with one another.

81. A method of making a three-dimensional stacked semiconductor package, comprising:
provoding a first semiconductor chip assembly that includes:
a first semiconductor chip that includes first and second opposing surfaces, wherein the first surface of the first chip includes a first conductive pad;
a first conductive trace that includes a first routing line, a first metal particle and a first metal pillar;
a first connection joint that electrically connects the first routing line and the first pad; and
a first encapsulant that includes first and second opposing surfaces, wherein the first surface of the first encapsulant faces in a first direction, the second surface of the first encapsulant faces in a second direction opposite the first direction, the first chip and the first metal particle are embedded in the first encapsulant, the first chip, the first metal particle and the first encapsulant extend vertically beyond the first routing line in the first direction, the first routing line extends laterally beyond the first metal particle and the first metal pillar towards the first chip and extends vertically beyond the first chip and the first metal particle in the second direction, the first metal particle overlaps and is non-integral with the first routing line and the first metal pillar, is disposed outside a periphery of the first chip and extends vertically across at least some of a thickness of the first chip between the first and second surfaces of the first chip, the first metal pillar is devoid of solder and conductive adhesive, contacts and is non-integral with the first routing line, is disposed outside the periphery of the first chip and extends vertically beyond the first chip, the first routing line, the first metal particle and the first encapsulant in the second direction, and any chip embedded in the first encapsulant is electrically connected to the first metal particle by an electrically conductive path that includes the first routing line;
providing a second semiconductor chip assembly that includes:
a second semiconductor chip that includes first and second opposing surfaces, wherein the first surface of the second chip includes a second conductive pad;
a second conductive trace that includes a second routing line and a second metal particle;
a second connection joint that electrically connects the second routing line and the second pad; and
a second encapsulant that includes first and second opposing surfaces, wherein the first surface of the second encapsulant faces in the first direction, the second surface of the second encapsulant faces in the second direction, a second aperture in the second encapsulant extends from the first surface of the second encapsulant to the second metal particle, extends into but not through the second encapsulant, is spaced from the second routing line and is disposed outside a periphery of the second chip, the second chip and the second metal particle are embedded in the second encapsulant, the second chip, the second metal particle and the second encapsulant extend vertically beyond the second routing line in the first direction, the second routing line extends laterally beyond the second metal particle towards the second chip and extends vertically beyond the second chip and the second metal particle in the second direction, the second metal particle overlaps and is non-integral with the second routing line, is disposed outside the periphery of the second chip and extends vertically across at least some of a thickness of the second chip between the first and second surfaces of the second chip, and any chip embedded in the second encapsulant is electrically connected to the second metal particle by an electrically conductive path that includes the second routing line; then
positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, the first metal pillar extends into the second aperture and is disposed vertically beyond the second routing line in the first direction, the first and second routing lines are spaced from and vertically aligned with one another, and the first and second metal particles are spaced from and vertically aligned with one another;
reflowing the second metal particle such that the first metal pillar extends into and is embedded in the second metal particle; and
electrically connecting the first metal pillar and the second metal particle within the second encapsulant.

82. The method of claim 81, wherein forming the first routing line and the first metal pillar includes selectively depositing the first routing line on a first metal base, and then etching the first metal base, thereby forming the first metal pillar from an unetched portion of the first metal base.

83. The method of claim 82, wherein selectively depositing the first routing line includes providing a plating mask on the first metal base, wherein the plating mask includes an opening that exposes a portion of the first metal base, and then electroplating the first routing line on the exposed portion of the first metal base through the opening in the plating mask.

84. The method of claim 82, wherein etching the first metal base removes a first portion of the first metal base that contacts the first routing line without removing a second portion of the first metal base that contacts the first routing line, thereby reducing but not eliminating contact area between the first metal base and the first routing line.

85. The method of claim 81, wherein forming the second aperture includes etching the second metal particle after forming the second encapsulant.

86. The method of claim 85, wherein etching the second metal particle includes applying a wet chemical etch that is selective of the second metal particle relative to the second encapsulant.

87. The method of claim 85, wherein etching the second metal particle includes receding the second metal particle relative to the first surface of the second encapsulant.

88. The method of claim 81, wherein positioning the first and second assemblies includes contacting the first metal pillar and the second metal particle.

89. The method of claim 81, wherein reflowing the second metal particle includes moving the first metal pillar towards the second routing line.

90. The method of claim 81, wherein reflowing the second metal particle transforms a loose unsecured relation between the first metal pillar and the second metal particle into a secure mechanical attachment between the first metal pillar and the second metal particle.

91. The method of claim 81, wherein the first chip is the only chip embedded in the first encapsulant, and the second chip is the only chip embedded in the second encapsulant.

92. The method of claim 81, wherein the first routing line is disposed vertically beyond the first chip and the first metal particle in the second direction and is unbent in the first and second directions, and the second routing line is disposed vertically beyond the second chip and the second metal particle in the second direction and is unbent in the first and second directions.

93. The method of claim 81, wherein the first metal particle extends vertically across most or all of the thickness of the first chip, and the second metal particle extends vertically across most or all of the thickness of the second chip.

94. The method of claim 81, wherein the first metal pillar includes first and second opposing surfaces that are flat and parallel to one another and first tapered sidewalls therebetween, the first surface of the first metal pillar faces towards and contacts the first routing line and is disposed outside the second aperture, the second surface of the first metal pillar faces away from and is spaced from the first routing line and is disposed within the second aperture, and the first tapered sidewalls slant inwardly towards the second surface of the first metal pillar and extend within and outside the second aperture.

95. The method of claim 94, wherein the second surface of the first metal pillar is concentrically disposed within a surface area of the first surface of the first metal pillar, and a surface area of the first surface of the first metal pillar is at least 20 percent larger than a surface area of the second surface of the first metal pillar.

96. The method of claim 94, wherein the second surface of the first metal pillar is disposed vertically beyond one of the first and second surfaces of the second chip in the first direction and is disposed vertically beyond the other of the first and second surfaces of the second chip in the second direction.

97. The method of claim 81, wherein the second aperture has a diameter that increases as the second aperture extends from the first surface of the second encapsulant to the second metal particle.

98. The method of claim 81, wherein the first and second assemblies are mechanically attached to one another solely by solder joints.

99. The method of claim 81, wherein the first and second conductive traces are essentially identical to and vertically aligned with one another.

100. The method of claim 81, wherein the first and second assemblies are essentially identical to and vertically aligned with one another.

101. A method of making a three-dimensional stacked semiconductor package, comprising:
  providing a first semiconductor chip assembly, including:
    providing a first routing line;
    mechanically attaching a first semiconductor chip to the first routing line, wherein the first chip includes first and second opposing surfaces, and the first surface of the first chip includes a first conductive pad;
    mechanically attaching and electrically connecting a first metal particle to the first routing line after providing the first metal particle;
    forming a first metal pillar that is electrically connected to the first routing line;
    forming a first connection joint that electrically connects the first routing line and the first pad; and
    forming a first encapsulant after attaching the first chip and the first metal particle to the first routing line, wherein the first encapsulant includes a first surface that faces in a first direction and a second surface that faces in a second direction opposite the first direction, the first encapsulant covers the first chip and extends vertically beyond the first chip, the first routing line and the first metal pillar in the first direction, the first chip and the first metal particle are embedded in the first encapsulant and extend vertically beyond the first routing line in the first direction, the first routing line overlaps the first metal pillar and extends laterally beyond the first metal particle and the first metal pillar towards the first chip, the first metal particle overlaps the first routing line and the first metal pillar and is disposed outside a periphery of the first chip, the first metal particle extends vertically across most or all of a thickness of the first chip between the first and second surfaces of the first chip while forming the first encapsulant, and the first metal pillar is devoid of solder and conductive adhesive, is disposed outside the periphery of the first chip and extends vertically beyond the first chip, the first routing line, the first metal particle and the first encapsulant in the second direction;
  providing a second semiconductor chip assembly, including:
    providing a second routing line;
    mechanically attaching a second semiconductor chip to the second routing line, wherein the second chip includes first and second opposing surfaces, and the first surface of the second chip includes a second conductive pad;
    mechanically attaching and electrically connecting a second metal particle to the second routing line after providing the second metal particle;
    forming a second connection joint that electrically connects the second routing line and the second pad;
    forming a second encapsulant after attaching the second chip and the second metal particle to the second routing line, wherein the second encapsulant includes a first surface that faces in the first direction and a second surface that faces in the second direction, the second encapsulant covers the second chip and extends vertically beyond the second chip and the second routing line in the first direction, the second chip and the second metal particle are embedded in the second encapsulant and extend vertically beyond the second routing line in the first direction, the second routing line extends laterally beyond the second metal particle towards the second chip, the second metal particle overlaps the second routing line and is disposed outside a periphery of the second chip, and the second metal particle extends vertically across most or all of a thickness of the second chip between the first and second surfaces of the second chip while forming the second encapsulant; and
    etching the second metal particle after forming the second encapsulant, thereby forming a second aperture in the second encapsulant that extends from the first surface of the second encapsulant to the second metal particle, extends into but not through the second encapsulant, is spaced from the second routing line and is disposed outside the periphery of the second chip; then positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture;

reflowing the second metal particle such that the first metal pillar extends into and is embedded in the second metal particle; and electrically connecting the first metal pillar and the second metal particle within the second encapsulant.

102. The method of claim 101, wherein forming the first routing line and the first metal pillar includes selectively depositing the first routing line on a first metal base, and then etching the first metal base after forming the first encapsulant, thereby forming the first metal pillar from an unetched portion of the first metal base.

103. The method of claim 102, wherein selectively depositing the first routing line includes providing a plating mask on the first metal base, wherein the plating mask includes an opening that exposes a portion of the first metal base, and then electroplating the first routing line on the exposed portion of the first metal base through the opening in the plating mask.

104. The method of claim 102, wherein etching the first metal base removes a first portion of the first metal base that contacts the first routing line without removing a second portion of the first metal base that contacts the first routing line, thereby reducing but not eliminating contact area between the first metal base and the first routing line.

105. The method of claim 102, wherein etching the first metal base removes all of the first metal base within the periphery of the first chip.

106. The method of claim 102, wherein etching the first metal base electrically isolates the first routing line from other routing lines formed on the first metal base.

107. The method of claim 102, wherein etching the first metal base electrically isolates the first conductive pad from other conductive pads of the first chip.

108. The method of claim 101, wherein forming the second encapsulant includes transfer molding the second encapsulant.

109. The method of claim 101, wherein forming the second encapsulant includes depositing the second encapsulant such that the second encapsulant covers the second metal particle in the first direction and the second metal particle is not exposed, and after forming the second encapsulant and before forming the second aperture, removing a portion of the second encapsulant thereby exposing the second metal particle.

110. The method of claim 109, wherein removing the portion of the second encapsulant includes applying a laser that ablates the second encapsulant.

111. The method of claim 100, wherein removing the portion of the second encapsulant includes applying a plasma that etches the second encapsulant.

112. The method of claim 109, wherein removing the portion of the second encapsulant includes grinding the second encapsulant.

113. The method of claim 109, wherein removing the portion of the second encapsulant includes grinding the second encapsulant without grinding the second metal particle, and then grinding the second encapsulant and the second metal particle.

114. The method of claim 101, wherein etching the second metal particle includes applying a wet chemical etch that is selective of the second metal particle relative to the second encapsulant, thereby receding the second metal particle relative to the first surface of the second encapsulant.

115. The method of claim 101, wherein positioning the first and second assemblies includes contacting the first metal pillar and the second metal particle.

116. The method of claim 115, wherein the second metal particle is solder.

117. The method of claim 101, wherein reflowing the second metal particle includes moving the first metal pillar towards the second routing line.

118. The method of claim 117, wherein the second metal particle is solder.

119. The method of claim 118, wherein essentially all of the first metal pillar is embedded in the second metal particle.

120. The method of claim 101, wherein reflowing the second metal particle transforms a loose unsecured relation between the first metal pillar and the second metal particle into a secure mechanical attachment between the first metal pillar and the second metal particle.

121. The method of claim 120, wherein the second metal particle is solder.

122. The method of claim 121, wherein essentially all of the first metal pillar is embedded in the second metal particle.

123. The method of claim 101, wherein providing the first assembly includes forming the first encapsulant and then forming the first metal pillar.

124. The method of claim 101, wherein providing the first assembly includes forming the first connection joint and then forming the first metal pillar.

125. The method of claim 101, wherein providing the first assembly includes etching the first metal particle after forming the first encapsulant, thereby forming a first aperture in the first encapsulant that extends from the first surface of the first encapsulant to the first metal particle, extends into but not through the first encapsulant, is spaced from the first routing line and is disposed outside the periphery of the first chip.

126. The method of claim 101, wherein providing the second assembly includes attaching the second chip to the second routing line and then attaching the second metal particle to the second routing line.

127. The method of claim 101, wherein providing the second assembly includes attaching the second metal particle to the second routing line and then attaching the second chip to the second routing line.

128. The method of claim 101, wherein providing the second assembly includes providing a second metal pillar that is devoid of solder and conductive adhesive, is disposed outside the periphery of the second chip, is overlapped by and electrically connected to the second routing line and the second metal particle and extends vertically beyond the second chip, the second routing line, the second metal particle and the second encapsulant in the second direction.

129. The method of claim 101, wherein the first chip is the only chip embedded in the first encapsulant, and the second chip is the only chip embedded in the second encapsulant.

130. The method of claim 101, wherein any chip embedded in the first encapsulant is electrically connected to the first metal particle by an electrically conductive path that includes the first routing line, and any chip embedded in the second encapsulant is electrically connected to the second metal particle by an electrically conductive path that includes the second routing line.

131. The method of claim 101, wherein the first routing line is disposed vertically beyond the first chip and the first metal particle in the second direction and is unbent in the first and second directions, and the second routing line is disposed vertically beyond the second chip and the second metal particle in the second direction and is unbent in the first and second directions.

132. The method of claim 101, wherein the first metal particle extends vertically beyond the first chip in the first and second directions while forming the first encapsulant, and the second metal particle extends vertically beyond the second chip in the first and second directions while forming the second encapsulant.

133. The method of claim 101, wherein the first metal pillar includes first and second opposing surfaces that are flat and parallel to one another and first tapered sidewalls therebetween, the first surface of the first metal pillar faces towards and contacts the first routing line and is disposed outside the second aperture, the second surface of the first metal pillar faces away from and is spaced from the first routing line and is disposed within the second aperture, and the first tapered sidewalls slant inwardly towards the second surface of the first metal pillar and extend within and outside the second aperture.

134. The method of claim 133, wherein the second surface of the first metal pillar is concentrically disposed within a surface area of the first surface of the first metal pillar, and a surface area of the first surface of the first metal pillar is at least 20 percent larger than a surface area of the second surface of the first metal pillar.

135. The method of claim 133, wherein the second surface of the first metal pillar is disposed vertically beyond one of the first and second surfaces of the second chip in the first direction and is disposed vertically beyond the other of the first and second surfaces of the second chip in the second direction.

136. The method of claim 101, wherein the second metal particle is provided as a ball.

137. The method of claim 136, wherein the second metal particle is provided as a solder ball, and attaching the second metal particle to the second routing line includes reflowing the solder ball.

138. The method of claim 136, wherein the second metal particle is provided as a metal ball that is devoid of conductive adhesive, and attaching the second metal particle to the second routing line includes depositing solder paste or conductive adhesive on the second routing line, then depositing the second metal particle on the solder paste or the conductive adhesive, and then hardening the solder paste or the conductive adhesive to provide a second conductive bond that is solder or conductive adhesive and contacts the second routing line and the second metal particle.

139. The method of claim 136, wherein the second metal particle is provided as a metal ball, and attaching the second metal particle to the second routing line includes depositing solder paste on the second routing line, then depositing the second metal particle on the solder paste and then hardening the solder paste to provide a second conductive bond that is solder and contacts the second routing line and the second metal particle.

140. The method of claim 101, wherein the second metal particle is provided as a wire segment that is sliced from a wire.

141. The method of claim 140, wherein the second metal particle is provided as a solder wire segment, and attaching the second metal particle to the second routing line includes reflowing the solder wire segment.

142. The method of claim 140, wherein the second metal particle is provided as a metal wire segment that is devoid of conductive adhesive, and attaching the second metal particle to the second routing line includes depositing solder paste or conductive adhesive on the second routing line, then depositing the metal particle on the solder paste or the conductive adhesive, and then hardening the solder paste or the conductive adhesive to provide a second conductive bond that is solder or conductive adhesive and contacts the second routing line and the second metal particle.

143. The method of claim 140, wherein the second metal particle is provided as a metal wire segment, and attaching the second metal particle to the routing line includes depositing solder paste on the second routing line, then depositing the second metal particle on the solder paste, and then hardening the solder paste to provide a second conductive bond that is solder and contacts the second routing line and the second metal particle.

144. The method of claim 101, wherein the second metal particle has a substantially spherical shape while forming the second encapsulant.

145. The method of claim 101, wherein the second metal particle has a substantially cylindrical shape while forming the second encapsulant.

146. The method of claim 101, wherein the second aperture has a diameter that increases as the second aperture extends from the first surface of the second encapsulant to the second metal particle.

147. The method of claim 101, wherein the first and second assemblies are mechanically attached to one another solely by solder joints.

148. The method of claim 101, wherein the first and second conductive traces are essentially identical to and vertically aligned with one another.

149. The method of claim 101, wherein the first and second encapsulants are essentially identical to and vertically aligned with one another.

150. The method of claim 101, wherein the first and second assemblies are essentially identical to and vertically aligned with one another.

151. A method of making a three-dimensional stacked semiconductor package, comprising:
    providing a first semiconductor chip assembly, including:
        providing a first metal base;
        forming a first routing line on the first metal base;
        mechanically attaching a first semiconductor chip to the first routing line, wherein the first chip includes first and second opposing surfaces, and the first surface of the first chip includes a first conductive pad;
        mechanically attaching and electrically connecting a first metal particle to the first routing line after providing the first metal particle;
        forming a first connection joint that electrically connects the first routing line and the first pad;
        forming a first encapsulant after attaching the first chip and the first metal particle to the first routing line, wherein the first encapsulant includes a first surface that faces in a first direction and a second surface that faces in a second direction opposite the first direction, the first encapsulant covers the first chip and extends vertically beyond the first chip, the first routing line and the first metal base in the first direction, the first chip and the first metal particle are embedded in the first encapsulant and extend vertically beyond the first routing line in the first direction, the first routing line extends laterally beyond the first metal particle towards the first chip, the first metal particle overlaps the first routing line and is disposed outside a periphery of the first chip, and the first metal particle extends vertically across most or all of a thickness of the first chip between the first and second surfaces of the first chip while forming the first encapsulant; and etching the first metal base after forming the first encapsulant, thereby forming a first metal pillar from an unetched portion of the first metal base that contacts and is electrically connected to the first routing line, is disposed outside the periphery of the first chip, is overlapped by the first routing line and the first metal particle and extends vertically beyond the first chip, the first routing line, the first metal particle and the first encapsulant in the second direction;

providing a second semiconductor chip assembly, including:

providing a second routing line;

mechanically attaching a second semiconductor chip to the second routing line, wherein the second chip includes first and second opposing surfaces, and the first surface of the second chip includes a second conductive pad;

mechanically attaching and electrically connecting a second metal particle to the second routing line after providing the second metal particle;

forming a second connection joint that electrically connects the second routing line and the second pad;

forming a second encapsulant after attaching the second chip and the second metal particle to the second routing line, wherein the second encapsulant includes a first surface that faces in the first direction and a second surface that faces in the second direction, the second encapsulant covers the second chip and the second metal particle and extends vertically beyond the second chip, the second routing line and the second metal particle in the first direction, the second chip and the second metal particle are embedded in the second encapsulant and extend vertically beyond the second routing line in the first direction, the second routing line extends laterally beyond the second metal particle towards the second chip, the second metal particle overlaps the second routing line and is disposed outside a periphery of the second chip, and the second metal particle extends vertically across most or all of a thickness of the second chip between the first and second surfaces of the second chip while forming the second encapsulant; then removing a portion of the second encapsulant, thereby exposing the second metal particle; and then etching the second metal particle, thereby forming a second aperture in the second encapsulant that extends from the first surface of the second encapsulant to the second metal particle, extends into but not through the second encapsulant, is spaced from the second routing line and is disposed outside the periphery of the second chip; then positioning the first and second assemblies such that the first assembly overlaps the second assembly, the first surfaces of the encapsulants face in the first direction, the second surfaces of the encapsulants face in the second direction, the first surface of the second encapsulant faces towards the second surface of the first encapsulant, and the first metal pillar extends into the second aperture;

reflowing the second metal particle such that the first metal pillar extends into and is embedded in the second metal particle; and electrically connecting the first metal pillar and the second metal particle within the second encapsulant.

152. The method of claim 151, wherein forming the first routing line includes selectively depositing the first routing line on the first metal base.

153. The method of claim 151, wherein forming the first routing line includes providing a plating mask on the first metal base, wherein the plating mask includes an opening that exposes a portion of the first metal base, and then electroplating the first routing line on the exposed portion of the first metal base through the opening in the plating mask.

154. The method of claim 151, wherein etching the first metal base removes a first portion of the first metal base that contacts the first routing line without removing a second portion of the first metal base that contacts the first routing line, thereby reducing but not eliminating contact area between the first metal base and the first routing line.

155. The method of claim 151, wherein etching the first metal base removes all of the first metal base within the periphery of the first chip.

156. The method of claim 151, wherein etching the first metal base electrically isolates the first routing line from other routing lines formed on the first metal base.

157. The method of claim 151, wherein etching the first metal base electrically isolates the first conductive pad from other conductive pads of the first chip.

158. The method of claim 151, wherein forming the second encapsulant includes transfer molding the second encapsulant.

159. The method of claim 151, wherein forming the second encapsulant includes curing the second encapsulant.

160. The method of claim 151, wherein removing the portion of the second encapsulant includes applying a laser that ablates the second encapsulant.

161. The method of claim 151, wherein removing the portion of the second encapsulant includes applying a plasma that etches the second encapsulant.

162. The method of claim 151, wherein removing the portion of the second encapsulant includes grinding the second encapsulant.

163. The method of claim 151, wherein removing the portion of the second encapsulant includes grinding the second encapsulant without grinding the second metal particle, and then grinding the second encapsulant and the second metal particle.

164. The method of claim 151, wherein etching the second metal particle includes applying a wet chemical etch that is selective of the second metal particle relative to the second encapsulant, thereby receding the second metal particle relative to the first surface of the second encapsulant.

165. The method of claim 151, wherein positioning the first and second assemblies includes contacting the first metal pillar and the second metal particle.

166. The method of claim 165, wherein the second metal particle is solder.

167. The method of claim 151, wherein reflowing the second metal particle includes moving the first metal pillar towards the second routing line.

168. The method of claim 167, wherein the second metal particle is solder.

169. The method of claim 168, wherein essentially all of the first metal pillar is embedded in the second metal particle.

170. The method of claim 151, wherein reflowing the second metal particle transforms a loose unsecured relation between the first metal pillar and the second metal particle into a secure mechanical attachment between the first metal pillar and the second metal particle.

171. The method of claim 170, wherein the second metal particle is solder.

172. The method of claim 171, wherein essentially all of the first metal pillar is embedded in the second metal particle.

173. The method of claim 151, wherein providing the first assembly includes etching the first metal particle after forming the first encapsulant, thereby forming a first aperture in the first encapsulant that extends from the first surface of the first encapsulant to the first metal particle, extends into but not through the first encapsulant, is spaced from the first routing line and is disposed outside the periphery of the first chip.

174. The method of claim 173, including forming the first metal pillar and then forming the first aperture.

175. The method of claim 173, including forming the first aperture and then forming the first metal pillar.

176. The method of claim 151, wherein providing the second assembly includes attaching the second chip to the second routing line and then attaching the second metal particle to the second routing line.

177. The method of claim 151, wherein providing the second assembly includes attaching the second metal particle to the second routing line and then attaching the second chip to the second routing line.

178. The method of claim 151, wherein providing the second assembly includes providing a second metal pillar that is devoid of solder and conductive adhesive, is disposed outside the periphery of the second chip, contacts the second routing line, is overlapped by and electrically connected to the second routing line and the second metal particle and extends vertically beyond the second chip, the second routing line, the second metal particle and the second encapsulant in the second direction.

179. The method of claim 151, wherein the first chip is the only chip embedded in the first encapsulant, and the second chip is the only chip embedded in the second encapsulant.

180. The method of claim 151, wherein any chip embedded in the first encapsulant is electrically connected to the first metal particle by an electrically conductive path that includes the first routing line, and any chip embedded in the second encapsulant is electrically connected to the second metal particle by an electrically conductive path that includes the second routing line.

181. The method of claim 151, wherein the first routing line is disposed vertically beyond the first chip and the first metal particle in the second direction and is unbent in the first and second directions, and the second routing line is disposed vertically beyond the second chip and the second metal particle in the second direction and is unbent in the first and second directions.

182. The method of claim 151, wherein the first metal particle extends vertically beyond the first chip in the first and second directions while forming the first encapsulant, and the second metal particle extends vertically beyond the second chip in the first and second directions while forming the second encapsulant.

183. The method of claim 151, wherein the first metal pillar includes first and second opposing surfaces that are flat and parallel to one another and first tapered sidewalls therebetween, the first surface of the first metal pillar faces towards and contacts the first routing line and is disposed outside the second aperture, the second surface of the first metal pillar faces away from and is spaced from the first routing line and is disposed within the second aperture, and the first tapered sidewalls slant inwardly towards the second surface of the first metal pillar and extend within and outside the second aperture.

184. The method of claim 183, wherein the second surface of the first metal pillar is concentrically disposed within a surface area of the first surface of the first metal pillar, and a surface area of the first surface of the first metal pillar is at least 20 percent larger than a surface area of the second surface of the first metal pillar.

185. The method of claim 183, wherein the second surface of the first metal pillar is disposed vertically beyond one of the first and second surfaces of the second chip in the first direction and is disposed vertically beyond the other of the first and second surfaces of the second chip in the second direction.

186. The method of claim 151, wherein the second metal particle is provided as a ball.

187. The method of claim 186, wherein the second metal particle is provided as a solder ball, and attaching the second metal particle to the second routing line includes reflowing the solder ball.

188. The method of claim 186, wherein the second metal particle is provided as a metal ball that is devoid of conductive adhesive, and attaching the second metal particle to the second routing line includes depositing solder paste or conductive adhesive on the second routing line, then depositing the second metal particle on the solder paste or the conductive adhesive, and then hardening the solder paste or the conductive adhesive to provide a second conductive bond that is solder or conductive adhesive and contacts the second routing line and the second metal particle.

189. The method of claim 186, wherein the second metal particle is provided as a metal ball, and attaching the second metal particle to the second routing line includes depositing solder paste on the second routing line, then depositing the second metal particle on the solder paste, and then hardening the solder paste to provide a second conductive bond that is solder and contacts the second routing line and the second metal particle.

190. The method of claim 151, wherein the second metal particle is provided as a wire segment that is sliced from a wire.

191. The method of claim 190, wherein the second metal particle is provided as a solder wire segment, and attaching the second metal particle to the second routing line includes reflowing the solder wire segment.

192. The method of claim 190, wherein the second metal particle is provided as a metal wire segment that is devoid of conductive adhesive, and attaching the second metal particle to the second routing line includes depositing solder paste or conductive adhesive on the second routing line, then depositing the metal particle on the solder paste or the conductive adhesive, and then hardening the solder paste or the conductive adhesive to provide a second conductive bond that is solder or conductive adhesive and contacts the second routing line and the second metal particle.

193. The method of claim 190, wherein the second metal particle is provided as a metal wire segment, and attaching the second metal particle to the routing line includes depositing solder paste on the second routing line, then depositing the second metal particle on the solder paste and then hardening the solder paste to provide a second conductive bond that is solder and contacts the second routing line and the second metal particle.

194. The method of claim 151, wherein the second metal particle has a substantially spherical shape while forming the second encapsulant.

195. The method of claim 151, wherein the second metal particle has a substantially cylindrical shape while forming the second encapsulant.

196. The method of claim 151, wherein the second aperture has a diameter that increases as the second aperture extends from the first surface of the second encapsulant to the second metal particle.

197. The method of claim 151, wherein the first and second assemblies are mechanically attached to one another solely by solder joints.

198. The method of claim 151, wherein the first and second conductive traces are essentially identical to and vertically aligned with one another.

199. The method of claim 151, wherein the first and second encapsulants are essentially identical to and vertically aligned with one another.

200. The method of claim 151, wherein the first and second assemblies are essentially identical to and vertically aligned with one another.

* * * * *